(12) United States Patent
Forest et al.

(10) Patent No.: US 7,430,261 B2
(45) Date of Patent: Sep. 30, 2008

(54) METHOD AND BIT STREAM DECODING UNIT USING MAJORITY VOTING

(75) Inventors: Thomas Forest, Macomb, MI (US); Bernd Hedenetz, Denkendorf (DE); Mathias Rausch, Marktschwaben (DE); Christopher Temple, Munich (DE); Harald Eisele, Pinneberg (DE); Bernd Elend, Hamburg (DE); Jörn Ungermann, Aachen (DE); Matthias Kühlewein, Tübingen (DE); Ralf Belschner, Pliezhausen (DE); Peter Lohrmann, Eislingen (DE); Florian Bogenberger, Munich (DE); Thomas Wuerz, Poing (DE); Arnold Millsap, Leonard, MI (US); Patrick Heuts, Malden (NL); Robert Hugel, Karlsruhe (DE); Thomas Führer, Gerlingen (DE); Bernd Müller, Leonberg (DE); Florian Hartwich, Reutlingen (DE); Manfred Zinke, Aachen (DE); Josef Berwanger, Poing (DE); Christian Ebner, Munich (DE); Harald Weiler, Göppingen (DE); Peter Fuhrmann, Aachen (DE); Anton Schedl, Munich (DE); Martin Peller, Munich (DE)

(73) Assignees: Robert Bosch GmbH, Stuttgart (DE); DaimlerChrysler AG, Stuttgart (DE); Bayerische Motoren Werke AG, Munich (DE); General Motors Corp., Warren, MI (US); Motorola Inc., Schaumburg, IL (US); Koninklijke Philips Electronics N.V., Eindhoven (NL)

( * ) Notice: Subject to any disclaimer, the term of this patent is extended or adjusted under 35 U.S.C. 154(b) by 978 days.

(21) Appl. No.: 10/613,039

(22) Filed: Jul. 7, 2003

(65) Prior Publication Data

US 2004/0090962 A1 May 13, 2004

Related U.S. Application Data

(63) Continuation of application No. PCT/EP03/03993, filed on Apr. 16, 2003.

(30) Foreign Application Priority Data

Apr. 16, 2002 (DE) .............................. 102 16 984
Apr. 16, 2002 (EP) .................................. 02008171

(51) Int. Cl.
*H04L 7/06* (2006.01)

(52) U.S. Cl. ...................... 375/364; 370/392; 370/442

(58) Field of Classification Search ................ 375/364; 370/392, 442

See application file for complete search history.

(56) References Cited

U.S. PATENT DOCUMENTS 4,005,266 A 1/1977 Lehr (Continued)

FOREIGN PATENT DOCUMENTS

| EP | 0 412 234 | 2/1991 |
|----|-----------|--------|
| GB | 1 560 270 | 2/1980 |

OTHER PUBLICATIONS

"Protocol Overview", FlexRay International Workshop, Apr. 16, 2002, Munich, p. 26; http://www.flexray.com/publications/intworkshop2002_04.pdf.*

(Continued)

*Primary Examiner*—David C. Payne
*Assistant Examiner*—Nader Bolourchi
(74) *Attorney, Agent, or Firm*—Paul Vincent

(57) ABSTRACT

A method and a bit stream decoding unit for bit stream decoding has a bit stream comprising a number of consecutive samples. In order to provide for rapid and, in particular, reliable decoding of the bit stream, a detection window comprising a number of samples is defined and the detection window is positioned at certain positions on the bit stream in order to comprise certain samples with respective sample values. A majority voting is applied to the sample values in the detection window and, in dependence on the result of the majority voting, the bit stream is decoded and respective bit values are generated.

23 Claims, 70 Drawing Sheets

U.S. PATENT DOCUMENTS

| | | | | |
|---|---|---|---|---|
| 4,653,076 A | * | 3/1987 | Jerrim et al. | 375/367 |
| 5,289,466 A | | 2/1994 | Nobutoki | |
| 5,671,256 A | * | 9/1997 | Clark et al. | 375/342 |
| 5,694,542 A | | 12/1997 | Kopetz | |
| 5,923,663 A | | 7/1999 | Bontemps | |
| 5,995,559 A | * | 11/1999 | Hedberg | 375/340 |
| 6,118,603 A | * | 9/2000 | Wilson et al. | 360/48 |
| 6,246,702 B1 | | 6/2001 | Fellmann | |
| 6,308,068 B1 | * | 10/2001 | Kunkel | 455/434 |
| 6,449,290 B1 | | 9/2002 | Willars | |
| 6,473,450 B1 | * | 10/2002 | Sutterlin et al. | 375/142 |
| 6,748,451 B2 | | 6/2004 | Woods | |
| 6,944,804 B1 | * | 9/2005 | Kim et al. | 714/704 |

OTHER PUBLICATIONS http://en.wikipedia.org/wiki/Flexray.*

Chih-Kong Ken Yang, et al. "A 0.6 μm CMOS 4Gb/s Transceiver with Data Recovery using Oversampling". 1997 Symposium on VLSI Circuits Digest of Technical Papers, Jun. 12, 1997, pp. 71-72.

Christopher Temple "Avoiding the Babbling-Idiot Failure in a Time-Triggered Communication System". 28th International Symposium on FTCS, Jun. 1998, Munich/ Germany.

* cited by examiner

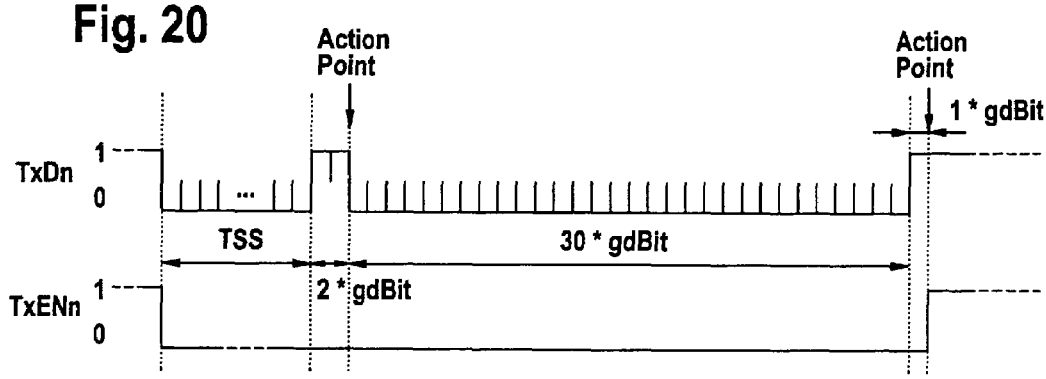
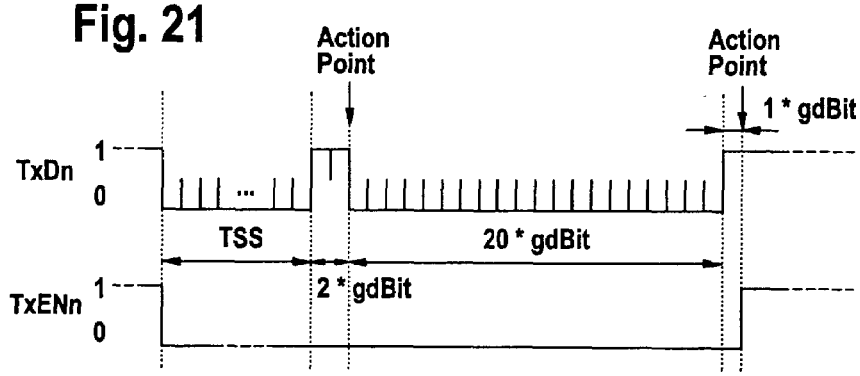
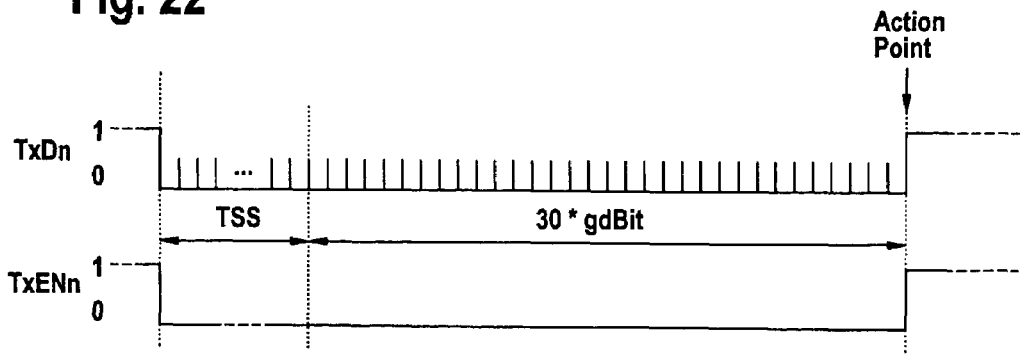

Expected falling edge    Detected falling edge

Detected falling edge    Expected falling edge

Expected falling edge    Detected falling edge n = number of Macroticks per cycle Wakeup channel monitoring Wakeup pattern transmission Channel monitoring and selection of startup path.

Selection of ColdStart Initiator

Initial Synchronization

Check on successful integration

Wakeup state machine for the wakeup ( WU ) protocol mode

Startup state machine for the time-triggered (TT-D, TT-M) protocol modes

Startup state machine for the byteflight (BF) protocol mode

Startup state machine for the event-triggered (ET) protocol mode

METHOD AND BIT STREAM DECODING UNIT USING MAJORITY VOTING

This application is a continuation of PCT/EP03/03993 filed Apr. 16, 2003 and claims Paris Convention priority of EP 02 008 171.7 and DE 102 16 984.5 both filed on Apr. 16, 2002 the entire disclosure of which are all hereby incorporated by reference.

BACKGROUND OF THE INVENTION

The present invention refers to a method for bit stream decoding. The bit stream comprises a number of consecutive samples.

Furthermore, the invention refers to a computer program, which is able to run on a computer, in particular on a microprocessor.

Further, the invention refers to a bit stream decoding unit for decoding a bit stream. The bit stream comprises a number of consecutive samples.

Finally, the present invention refers to one of a number of nodes of a communication system. The nodes are connected to a communication media for transmitting data among the nodes. The data is transmitted across the communication media in the form of a bit stream, whereas the bit stream comprises a number of consecutive samples.

Various types of communication systems are known in the art. Generally, they comprise a communication media, which for example is a data bus. Various nodes are connected to the communication media. Each node comprises a host controller, a communication controller, a bus driver and optionally a bus guardian. Data can be transmitted across the communication system according to various protocols. An example of such a protocol is TTCAN (Time Triggered Controller Area Network) for time triggered communication systems.

Data transmission can be effected in communication cycles, which comprise various time slots assigned to the nodes of the communication system. Each node can send data across the communication media within the timeslot assigned to the node. Which timeslots are assigned to which nodes is part of a communication media access scheme. If a node wants to transmit data, the data is brought into a format specified in the protocol used. Formatting the data is effected by the communication controller of the node. The formatted data is called bit stream. The bit stream is forwarded from the communication controller to the bus driver, which translates the formatted data into electrical signals which then are applied to the communication media within the timeslots assigned to the node.

A node receiving information receives the electrical signals from the communication media. The signals are transformed into the respective bit stream in the bus driver of the node. From there the bit stream is forwarded to the communication controller, where the bit stream has to be decoded.

Decoding of the bit stream is conducted in the physical layer of the communication system. The decoding comprises in particular extracting logical frames and symbol information, and passing this information to a protocol engine of the node. In particular the following steps have to be performed during decoding of the bit stream:

Detecting bit edges between two bit cells within the bit stream applied to the bit stream decoding unit at an input from the communication media, and Determining the actual value of a bit cell within the bit stream.

Depending on the detected edges between two bit cells, in particular depending on the detected initial edge of the first bit cell within the bit stream, the decoding within the communication controller is started and data reception is activated. The communication controller itself runs on a time triggered basis, however the processing of the bits runs event triggered. Therefore, it is very important to reliably determine the initial edge of the bit cell within the bit stream. Otherwise the communication controller is started to no purpose.

It is an object of the present invention to provide a possibility of fast and in particular reliable decoding of a bit stream.

SUMMARY OF THE INVENTION

To solve this object according to the present invention a method of the above mentioned kind is suggested, characterized in that a detection window comprising a number of samples is defined;

the detection window is positioned at certain positions on the bit stream in order to comprise certain samples with respective sample values;

a majority voting is applied to the sample values comprised by the detection window; and according to the result of the majority voting the bit stream is decoded and respective bit values are generated.

Typically, in a FlexRay communication system, a bit comprises 8 or 10 samples, respectively, a bit cell comprises 8 or 10 sample values.

The method begins with detecting a valid edge. This is done in the Bit Clock Alignment function (BCA). The BCA function is started as soon as an idle state of a channel, across which the bit stream is transmitted, is detected. The detection of channel idle is detected at an input (RxDn) of the Bit Stream Decoding (BSD) unit. As soon as a valid edge is detected, the detection window is positioned on the bit stream in order to detect further bit-edges and to determine the actual value of a bit cell within the bit stream.

Of course, the detection window can comprise any number of samples, in particular an even number of samples. However, according to a preferred embodiment of the invention it is suggested that the detection window comprises an odd number of samples. This allows an unambiguous majority voting.

According to another preferred embodiment of the present invention it is suggested that the detection window is positioned at an expected edge between two bit cells of the bit stream in order to comprise at least one samples of a first bit cell and at least one sample of a subsequent bit cell with the respective sample values and that the method is used for bit edge detection. An edge detection window determines the time window in which the next edge for bit clock alignment is expected. This window is set during frame reception around the expected logical '1' to '0' transition between two consecutive bits of a BSS (Byte Start Sequence) signal. For example, the detection window for bit edge detection comprises 3 samples.

According to yet another preferred embodiment of the present invention it is suggested that the detection window is centered on an expected center of a bit cell of the bit stream in order to comprise at samples only of said bit cell and that the method is used for detecting a bit value of said bit cell. According to this embodiment the actual bit value of a bit cell is not determined from a single sample value. Rather, a number of sample values are acquired and the actual bit value is determined by means of the majority voting over the acquired samples. For example, the detection window for detecting a bit value (sample voting) comprises 6 samples.

Preferably, the method according to the present invention is used for filtering out glitches or spikes in the bit stream. The majority voting over the acquired samples of a bit cell has the effect that glitches or spikes within the bit stream are filtered out.

For positioning the detection window on a bit cell within the bit stream, appropriate parameters can be predefined according to which the detection window is positioned. It is suggested that the detection window is positioned on the expected center of a bit cell according to a predetermined offset-parameter and to a predetermined parameter specifying the number of samples in the detection window. The offset-parameter specifies the distance from the beginning of the bit cell to the beginning of the detection window. Preferably the parameters have a time entity, in particular numbers of samples.

Furthermore, the above-mentioned object is achieved by a computer program of the above-mentioned kind, characterized in that, the computer program is programmed in order to execute a method according to the present invention.

According to a preferred embodiment it is suggested that the computer program is stored on a read-only-memory (ROM), on a random-access-memory (RAM) or on a flash-memory.

Moreover, the above-mentioned object is achieved by a bit stream decoding unit of the above-mentioned kind, characterized in that it comprises:
- means for positioning a predefined detection window at certain positions on the bit stream, the detection window being predefined in order to comprise a number of samples, the detection window being positioned in such a way as to comprise certain samples with respective sample values;
- means for applying a majority voting to the sample values comprised by the detection window; and
- means for decoding the bit stream according to the result of the majority voting and for generating respective bit values.

According to a preferred embodiment of the invention it is suggested that the bit stream decoding unit comprises means for executing the method according to the present invention.

Finally, the above-mentioned object is achieved by a node of a communication system of the above-mentioned kind, characterized in that the node comprises a bit stream decoding unit according to the present invention for decoding the bit stream received from the communication media.

These and other features, aspects and advantages of the present invention will become better understood with reference to the following detailed description, appended claims, and accompanying drawings, wherein:

BRIEF DESCRIPTION OF THE DRAWING

FIG. 20 illustrates a bit stream of a status normal symbol (SNS);

FIG. 21 illustrates a bit stream of a status alarm symbol (SAS);

FIG. 22 illustrates a bit stream of a collision avoidance symbol (CAS);

DESCRIPTION OF THE PREFERRED EMBODIMENT

Figure 1:
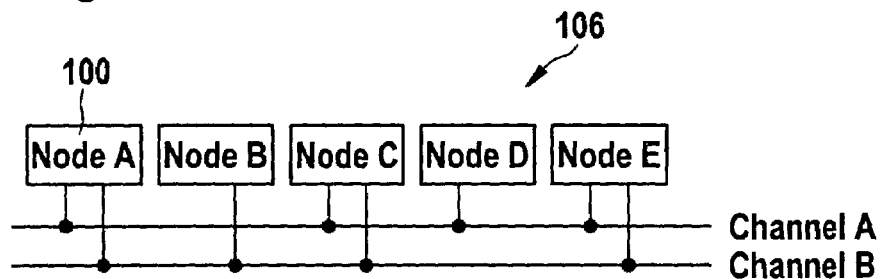
FIG. 1 illustrates a communication system according to the present invention with a dual channel bus configuration.

The present invention refers to a dependable automotive network. Throughout the following description the following structure is followed: at the beginning of each chapter (section) the requirements for this topic are defined, afterwards more detailed descriptions are provided. In the description UPPER CASE letters are used to denote constants. All constants used in the document are listed at the end of the description.

Objectives

The objectives pursued in the development of the dependable automotive network are the following:

Support of two communication paradigms, deterministic (statically defined) communication and dynamic event driven communication.

Configurable static and dynamic part (segment) within one communication cycle. Fully static and fully dynamic configuration has to be supported.

Flexible extendibility, even after deployment.

High data rate and bandwidth efficiency.

Scalable fault tolerance (i.e., single channel and dual channel operation must be supported).

Reliable error detection (bus guardian mechanism in the time domain, cyclic redundancy check (CRC) in the value domain).

Support of electrical and optical physical interfaces.

Enable very low system level failure in time ratings.

Allow use of crystal oscillators and low tolerance ceramic resonators.

Support of active star and bus topologies.

Low overall system cost.

Enable re-use of carry over components without embedding knowledge of future platform partitioning.

The objectives of the static segment are the following:

Deterministic communication behavior in the time domain.

Global time implemented by a fault tolerant clock synchronization algorithm.

Immunity against accepting error-free sub-sequences of a message as valid messages (i.e. short message rejection).

The objectives of the dynamic segment are the following:

Event driven dynamic communication possibility.

Flexible bandwidth allocation (for different nodes during runtime).

No interference with the static segment.

Support for prioritized bus access.

Support of variable length messages with at least 200 data bytes.

The global requirements are the following:

Support for fault tolerance, but operation without fault tolerance must also be possible, i.e., a single bus (channel) connection must be possible for non-fault-tolerant nodes.

The communication network has to support a system architecture, where no single fault may lead to a functional degradation.

Protection against faults in accordance with a well-defined fault hypotheses.

Protect against up to and including five random bit errors per frame.

The communication protocol should be independent as far as possible from the topology.

For highly dependable and fault-tolerant applications an independent bus guardian to prevent the monopolization of the communication medium by a communication controller is required (so called "babbling idiot").

Errors in hardware and configuration data have to be detected during initialization and operation by error detection mechanisms (EDMs). In case a critical error is detected the controller and transceiver must not be allowed to enter normal operation or immediately abort normal operation and report an error to the host.

Support of serviceability of system- and component-level faults.

The bit encoding technique must not introduce data dependent changes in the length of the resulting bit stream, e.g., bit stuffing is not allowed.

Automotive qualification of the communication controller, bus guardian, and the physical layer is required.

Configuration data must be readable/writeable by the host. It must be possible to prohibit writing during runtime.

Support of comprehensive self test at system communication startup.

Support of timely and highly reliable component re-integration and system-level startup.

Support of master-less system startup and shutdown.

Support of traceability of system- and component-level faults to identify root causes of failures.

Support of synchronized system shutdown without error indications.

Support of synchronous distributed application startup and shutdown with acceptable timing and fault tolerance characteristics.

Support of node and network moding with high security against critical inadvertant mode changes.

Logical line compatibility to the byteflight protocol, when using an optical physical layer must be possible.

Basic Concepts

The communication protocol for the dependable automotive network according to the present invention has the following properties:

Synchronous and asynchronous frame transfer.
Multi-master clock synchronization.
Guaranteed frame latency times and jitter during synchronous transfer.
Prioritization of frames during asynchronous transfer.
Error detection and signaling.
Error containment on the physical layer through an independent bus guardian device.
Scalable fault tolerance, e.g., one controller, one/two channels, one bus guardian for each channel.

The FlexRay protocol can be divided into various layers of a layer architecture comprising the following layers:

The Physical Layer defines how signals are actually transmitted. Tasks of the Physical Layer are fault confinement and error detection and signaling. The Physical Layer comprises a signal level, a bit representation and a transmission medium. One task of the Physical Layer is to detect errors of the communication controller in the time domain. This is done by the so-called Bus Guardian.

The Transfer Layer represents the kernel of the protocol. It presents frames received to the presentation layer and accepts frames to be transmitted from the presentation layer. The transfer layer is responsible for timing, synchronization, message framing, error detection and signaling, and fault confinement.

The Presentation Layer is concerned with frame filtering and masking, frame status handling and contains the communication controller host interface.

The Application Layer is not part of this description.

Node (ECU) Architecture

Figure 103:
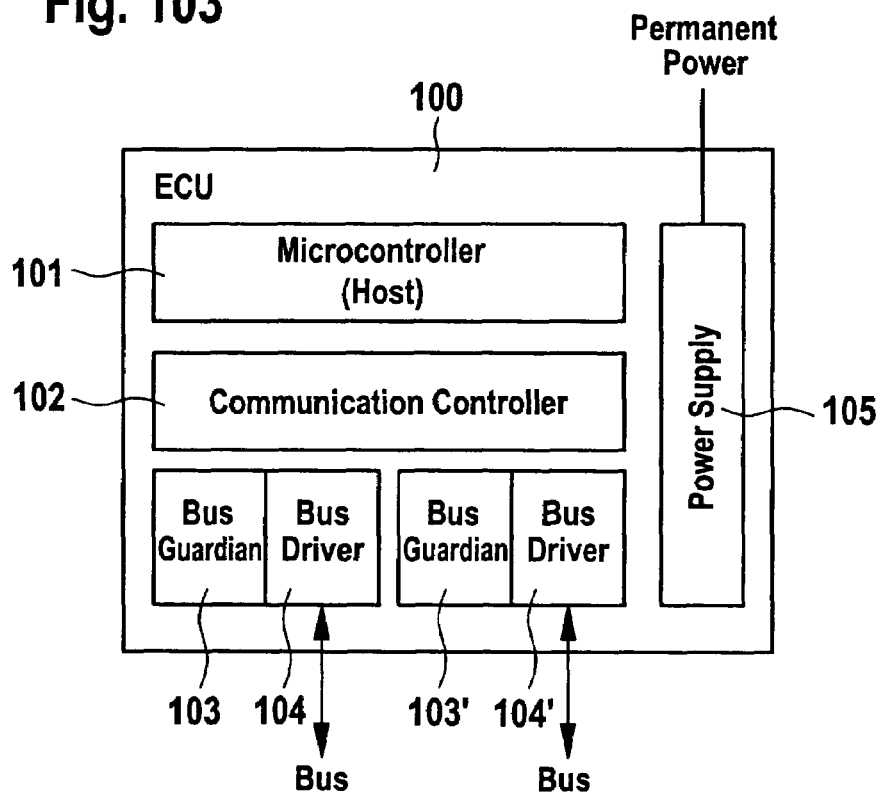
FIG. 103 illustrates an architecture of a node of the communication system.

FIG. 103 shows the architecture of a node 100 (electronic control unit, ECU) of the communication system. Every node 100 consists of the five sub-components host controller 101, communication controller 102, bus guardian 103, bus driver 104, and power supply 105. In the following description the requirements for the communication controller 102, the bus guardian 103, the bus driver 104 and the interfaces to the host 101 and the power supply 105 are described.

Two implementations for the communication controller 102 are possible, one configuration of a communication controller 102 that sends and receives on two redundant physical channels, and a second configuration which is solely connected to one physical channel.

Topology

Figure 104:
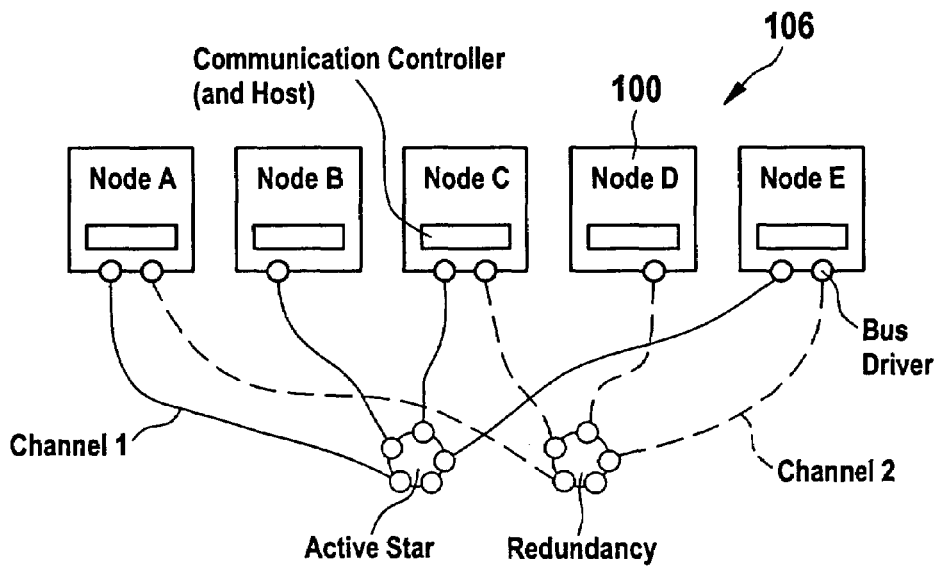
FIG. 104 illustrates an example for a possible network configuration.

FIG. 104 shows a possible topology configuration of the communication system 106 (network). A node 100 can either be connected to both channels 1 and 2 (node A, C, and E) or only channel 1 (node B) or only channel 2 (node D). A configuration, where all nodes 100 are connected by one channel only is also possible.

Frame Transfer

In FlexRay media access occurs within a communication cycle. Within one communication cycle FlexRay offers the choice of two media access schemes. These are a static time division multiple access (TDMA) scheme, and a dynamic mini-slotting based scheme. Communication in the communication system 106 is done in a communication cycle consisting of a static segment and a dynamic segment, where each of the segments may be empty. The first frame ID in a system with a static segment is ID number 1 (see FIG. 105). In a pure dynamic system with a start of cycle (SOC) symbol (see FIG. 106). The sending slots are represented through the ID numbers that are the same on both channels.

The sending slots are used deterministically (in a predefined time divisional multiple access (TDMA) strategy) in the static segment. In the dynamic segment there can be differences in the phase on the two channels (see FIG. 106). Nodes 100 that are connected to both channels send their frames in the static segment simultaneously on both channels. Two nodes, that are connected to one channel only, but not the same channel, may share a slot in the static segment.

To guarantee the consistency of the clock synchronization only nodes 100 can participate that send frames, which are received by all other nodes (e.g., node A, C and E in FIG. 104). All nodes execute the clock synchronization algorithm, but only the frames of the static segment are considered. It is possible to send different data in the same sending slot on different channels.

The following constraints should be respected in the communication system 106 according to the present invention:

The communication controller 102 must allow to interface to an optical or an electrical physical layer.

The communication controller 102 must support a net data rate of at least 5 Mbit/s real application data transferred per seconds under the constraints of frame overhead (including CRC) and protocol timing overhead (inter frame gap, IFG) in static communication mode.

It must be possible to connect 2 up to a value CONTROLLER_MAX controllers 102 to one communication channel. CONTROLLER_MAX is the maximum number of controllers 102 connected to one communication channel and can have a value of 64, for example.

The maximum number of slots in the static segment is set to STATIC_SLOTS_MAX. STATIC_SLOTS_MAX is the maximum number of static slots in a static segment of a communication cycle and can have a value of 4095, for example.

The power supply 105 for the bus driver 104 (including the bus guardian 103) and the communication controller 102 must meet automotive requirements.

Comment

Considering the FlexRay protocol as described in the previous part of the description the communication scheme of networked FlexRay nodes can be briefly characterized as follows:

Each node 100 must be able to make use of the distributed clock.

Each node 100 must send frames inside a predefined static slot or/and inside the dynamic segment (collision free access)

The transmission of frames must be subdivided into 3 phases:

$1^{st}$ a bus guardian 103 must enable the access to the bus;
$2^{nd}$ it must be signalled that a frame should be transmitted;
$3^{rd}$ the transmission of the frame itself.

Protocol Description

Throughout the document the following notation is used:
Req: Requirements
Comment: contains additional descriptions and explanations General Requirements Req: The communication protocol shall be independent from the data rate.

Comment:
It shall be possible to implement low end controllers e.g., 500 Kbit/s and high end controllers beyond 100 Mbit/s.

Req: The first communication controller must support a net data rate of at least 5 Mbit/s.
Comment:
Net data rate: Real application data transferred per seconds under the constraints of frame overhead (including CRC) and protocol timing overhead (IFG) in static communication mode.
Req: A CRC code with a Hamming Distance of at least 6 must be used.
Req: The communication controller shall be able to operate in a current byteflight environment, i.e., the two protocol controllers have to support the same physical interface and the same representation at the logical line level. The byteflight compatibility is required for the optical physical layer only.
Comment:
Compatibility of the interfaces between host CPU and the protocol controller (CHI) is not required. The electrical physical layer does not need to support byteflight compatibility The byteflight specification can be downloaded from the following web address: www.byteflight.com.

Frame Transfer

Figure 105:
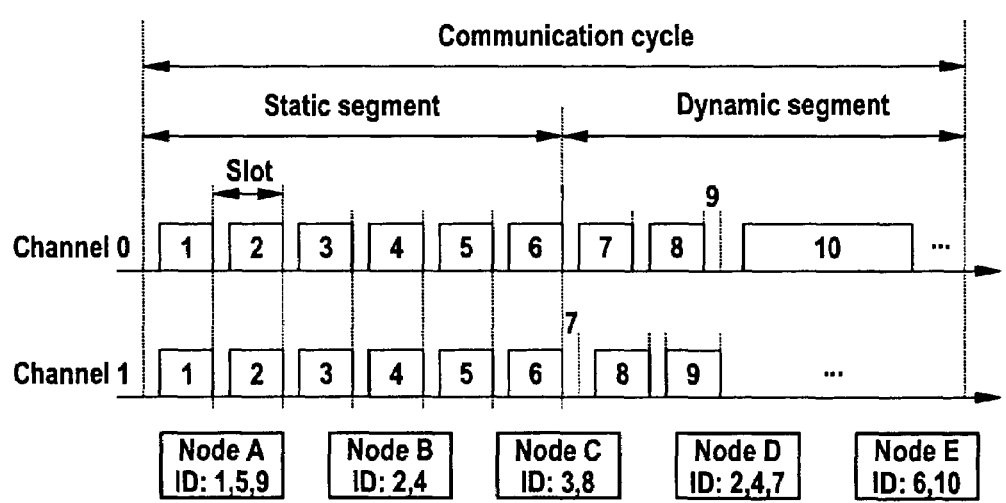
FIG. 105 illustrates a definition of a communication cycle with a static segment.
Figure 106:
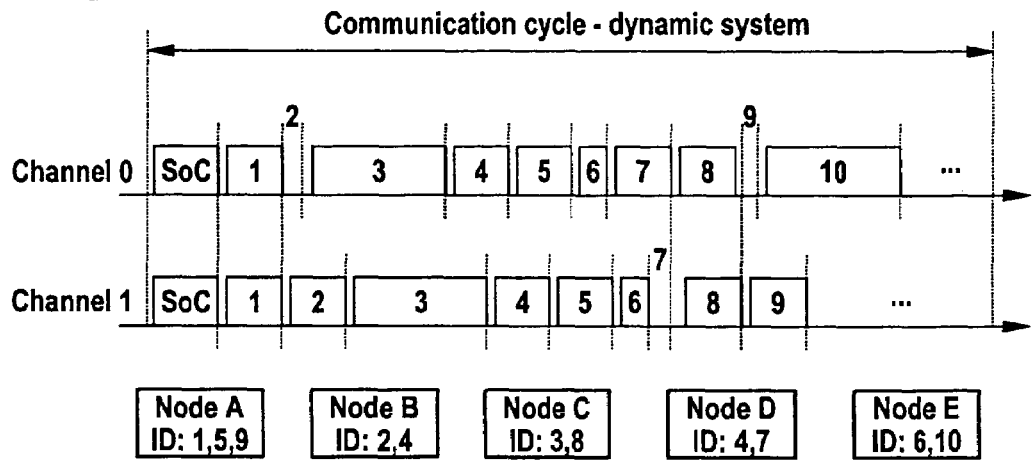
FIG. 106 illustrates a definition of a communication cycle in a pure dynamic communication system.
Figure 107:
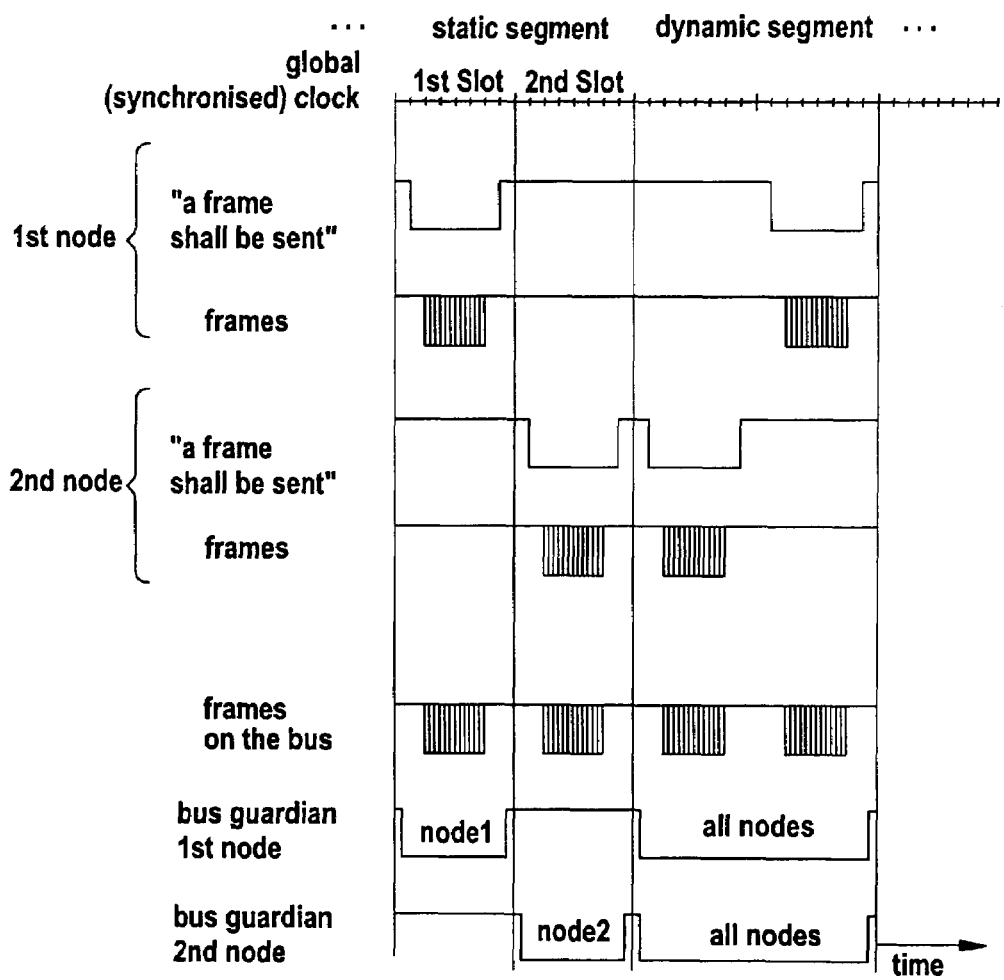
FIG. 107 illustrates an example for a communication scheme of two nodes of a FlexRay communication system.

Data transfer in FlexRay is done in cycles, called communication cycles.
Req: The communication cycle consists of a static and a dynamic segment as shown in FIG. 105. Each of the segments may be empty, that means there are three possible configurations of the communication cycle (pure static, mixed static and dynamic (a mixed system consists of at least two static slots) and pure dynamic).
In a pure dynamic system the communication cycle starts with a SOC symbol. There are two different SOC symbols (alarm condition, normal condition). The sending slots are represented through the identifiers that are the same on both channels (see FIG. 106).
The sending slots are used deterministically (in a predefined TDMA strategy) in the static segment. In the dynamic segment there can be differences in the phase on the two channels (see FIG. 105). Nodes that are connected to both channels send their frames in the static segment simultaneously on both channels. A node that is connected to only one channel may share an identifier with another node that is only connected to the other channel.
The current communication cycle is determined by a cycle counter that is consistently incremented in every cycle (see FIG. 108).
Req: The length of the communication cycle has to be stored in the configuration data.
Fit Criteria:
The maximum cycle length is defined by CYCLE_LENGTH_MAX and can have a value of 64 ms, for example.
Req: A check mechanism has to be designed that ensures that no frame transmission is started within a certain interval so called forbidden region before the end of the communication cycle, to ensure that the beginning of the static segment in the next communication cycle is not disturbed.
Req: Multiplexing of sending slots of one controller must be supported in such a way, that the contents of frames can be multiplexed for a certain sending slot in different communication cycles.
Comment:
So a communication matrix with nearly any possible communication patterns (periods of certain frames) based on the principle of communication cycles can be built up.

Static Segment
Req: If the static segment of the communication cycle is not empty it consists of $STATIC\_SLOTS\_MIN \leq NUMBER\_OF\_SLOTS \leq STATIC\_SLOTS\_MAX$.
Req: The static segment is subdivided into a sequence of time slots. In each of these static slots only one controller may send one frame on each channel.
Comment:
In the static segment of the communication cycle a TDMA media access strategy is used.
Req: There is one configuration parameter for the slot length (slot_length) in the static segment, that defines this value. The length of the slots is configurable off-line but fixed during runtime.

Dynamic Segment
Req: In a pure dynamic system the communication cycle starts with the start of cycle (SOC) symbol.
Req: The dynamic segment of the communication cycle consists of zero or more dynamic identifiers (slots) within the communication cycle.
Req: Bus access in the dynamic segment is done via static frame priorities according to the byteflight specification.
Req: In the dynamic segment the media access strategy is based on wait times (mini-slotting scheme) and the priority of identifiers. Controllers transmitting frames with higher priority identifiers send before controllers transmitting lower priority frames.
Req: The frame length in the dynamic segment is variable during runtime.
Req: In pure dynamic mode an external triggered SOC generation and with it the start of the communication cycle has to be supported. The timing behavior of the external trigger has to be monitored by the communication controller.

Frame Format FlexRay
Req: Two frame formats as specified below must be supported.
Comment:
The mixture of the two frame formats need not be supported, i.e., all nodes connected to a FlexRay communication system can be configured using only the FlexRay format (see FIG. 108) or the byteflight format (see FIG. 109).

Figure 108:
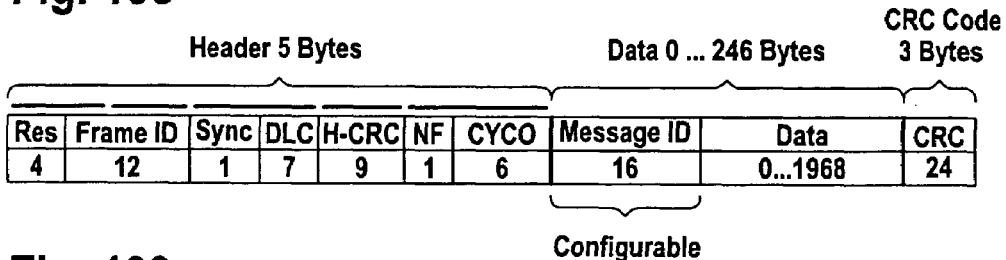
FIG. 108 illustrates a FlexRay frame format.

FlexRay Frame Format
The following refers to the FlexRay frame format.
Req: It must be possible to use the FlexRay format in a pure static, in a combined static and dynamic, and in a pure dynamic configuration.
Req: The first section of the data field in a frame according to the FlexRay format must be configurable as a message ID field. This data field must be filterable by the receiver.
In FIG. 108 the following abbreviations are used:
Res: Reserved bits, 4 bit, for future protocol extensions.
ID: Identifier, 12 bit, value domain: ($1_{10} \ldots 4095_{10}$), defines the slot position in the static segment and defines the priority in the dynamic segment. A lower identifier determines a higher priority. The identifier of a frame must be unique within a cluster. Each controller can have one or more identifiers (in the static and the dynamic segment).

SYNC: Synchronization field, 1 bit, indicates that the slot is used for clock synchronization.

DLC: Data length code field, 7 bit, DLC*2=number of data bytes ($0_{10}$, $2_{10}$, ..., $246_{10}$).

H-CRC: 9 Bit Cyclic Redundancy Check-Sequence. The H-CRC is calculated over the SYNC- and DLC-field.

NF: Null frame indication field, 1 bit, indicates that the corresponding data buffer is not updated by the host before sending.

CYCO: Cycle Counter, 6 bit, the cycle counter is increased simultaneously in all nodes by the controller at the start of each new communication cycle.

Message ID: The Message ID field is configurable to be used as the message identifier or as the first two data bytes.

D0 ... D246: Data bytes, 0-246 bytes.

CRC: 24 Bit Cyclic Redundancy Check-Sequence. The CRC is calculated over the complete frame.

Byteflight Frame Format

Figure 109:
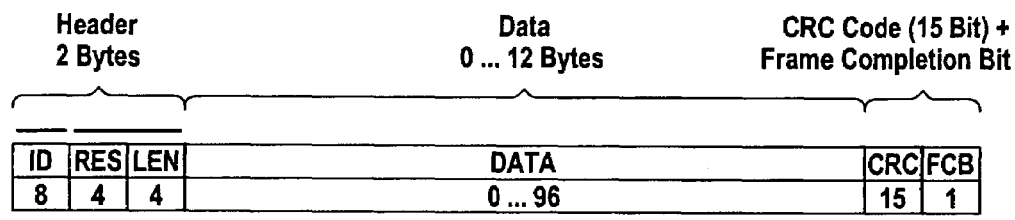
FIG. 109 illustrates a byteflight frame format.

The following refers to the byteflight frame format (see FIG. 109).

Req: The byteflight frame format must be supported for pure dynamic configurations.

In FIG. 109 the following abbreviations are used:

ID: Identifier, 8 bit, value domain: ($1_{10}$ ... $255_{10}$), defines the priority in the dynamic segment. A lower identifier determines a higher priority. The identifier of a frame must be unique within a cluster. Each controller can have one or more identifiers.

Res: Reserved bits, 4 bits, for future protocol extensions.

LEN: Length field, 4 bit, LEN=number of data bytes ($0_{10}$ ... $12_{10}$), a value higher than 12 is handled as LEN=12.

D0 ... D11: Data bytes, 0-12 Bytes

CRC: 15 Bit Cyclic Redundancy Check-Sequence ($x^{15}+x^{14}+x^{10}+x^8+x^7+x^4+x^3+1$).

FCB: Fill completion bit: an additional bit is added to the 15 bit CRC to fill the complete word. The bit is set to "0" as LSB.

Frame Scheduling—Multiplexing of Sending Slots

The following refers to frame scheduling and multiplexing of sending slots.

Req: The cycle counter can be used to distinguish between different frame contents.

Comment:

For a sending slot different send and receive buffers can be defined in different cycles (slot multiplexing).

Comment:

The cycle counter can be used as a logical extension to the identifier (in the case of multiplexing).

Frame and Bit Coding

The following refers to frame and bit coding.

Req: The coding algorithm in the communication controller has to be robust against:
glitches Optical Physical Layer The following refers to the optical physical layer.

Req: The controller must support at least the byteflight optical bit encoding.

Comment:

In byteflight, frames on the communication media are composed of individual bytes consisting of a start bit, eight data bits and a stop bit.

Figure 110:
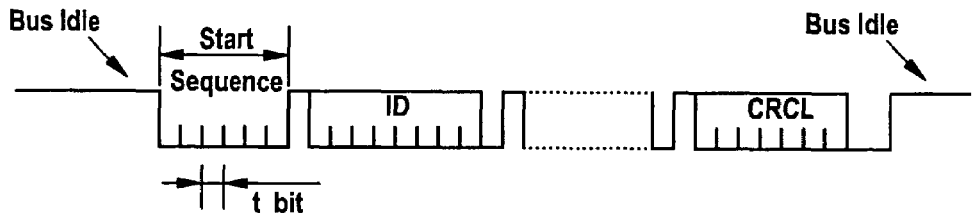
FIG. 110 illustrates a transmission of a start sequence.
Figure 111:
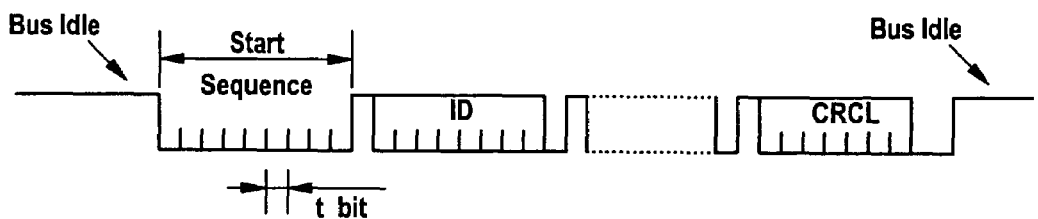
FIG. 111 illustrates a reception of a start sequence.

In addition, transmission of each frame begins with a start sequence consisting of 6 logical "0"-bits. This is illustrated by the diagram in FIG. 110. Due to certain effects in the optical transmission, it is possible for the start sequence to be become shorter or longer during optical transmission. This is why the receiver accepts start sequences in the region of 1 to 9 logical "0"-bits. This is illustrated by the diagram in FIG. 111.

Electrical Physical Layer

The following refers to the electrical physical layer.

Figure 112:
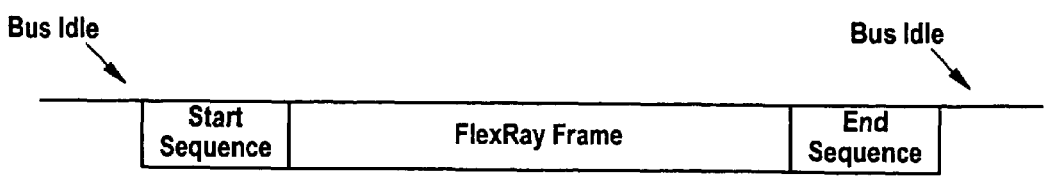
FIG. 112 illustrates a frame format for an electrical transmission on the physical layer.

Req: Frames on the communication media for the electrical physical layer are composed as shown in FIG. 112. The frame end sequence may be empty.

Req: A suitable bit coding scheme has to be selected, in accordance to bandwidth efficiency and electromagnetic compatibility (EMC) requirements.

Frame Timing

The following refers to frame timing.

Req: Frame timing of different communication controller implementations must be interoperable.

Frame Timing for the Static Segment

Req: Looking at the frame timing for the static segment, the reception start window shall be defined in relation to the precision. I.e., the start window must be greater than the precision.

Comment:

The actual value for the reception start window must be defined in the implementation specification.

Req: In the static segment accurate timing requirements have to be ensured for correct frame reception. Frames may only start within the reception start window.

Comment:

The length of the frame determines the frame duration. Correct reception is given if the respective frame does not violate the temporal borders given by the access scheme. The judgement of temporal correctness is based on a rigid timing scheme.

Req: The time difference between the predicted start Start-Nom and the observed start of the frame (SOF) is used by the clock synchronization algorithm.

Req: The length of the inter frame gap (IFG) has to be minimized, in order to optimize the net communication rate.

Frame Timing for the Dynamic Segment

Req: Looking at the frame timing for the dynamic segment, the frame timing in the dynamic segment must be defined due to the byteflight specification.

Start-Up

Requirements

The following refers to the start-up of the communication system.

Req: For each configuration (Pure Static, Pure Dynamic and Mixed Systems) the start-up of the communication network has to be possible as soon as two nodes are able to communicate.

Req: The integration of controllers that are powered on later must not disturb the start-up procedure of the other nodes.

Req: The start-up and re-integration of controllers shall not disturb the normal operation of the network.

Req: The worst-case start-up time under the fault conditions given above has to be provided and guaranteed by the supplier of the communication controller. The communication network must be operational after 100 ms.

Comment:

The application designer has to consider the start-up time during the determination of the configuration parameters. Typical automotive applications require a worst case startup time of 100 ms. For system configurations with extremely long communication cycles longer startup times are acceptable.

Req: During start-up a communication controller sets the cycle counter according to the value in the received frame. The cycle time is derived from the frame ID and set accordingly.

Req: The startup must work without reliance on collision detection.

Comment:

Collisions can occur on the bus during start-up and in the case of faults. In star topologies collision detection is not always feasible.

Principle of Operation—Protocol Modes

Pure Static System and Mixed System

Req: The start-up has to work as a distributed algorithm.

Req: Only controllers that participate in clock synchronization (sync bit set) are allowed to start up the system.

Comment:

In a dual channel system only controllers connected to both channels are allowed to execute the start-up in a heterogeneous topology (mixing controllers with single channel and controllers with dual channel).

Controllers connected to only one channel are not allowed to start-up the bus because they may corrupt the traffic of this channel in case of an incoming-link failure by sending frames after the listen-timeout (listen_timeout).

Req: The start-up of the communication network, the integration of nodes powered on later and the re-integration of failed nodes must be fault-tolerant against:

the temporary/permanent failure of one or more communication controllers (down to one controller sending in the static segment for mixed or pure static configurations), the temporary/permanent failure of one or more communication channel(s) in a redundant configuration, and the loss of one or more frames.

Pure Dynamic System

Req: A single master sends the SOC symbol. The master shall be defined at design time.

Shutdown

The following refers to shut-down of the communication system.

Req: The co-ordinated shutdown of the FlexRay cluster, including all nodes and all stars initiated by the application must be possible. The interference with the wake-up mechanism must be handled.

Req: The communication system has to support a synchronized system shutdown without error indications.

Clock Synchronization

The following refers to clock synchronization of the nodes in the communication system.

Comment:

The proper synchronization of the individual clocks of the communication controllers is a pre-requisite for the TDMA communication scheme.

The following description refers to the FlexRay clock synchronization mechanism (based on the Fault-Tolerant Midpoint algorithm).

Pure Dynamic System

Req: In a pure dynamic operation the clock synchronization is performed by a master (SOC).

Pure Static and Mixed System

Req: The global time is a vector of two values. Global time=<cycle_counter, cycle_time>.

Req: The cycle time is a counter incremented in units of macroticks. The cycle time is reset to 0 at the beginning of each communication cycle.

Req: The macrotick defines the resolution of the global time within one cluster. A resolution of 1 µs must be achievable in realistic configurations.

Req: The macrotick shall be independent of oscillator frequency.

Comment:

In the implementation each (local) macrotick is an integer multiple of the (local) clock tick, i.e. depends on the oscillator frequency, but the factors of two different macroticks can be different, so over a cycle, independence can be achieved.

Req: The microtick defines the accuracy of the clock difference measurement. A resolution of <=50 ns is required for the microtick.

Comment:

Typical automotive applications require a resolution of 50 nanosecond. For system configurations with low bandwidth, higher values are acceptable.

Req: The clock synchronization mechanism must be able to keep all fault-free controllers within the precision. A clock synchronization precision within the different controllers of better than 1 microsecond is required.

Comment:

Typical automotive applications require a precision of 1 microsecond. For system configurations with lower precision requirements, greater values are acceptable.

Req: The absolute value of the global time must be the same at every controller, within the limits defined by the precision. During start-up the first sending node determines the value of the global time.

Req: The fault tolerance of the clock synchronization mechanism must be scalable with the number of controllers. The level of fault tolerance depends on the number of actual nodes in the system (3k+1 to tolerate k asymmetric faults). In a reduced fault-tolerant configuration of less than four controllers (e.g., 2 or 3, in a degraded mode of operation) the synchronization must be possible. For 4 to 6 controllers the clock synchronization mechanism must be fault-tolerant against 1 (asymmetric) fault. For 7 or more controllers the clock synchronization mechanism must be fault-tolerant against 2 (asymmetric) faults.

Req: The clock synchronization mechanism must prevent the formation of cliques with different notions of time within the network.

Req: The clock synchronization mechanism must be able to operate with oscillators that have automotive quality. In particular the clock synchronization mechanism must be able to deal with the physical phenomena (drift, deterioration) that can occur during an automobile lifetime.

Req: A subset of controllers must be configured to send sync-frames (a frame with a set SYNC bit). In a dual channel system only controllers connected to both channels may belong to this subset.

Req: Only one static sending slot of each controller is allowed to contribute to the clock synchronization mechanism, i.e., a controller may send at most one sync-frame per communication cycle.

Req: Only correctly received sync-frames are used for clock synchronization.

Req: Every node has to use all available sync-frames for clock synchronization.

Req: The clock synchronization and the implementation of the clock synchronization shall be as resilient as possible against design violations resulting from environment or possible misuse.

Principle of Operation

The following refers to the principle of operation.

Obtaining the Time Values

Req: In the static segment every node measures the time difference between the actual receive time and the expected receive time for the sync-frames with a resolution of a microtick.

Req: This time difference measurement is done for all channels.

Req: A start of frame (SOF)-window is placed around the expected receive time of an SOF. The length of the receive-window is equal to the length of the SOF-window.

Req: Time values are obtained for correct frames only.

Comment:

Note that one of the reasons why a frame is considered incorrect is reception outside the receive window. The stringent application of the receive-window mechanism ensures that synchronization errors of nodes are detectable.

Measurement Method

Req: The measurement of the clock deviations is done through measuring the differences between the expected arrival time and the actual arrival time. The expected arrival time of a frame is defined by the internal view of the cycle time.

Synchronization Algorithm

The following refers to the synchronization algorithm.

Req: The synchronization algorithm uses a fault-tolerant midpoint algorithm (FTM) that operates with an arbitrary number of controllers.

Comment, Description of the FTM:

The measured values are sorted and the k largest and smallest values are discarded. k is adapted dynamically so that at least 2 measured values are remaining. The largest and the smallest of the remaining values are selected for the calculation of the midpoint value, i.e., average of those two values. The resulting value in a node describes the deviation of the own clock from the global time base and serves as a correction term.

Req: The resulting correction term(s) shall be used for error detection of the communication controller. If the correction term cannot be applied, an error has to be signaled to the host.

Req: The clock correction term(s) calculated in the previous step shall be applied to the local clock.

Req: If equal or more than half of the frames are received outside the reception start window a synchronization error is indicated to the host. The synchronization error is a fatal error the controller has to reintegrate.

Comment:

This mechanism prevents the formation of cliques.

External Synchronization

The following refers to the external synchronization

Req: External synchronization must be supported.

Comment:

External synchronization is necessary for the synchronization of a FlexRay network to an external time reference, e.g., a GPS receiver or a DCF77 receiver, or to synchronize several FlexRay networks.

Req: Each controller can add an additional external clock correction term(s) to the calculated clock correction term(s).

Req: The resulting clock correction term(s) shall not be greater than the maximum allowed correction term(s) or smaller than the minimum allowed term(s). The communication controller shall limit the applied correction term(s) to allowed values.

Req: The host shall be able to read the current (local) correction term(s) (current clock value) and set the external correction term(s).

Req: A hardware input signal at the communication controller for external synchronization is required.

Req: The hardware input signal shall be connected to the internal soft-reset of the controller. It shall be possible to release the controller from soft reset at a specific time by the host.

Support of Application Agreement Protocols

Req: The protocol has to support the realization of application agreement protocols. This requires multiple sending slots to achieve agreement within one communication cycle.

Support of Network Management

Req: Support of synchronous distributed application startup and shutdown with acceptable timing and fault tolerance characteristics.

Req: Support of node and network modes with high security against critical inadvertent mode changes.

Hardware Specification

The following part of the description explains the hardware-related requirements for a FlexRay system.

General Requirements

Regarding the communication hardware, a distributed system of FlexRay nodes must offer some properties when being designed by using active stars and passive busses:

Req: One and two channel solutions have to be supported.

Req: An electrical and optical physical layer must be supported.

Req: Communication via redundant physical links is optional. The communication system must support both communication via redundant and non-redundant physical links. A mix of redundant and non-redundant physical links must be supported.

Req: When using active stars several 1:1 links must be used.

Req: Wake-up of nodes and stars via the communication system must be supported. Signaling on one channel is sufficient for wake-up.

Req: A baud-rate from 500 kbit/s up to 10 Mbit/s must be supported.

Req: A power mode management must be supported.

Topology

Req: The protocol has to be independent from the topology as far as possible. Mixed and homogeneous system topologies must be supported.

Figure 114:
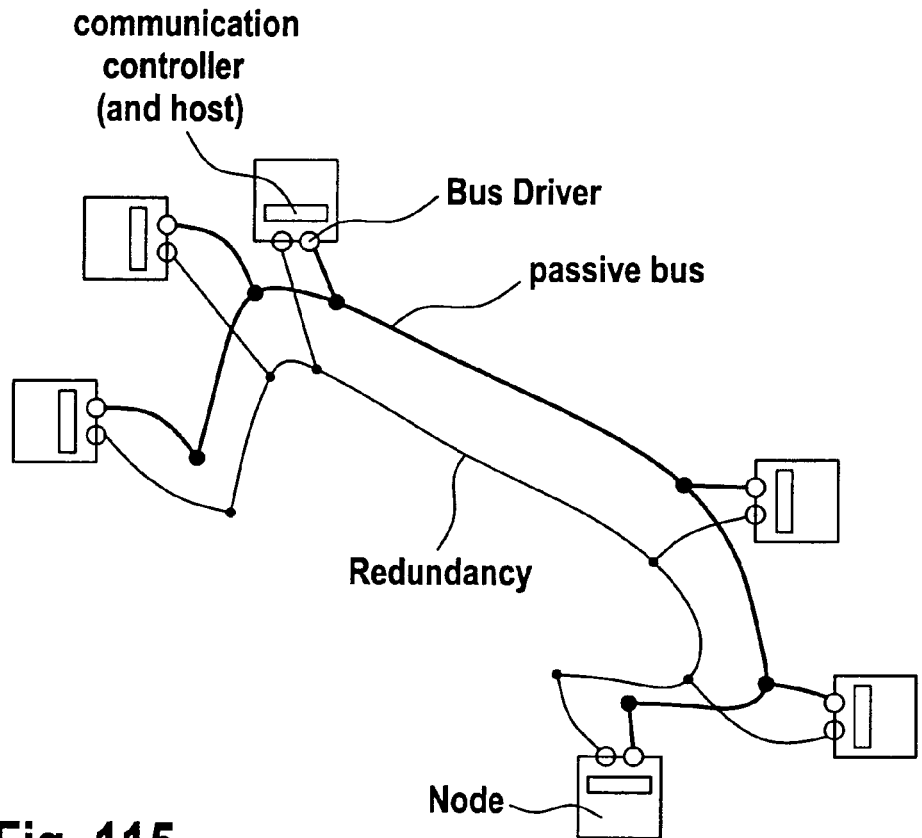
FIG. 114 illustrates a topology of a FlexRay communication system using a passive bus.

Req: A FlexRay network using a passive bus must be possible (see FIG. 114).

Req: A FlexRay network using a passive star must be possible.

Figure 113:
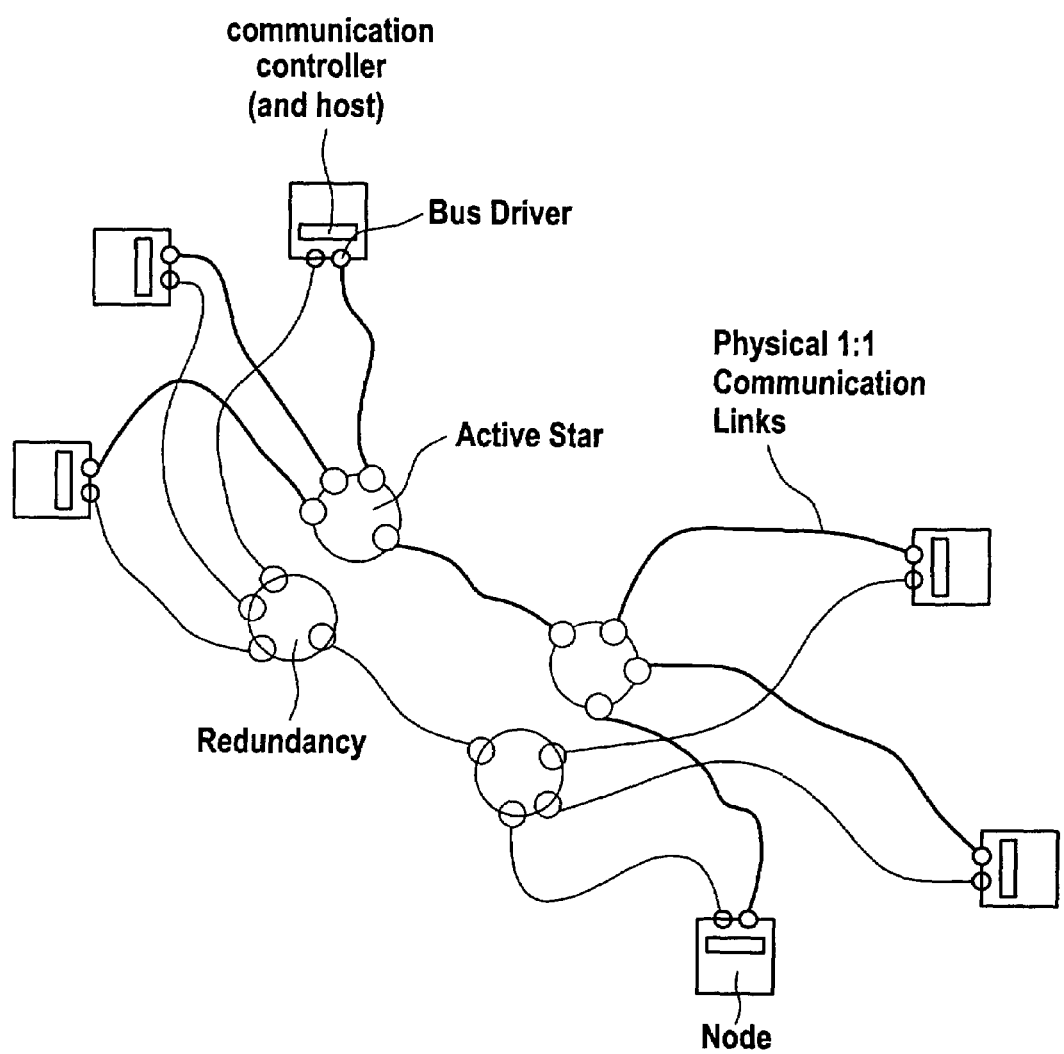
FIG. 113 illustrates a topology of a FlexRay communication system using active stars.

Req: A FlexRay network using a active star must be possible (see FIG. 113).

Req: Support for different topologies/physical layers on different channels is desirable.

Req: Support for different physical layers on one channel is desirable.

Figure 115:
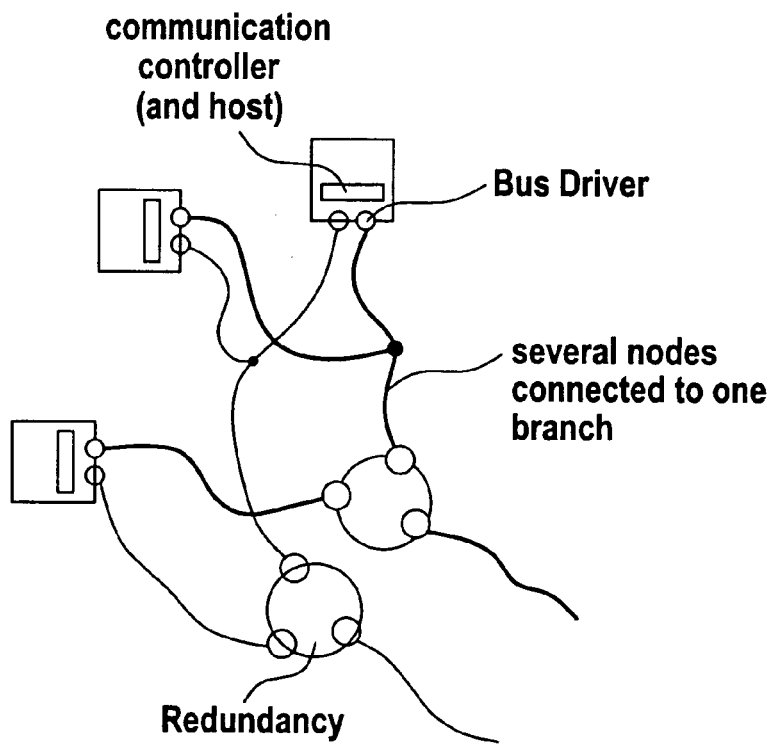
FIG. 115 illustrates a topology of a FlexRay communication system using an active star combined with a passive bus.

Req: A distributed system of FlexRay nodes can be designed by combining the active star and the passive bus approach (see FIG. 115). Several nodes may be connected to a branch.

Each node must adhere to the following requirements (see FIG. 103):

Req: Within a node 1 or 2 bus drivers must be connected to a single communication controller.

Figure 116:
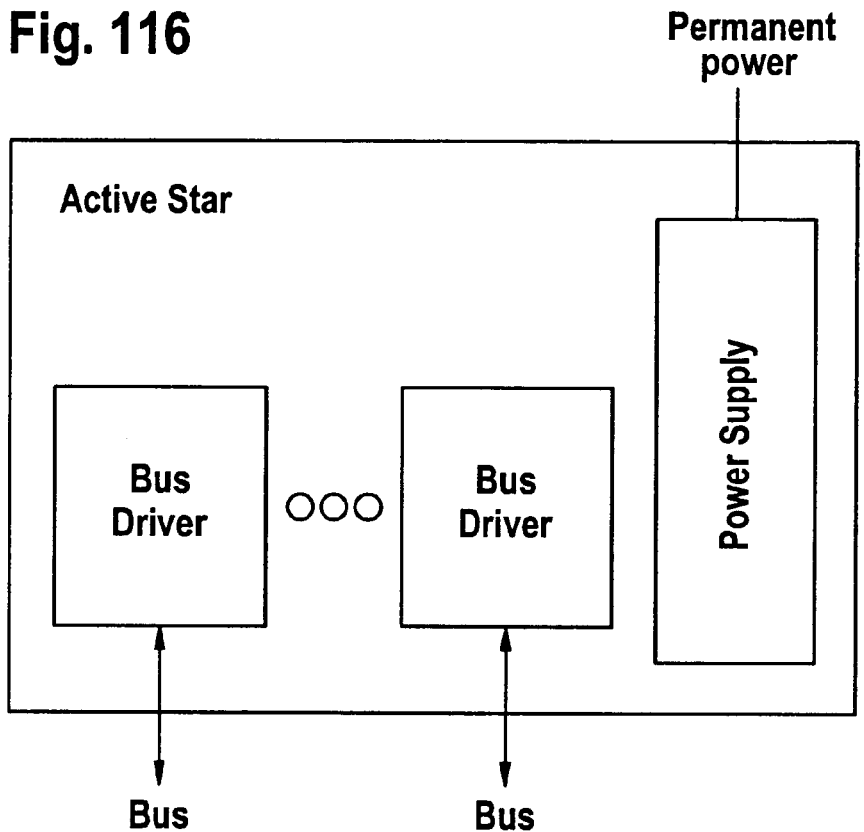
FIG. 116 illustrates a block chart of an electrical active star.

Each active star must adhere to the following requirements (see FIG. 116):

Req: No communication controller is required to perform the star functionality.

Req: No host is required to perform the star functionality.
Comment:
An implementation may integrate the star within an ECU.

Req: A branch of an active star has to be de-activated if a faulty communication signal is detected:
1) permanent "0" on the bus or
2) permanent "1" on the bus or
3) permanent noise on the bus.

Req: A de-activated branch may not influence the communication of the active modules (fail silent).

Req: A de-activated branch has to be re-activated if the failure condition which leads to a faulty communication signal is no longer available.

Automotive Constraints

The communication system according to the present invention can be used in almost any environment. However, preferably it is used in vehicles of any kind, in particular in safety critical applications in the automotive sector. In that case the communication system has to fulfill the following automotive constraints:

Req: FlexRay devices must meet automotive temperature requirements.
Comment:
General temperature requirements include a range of −40 to +125 degrees Celsius. Special applications may require higher temperatures, e.g., near braking actuators.

Req: Each product has to be optimized to meet the automotive and legal EMC requirements. External filters may not be required but may well be used.
Comment:
Listed severity levels as named won't be achievable when using a passive bus.

Req: The power consumption during the normal operating mode and the low power mode has to be minimized.
Comment:
Typical values are given in the following table 1:

TABLE 1

| Typical current consumption. | | | | | |
|---|---|---|---|---|---|
| Function | Min. | Typ. | Max. | Unit | Remarks |
| Quiescent current (from the permanent power) of the bus driver | | 10 | | µA | The bus driver monitors wake-up events, the voltage regulator is switched off |
| Current for the bus driver and the communication controller | | 10 | | mA | bus free - no actual communication |
| Current for the bus driver and the communication controller | | 50 | | mA | bus busy - communication active |

Req: The voltage supply for the communication controller should be the same as for commercially available ECUs.
Comment:
Today most ECUs support 5 V. For optimizations e.g., 3 V are allowed.

Req: All inputs and outputs of the bus driver and the communication controller which are directly coupled to the wire harness have to fit the known electric requirements. Support of future high supply voltages (36/42 V instead of 12 V) must be supported.

Architecture—Power Modes

This part of the description summarizes the requirements on the communication controller and the bus driver to run an ECU in several modes.

Req: The power modes of the ECU must be sensitive to control signals from the host and wake-up signals from the transmission media, from the ECU internally (e.g., from the host) and optionally from the ECU externally (e.g., by a switch).

Req: At least 3 power modes must be distinguished for communication controllers and bus drivers and stars (see Table 2):

Normal (voltage regulator(s) active, communication possible)

Standby (voltage regulator(s) active, communication not possible)

Sleep (voltage regulator(s) not active, communication not possible)

TABLE 2

| | Power modes | |
|---|---|---|
| Power Mode of the Node | Communication | Power Supply |
| Normal | available | available |
| Standby | not available | available |
| Sleep | not available | not available |

Req: The power modes of the active star must be controlled by the bus drivers automatically. It is not desireable that a dedicated 'wake-up' and 'shut-down' command is send to the star or additional wiring is required.

Communication Controller

The following refers to the Communication Controller:

Req: A communication controller must include an interface to connect a host.

Req: Parts of the behavior visible to the host, e.g., application control, configuration, message area, communication controller status, interrupts, etc. have to be confirmed among the suppliers and specified.

Req: The time base of the redundant channels must be the same within each node (e.g., by a single state machine).

Req: The functionality of the communication controller must be independent of the existence of a bus guardian.

Req: For a stand-alone controller the pin-out must be completely specified and documented.

States and Operating Modes

Req: Power-on and NOT (power-on) must be distinguished at least.

Req: The controller has to be passive outside the mode power-on.

Req: The controller has to be resetable externally.

Req: The controller has to support at least one low-power mode.

Req: The controller modes have to be defined in accordance with the bus driver modes.

Logical Line Operation on the Communication Media (e.g. Bus)

Req: At least the following information has to be distinguished:

bus busy: data or SOC symbol are transmitted.

bus idle.

Req: The encoding/decoding method has to allow both optical and electrical communication networks. At least one method has to be supported:

Non Return to Zero (NRZ) in the physical layer coding scheme (see byteflight specification).

Req: Bit sampling must be robust against disturbances typically inside vehicles e.g., signal delay, edge jitter, baud-rate jitter.

Req: Bit sampling must be able to deal with e.g., temperature variations or tolerances of electrical and physical parameters.

Optical Driver

Req: See the byteflight specification.

Electrical Bus Driver

Req: For a bus driver the pin-out must be completely specified and documented.

Req: For redundant configurations an implementation has to be chosen which minimizes the probability of common mode failures of both bus drivers (→each redundant communication is disturbed).

Comment:

Two bus drivers to support redundant communication by a single communication controller may possibly not be implemented on a single die.

Two bus drivers to support redundant communication by a single communication controller can be integrated in one package, if any common mode failure can be excluded.

Req: The bus driver must provide status information and diagnostics information which can be read by any u-controller optionally.

Req: The bus driver must be protected against electrical over-voltage and short-circuits.

Voltage Monitoring

Req: The bus driver must monitor the battery voltage and has to provide status information.

Req: The bus driver must detect an interrupted connection to the battery and has to provide status information.

States and Operating Modes

The bus driver has to support several states or operating modes:

Req: Power-on and NOT (power-on) must be distinguished

→permanent power

→regulator voltage

Req: The bus driver has to support at least two low-power modes.

Req: The bus driver has to be able to signal an internal power down mode to an external voltage regulator.

Req: the bus driver has to support a "shutdown mode"

→this mode has to be reached by secured mechanisms on demand of the host

→this mode must be left only by a power down

→the bus driver has to be passive and has to signal to the voltage regulator to switch off.

Req: The bus-levels have to be chosen by the bus driver automatically to support any net-wide power down modes.

Bus Guardian

Req: The failure of a communication controller in the time domain, e.g., a communication controller sends in a time slot when it is not allowed to send, must be prevented by a bus guardian. The probability for common mode failures in the time domain affecting both, the communication controller and the bus guardian must be sufficiently low.

Req: The bus guardian must protect the static slots (controller) from each other. In the dynamic segment the bus guardian grants all controllers access to the bus.

Comment:

One of the main reasons for an error in the time domain is an erroneous internal state that leads to an incorrect (timing) access to the communication media.

Req: The bus guardian must be able to detect errors in the physical clock source as well as errors in the internal representation of the time base of the communication controller.

Comment:

One of the main reasons for an error in the time domain is an error in the clock source of the communication controller. Hence, the clock source check mechanism of the bus guardian must concentrate on the main physically possible failure modes of the clock source of the communication controller.

The bus guardian may have a clock source of its own. Two bus guardians, which are connected to the same communication controller can use the same clock source.

Req: The bus guardian must not disable access to more than one channel, i.e., one bus guardian per channel is required.

Req: It must be possible to implement the bus guardian as a stand-alone circuit. This circuit has to be combinable with the known state of the art physical layers.

Comment:
  The bus guardian could be integrated in the bus driver. The interface(s) towards the communication controller (and the bus driver) must be defined.
Req: It must be possible to implement the bus guardian as a stand-alone circuit in the star coupler. This circuit has to interact with the known state of the art physical layer.
Req: The bus guardian has to check the correct enabling of the driver output stage.
Req: The mechanism of separating the communication controller from the communication media must be checked. At least once per driving cycle (power on/power off) is sufficient.
Req: The bus guardian is configured via a configuration data interface.
Req: The bus guardian has to enable and disable the bus driver output stage according to a predefined timing pattern. If the bus guardian detects an error in the timing pattern of the communication controller it permanently disables access to the communication media and signals this.
Req: If an error in the bus guardian occurs the communication channel must not be disturbed (monopolized).
Req: The configuration data interface must be specified and documented. This mainly includes the logical contents of the timing pattern.

Wake-Up
  Req: Several wake-up mechanisms have to be taken into consideration.

ECU→Bus Driver
  Req: The bus driver has to be woken up by any source inside or outside the ECU (local wake-up).
  Req: The wake has to be two edge sensitive.
    Example:
      e.g., edge at a Wakeup pin of the Bus Driver Bus→Bus Driver
  Req: From the host's point of view a general wake-up mechanism is required for both electrical and optical systems.
  Req: The bus driver should be woken up via standard communication (message-pattern).
  Req: The wake-up detector has to be robust against disturbances in vehicles like common mode signals by emission.
  Req: The bus driver may not be woken up by any noise.

Bus Driver→Controller
  Req: The bus driver has to wake up the controller by any signal on the interface. A dedicated wake-up line is not required.
    Example:
      e.g., edge at the receive (Rx) pin produced by the bus driver Bus Driver→Power Supply
  Req: The bus driver has to signal its sleep state, e.g., to control the voltage regulator.
    Example:
      inhibit signal Controller→Bus Driver
  Req: The controller must be able to wake-up the bus driver by any signal on the interface. A dedicated wake-up line is not required.
    Example:
      Edge at the Send (Tx) pin Selective Sleep
  Req: The realization of selective sleep has to be supported.

Figure 117:
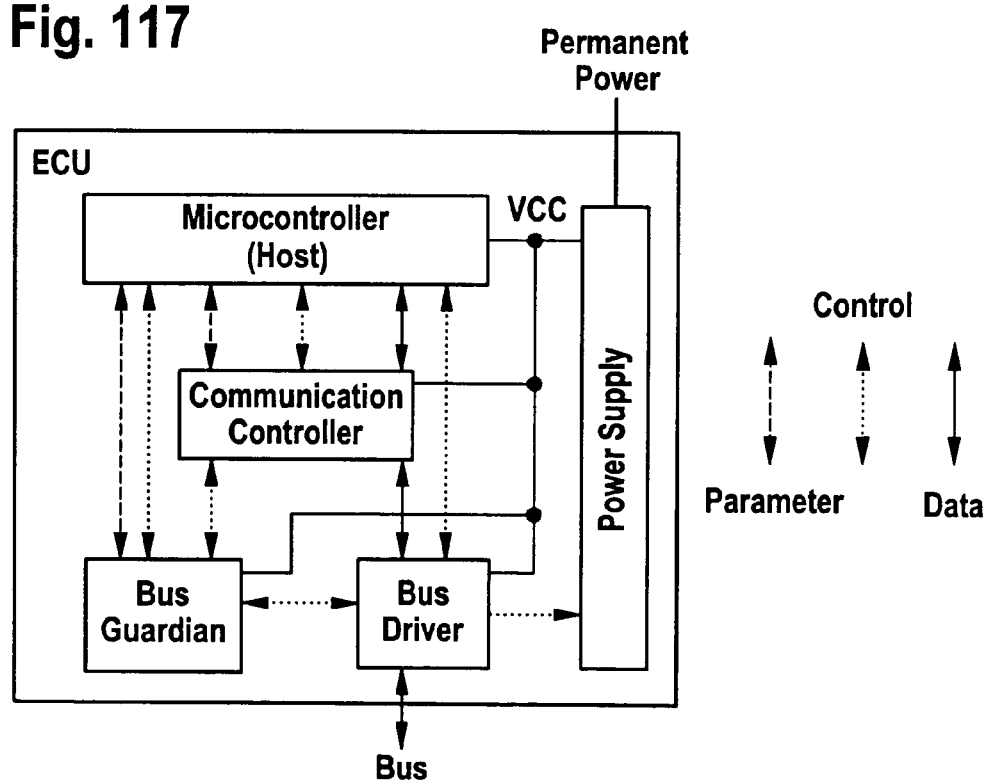
FIG. 117 illustrates an overview of interfaces between a host controller, a communication controller, a bus driver, a bus guardian, and a power supply of a node of the communication system.

Interfaces
The following refers to the interfaces provided within a node of the communication system:
The interfaces between the single modules (host, controller, bus driver, bus guardian, and power supply) have to be agreed upon among the suppliers according to the general requirements defined in this document. FIG. 117 shows an overview of all interfaces.

Communication Controller ⇔ Host Interface (CHI)

General Requirements
  Req: The configuration data of the communication controllers must be securable (e.g., by soft reset) against accidental access and modifications.
  Req: Protect against improper host modification of BG and CC configuration data.
  Req: The interface between the host and the communication controller should be implemented as a 16 bit interface (selectable multiplexed/non-multiplexed bus interface).
  Req: Functional compatibility between different suppliers has to be guaranteed at CHI level.
  Req: The CHI has to be configurable into transmit and dedicated receive buffers and receive buffers with first in first out (FIFO) behavior.
  Req: If the FIFO queue is full and new data arrives the oldest data is overwritten. The FIFO queue must set a diagnosis bit when data in the buffer is overwritten.
  Req: Most significant bit/byte (MSB) first is used for frame transmission.
    Comment:
      The status area of the CHI contains communication controller status fields, which are written by the controller and which are read-only for the host. The status fields will be defined in the protocol specification and interface specification.
      The control area in the CHI contains fields that allow the host to control the behavior of the communication controller. The control fields will be defined in the protocol specification and interface specification.
      The message area in the CHI contains a memory area where the frames to be sent/received are stored together with status information for each frame. The layout of this memory area is determined in the configuration data of each communication controller. The message buffer status fields will be defined in the protocol specification and interface specification.
  Req: Support of traceability of system- and component-level faults to identify root causes of failures.
  Req: The hardware implementation should verify that only one combination of frame ID and sync bit is considered valid for transmission.

Frame Filtering and Masking
  Req: Message Reception, every message buffer has to contain a channel, frame ID and cycle counter which are used for message filtering. Optionally the first two data bytes of each message buffer are used as message ID filter.

Options for filtering:
1) Frame ID+channel
2) Frame ID+cycle counter+channel
3) Message ID+cycle counter+channel
Comment:
Filtering: Filtering of messages means that for each message buffer the message's frame ID, cycle count and message ID are parameters that define in which message buffer the correctly (correct CRC, time, etc.) received message is stored or if the message is discarded.

Req: There must be at least one mask register per communication controller and channel that allows all combinations of masking.
Comment:
Masking: Masking of message filters means that some (parts) of the filtering parameters may be configured to be disregarded (set to "don't care").

Req: Message transmission, filtering parameters for transmission are frame ID and cycle counter; there is no masking possible for the frame ID. Each transmit buffer has its own mask for the cycle counter.

Interrupts

Req: The host computer has to be able to request different interrupts from the communication controller: at least read interrupt (buffer), write interrupt (buffer), 2 independent timer interrupts.

Req: Timer interrupt: the host can request a time interrupt at any absolute point in the global time (across communication cycle borders).

Req: One interrupt line is required for a standalone controller implementation.

Req: Interrupts can be mapped to one or more interrupt lines in an integrated controller.

Host ⇔ Bus Guardian Interface

Req: The bus guardian configuration data is written during download and then stored in a local memory of the bus guardian.

Req: During normal operation no configuration data transfer from the host to the bus guardian is allowed.

Req: The bus guardian periodically updates a status field which can be accessed by the host/bus guardian interface containing at least the following status information:
State of the bus
State of the controller Communication Controller ⇔ Bus Guardian Interface Req: At least the following control information is required:
ARM signal Communication Controller ⇔ Bus Driver Interface Req: This interface has to be confirmed among the suppliers.
Example:
Tx, TxEnable (TxEN)
Rx, RxEnable (RxEN)

Bus Guardian ⇔ Bus Driver Interface

Bus Driver ⇔ Power Supply Interface

Req: To perform the wake-up and sleep functionality an interface between bus driver and power supply is required.

Error Handling

The following refers to the error handling.

The communication system and its components shall offer adequate error management mechanisms to deal with faults arising from the following levels:
media
bit (coding)
frame
data
topology and
time.

The communication system furthermore shall offer diagnosis information to the host computer with respect to controller, bus (channel), and incoming/outgoing link failures.

Requirements

Req: The error management shall follow the "never-give-up" philosophy.
Comment:
This means that the communication protocol has to support proper operation until a certain critical error states is reached.

Req: The non-arrival of periodic messages shall not be unrecognized.
Comment:
It is okay, if, e.g. one, periodic message is missed, but this has to be detected. The fact, that a periodic message was missed should be signaled to the host.

Req: If a periodic message was missed, no random data shall be given to the host.

Req: Data content of messages, (periodic and spontaneous) must not be changed by the communication protocol.

Req: The change of data content shall be signaled to the host.

Req: After an error was detected at a communication partner in the network, the functionality of the other communication partners shall not be influenced.
Comment:
The correct function may not depend from the correct function of a certain host, of a certain communication controller or of a certain power supply.

The communication controller shall detect the following list of errors:

Req: Synchronization error. The communication controller is not any more synchronized to the global time on the bus.

Req: The communication network must offer diagnosis information to the host computer with respect to the bus (channel), incoming/outgoing link failures.

Req: The communication network must offer diagnosis information to the host computer within a defined maximum delay after the occurrence of the failure of the diagnosis element.

Req: The communication network is not required to provide consistent and agreed diagnosis information to the host computer.

Hardware Units

The following faults have at least to be detected by the communication controller:
Req: Defect time source (e.g., broken crystal).
Req: Low voltage.
The following faults has to be recognized by the bus driver as errors:
Req: Faulty communication signals caused by e.g. any faulty transmission media (e.g., a broken line, short circuit to ground, . . . ).

Req: Incorrect communication with the host e.g., communication via the data interface.

Req: Incorrect communication with the communication controller e.g., bus-blocking transmit signals.

Req: De-activated branch.

Interfaces

Req: Status information on detected errors must be provided. Additionally it is required that maskable interrupts for certain detected errors can be requested by the host.

Constant Definitions

In the following part of the description the constants for a number of design parameters defined throughout the document are set to actual values. The values mentioned are examples and can be replaced by almost any desired value.

Table 3 shows Communication Network Constants (Min/Max).

TABLE 3

Definition of the constants used throughout the specification.

| Name | Value | Description |
|---|---|---|
| CONTROLLER_MAX | 64 | Maximum number of controllers connected to one communication channel. |
| CYCLE_LENGTH_MIN | 250 µs | Minimum length of the configurable communication cycle. |
| CYCLE_LENGTH_MAX | 64 ms | Maximum length of the configurable communication cycle. |
| DATA_BYTES_MAX | 246 | Maximum number of data bytes. |
| DYNAMIC_IDS | 4095 | Maximum number of dynamic identifiers. |
| STATIC_SLOTS_MIN | 2 | Minimum number of static slots in a static segment of a communication cycle |
| STATIC_SLOTS_MAX | 4095 | Maximum number of static slots in a static segment of a communication cycle |

Glossary

In the following glossary some of the terms used for description of the present invention are defined.

| | |
|---|---|
| Bus | Consists of one or several channels. |
| Bus Driver | A bus driver connects a communication controller to one channel. |
| Bus Guardian | A bus guardian protects one channel from timing failures of the communication controller. It is therefore connected to one communication controller and one bus driver. The bus guardian must be independent from the protocol communication controller. |
| byteflight | Communication network developed by BMW AG, Motorola, ELMOS, Infineon, Siemens EC, Steinbeis Transferzentrum fur Prozessautomatisierung, IXXAT (see www.byteflight.com) |
| Channel | A channel is a physical connection between several communication controllers. A redundant channel consists of two channels connecting the same communication controllers. |
| CHI | Controller Host Interface. |
| Clique | Set of communication controllers having the same view of certain system properties, e.g., the global time value, or the activity state of communication controllers. |
| Cluster | Synonym for network within this specification. |
| Cluster time | Same as cycle time. |
| Communication Controller | A communication controller is connected to one or two channels where it can send and receive frames. |
| Communication Cycle | Periodic data transfer mechanism. Structure and timing are statically defined. However, a static and a dynamic segment allows for the transmission of both, state and event information. |
| Controller | see, Communication Controller. |
| CRC | Cyclic Redundancy Code attached to a frame. |
| CYCLE | The CYCLE field is used to transmit the cycle counter. The cycle counter is increased simultaneously in all nodes by the communication controller at the start of each new communication cycle. |
| Cycle Counter | Contains the number of the current communication cycle. |
| Cycle time | Contains the time within a communication cycle in units of macroticks. Same as cluster time. |
| DATA | Data field in a frame. |
| DLC: | Data length field |
| Dynamic Segment | Segment of the communication cycle where frames are transmitted according to a mini-slotting algorithm. The sending order is defined by a statically determined identifier. Identifiers with smaller numbers have priority over identifiers with higher numbers. A communication cycle may consist of the static segment only. |
| EOF | End Of Frame. An optical or electrical physical layer may require different end of frame sequences. |
| ECU | Electronic Control Unit. Same as node. |
| EMC | Electro Magnetic Compatibility. |
| FIFO | First In First Out. Buffers can be configured to work as a FIFO memory for frames. |
| Frame | A frame consists of all information transmitted in one slot (with one identifier) on one channel. |
| FTA | Fault Tolerant Average. The FTA is a fault tolerant clock synchronization algorithm that is able to tolerate up to a pre-defined number k of maliciously faulty clocks. This algorithm is based on a sorted array of clock deviations. The lower and upper k clock deviation values are discarded. From the remaining clock deviation values the average value is calculated and then used for the clock correction. |
| FTM | Fault Tolerant Midpoint. The FTM is a fault tolerant clock synchronization algorithm that is able to tolerate up to a pre-defined number k of maliciously faulty clocks. This algorithm is based on a sorted array of clock deviations. The lower and upper k clock deviation values are discarded. From the remaining clock deviation values the median value is chosen for the clock correction. |
| Gateway | A node may function as a gateway and connect two or more networks. |
| Global time | Contains the combination of cycle counter and cluster time. |
| Hamming Distance | Minimum distance of any two code words within a code. |
| Host | The host is the part of an ECU where the application software is executed, separated by the CHI from the communication network. |
| ID | The frame identifier defines the slot position in the static segment and defines the priority in the dynamic segment. A lower identifier determines a higher priority. Identifier 0 is reserved for the SOC symbol. The identifier of a frame must be unique within a cluster. Each controller can have one or more identifiers (in the static and the dynamic segment). |

-continued

| | |
|---|---|
| Identifier | see, ID. |
| IFG | Inter Frame Gap. |
| LEN | Length field of a frame. |
| LLI | Logical Line Interface. |
| LSB | Least Significant Bit/Byte. |
| MAC | Media Access Control. |
| Macrotick | Basic unit of time measurement within a network of communication controllers. The clock synchronization mechanism guarantees that the clock values at all non-faulty controllers are equal. The uncertainty in the clock values is bounded by the precision. |
| Message | Application data transported within a frame. Several messages may be packed together to constitute a frame. |
| Microtick | Basic unit of time measurement within a communication controller for measuring the time difference between the controllers clock and the clocks of the other communication controllers. Clock correction is done in units of Microtick. |
| MSB | Most Significant Bit/Byte. |
| Network | A network consists of a set of nodes (more than one node) connected by communication subsystem. Networks are connected by special nodes (gateways). Same as Cluster. |
| Node | A node may contain one or more communication controllers. Equivalent to ECU (Electronic Control Unit). |
| Nominal Precision | The nominal precision is the clock synchronization precision that can be reached by the local clock synchronization of a cluster. |
| NRZ | Non Return to Zero physical layer coding scheme. |
| Precision | The precision is a time interval bounding the deviations between the local clocks of all active communication controllers. If a communication controllers clock deviates more than the precision from the clocks of the other controllers it must not participate in the communication any longer. |
| Slot | Duration of time during which one communication controller may access the communication medium. |
| SOC | Start of Cycle. Defines the start of a communication cycle in the pure dynamic mode, and the start of communication for start-up. |
| SOF | Start of Frame. An optical or electrical physical layer may require different start of frame sequences. |
| Star Coupler | A star coupler is connected to one channel. |
| Static Segment | Segment of the communication cycle where frames are transmitted according to a statically defined TDMA scheme. A communication cycle may consist of the static segment only. |
| SYNC | Synchronization field. This field indicates that the slot is used for clock synchronization. |
| TDMA | Time Division Multiple Access. |

The following is a description of the notation used for variables, constants and parameters in this document.

TABLE 4

Naming Conventions

| Naming Convention | Information Type | Description |
|---|---|---|
| cName | Protocol Constant | Values used to define characteristics or limits of the protocol. These values are fixed for the protocol and can not be changed. |
| vName | Node Variable | Values which will be changed depending on time, events, etc. |
| gName | Cluster Constant | Parameter which must have the same value in all nodes in a cluster, is initialized during soft reset, and can only be changed during soft reset |
| pName | Node Constant | Parameter which may differ in nodes of a cluster, is initialized during soft reset, and can only be changed during soft reset |
| fName | Frame Variable | Parameters which are transmitted as part of a FlexRay or byteflight frame. These variables are set by the transmitting node and read by the receiving nodes. |
| xdName | Time Duration | Value (variable, parameter, etc.) describing a time duration, the time between two time points |
| xtName | Time | Value (variable, constant, etc.) describing an instant |
| xsName | Set | Set of values (variables, parameters, etc.) |
| xyName[ch] | Channel Specific Info | Set of variables/parameters that are channel specific. xyName[ch] represents the pair of variables, xyName[A] represents the variable associated with channel A, xyName[B] represents variable associated with channel B. |
| S_Name | Event | Internal event signal sent between various portions of the protocol description. These do not necessarily represent actual parameters, but rather represent an abstract method by which various protocol descriptions can interact. |
| x | | Stands for one of c, v, g, or p above |
| y | | Optionally stands for one of d, t, or s above. |

Pseudocode Conventions

To specify functions and algorithms short code pieces are used. The pseudocode is loosely based on the programming language used by MATLAB. The following table 5 outlines some of the pseudocode conventions (functions and elements).

TABLE 5

Pseudocode Conventions

| Function or Element | Description |
|---|---|
| x = LENGTH(list) | Returns the number of elements in the list "list" |
| list = [ ] | Sets the list "list" to an empty list (i.e., a list with no elements) |
| list = [list, x] | Appends element "x"" to the end of the list "list" |
| x = list(i) | "x" is the i-th element of the list "list". list(1) is the first element of the list "list" |
| x = SORT(list) | "x" is a sorted list containing the elements from the n-element list "list" placed in decreasing order such that $x(1) \geq x(2) \geq x(3) \geq \ldots \geq x(n-1) \geq x(n)$ |
| x = MIN(a, b) | Minimum function. If both a and b are valid it returns a if a < b, otherwise returns b; if a invalid returns b, if b invalid returns a, if a and b invalid returns an empty set |
| x = Midterm(list) | "x" is the result of the Fault Tolerant Midpoint Algorithm executed on the list "list". for the definition of the Fault-tolerant Midpoint Algorithm |
| x = Int[a] | Returns the integer part of the (real) number "a" |
| x = \|a\| | Returns the absolute value of "a" (a if $a \geq 0$, $-a$ if $a < 0$) |

TABLE 5-continued

Pseudocode Conventions

| Function or Element | Description |
|---|---|
| x = MODULO(a,b) | The modulo or remainder function. "x" is the remainder when integer "a" is divided by integer "b". For example, MODULO(6,2) = 0 and MODULO(7,2) = 1. |
| // | Pseudocode comment. Characters on the line after the "//" are considered comments (i.e., not part of the pseudocode). |

Bus Topology

FIG. 1 shows a possible topology configuration of a communication system 106 as a dual bus. A node 100 can either be connected to both channels A and B (nodes A, C, and E), only to channel A (node D) or only to channel B (node B).

A FlexRay communication system 106 can also be a single bus. In this case, all nodes 100 are connected to this bus.

Star Topology

Valid Star Network Configurations

A FlexRay communication system can be built as a multiple star topology. Similar to the bus topology, the multiple-star topology can support redundant communication channels. Each network channel must be free of closed rings, and the number of star couplers must be between 1 and cStarCouplersMax, inclusive, if there are sequentially connected (cascaded) star couplers. The total number of star couplers may be more than cStarCouplersMax if there are branches in the network. Each network line connecting a node to the star coupler or between two star couplers represents a properly terminated point-to-point connection. The incoming signal received by the star coupler is actively driven to all communication nodes.

Figure 2:
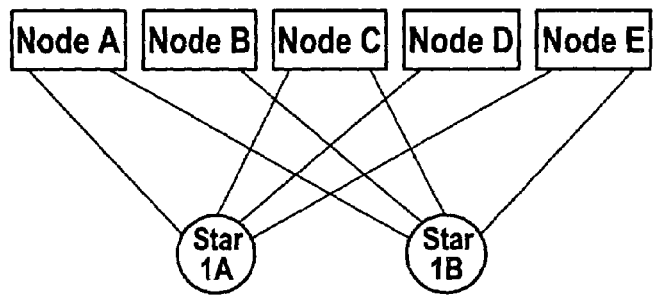
FIG. 2 illustrates a communication system according to the present invention with a dual channel single star configuration.

The configuration of a single redundant star network is shown in FIG. 2. The logical structure (i.e., the node connectivity) of this topology is identical with that shown in FIG. 1. It is also possible to create a single, non-redundant star topology which has the same logical structure as the single bus mentioned above.

Figure 3:
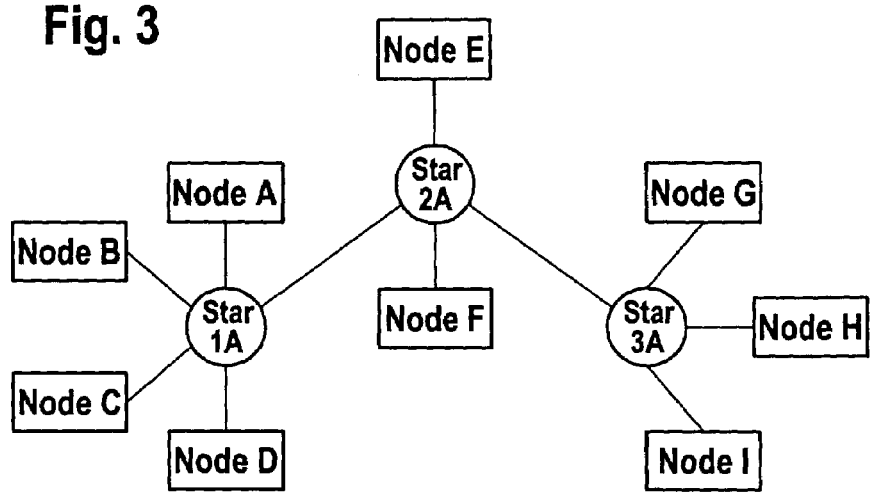
FIG. 3 illustrates a communication system according to the present invention with a single channel cascaded star configuration.

FIG. 3 shows a single channel network built with three star couplers. Each node has a point-to-point-connection to one of the three star couplers. Two of the star couplers (No. 1 and 3) are directly connected to the third star coupler (No. 2).

Figure 4:
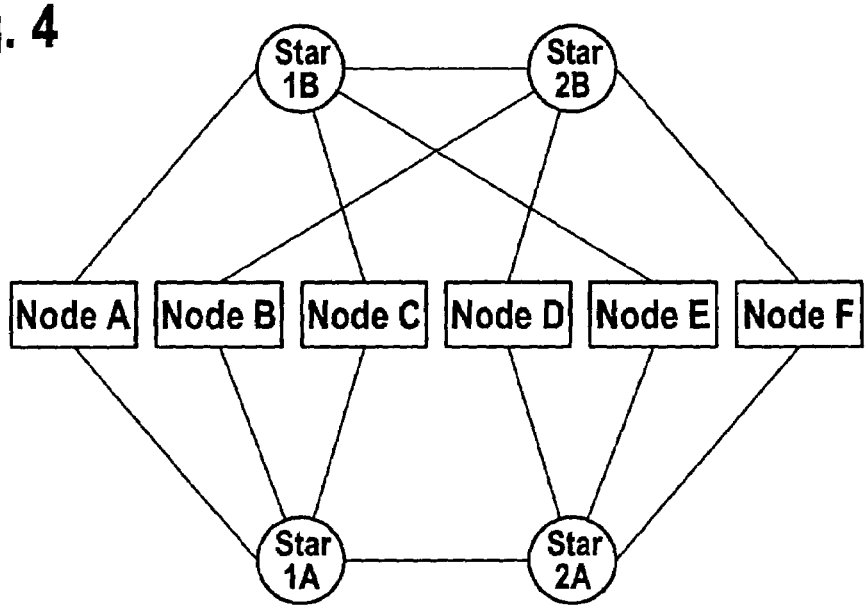
FIG. 4 illustrates a communication system according to the present invention with a dual channel cascaded stars configuration.

Note that it is also possible to have a redundant channel configuration with cascaded stars. An example of such a configuration is FIG. 4. Note that this example does not simply replicate the set of stars for the second channel—Star 1A connects nodes A, B, and C, while Star 2A connects nodes A, C, and E.

Star Coupler Behavior and Protocol Impact

For each node connected to a star coupler, the star coupler contains a bi-directional connection operating in half-duplex mode.

Before transmitting a frame, all connections in each star coupler must be dynamically set up to either receive or transmit The FlexRay coding mechanism defines a Transmission Start Sequence (TSS), which is used to initiate a proper connection setup throughout the network before the actual FlexRay frame or symbol is transmitted. The transmission of the TSS is detected by the star coupler and is treated as a connection setup request. The star coupler returns to its idle state after the bus has been released to the idle state by the transmitting node.

At the end of each frame transmission, all star couplers must return to the initial state before the next connection setup request is initiated. This is necessary in order for the star coupler to be able to process the next configuration request correctly.

The minimum idle time between two consecutively transmitted frames must accommodate the times for connection setup and return to the initial state for the star couplers that are used in the system.

Hybrid Topologies

In addition to topologies that are composed either entirely of a bus topology or entirely of a star topology, it is possible to have hybrid topologies that are a mixture of bus and star configurations. The FlexRay system supports such hybrid topologies as long as the limits applicable to each individual topology are not exceeded. For example, the limit of cStarCouplersMax cascaded star couplers also limits the number of cascaded star couplers in a hybrid topology.

Figure 5:
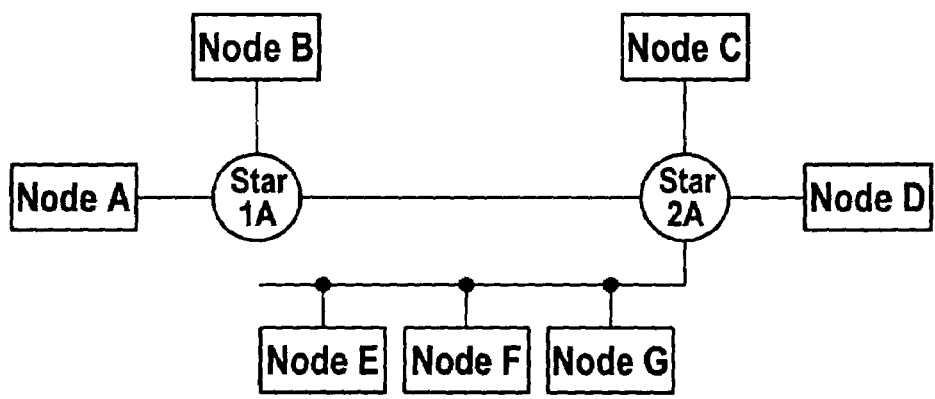
FIG. 5 illustrates a communication system according to the present invention with a single channel hybrid configuration.

There are a large number of possible hybrid topologies, but only two representative topologies are shown here. FIG. 5 shows an example of one type of hybrid topology. In this example, some nodes (nodes A, B, C, and D) are connected using point-to-point connections to a star coupler. Other nodes (nodes E, F, and G) are connected to each other using a bus topology. This bus is also connected to a star coupler, allowing nodes E, F, and G to communicate with the other nodes.

Figure 6:
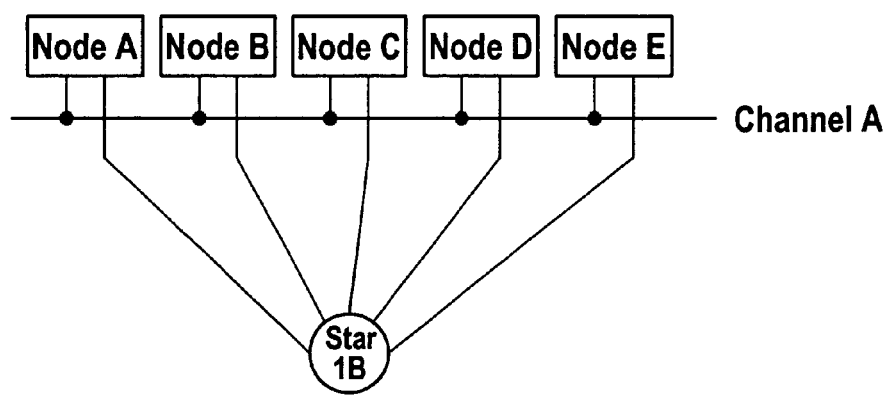
FIG. 6 illustrates a communication system according to the present invention with a dual channel hybrid configuration.

A fundamentally different type of hybrid topology is shown in FIG. 6. In this case, different topologies are used on different channels. Here, channel A is implemented as a bus topology connection, while channel B is implemented as a star topology connection.

Communication Cycle

The communication cycle is the fundamental element of the media access scheme within FlexRay. It is defined by means of a timing hierarchy.

Timing Hierarchy

Figure 7:
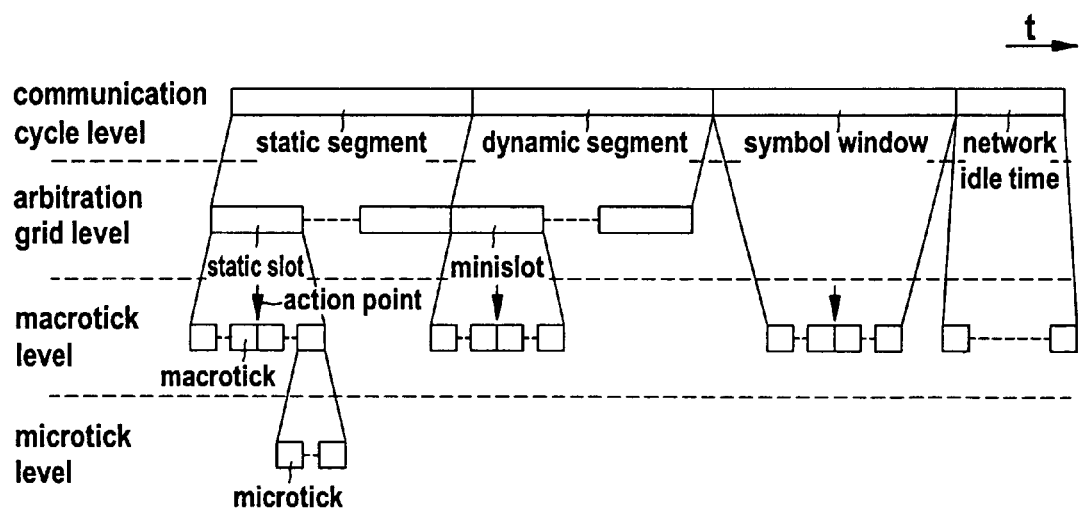
FIG. 7 illustrates timing hierarchy levels within a communication cycle for data transmission within the communication system.

The timing hierarchy consists of four timing hierarchy levels as shown in FIG. 7.

The highest level, the communication cycle level, defines the communication cycle. It contains the static segment, the dynamic segment, the symbol window and the network idle time (NIT). Within the static segment a static time division multiple access scheme is used to arbitrate transmissions. Within the dynamic segment a dynamic mini-slotting based scheme is used to arbitrate transmissions. The symbol window is a communication period in which one symbol out of a defined set of symbols can be transmitted on the network. The static segment, the dynamic segment and the symbol window form the network communication time (NCT), a period during which network wide communication takes place. The network idle time defines a communication-free period that concludes each communication cycle.

The next lower level, the arbitration grid level, contains the arbitration grid that forms the backbone of FlexRay media arbitration. In the static segment the arbitration grid consists of consecutive time intervals, called static slots, in the dynamic segment the arbitration grid consists of consecutive time intervals, called minislots.

The arbitration grid level builds on the macrotick level that is defined by the macrotick. The macrotick is specified further on. Specific macrotick boundaries are called action points.

These are dedicated instants at which transmissions shall start (in the static segment, dynamic segment and symbol window) and shall end (only in the dynamic segment).

The lowest level in the hierarchy is defined by the microtick that is covered further on.

Communication Cycle Execution

The following specifies the communication cycle for the time-triggered distributed (TT-D) mode and for the time-triggered master-controlled (TT-M) mode. The communication cycle for the event-triggered (ET) mode is specified futher on. The communication cycle for the byteflight mode is covered in the byteflight specification.

In both the TT-D mode and the TT-M mode the synchronized time triggers the execution of the communication cycle based on a periodically recurring principle with a period that consists of a constant number of macroticks.

The communication cycles are numbered from 1 to cCycleMax. Each node shall maintain a cycle counter vCycle that shall hold the number of the current communication cycle. Initialization of the cycle counter is specified further on.

Figure 8:
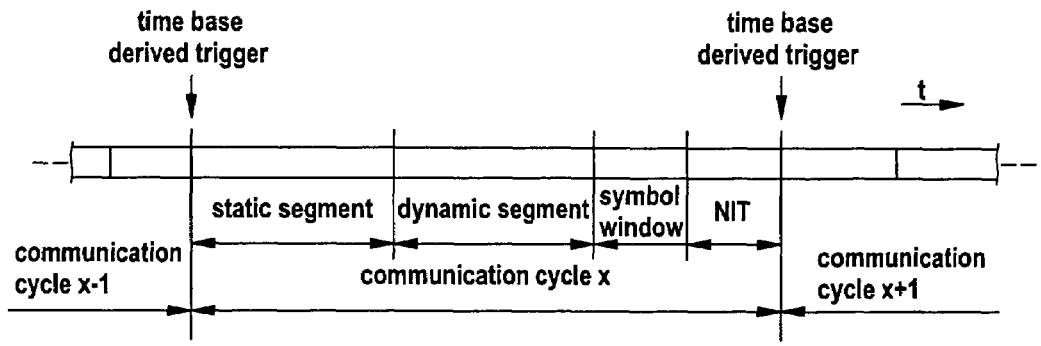
FIG. 8 illustrates a time base triggered communication cycle for data transmission within the communication system.

FIG. 8 illustrates the execution of the communication cycle.

In the TT-D mode the static segment must contain at least two static slots (at least two frames must be sent with the sync bit set). The dynamic segment may exist optionally as well as the symbol window. Media access test, however, can only be performed if the symbol window exists.

In the TT-M mode the static segment must contain exactly one static slot (In this slot a frame must be sent with the sync bit set). In this mode the dynamic segment must exist, while existence of the symbol window remains optional.

Table 6 summarizes the protocol modes and the possible configurations of the communication cycle.

TABLE 6

Network Communication Time Constituents vs. Protocol Modes

| protocol mode | network communication time | | | |
|---|---|---|---|---|
| | static segment | dynamic segment | symbol window | media access test usable |
| TT-D mode | at least 2 static slots configured | — | — | no |
| | at least 2 static slots configured | minislots configured | configured | yes |
| TT-M mode | 1 static slot configured | minislots configured | — | no |
| | | | configured | yes |
| ET mode | see Chapter "Event Triggered Mode" | | | no |
| BF mode | see byteflight specification | | | |
| WU mode | no communication cycle established | | | |

As described above, the FlexRay protocol supports clusters with a single communication channel (channel A only) or with dual communication channels (channel A and channel B). In the case of a dual channel cluster the channels are synchronized to one another. In the dual channel case nodes may be connected to either one or both of the communication channels. These topology options may be combined freely with the communication cycle.

Network Communication Time

Arbitration within the network communication time is performed by means of unique frame priorities and a slot counting scheme.

Arbitration assumes that unique frame priorities, referred to as frame identifiers, have been assigned to the frames among the nodes for each channel (The frame identifiers may either be assigned by an off-line configuration tool or during run-time using an application based assignment strategy. Note that in all cases the uniqueness of the frame identifiers per channel must be maintained to ensure collision-free arbitration). The frame identifiers shall range from 1 to cSlotID-Max. The frame identifier determines in which segment and when within the respective segment a frame shall be sent.

Each node shall maintain a slot counter vSlotCounter[ch] for each of the two respective channels. In the operation phase the slot counters shall be initialized with 1 at the start of each communication cycle. Initialization in the startup phase is specified further on.

Static Segment

Within the static segment a static time division multiple access scheme shall be applied to arbitrate transmissions. In this segment all communication slots are of equal, statically configured duration and all frames are of equal, statically configured length.

Structure

The static segment shall consist of gNumberOfStaticSlots static slots of equal duration. The number of static slots gNumberOfStaticSlots is a global constant for a given cluster and may range between 1 and cSlotIDMax.

Figure 9:
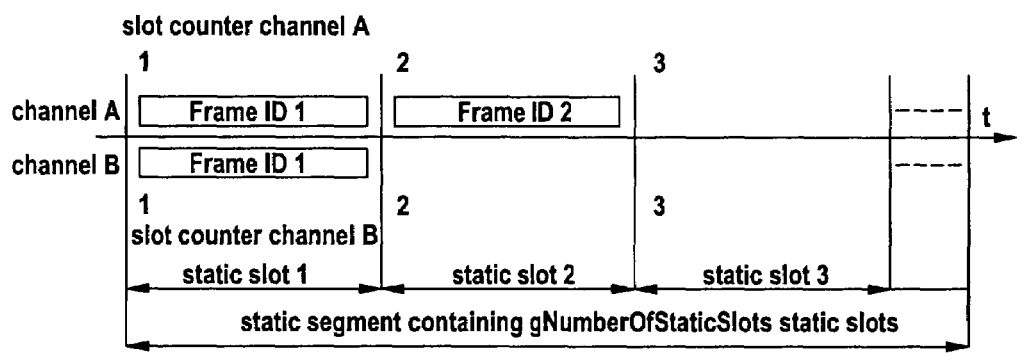
FIG. 9 illustrates possible transmission patterns for a single node within a static segment of the communication cycle.

In any given node one static slot pSyncSlot may be configured to contain a synchronization frame, a special type of frame required for synchronization within the cluster. psyncSlot is a node specific value that equals the number of the static slot in which the sync frame shall be transmitted FIG. 9 illustrates all transmission patterns that are possible for a single node within the static segment.

In slot 1 the node transmits a frame on channel A and a frame on channel B. In slot 2 the node transmits a frame only on channel A (An equivalent pattern is also possible in which a node transmits a frame on channel B and no frame on channel A. Different nodes can share a static slot across both channels as described above). In slot 3 no frame is transmitted on either channel.

Transmission Condition

In the static segment the condition whether a frame shall be transmitted or not differs depending on the current protocol phase.

In the startup phase a frame shall be transmitted on a channel
1. if the slot is assigned to the node via the frame ID and channel specific assignment, and
2. if startup has enabled frame transmission, and
3. if the slot is configured to contain a sync frame, i.e. the respective slot counter matches pSyncSlot.

In the operation phase a frame shall be transmitted on a channel
1. if the slot is assigned to the node via the frame ID and channel specific assignment, and
2. if the control state machine is in the operation state.

The frame shall be assembled as follows:
1. The reserved bit shall be set to zero.
2. The sync bit shall be set to one if the respective slot counter vSlotCounter[ch] matches pSyncSlot, otherwise set to zero.
3. The network management bit shall be set to the value held in the CHI.
4. The frame ID field shall be set to the value of the respective slot counter vSlotCounter[ch].
5. The length field shall be set to gPayloadLengthStatic.
6. The header CRC shall be set to the value held in the CHI.

7. The cycle count field shall be set to the value of the current cycle counter vCycle.
8. If payload data is available from the CHI for the respective slot then
   a. the null frame indication bit shall be set to zero, and
   b. the payload data shall be set to the values received from the CHI, and
   c. any remaining payload data bytes shall be set to the padding pattern 0x00.
9. If no payload data is available from the CHI for the respective slot then
   a. the null frame indication bit shall be set to one, and
   b. all payload data shall be set to the padding pattern 0x00.
10. The frame CRC shall be calculated using the procedure specified further on.

Timing and Slot Counter Housekeeping

All static slots shall consist of an equal number of gdStaticSlot macroticks. The number of macroticks per static slot gdStaticSlot is a global constant for a given cluster and may range between 2 and TBD.

Each static slot contains an action point that shall be offset from the start of the slot by gdActionPointOffset macroticks. Frame transmission shall start at the action point of the respective static slot. The number of macroticks within the action point offset gdActionPointOffset is a global constant for a given cluster and may range between 1 and TBD.

Appropriate configuration of the static slot length must assure that the frame and the communication separator fit within the static slot.

Figure 10:
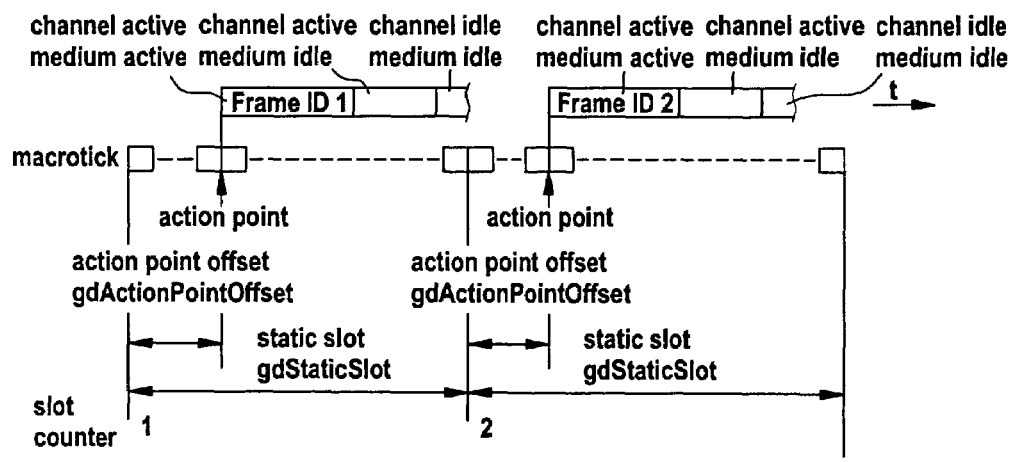
FIG. 10 illustrates detailed timing of a static slot within the static segment of a communication cycle.

FIG. 10 depicts the detailed timing of the static slot.

At the end of every static slot the slot counter for channel A vSlotCounter[A] and the slot counter for channel B vSlotCounter[A] shall be incremented by one (Note that this also holds for the last static slot within the static segment).

Configuration

The static slot length gdStaticSlot shall be chosen such that the static slot accommodates not only the transmission of the frame but also the channel idle detection latency under worst-case assumptions (The parameter gdStaticSlot shall be determined by an off-line configuration tool). The formula for determining this parameter and respective constraints are specified further on. The formula for determining the parameter gdActionPointOffset and respective constraints are specified further on, too.

Dynamic Segment

Within the dynamic segment a dynamic mini-slotting based scheme shall be used to arbitrate transmissions. In this segment the duration of communication slots may vary in duration in order to accommodate frames of different length.

Structure

The dynamic segment shall consist of gNumberOfMiniSlots minislots of equal duration. The number of minislots gNumberOfMiniSlots is a global constant for a given cluster and may range between 0 and tbd.

The dynamic segment also consists of a set of consecutive dynamic slots that contain one or multiple minislots. The duration of a dynamic slot depends on whether or not communication, i.e. frame transmission or reception, takes place. The duration of a dynamic slot shall be established on a per channel basis.

The condition of whether or not communication takes place shall be evaluated at the end of every minislot:

The dynamic slot shall consist of one minislot if no communication takes place, i.e. the respective communication channel is in the channel idle state throughout the respective minislot.

The dynamic slot shall consist of multiple minislots if communication takes place.

Details of how the duration of a dynamic slot is determined for frame transmissions are specified in the subsequent subsection. Details of how this is determined in the case of frame reception are specified further on.

Figure 11:
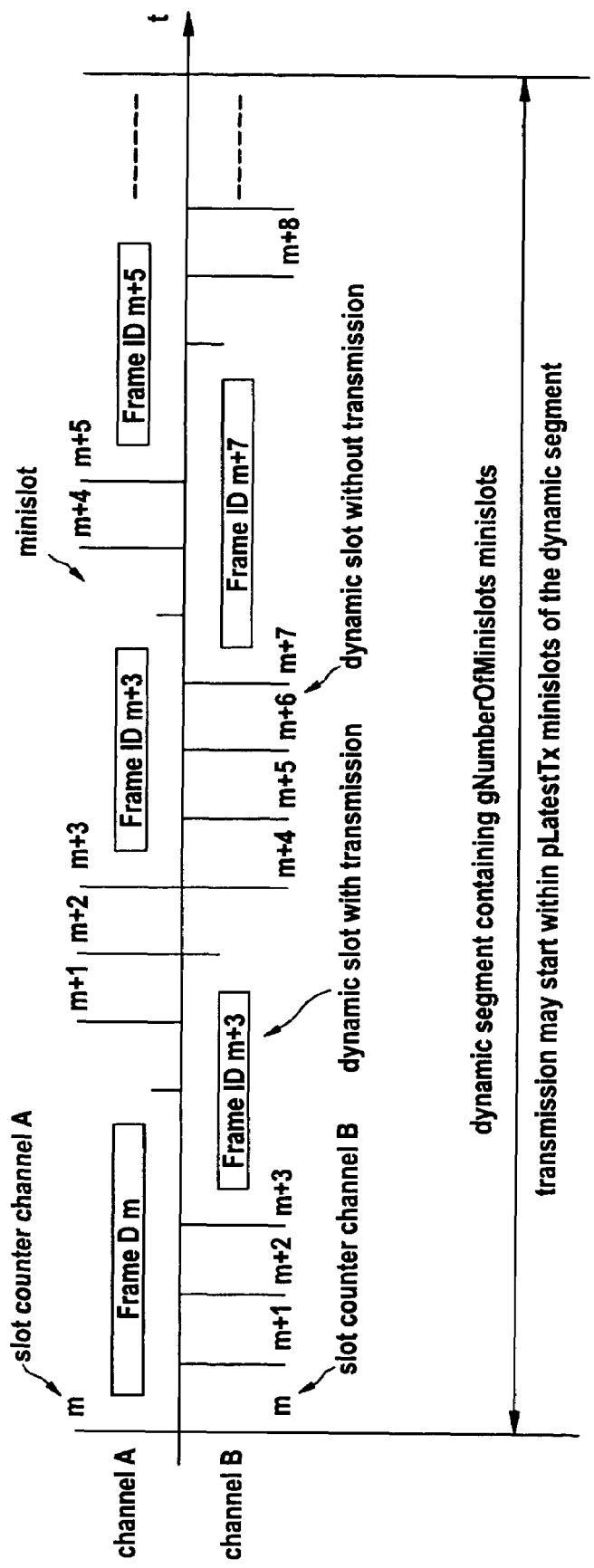
FIG. 11 illustrates an overview of a dynamic segment of a communication cycle.

FIG. 11 outlines the media access scheme within the dynamic segment.

As shown in the figure the media access on the two communication channels does not occur in lock step. Both communication channels do share, however, the same arbitration grid. FIG. 11 also shows how the duration of a dynamic slot adapts depending on whether or not communication takes place.

Transmission Condition

In the dynamic segment the condition that determine whether a frame shall be transmitted or not depend on the current protocol phase.

In the startup phase no frames shall be transmitted on either channel.

In the operation phase a frame shall be transmitted on a channel
1. if the slot is assigned to the node via the frame ID and channel specific assignment, and
2. if the dynamic segment has not exceeded the pLatestTx minislot, which is a node specific upper bound, and
3. if the control state machine is in the operation state.

The frame shall be assembled as follows:
1. The reserved bit shall be set to zero.
2. The sync bit shall be set to zero.
3. The network management bit shall be set to the value held in the CHI.
4. The frame ID field shall be set to the value of the respective slot counter vSlotCounter[ch].
5. The length field shall be set to the number of payload data bytes divided by two.
6. The header CRC shall be set to the value held in the CHI.
7. The cycle count field shall be set to the value of the current cycle counter vCycle.
8. If payload data is available from the CHI for the respective slot then
   a. the null frame indication bit shall be set to zero, and
   b. the payload data shall be set to the values received from the CHI, and
   c. any remaining payload data bytes shall be set to the padding pattern 0x00.
9. If no payload data is available from the CHI for the respective slot then
   a. the null frame indication bit shall be set to one, and
   b. all payload data shall be set to the padding pattern 0x00.
10. The frame CRC shall be calculated using the procedure specified further on.

Timing and Slot Counter Housekeeping

Timing within the dynamic segment is based on minislots. Each minislot shall contain an equal number of gdMinislot macroticks. The number of macroticks per minislot gdMinislot is a global constant for a given cluster and may range between 2 and tbd.

Each minislot contains an action point that shall be offset from the start of the minislot by gdMsActionPointOffset macroticks. The number of macroticks within the minislot action point offset gdMsActionPointOffset is a global constant for a given cluster and may range between 1 and tbd.

Figure 12:
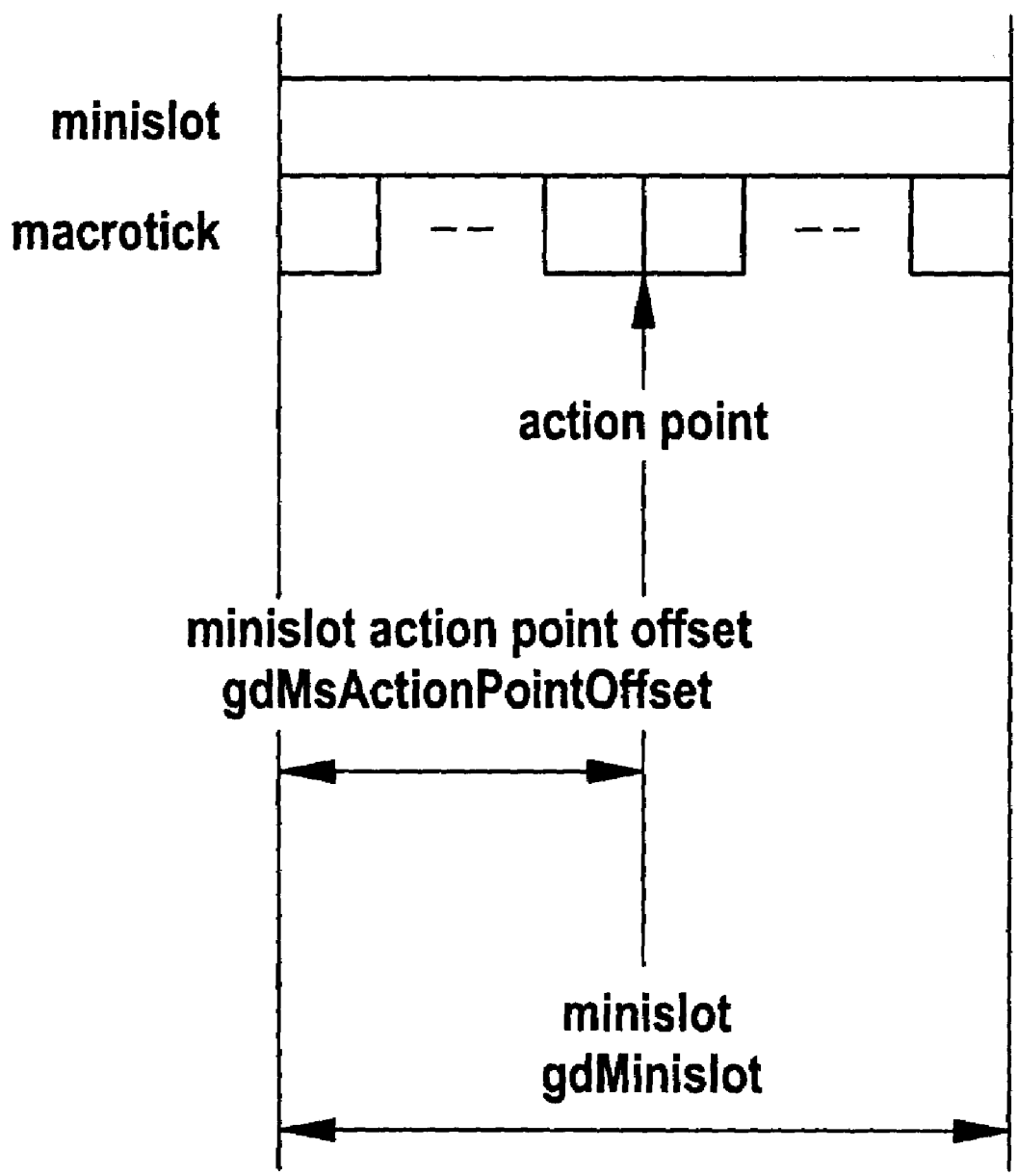
FIG. 12 illustrates a detailed timing within a minislot of a communication cycle.

FIG. 12 shows the detailed timing of a minislot.

Frame transmission shall start at the minislot action point of the first minislot of the respective dynamic slot. In the dynamic segment frame transmission shall also end at a minislot action point. If the frame does not end at a minislot action point by virtue of its data length, then the transmitter shall extend the transmission using the dynamic trailing sequence (DTS) as described further on. The DTS prevents premature idle detection by the receivers.

In contrast to a static slot the dynamic slot distinguishes between the transmission phase and the dynamic slot idle phase. The transmission phase ranges from the start of the dynamic slot to the last minislot, in which the transmission terminates. The dynamic slot idle phase concludes the dynamic slot. The dynamic slot idle phase is defined as a communication-free phase that succeeds the transmission phase in each dynamic slot. It is required to account for the communication channel idle detection latency and to process the frame by the receivers.

Figure 13:
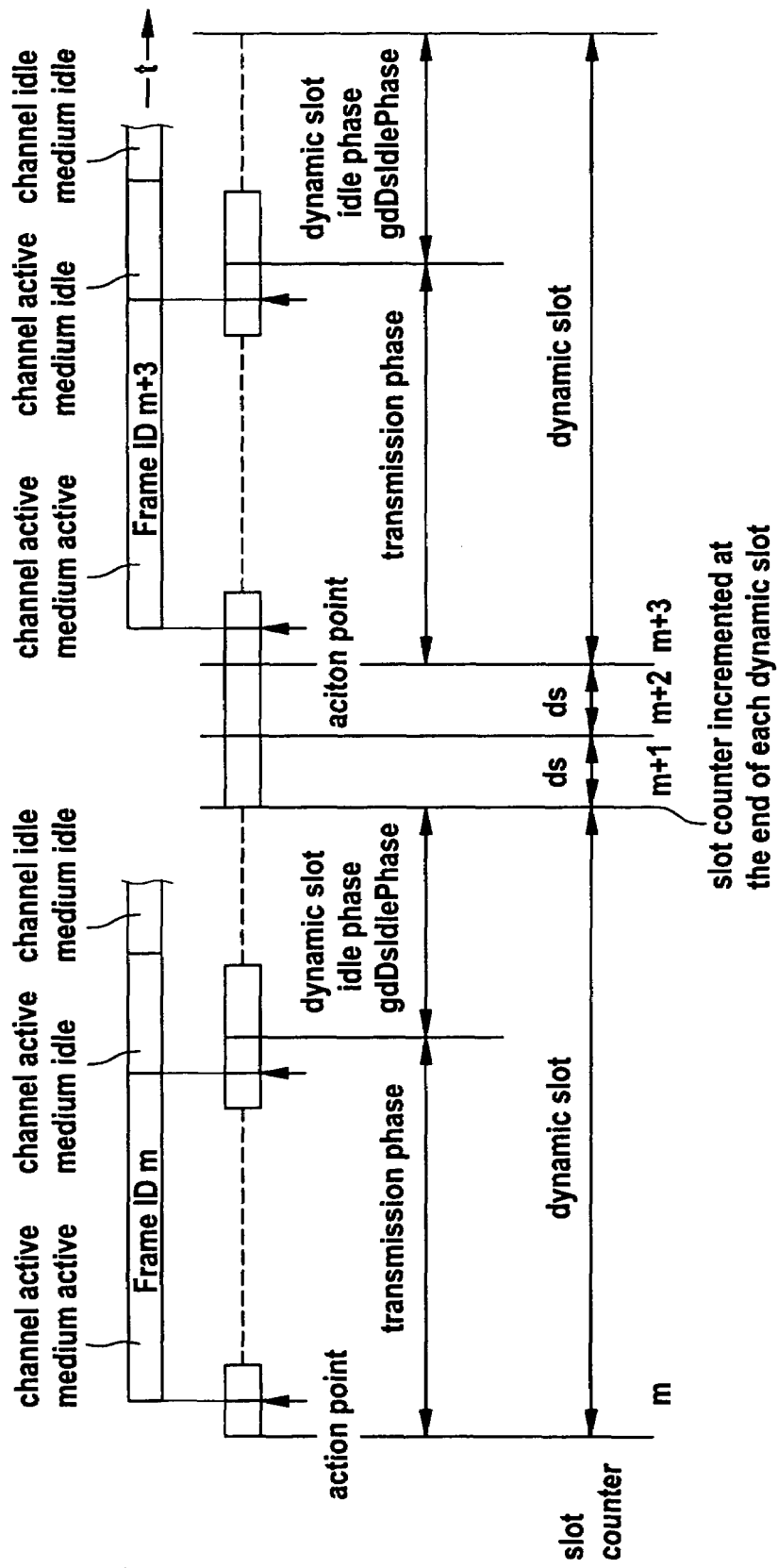
FIG. 13 illustrates a detailed timing within a dynamic segment of a communication cycle.

FIG. 13 shows the detailed timing within the dynamic segment.

The start of the dynamic segment requires particular attention. The first action point in the dynamic segment shall occur after max(gdActionPointOffset, gdMsActionPointOffset) macroticks after the end of the static segment.

Figure 14:
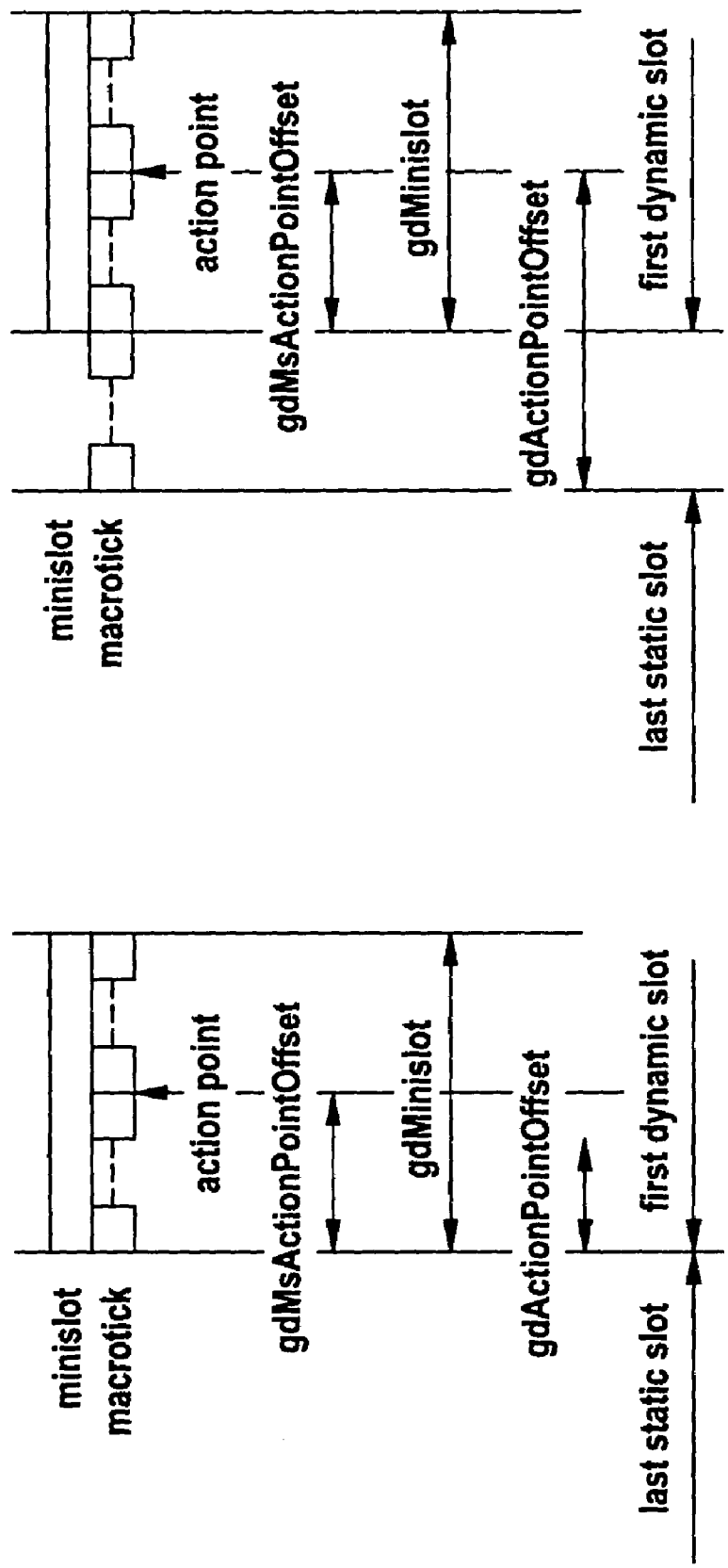
FIG. 14 illustrates a detailed timing at the boundary between a static segment and a dynamic segment of a communication cycle.

The two possible cases are illustrated in FIG. 14.

Each node shall perform slot counter housekeeping on a per channel basis. At the end of every dynamic slot the respective slot counter vSlotCounter[ch] shall be incremented by one until either 1. the respective slot counter vSlotCounter[ch] has reached cSlotIDMax, or
2. the dynamic segment has reached the minislot gNumberOfMinislots, i.e. the end of the dynamic segment, or Once one of these conditions is met the respective slot counter shall be set to zero and further increments shall be suspended for the respective communication cycle.

The arbitration procedure assures that all fault-free receivers agree implicitly on the dynamic slot in which the transmission starts. Further, all fault-free receivers also agree implicitly on the minislot in which slot counting is resumed. As a result, the slot counter of all fault-free receivers matches the slot counter of the fault-free transmitter and the frame identifier contained in the frame.

Configuration

Constraints concerning the configuration of the dynamic segment are specified further on.

Symbol Window

Within the symbol window a single symbol may be sent, i.e. either a normal symbol, an alarm symbol, a medium access test symbol or no symbol at all shall be sent. In general, arbitration among different senders is not provided by the protocol for the symbol window. If arbitration among multiple senders is required for the symbol window it has to be performed by means of a higher-level protocol.

Structure

The symbol window shall consist of a fixed number of gdSymbolWindow macroticks. The number of macroticks per symbol window gdSymbolWindow is a global constant for a given cluster and may range between 0 and TBD.

Transmission Condition

As in the two communication segments the condition whether a symbol shall be transmitted or not differs depending on the current protocol phase.

In the startup phase no symbol shall be transmitted on either channel.

In the operation phase a symbol shall be transmitted on a channel
1. if a symbol is released for transmission, and
2. if the control state machine is in the operation state.

Details specifying when a symbol is released for transmission are specified further on.

Transmission Timing

Figure 15:
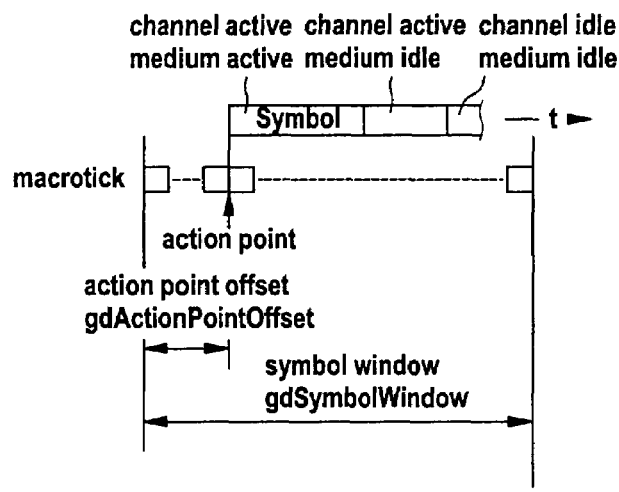
FIG. 15 illustrates a detailed timing within a symbol window of a communication cycle.

The symbol window contains an action point that shall be offset from the start of the slot by gdActionPointOffset macroticks. Symbol transmission shall start at the action point within the symbol window (see FIG. 15).

Configuration

Constraints concerning the configuration of the symbol window are specified further on.

Network Idle Time

Within the network idle time the clock correction terms shall be calculated and the offset correction term shall be applied in one or multiple macroticks. Details of the clock synchronization process are described further on.

The network idle time shall also serve as a phase to perform implementation specific cluster cycle related tasks.

The network idle time shall contain gdNIT macroticks. The number of macroticks within the network idle time gdNIT is a global constant for a given cluster and may range between 1 and TBD.

Constraints on the duration of the network idle time are specified further on.

Coding and Decoding

The following describes the coding and decoding methods used by the FlexRay system.

Figure 16:
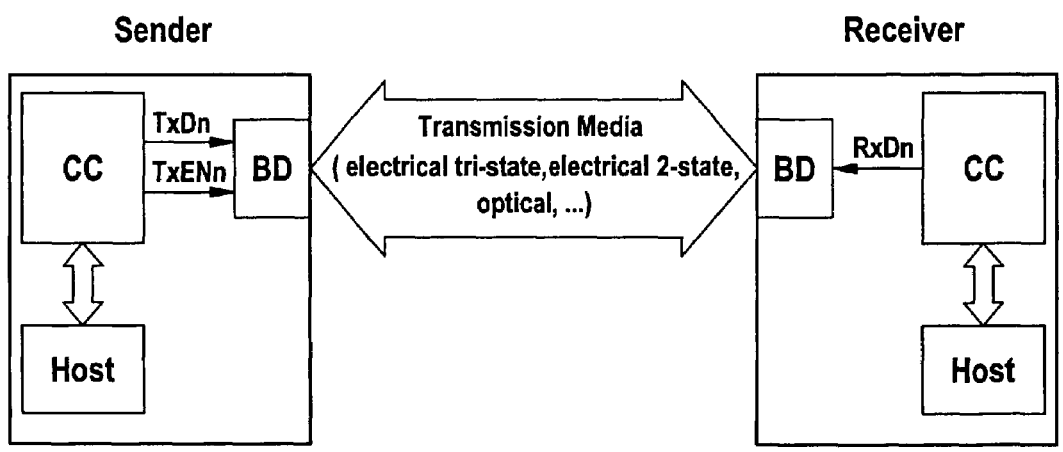
FIG. 16 illustrates a sender/receiver interface of a communication controller of a node of the communication system.

Since the FlexRay protocol is independent from the underlying physical layer, the following describes the coding and decoding rules of the interface signals as seen by the communication controller (i.e., TxENn, TxDn and RxDn, n∈{A, B} in FIG. 16). Further on additional information on this interface will be given.

In general, there are several non-ideal conditions (for example, clock oscillator differences, electrical characteristics of the transmission media and transceivers, etc.) that can cause variations of signal timing or introduce anomalies/glitches into the communication bit stream. The coding and decoding mechanisms described below are intended to be robust against such effects.

FlexRay uses a Non-Return to Zero (NRZ) signaling method for coding and decoding of frames and symbols.

Bit Stream Coding with NRZ

This section specifies the mechanisms used to encode the logical frames and symbols into a bit stream for transmission and how the transmitting node presents this bit stream to the Bus Driver for communication onto the network. The sender shall start the transmission of a frame or symbol by setting the TxENn signal to logical "0". The sender shall stop the transmission of a frame or symbol by setting the TxENn and the TxDn signals to logical "1". The logical frame is described further on.

Frame Coding

Frame coding transforms logical frames to a continuous bit stream by the following steps:

Dividing the logical frame into single byte components

Building byte sequences by adding a Byte Start Sequence (BSS) at the beginning of each byte component Assembling a continuous bit stream out of the byte sequences Adding a Transmission Start Sequence (TSS) before the start of the bit stream Appending a Frame End Sequence (FES) at the end of the bit stream Appending a Dynamic Trailing Sequence (DTS) after the Frame End Sequence if the frame is transmitted in the dynamic segment of the communication cycle Byte Coding Each byte sequence shall begin with a Byte Start Sequence (BSS). The BSS consists of a logical "1" bit followed by a logical "0" bit. A byte sequence consists of a BSS followed by eight data bits from the logical frame.

Figure 17:
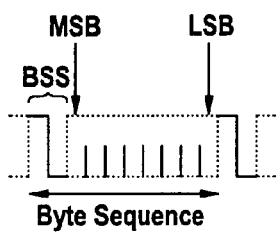
FIG. 17 illustrates a byte coding.

Transmission of the data bits within a byte sequence shall be such that the most significant bit of the data is transmitted first with the remaining bits of the data being transmitted in decreasing order of significance. This is shown in FIG. 17.

The purpose of the BSS is to provide bit stream timing information to receiving devices. The signal edge between the first and the second bit of the BSS is used to realign the bit timing of the receiver (i.e., bit clock resynchronization).

Transmission Start Sequence (TSS)

The Transmission Start Sequence (TSS) is inserted into the bit stream before the first byte sequence. The TSS consists of a continuous logical "0" level. The duration of the TSS shall be configurable between 1 to 15 nominal bit times.

Frame End Sequence (FES)

The Frame End Sequence (FES) is appended to the bit stream following the final byte sequence. The FES is a two bit sequence consisting of a logical "0" bit followed by a logical "1" bit.

Dynamic Trailing Sequence (DTS)

A dynamic trailing sequence (DTS) shall be transmitted immediately after the FES of a frame that is transmitted in the dynamic segment of a communication cycle. The purpose of this sequence is to indicate the exact point in time of the minislot action point.

The DTS starts with a variable number of consecutive logical "0"s. The DTS length is greater or equal to 1 bit. The DTS is concluded with the transmission of a logical "1" bit. Note that the granularity of the length of the "0" portion of the DTS is microticks rather than bits. In general, the trailing "0" to "1" transition is not synchronous to a bit cell boundary.

Entire Bit Stream for a Frame in the Static Segment

Figure 18:
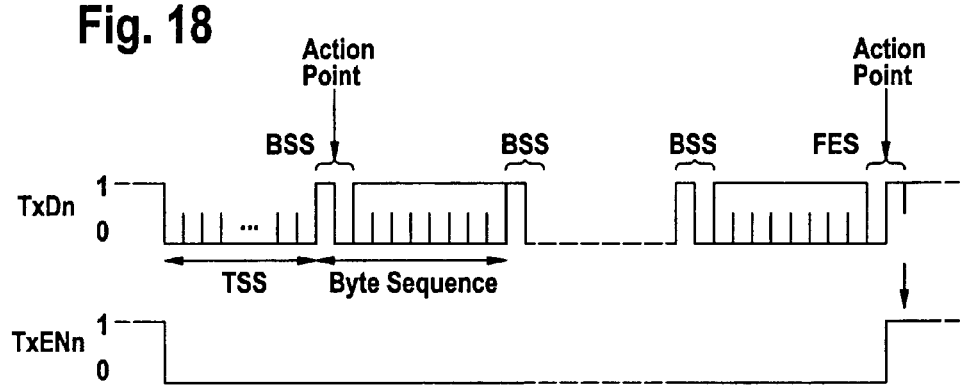
FIG. 18 illustrates a frame coding in a static segment of a communication cycle.

FIG. 18 shows the entire bit stream of a frame transmitted in the static segment.

At the completion of the FES the transmitting node shall set the TxENn signal to logical one.

Entire Bit Stream for a Frame in the Dynamic Segment

Figure 19:
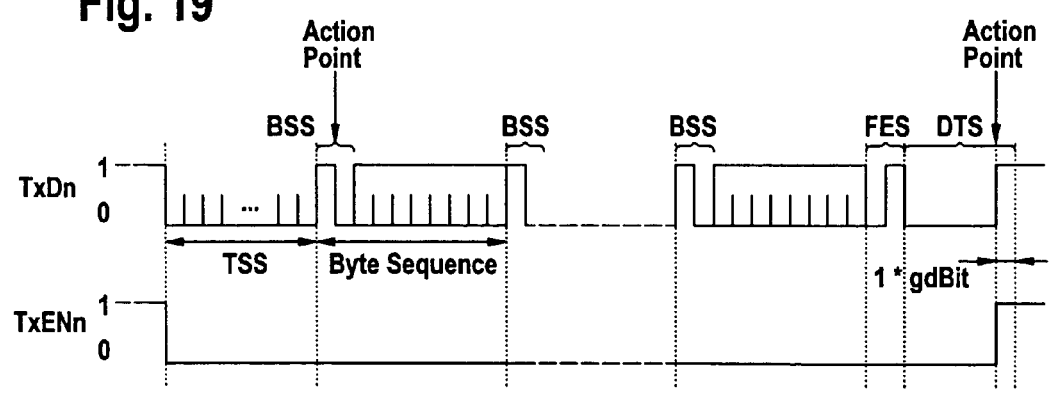
FIG. 19 illustrates a frame coding in a dynamic segment of a communication cycle.

FIG. 19 shows the entire bit stream of a frame transmitted in the dynamic segment.

At the minislot action point the TxDn output shall switch to logical "1" level, while TxENn shall switch to logical "1" one bit duration gdBit after the action point (This ensures that there is a duration of gdBit in which the TxDn output is at logical one prior to the transition of TxENn to logical one. This is required for the stability of certain types of physical layers.).

Symbol Coding

The FlexRay communications protocol defines six symbols; each of which is represented by specific bit pattern:

Status Normal Symbol (SNS)

Status Alarm Symbol (SAS)

Media Access Test Symbol (MTS)

Collision Avoidance Symbol (CAS)

Event Indication Symbol (EIS)

Wake-Up Symbol (WUS).

The bit stream of each symbol is described in the following sections.

Status Normal Symbol (SNS)

The Status Normal Symbol shall be transmitted starting with the Transmission Start Sequence (TSS) followed by 2 gdBit times at a logical "1" level, 30 gdBit times at a logical "0" level, and a final gdBit time at a logical "1" level as shown in FIG. 20.

Status Alarm Symbol (SAS)

The Status Alarm Symbol shall be transmitted starting with the Transmission Start Sequence (TSS), followed by 2 gdBit times at a logical "1" level, 20 gdBit times at a logical "0" level, and a final gdBit time at a logical "1" level as shown in FIG. 21.

Collision Avoidance Symbol (CAS)

The Collision Avoidance Symbol shall be transmitted starting with the Transmission Start Sequence (TSS), followed by 30 gdBit times at a logical "0" level as is shown in FIG. 22.

Media Access Test Symbol (MTS)

The Media Access Test Symbol (MTS) shall be encoded in the same manner as the CAS symbol described above.

Event Indication Symbol (EIS)

The Event Indication Symbol (EIS) shall be encoded in the same manner as the SNS symbol described above.

Wake-Up Symbol (WUS)

At the TxD output the Wake-Up Symbol shall be transmitted starting with a configurable number of gdBit times at a logical "0" level (gdWakeupSymbolTxLow) followed by a configurable number of gdBit times at a logical "1" level (gdWakeupSymbolTxIdle).

At the TxENn output the WUS shall be transmitted identically to the TxD line, i.e., starting with a configurable number of gdBit times at a logical "0" level (gdWakeupSymbolTxLow) followed by a configurable number of gdBit times at a logical "1" level (gdWakeupSymbolTxIdle).

Figure 23:
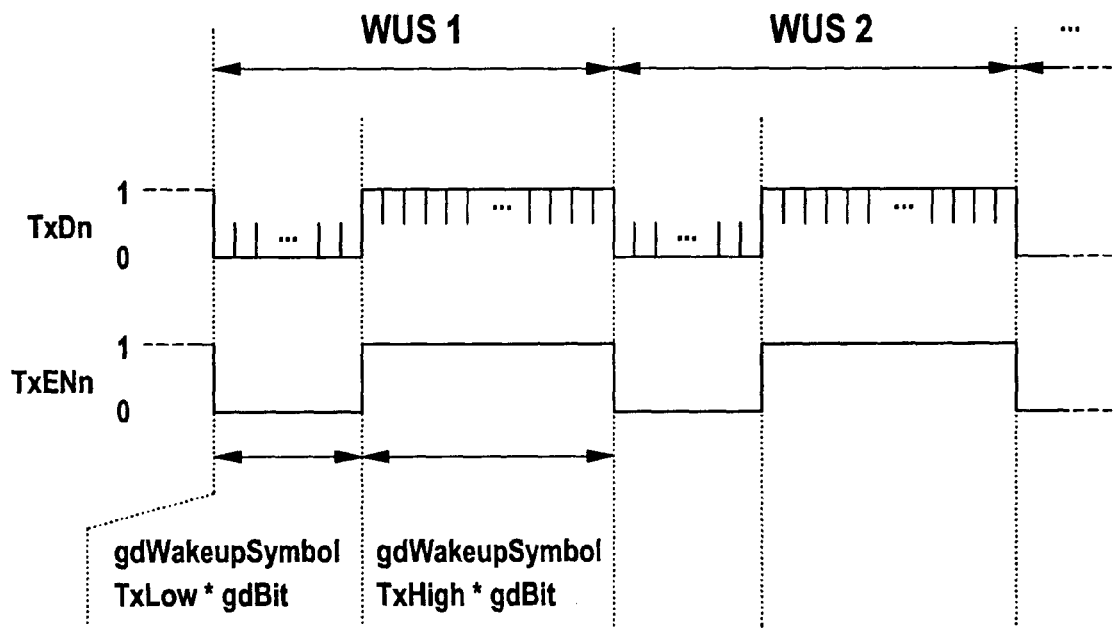
FIG. 23 illustrates a bit stream of a sequence of two wake-up symbols (WUS)

The Wake-up symbol shall be repeated for a configurable number of times (gWakeupPattern). The minimum number of repetitions is 2. The configuration parameters for the WUS are described more detail below. An example with a sequence of two WUS's is shown in FIG. 23.

Bit Stream Decoding with NRZ

This section specifies the mechanisms used to perform bit stream decoding, including the relevant parameter limits and configuration parameters with this function. The decoding function interprets the bit stream observed at the RxDn inputs of the CC.

Figure 24:
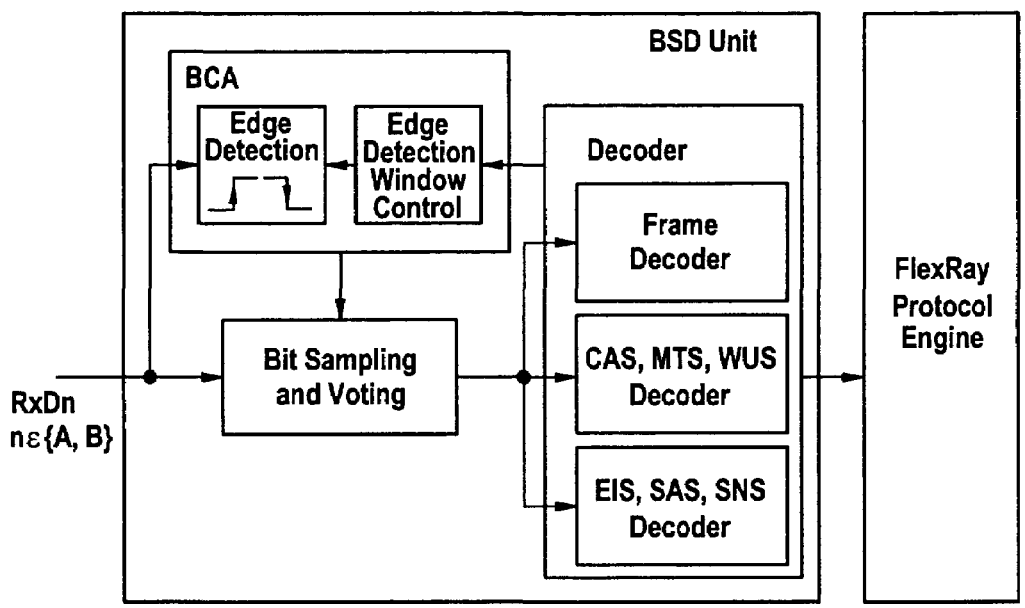
FIG. 24 illustrates a block diagram of a bit stream decoding unit of a node of the communication system.

The block diagram in FIG. 24 shows the control flow of the receive signals through the Bit Stream Decoding (BSD) unit.

The bit stream decoding processes bit streams present on the physical media, extracts logical frame and symbol information, and passes this information to the FlexRay protocol engine. The following steps are performed:
- Bit clock alignment at dedicated edges during the bit stream detected at the RxDn input
- Bit sampling and voting based on the aligned bit clock
- Decoding of frame and symbol information from the bit sampling and voting output The bit stream decoding processes of the individual channels on a multiple channel FlexRay node operate independently from one another. Specifically, the bit clock alignment, edge detection, sample voting, frame decoding, and symbol detection processes on the individual channels must be capable of independent operation.

Bit Clock Alignment

The Bit Clock Alignment function (BCA) synchronizes the local bit clock used for bit sampling and voting to the received bit stream at the RxDn input.

Edge Detection Window Control

The edge detection window determines the time window in which the next edge for bit clock alignment is expected. This window is set during frame reception around the expected logical "1" to "0" transition between the two bits of the next BSS.

Initial Edge Detection Window Determination

Figure 25:
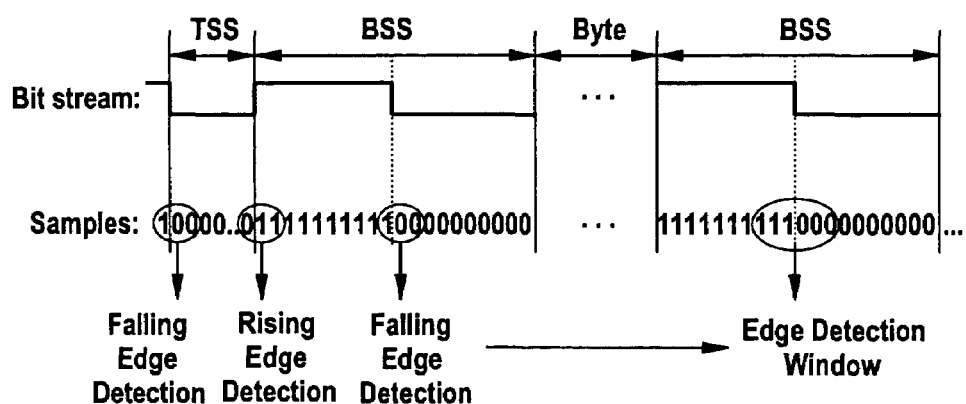
FIG. 25 illustrates a mechanism for determining an initial edge detection window when a frame is received.

The initialization of the BCA is started as soon as channel idle is detected at RxDn (and signaled to the BCA via the decoder unit). FIG. 25 shows the mechanism that determines the initial edge detection window when a frame is received. If the received bit stream is not a frame (e.g., symbol reception), the BCA shall be deactivated until the next channel idle is signaled to the BCA via the decoder unit.

The initialization of the BCA is performed through the following steps:
- Falling edge detection (potential start of a frame, i.e., the start of a TSS)
- Rising edge detection (potential start of BSS)
- Falling edge detection (potential falling edge in the middle of the BSS)
- Alignment of bit stream to that falling edge
- First edge detection window determination Start of Frame Detection After channel idle the BCA waits for a falling edge that is potentially the start of a frame (TSS). In order to filter out glitches, a continuous number of pVotingSamples samples are taken for majority voting to validate the occurrence of the edge (see FIG. 25 with pVotingSamples=3).

If the majority of pVotingSamples consecutive samples is logical "0", a valid falling edge has been detected.

Start of BSS Detection

After detecting a valid falling edge the BCA waits for a rising edge that is potentially the start of a BSS. In order to filter out glitches, a continuous number of pVotingSamples samples are taken for majority voting to validate the occurrence of the edge (see FIG. 25 with pVotingSamples=3).

If the majority of pVotingSamples consecutive samples is logical "1", a valid rising edge has been detected.

Falling Edge Detection in the Middle of the BSS

After detecting a valid rising edge the BCA waits for a falling edge that is potentially the middle of a BSS. In order to filter out glitches, a continuous number of pVotingSamples samples are taken for majority voting to validate the occurrence of the edge (see FIG. 25 with pVotingSamples=3).

If the majority of pVotingSamples consecutive samples are logical "0", a valid falling edge has been detected.

Alignment of Bit Stream

Figure 26:
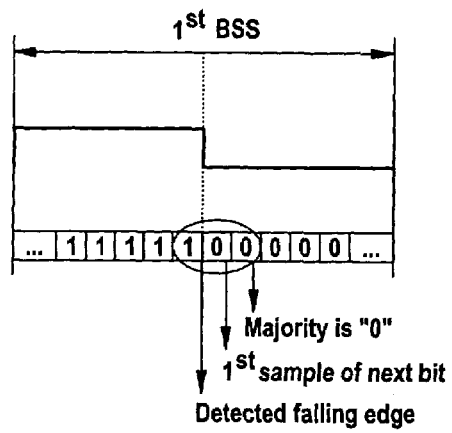
FIG. 26 illustrates a mechanism for detecting a falling edge in the middle of a first byte start sequence (BSS)

After detecting a valid falling edge the bit clock is aligned to the bit stream as seen in FIG. 26.

The first sample of the next bit is determined by the central sample of the voting window. FIG. 26 shows an example with pVotingSamples=3, where the second sample of the voting window shall be considered to be the first sample of the next bit. After aligning the bit sampling to this particular sample in the BSS, the first sample of each consecutive bit of the next byte is considered to occur pSamplesPerBit after first sample of the previous bit.

First Edge Detection Window Determination

Figure 27:
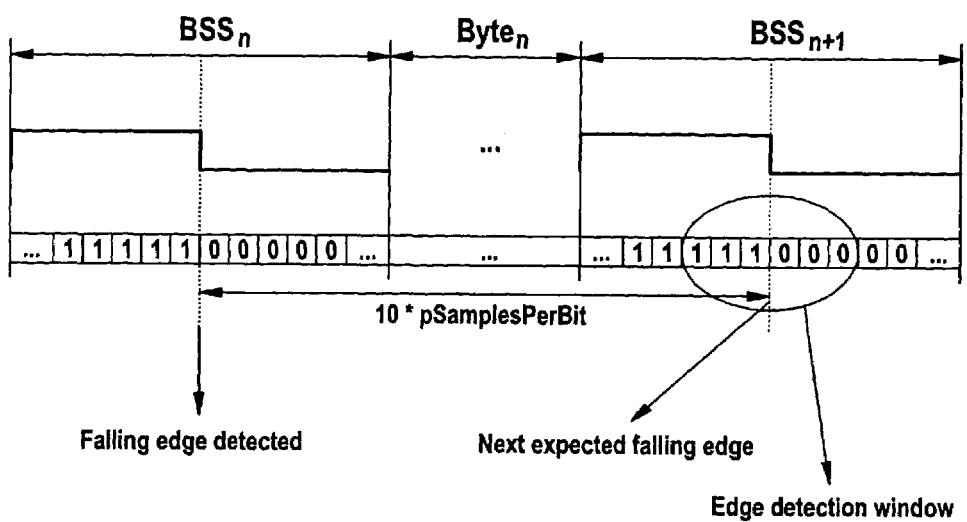
FIG. 27 illustrates a mechanism for determining an edge detection window.

The falling edge of the next BSS is expected 10*pSamplesPerBit samples after the falling edge of the current BSS. The bit time window is placed symmetrically around the expected edge in the next BSS with a size of 6 samples, i.e., the next edge detection window is set from three samples before to three samples after that expected falling edge (see FIG. 27).

Bit Clock Alignment

During the edge detection window, the number of samples that equal logical "0" is counted as vEdgeLowSamples. Three cases have to be distinguished:

Case 1: vEdgeLowSamples=pEdgeSamples/2

Figure 28:
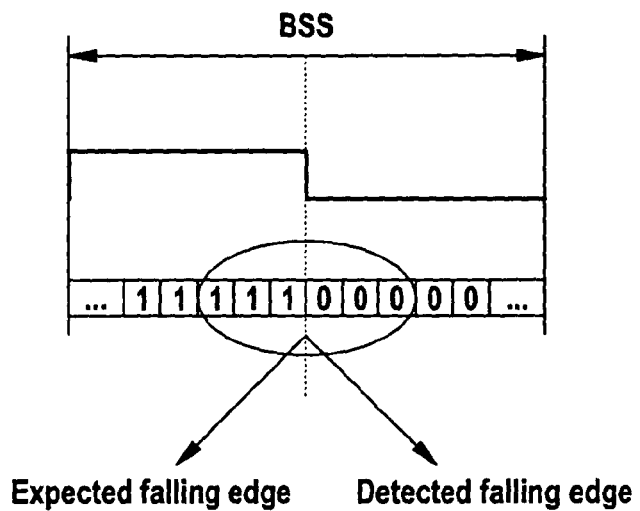
FIG. 28 illustrates a bit clock alignment according to a first example.

In this case, the bit clock alignment is assumed to be correct. The falling edge is detected at the expected falling edge (see FIG. 28).

Case 2: vEdgeLowSamples>pEdgeSamples/2

Figure 29:
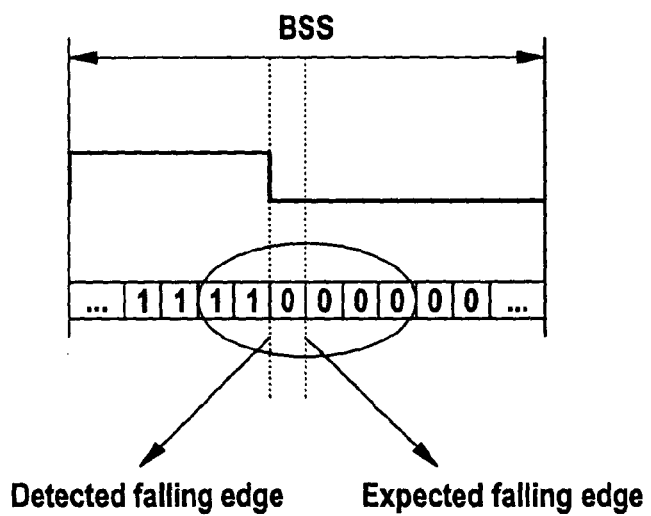
FIG. 29 illustrates a bit clock alignment according to a second example.

In this case, the bit clock has to be aligned by −1 sample point (see FIG. 29).

Case 3: vEdgeLowSamples<pEdgeSamples/2

Figure 30:
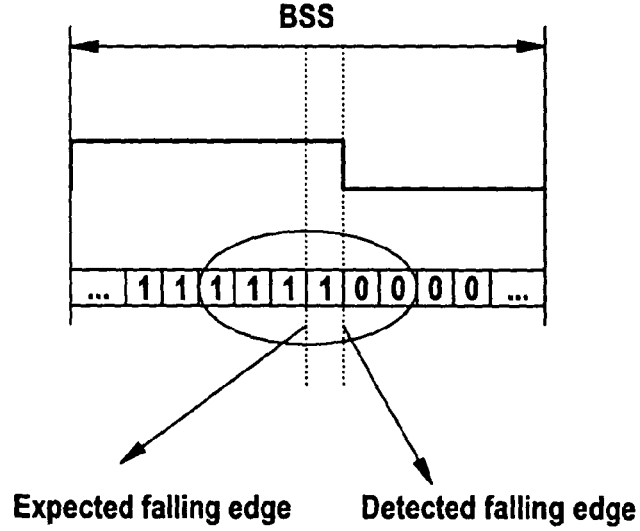
FIG. 30 illustrates a bit clock alignment according to a third example.

In this case, the bit clock has to be aligned by +1 sample (see FIG. 30).

In general, shifting the bit start time is limited to plus or minus one sample point.

If there is no falling edge detected during the edge detection window (i.e., all samples have the same value), the resynchronization of the next bit sampling is performed according to the following rules
- If only logical "0" values are sampled in the edge detection window, the bit clock is aligned −1 sample relative to the expected falling edge.
- If only logical "1" values are sampled in the edge detection window, the bit clock is aligned +1 sample relative to the expected falling edge.
- This condition does not constitute a coding error.

Edge Detection Window Determination During Frame Reception

The next edge detection window is determined from the aligned bit clock of the current detected falling edge. The falling edge of the next BSS is expected 10*pSamplesPerBit after the current detected falling edge. The bit time window is placed symmetrically around the expected edge in the next BSS, i.e., the next edge detection window is set from three samples before to three samples after that expected falling edge (see FIG. 27).

Bit Sampling and Voting

The bit sampling and voting function decides whether the current bit value is to be considered as logical "1" or as logical "0". This determination shall be performed on the signals RXDA and RXDB.

Initial Bit Start Determination

Figure 31:
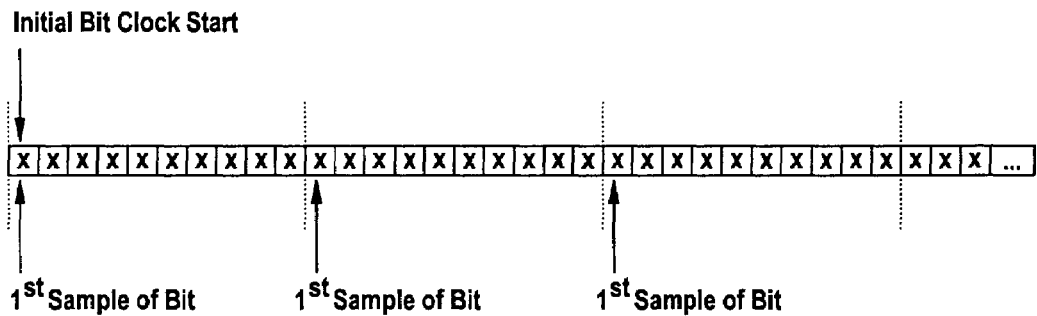
FIG. 31 illustrates an example of a bit sampling for bits comprising 10 samples.

After initialization of the CC, the BSD unit starts bit sampling immediately, i.e., the local bit clock is started immediately and the bit stream is sampled with this (unaligned) bit clock. The first bit is assumed to start with the first sample. Bit clock alignment starts independently as described above. The number of samples of a bit is configured by the parameter pSamplesPerBit. pSamplesPerBit can be either 8 or 10. Each consecutive bit is assumed to start pSamplesPerBit after it's predecessor bit. FIG. 31 shows an example of bit sampling with pSamplesPerBit=10.

Resynchronization of Bit Sampling

Figure 32:
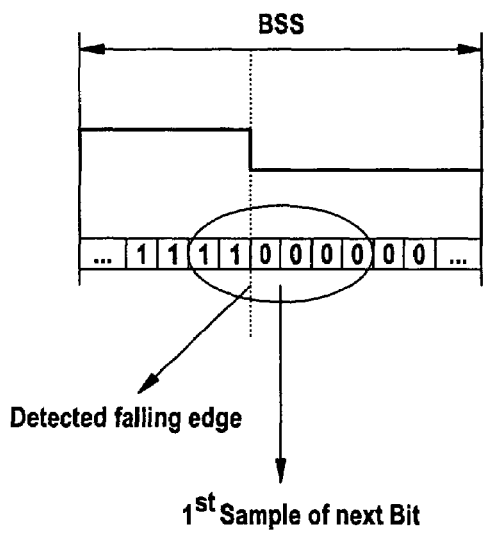
FIG. 32 illustrates a mechanism for a resynchronization of bit sampling.

Once the bit clock alignment is activated, bit sampling is resynchronized to the received bit stream by using the aligned bit clock. The resynchronization of the bit sampling is only performed at the falling edges in the BSS. In general, the first sample of the next bit shall be set to the sample following the falling edge detected by the BCA. This mechanism is illustrated in FIG. 32.

After bit clock alignment bit sampling is performed without resynchronization for the next ten bits, i.e., until the falling edge of the next BSS.

Bit Value Voting

The number of samples to be considered for majority voting shall be odd. It is recommended to center the voting window on the supposed center of the bit cell.

Figure 33:
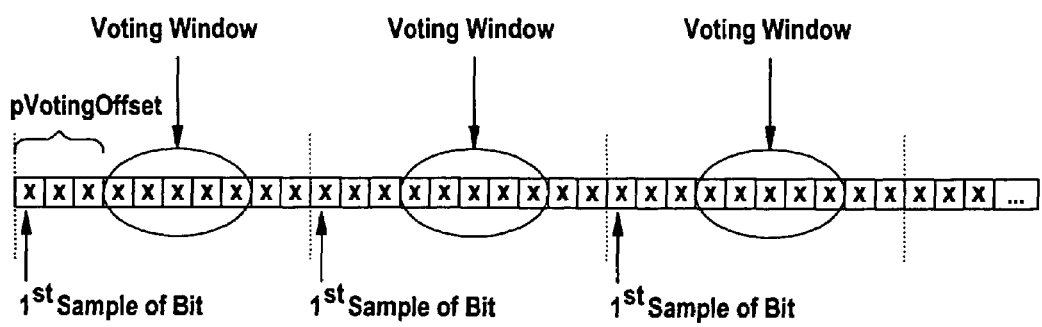
FIG. 33 illustrates an example for a bit value voting mechanism.

The sample voting process defines a "window" of samples that are used to make the determination of the value of a received bit. This window is characterized by two parameters, pVotingOffset and pVotingSamples. An example with pVotingOffset=3 and pVotingSamples=5 is shown for the case of pSamplesPerBit=10 in FIG. 33.

The parameter pVotingOffset specifies the offset between the $1^{st}$ sample of the bit and the start of the voting window. This offset defines the first sample of the bit that will be considered for the voting. Specifically, the first sample considered for voting is the sample after the first pVotingOffset samples of the bit (i.e., voting starts after pVotingOffset samples have been "skipped").

The pVotingSamples parameter specifies the number of samples in the voting window. The window is defined by taking pVotingSamples consecutive samples starting with the sample indicated by pVotingOffset.

The bit value shall be determined by majority voting over the samples within the voting window (This implies that the number of samples within the voting window, pVotingSamples, must be odd.), i.e., if a majority of samples within the voting window have logical value "0", the output value of the sampled bit shall be "0"; if a majority of samples within the voting window have logical value "1" the output value of the sampled bit shall be "1".

Note the voting window and the bit sampling shall be resynchronized with every edge between the two bits of the Byte Start Sequence (BSS). This is the only edge to be used for the resynchronization.

Frame and Symbol Decoding

Note that due to certain effects on the physical transmission medium (e.g., optical transmission, truncation due to connection setup in the star coupler, etc.), it is possible that the TSS seen at the RxDn input may be shorter or longer than the TSS that was transmitted. All receivers shall accept Transmission Start Sequences with any duration in the range of 1 to 16 bit times (inclusive).

A valid start of frame or symbol shall be considered when the following conditions are met:
  the channel was detected as idle and
  there was at least one transition from logical "1" to logical "0" and
  the bit value associated with the transition being considered as start of the bit cell was considered to be logical "0" (bit value voting result)

Note: for glitch filtering and bit start time alignment at start of frame and/or symbol see the bit clock alignment section in this chapter.

Frame Decoding

The frame coding status shall be "valid coding", if the following conditions are met:
  the TSS length was detected to be at least 1 bit and less or equal to 16 bits, and
  all the expected BSS's were successfully detected (i.e. the first bit of the BSS was voted as a logical "1" and the second bit was voted as a logical "0"), and
  the FES was successfully detected (i.e. the first bit of the FES was voted as a logical "0" and the second bit was voted as a logical "1").

Once the decoder unit detects an FES instead of an expected BSS, the BCA function is deactivated until channel idle is detected.

SNS Decoding

The detection of an SNS symbol shall be considered as "valid coding" if the following conditions are met:
  a TSS is detected with a duration between 1 and 16 gdBit, and
  two gdBit times logical "1" is detected, and
  a subsequent logical "0" level is detected for a duration of 27 gdBit<$t\_{sns\_0}$<33 bit SAS Decoding The detection of an SAS symbol shall be considered as "valid coding" if the following conditions are met:
  a TSS is detected with a duration between 1 and 16 gdBit, and
  two gdBit times logical "1" is detected, and
  a subsequent logical "0" level is detected for a duration of 18 gdBit<$t\_{sas\_0}$<22 gdBit EIS Decoding The detection of an EIS symbol shall be considered as "valid coding" if the same conditions are met as for SNS decoding (see above).

CAS Decoding

The detection of a CAS symbol shall be considered as "valid coding" if the following condition is met:
  the TSS is detected with a duration between 1 and 16 gdBit, and
  a logical "0" level is detected for a duration of 27 gdBit<$t\_{cas\_0}$<33 gdBit MTS Decoding The detection of an MTS symbol shall be considered as "valid coding" if the same condition is met as for CAS decoding (see above).

WUS Decoding

The detection of a WUS symbol shall be considered as "valid coding" if the following condition is met:
  a duration between 1 gdBit and gdWakeupSymbolRxLow at a logical "0" level is detected.

Channel Idle Detection

The channel idle detection function is located in the decoder, using the input from the sampling and voting unit. The channel idle detection function is always active, including, for example during ongoing frame and/or symbol detection. When the CC is in low power mode and/or in the CC configuration state, then channel idle detection support is not performed.

Upon exiting the CC configuration state and/or the CC low power mode, the channel shall initially be assumed to be busy (i.e. not idle). The behavior is also required when an undefined communication element is detected.

The channel shall be considered to be idle as soon as 12 consecutive bits with the data value logical '1' have been detected.

Presence of glitches while the channel is idle does not establish a coding error condition and there shall be no re-start of the channel idle detection timer. The channel idle detection counter shall be re-started when a logical "1" to "0" transition was detected where the associated bit voting result was "0".

If the next start of frame or symbol is detected earlier than after successful channel idle detection then this establishes a channel idle condition violation (but not a coding error) and shall be signaled to the host.

Coding Error Signaling

After a frame or symbol start is detected, i.e., if a transition from channel idle to logical "0" is observed at RxDn and none of the conditions described in section 0 hold, the coding status shall be "invalid coding".

After a valid frame or symbol is received, the CC shall perform the channel idle check. If the consecutive 12 bits after end of frame or symbol are not logical "1" a "channel idle coding violation" shall be signaled to the host.

Device is in Sleep Mode

As soon as a logical "0" condition is detected, this condition shall be captured and be considered as a potential start of a wakeup symbol. If the wakeup condition is verified as "valid", then the appropriate startup actions shall be performed (see below), otherwise the device shall continue to stay in sleep mode.

Configuration Parameters

In order to be able to support a suitable set of different bit rates without having to modify the oscillator frequency, the number of samples per bit pSamplesPerBit shall be configurable to either 8 or 10. In addition, a scalable oscillator clock period multiplier should typically be provided. At a minimum, the node shall support clock period multiplier settings (prescaler settings) of 1, 2, 4, 8, and 16. The supported bit rates depend on the oscillator frequency that is used, the prescaler setting, and the samples per bit setting.

The following Table 7 gives an example of supported bit rates with a 12.5 ns oscillator period (e.g. f_osc=80 MHz nominal.).

TABLE 7

Example of supported bit rates with a 12.5 ns oscillator period

| Index | Sample Clock Prescaler | Sample Clock Period (ns) | Samples per Bit | Bit Time (ns) | Bit Rate (Mbps) |
|---|---|---|---|---|---|
| 1 | 1 | 12.5 | 8 | 100 | 10.000 |
| 2 | 1 | 12.5 | 10 | 125 | 8.000 |
| 3 | 2 | 25.0 | 8 | 200 | 5.000 |
| 4 | 2 | 25.0 | 10 | 250 | 4.000 |
| 5 | 4 | 50.0 | 8 | 400 | 2.500 |
| 6 | 4 | 50.0 | 10 | 500 | 2.000 |
| 7 | 8 | 100.0 | 8 | 800 | 1.250 |
| 8 | 8 | 100.0 | 10 | 1000 | 1.000 |
| 9 | 16 | 200.0 | 8 | 1600 | 0.625 |
| 10 | 16 | 200.0 | 10 | 2000 | 0.500 |

Overview

The following describes the supported frame formats used by the FlexRay protocol and gives an overview. Then the description focuses on the frame formats.

The FlexRay protocol supports two distinct frame formats:
the FlexRay frame format
the byteflight frame format All controllers in a cluster must be configured to use the same frame format. Specifically, a system in which some controllers use the FlexRay frame format while other controllers use the byteflight frame format is not a valid system configuration.

The FlexRay frame format may be used for systems in time-triggered distributed mode (TT-D mode), in time-triggered master-controlled mode (TT-M mode), or event-triggered mode (ET mode).

The byteflight frame format may only be used in systems operating in byteflight mode (BF mode).

Both frame formats contain a header segment, a payload segment and a trailer segment, each of which contains specific fields. These are described for the FlexRay and byteflight frame formats, and illustrated, respectively, in FIG. 34 and FIG. 35.

FlexRay Frame Format

Figure 34:
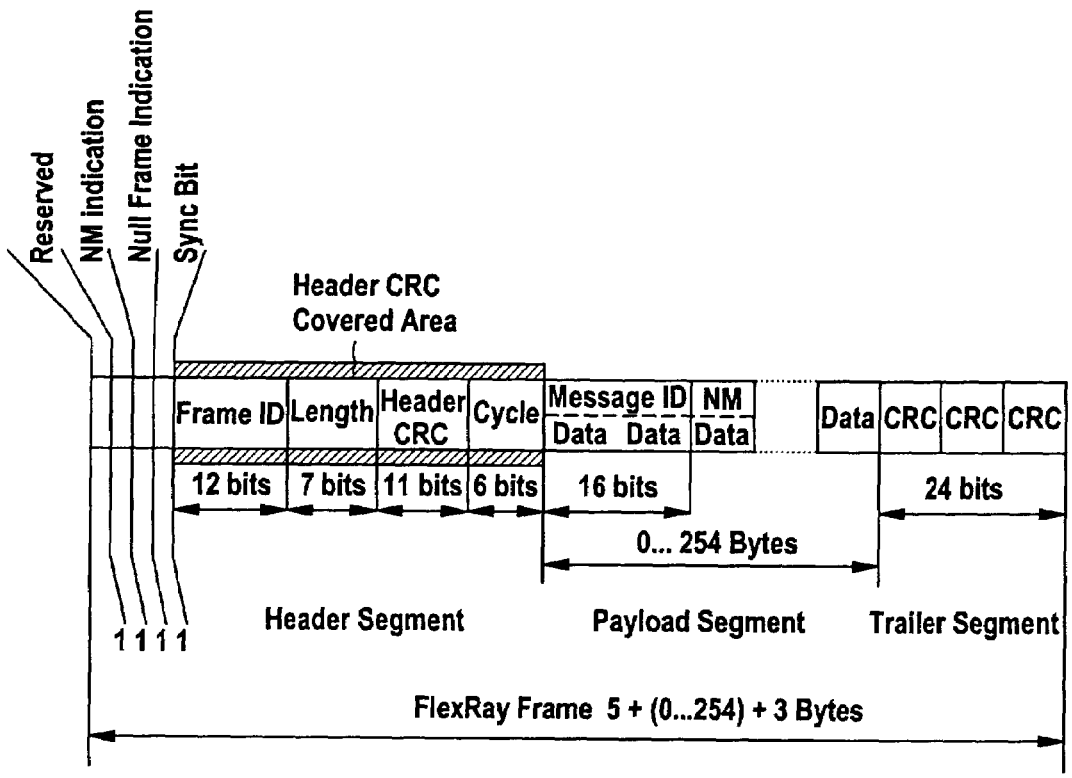
FIG. 34 illustrates an overview of a FlexRay frame format.

An overview of the FlexRay frame format is given in FIG. 34. The frame shall be transmitted on the network such that the header segment appears first, followed by the payload segment, and then followed by the trailer segment, which is transmitted last.

FlexRay Header Segment

The FlexRay header segment consists of 5 bytes that contain several distinct fields; a reserved bit, a Network Management Indication Bit, a Null Frame Indication Bit, a Sync Bit, a Frame ID field, a Payload Length field, a Header CRC field, and a Cycle Counter field. These fields are described in detail in the following sections.

Within the header segment the fields shall be transmitted in the order indicated in FIG. 34, moving from left to right (i.e., the Reserved bit is transmitted first and the Cycle Counter field is transmitted last).

Reserved Bit (1 bit—fReservedBit)

This field consists of one bit that is reserved for future protocol use. This bit shall not be used by the application.
In a transmitting node the Reserved bit shall be set to logical '0'.
In a receiving node the Reserved bit shall be ignored (The receiver uses the value of the Reserved Bit for the Frame CRC checking process, but otherwise ignores its value (i.e., the receiver shall accept either a 1 or a 0 in this field).).

Network Management Indication Bit (1 bit—fNMIndicationBit)

This field indicates whether an optional network management vector is contained within the payload section of the frame.
If the network management indication bit is set to fNMIndicationBit=1 the payload section of the frame contains a network management vector.
If the network management indication bit is set to fNMIndicationBit=0 the payload section of the frame does not contain a network management vector.

Null Frame Indication Bit (1 bit—fNullFrameIndicationBit)

The Null Frame Indication bit fNullFrameIndicationBit indicates whether the current frame is a "null frame", i.e., a frame that contains no usable data in the payload segment of the frame. (The Null frame indication bit indicates only whether valid data was available to the communications controller at the time the frame was sent. A Null Frame Indication Bit set to 1 means that received data in the payload segment is not valid. If the bit is set to 0 the data in the payload segment is valid from the transmitting communication controller's point of view. The receiver may have to do several other checks to decide whether the data is actually valid.)

If the Null frame indication bit is set to fNullFrameIndicationBit=1 the payload segment contains no valid data.

If the Null frame indication bit is set to fNullFrameIndicationBit=0 the payload segment contains data.

Further information on null frames may be found below.

Sync Bit (1 bit—fSyncBit)

The sync bit fSyncBit determines whether the frame is to be used for various aspects of system synchronization.

If the Sync Bit is set to fSyncBit=1 the frame is a candidate to be used for synchronization if it meets other criteria (see below).

If the Sync Bit is set to fSyncBit=0 the frame shall not be used for synchronization.

Examples of protocol mechanisms that make use of the Sync Bit include clock synchronization (described further on) and startup (described further on). In all cases, the condition fSyncBit=1 is only one of several conditions necessary for the frame to be used in the various synchronization mechanisms.

All frames transmitted in the dynamic segment (if present) shall be sent with fSyncBit=0.

If a node transmits a given frame on more than one channel it shall set fSyncBit to the same value on each channel.

A node shall not transmit a frame with fSyncBit=1 in more than one slot of a given communication cycle. If a node does transmit frames with fSyncBit=1, it shall do so in the same slot of every communication cycle.

A node shall only transmit a frame with fSyncBit=1 in a given slot of a communication cycle if it is configured to transmit on all configured channels for that slot (This implies that nodes transmitting frames with fSyncBit=1 on dual channel systems must transmit that frame on both channels of the system. Single channel systems implicitly meet this requirement—all frames are transmitted on all configured channels.).

Frame ID (12 bits—fFrameID)

This field contains the Frame Identifier for the frame. Each frame that may be transmitted in a cluster has a frame ID fFrameID assigned.

The frame ID fFrameID is a unique number per communication channel per communication cycle and defines the slot in which the frame is transmitted.

Valid values for fFrameID range from 1 to 4095 (In binary: from $(0000\ 0000\ 0001)_2$ to $(1111\ 1111\ 1111)_2$) during the protocol operation phase (POP). The Frame ID 0 is an invalid Frame ID.

The Frame ID field shall be transmitted such that the most significant bit of fFrameID is transmitted first with the remaining bits of fFrameID being transmitted in decreasing order of significance.

Payload Length (7 bits—fPayloadLength)

The Payload Length field consists of a single parameter, fPayloadLength, that is related to the number of bytes contained in the payload segment of the frame. Specifically, fPayloadLength indicates the number of bytes in the payload segment divided by two. For example, a frame that contains a payload segment consisting of 72 bytes would be sent with fPayloadLength=36. A detailed definition of the contents of the payload segment of a FlexRay frame can be found below.

The payload length field does not include the number of bytes within the header and the trailer segments of the FlexRay frame.

The maximum payload length is cPayloadLengthMax, which corresponds to a payload segment containing 2*cPayloadLengthMax bytes. The payload field shall be less than or equal to the maximum payload length: fPayloadLength≦cPayloadLengthMax.

The payload length shall be fixed for all frames in the static segment of a communication cycle. For these frames the payload length field shall be transmitted with fPayloadLength=gPayloadLengthStatic.

The payload length fPayloadLength may be different for different frames in the dynamic segment of a communication cycle. In addition, the payload length of a specific dynamic segment frame may vary from cycle to cycle. Finally, the payload lengths of a specific dynamic segment frame may be different on each configured channel. All dynamic segment frames, however, shall have 0≦fPayloadLength≦cPayloadLengthMax.

The Payload Length field shall be transmitted such that the most significant bit of fPayloadLength is transmitted first with the remaining bits of fPayloadLength being transmitted in decreasing order of significance.

Header CRC (11 bits—fHeaderCRC)

The Header CRC field contains a Cyclic Redundancy Check code (CRC) computed over the Sync Bit, Frame ID, and Payload Length fields of the frame.

The CRC is computed in the same manner on all configured channels. The CRC polynomial shall be $$x^{11}+x^9+x^8+x^7+x^2+1=(x+1)(x^5+x^3+1)(x^5+x^4+x^3+x+1)$$

This 11 bit CRC polynomial generates a (31,20) BCH code that has a minimum Hamming distance of 6. The codeword consists of the data to be protected and the CRC. In this application, this CRC protects exactly 20 bits of data (1 bit sync+12 bits frame ID+7 bits payload length=20 bits). This polynomial was obtained from T. Wadayama, *Average Distortion of Some Cyclic Codes*, web site available at http://vega.c.oka-pu.jp/~wadayama/distortion.html, and its properties were verified using the techniques described in P. Koopman, "32-bit Cyclic Redundancy Codes for Internet Applications," *Proceedings of the International Conference on Dependable Systems and Networks* (*DSN* 2002), Washington D.C., June 2002, pp. 459-468. The initialization vector of the register used to generate the header CRC shall be $(1A)_{HEX}$.

With respect to the computation of fHeaderCRC, the Sync Bit, the Frame ID and the Payload Length fields shall be fed into the CRC generator in network order, specifically the Sync Bit shall be shifted in first, followed by the most significant bit of the Frame ID field, followed by subsequent bits of the Frame ID, followed by the most significant bit of the Payload Length field, and followed by subsequent bits of the Payload Length field.

The Header CRC field shall be transmitted such that the most significant bit of fHeaderCRC is transmitted first with the remaining bits of fHeaderCRC being transmitted in decreasing order of significance.

A detailed description of how to generate or verify the Header CRC is given further on.

Cycle Counter (6 bits—fCycleCount)

The Cycle Counter field indicates the transmitting node's view of the cycle counter vCycle at the time of frame transmission.

The Cycle Counter field shall be set to fCycleCount=vCycle before transmitting a frame.

The Cycle Counter field shall be transmitted such that the most significant bit of fCycleCount is transmitted first with the remaining bits of fCycleCount being transmitted in decreasing order of significance.

FlexRay Payload Segment

The FlexRay payload segment contains 0 to 254 bytes (0 to 127 two-byte-words) of data written by the host.

Because of the limitations imposed on the representation of the length of the payload segment by the Payload Length field (fPayloadLength) of the header segment, the FlexRay Payload Segment shall consist of an even number of bytes. (The length of the payload segment indicated by fPayloadLength correlates with the number of bytes that are sent on the communication channel. It does not necessarily define the number of bytes used by the application in the payload section. The data provided by the application may be shorter than the payload section. A padding function in the communication controller fills the "missing" bytes if the configured transmit buffer is smaller than the configured payload length.)

Note that the frame CRC described below has a Hamming distance of six for payload lengths up to 248 bytes. For payload lengths greater than 248 bytes the CRC only provides a Hamming distance of four.

The first two bytes of the FlexRay payload segment may optionally be used as a message ID field, allowing receiving nodes to filter or steer data based on the contents of this field.

The subsequent bytes of the payload segment may optionally be used as network management vector. The length of the network management vector is configured by gNetworkManagementVectorLength during CC_SoftReset and cannot be changed during the protocol startup phase (PSP) or during the protocol operation phase (POP). gNetworkManagementVectorLength can be configured between 0 and 12 bytes, inclusive. The network management indication bit in the frame header indicates whether the payload section contains the network management vector (Frames that contain network management data are not restricted to containing only network management data—the other bytes in the payload section may be used to convey additional, non-Network Management data.).

If the optional message ID field is not used the network management vector (if present) starts with the first byte of the payload section.

The individual bytes within the Payload Segment shall be transmitted such that the most significant bit of the byte is transmitted first with the remaining bits of the byte being transmitted in decreasing order of significance.

FlexRay Trailer Segment

The FlexRay trailer segment contains a single field, a 24-bit CRC for the frame.

Frame CRC (24 bits—fFrameCRC)

The Frame CRC field contains a Cyclic Redundancy Check code (CRC) computed over the Header and Payload segments of the frame. The computation includes all fields in these segments (This includes the header CRC, as well as any Communication Controller-generated "padding" bytes that may be included in the Payload segment.).

The CRC is computed using the same generator polynomial on both channels. The CRC polynomial shall be $$x^{24}+x^{22}+x^{20}+x^{19}+x^{18}+x^{16}+x^{14}+x^{13}+x^{11}+x^{10}+x^{8}+x^{7}+x^{6}+x^{3}+x+1 \mathbf{32} \ (x+1)^{2}(x^{11}+x^{9}+x^{8}+x^{7}+x^{5}+x^{3}+x^{2}+x+1)(x^{11}+x^{9}+x^{8}+x^{7}+x^{6}+x^{3}+1)$$

This 24-bit CRC polynomial generates a code that has a minimum Hamming distance of 6 for codewords up to 2048 bits in length and a minimum Hamming distance of 4 for codewords up to 4094 bits in length. The codeword consists of all frame data and the CRC. This corresponds to H=6 protection for FlexRay frames with payload lengths up to 248 bytes and H=4 protection for longer payload lengths. This polynomial was obtained from G. Castagnoli, S. Bräuer, and M. Herrmann, "Optimization of Cyclic Redundancy-Check Codes with 24 and 32 Parity Bits," *IEEE Trans. Commun.*, vol. 41, pp. 883-892, June 1993., and its properties were verified using the techniques described in P. Koopman, "32-bit Cyclic Redundancy Codes for Internet Applications," *Proceedings of the International Conference on Dependable Systems and Networks* (*DSN* 2002), Washington D.C., June 2002, pp. 459-468.

The generation process of the CRC differs slightly depending on which channel the frame is being transmitted (Different initialization vectors are defined to prevent a node from communicating if it has crossed channels, connection of a single channel node to the wrong channel, or shorted channels (both controller channels connected to the same physical channel).):

The initialization vector of the CRC generator shall be (FE DC BA)$_{HEX}$ for frames sent on channel A.

The initialization vector of the CRC generator shall be (AB CD EF)$_{HEX}$ for frames sent on channel B.

With respect to the computation of fFrameCRC, the frame fields shall be fed into the CRC generator in network order (that is, the first thing into the generator is the most significant bit of the Reserved Bit field, and the last thing into the generator is the least significant bit of the last byte of the Payload Segment).

The Frame CRC field shall be transmitted such that the most significant bit of fFrameCRC is transmitted first with the remaining bits of fFrameCRC being transmitted in decreasing order of significance.

A detailed description of how to generate or verify the Frame CRC is given further on.

Null Frames

Under certain conditions a transmitting node may send a "null frame" which is a frame that contains no valid data in the payload segment. Such a frame is sent when a transmitter is configured to send in a given slot and channel of the static segment but is not in possession of valid data at the time when transmission of that slot is scheduled to begin. This could be caused by the host locking a transmit buffer and not releasing it before transmission time, or by a transmitter being configured for cycle counter filtering (see further on) and the current cycle counter does not match the filter. Additionally, a transmitting controller may indicate a null frame if the host has not successfully updated the data since the last scheduled transmission. This behavior is optional (see further on). The transmitter indicates a null frame by setting fNullFrameIndicationBit=1.

A Null Frame consists of

A header segment as described above, which has fNullFrameIndicationBit=1

A payload segment with all bits set to zero

A trailer segment as described above.

Null frames shall only be sent in the static segment, hence the payload length is defined by gPayloadLengthStatic.

The payload segment of a Null Frame shall be ignored by the receiver (The receiver uses the data in the Payload Segment for the Frame CRC checking process, but otherwise ignores the data.) but other fields of the frame may contain useful data (For example, the clock synchronization algorithm may make use of the arrival time of null frames with the Sync Bit field set to 1 (provided all other criteria for that frame's acceptance are met).).

byteflight Frame Format

Figure 35:
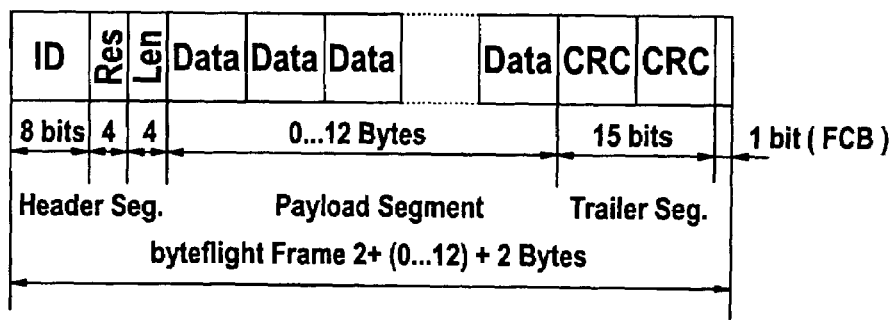
FIG. 35 illustrates an overview of a byteflight frame format.

An overview of the byteflight frame format is given in FIG. 35. The frame shall be transmitted on the network such that the header segment appears first, followed by the payload segment, and then followed by the trailer segment, which is transmitted last.

byteflight Header Segment

The byteflight header segment consists of 2 bytes that contain several distinct fields; the Frame ID, a field of reserved bits, and the frame length. These fields are described in detail in the following sections.

Within the header segment the fields shall be transmitted in the order indicated in FIG. 35, moving from left to right (i.e., the Frame ID field is transmitted first and the Frame Length field is transmitted last).

Frame ID (8 bits—fBfFrameID)

This field contains the Frame Identifier for the frame. Each frame that may be transmitted in a cluster has a frame ID fBfFrameID assigned.

The frame ID fBfFrameID is a unique number per communication cycle and defines the minislot in which the frame is transmitted.

Valid values for fBfFrameID range from $(0000\ 0001)_2$ to $(1111\ 1111)_2$.

The Frame ID field shall be transmitted such that the most significant bit of fBfFrameID is transmitted first with the remaining bits of fBfFrameID being transmitted in decreasing order of significance.

Special Application Bits (4 bits—fBfSpecialApplBits)

This field consists of four bits that may are used by the application.

The fBfSpecialApplBits field shall be transmitted such that the most significant bit of fBfSpecialApplBits is transmitted first with the remaining bits of fBfSpecialApplBits being transmitted in decreasing order of significance.

The fBfSpecialApplBits field in the transmitting node is written by the host (The four special application bits are written by the host of the transmitting node. The communication controllers on all nodes (transmitter and receiver) treat these bits as application data.).

Frame Length (4 bits—fBfFrameLength)

The Frame Length consists of a single parameter, fBfFrameLength, which indicates the number of data bytes that are contained in the payload segment of the frame.

The frame length field does not include the number of bytes within the header and the trailer segment of the byteflight frame.

The shortest possible length is 0 bytes (fBfFrameLength= $(0000)_2$), the longest length is 12 bytes (fBfFrameLength= $(1100)_2$). A frame which is received with fBfFrameLength greater than 12 shall be treated as an error.

The Frame Length field shall be transmitted such that the most significant bit of fBfFrameLength is transmitted first with the remaining bits of fBfFrameLength being transmitted in decreasing order of significance.

byteflight Payload Segment

The byteflight payload segment consists of 0 to 12 bytes of data written by the host.

The individual bytes within the Payload Segment shall be transmitted such that the most significant bit of the byte is transmitted first with the remaining bits of the byte being transmitted in decreasing order of significance.

byteflight Trailer Segment

The byteflight trailer segment consists of 2 bytes that contain two distinct fields; a Frame CRC and the Frame Completion Bit. These fields are described in detail in the following sections.

Within the trailer segment the fields shall be transmitted in the order indicated in FIG. 35, moving from left to right (i.e., the Frame CRC field is transmitted first and the Frame Completion Bit is transmitted last).

Frame CRC (15 bits—fBfFrameCRC)

The Frame CRC field contains a Cyclic Redundancy Check code (CRC) computed over the Header and Payload segments of the frame. The computation includes all fields in these segments.

The CRC generator polynomial shall be $$x^{15}+x^{14}+x^{10}+x^8+x^7+x^4+x^3+1$$

This is the same polynomial as used in the CAN protocol as defined in ISO/DIS 11898-1:1999, *Road vehicles—Controller area network (CAN)—Part* 1: *Data Link Layer and Physical Signaling*, International Standards Organization, 1999. It is optimized for code words of up to 127 bits.

The initialization vector of the byteflight Frame CRC shall be $(00)_{Hex}$.

With respect to the computation of fBfFrameCRC, the frame fields shall be fed into the CRC generator in network order (that is, the first thing into the generator is the most significant bit of the Frame ID field, and the last thing into the generator is the least significant bit of the last byte of the Payload Segment).

The Frame CRC field shall be transmitted such that the most significant bit of fBfFrameCRC is transmitted first with the remaining bits of fBfFrameCRC being transmitted in decreasing order of significance.

A detailed description of how to generate or verify the Frame CRC is given below.

Frame Completion Bit (1 bit—fBfFCB)

The Frame Completion Bit, fBfFCB, is a single bit whose sole purpose is to allow the byteflight frame to end on a byte boundary.

The Frame Completion Bit field shall be transmitted with fBfFCB=0.

Dependencies

Message ID (Optional, 16 bits—fMessageID)

The first two bytes of the payload segment of the FlexRay frame format can be used as receiver filterable data called Message ID.

The Message ID is an application determinable number that describes the contents of the data segment.

The Message ID is 16 bits long.

At the transmitter the Message ID is written by the host as application data. The communication controller has no knowledge about the message ID and no mechanism inside the communication controller is based on the message ID.

At the receiver the storage of a frame may depend on the result of a filtering process that makes use of the Message ID. All frame checks done in Frame Processing (see further on) are unmodified (i.e., are not a function of the Message ID). The use of the Message ID filter is defined in the Host Interface chapter (see further on).

The optional use of Message IDs must be consistent in all frames in the whole cluster (Consistency means that a Message ID is used for ALL frames (both static and dynamic) in a cluster or it is not used for ANY frame. Partial use of the Message ID is not possible.).

If this mechanism is used, the most significant bit of fMessageID shall be placed in the most significant bit of the first byte of the payload segment. Subsequent bits of fMessageID shall be placed in the next payload bits in order of decreasing significance.

Frame CRC Calculation

The Frame CRC calculation is done inside the communication controller before transmission or after reception of a frame. It is part of the frame transmission process or the frame reception process, respectively.

The variable vCheckCRC_x denotes the result of the check of the consistency of a frame and its CRC for the respective communication channel. The calculation may be described by the following pseudocode.

The values of the protocol constants cCrcSize, cCrcInit_x, and cCrcPolynomial depend on the frame format used, i.e. the FlexRay or byteflight frame format. For the FlexRay frame format the value of cCrcInit_x also depends on the channel that is used to transmit the frame:

Procedure 1: Frame CRC Calculation

```
// Initialize the CRC register
vCrcReg_x(cCrcSize - 1 : 0) = cCrcInit_x;
while(vNextBit_x)
    // determine if the CRC polynomial has to be applied by taking
    // the exclusive OR of the most significant bit of the CRC
    // register and the next bit to be fed into the register
    vCrcNext_x = vNextBit_x EXOR vCrcReg_x(cCrcSize - 1);
    // Shift the CRC register left by one bit
    vCrcReg_x (cCrcSize - 1 : 1) = vCrcReg_x(cCRCSize - 2 : 0);
    vCrcReg_x(0) = 0;
    // Apply the CRC polynomial if necessary
    if vCrcNext_x
        vCrcReg_x(cCrcSize - 1:0) = (vCrcReg_x(cCrcSize - 1 : 0)
        EXOR
        cCrcPolynomial;
    end;                                // end if
end;                                    // end while loop
```

The following comparison is only done in the receiver.

```
// compare fFrameCRC_x (frame CRC received on channel x) with CRC
// register content
if (vCrcReg_x == fFrameCRC_x)
    vCheckCRC_x = "T";
else
    vCheckCRC_x = "F";
end;
```

FlexRay frame format / channel A:

| | |
|---|---|
| cCrcSize = 24; | // size of the register is 24 bits |
| cCrcInit = (FE DC BA)$_{HEX}$; | // initialization vector of channel A |
| cCrcPolynomial = (5D 6D CB)$_{HEX}$; | // hexadecimal representation of the CRC polynomial |

FlexRay frame f rmat / channel A:

| | |
|---|---|
| cCrcSize = 24; | // size of the register is 24 bits |
| cCrcInit = (AB CD EF)$_{HEX}$; | // initialization vector of channel B |
| cCrcPolynomial = (5D 6D CB)$_{HEX}$; | // hexadecimal representation of the CRC polynomial | byteflight frame format:

| | |
|---|---|
| cCrcSize = 15; | // size of the register is 15 bits |
| cCrcInit = 0$_{HEX}$; | // initialization vector |
| cCrcPolynomial = (45 99)$_{HEX}$; | // hexadecimal representation of the CRC polynomial |

Short Description: Initialize the CRC shift register with the appropriate initialization value. As long as bits (vNextBit_x) from the header or payload segment of the frame are available the while-loop is executed. The number of bits available in the payload segment is derived from the payload length field. The bits (Transmitters use the bit sequence that will be fed into the coding algorithm, including any controller generated padding bits. Receivers use the decoded sequence as received from the decoding algorithm (i.e., after the removal of any coding sequences (e.g. Byte Start Sequences, Frame Start Sequences, etc.)).) of the header and payload segments are fed into the CRC register by using the variable vNextBit_x, bit by bit, in network order, e.g., for the FlexRay frame format the first bit used as vNextBit_x is the Reserved Bit field, and the last bit used is the least significant bit of the last byte of the Payload Segment.

Header CRC Calculation

Among its other uses, the Header CRC field of a FlexRay frame is intended to provide protection against improper modification of the Sync Bit field by a faulty communication controller (CC). The CC that is responsible for transmitting a particular frame shall not compute the Header CRC field for that frame. Rather, the CC shall be configured with the appropriate Header CRC for a given frame by the host. This makes it unlikely that a fault in the CC that causes the value of a Sync Bit to change would result in a frame that is accepted by other nodes in the network because the CRC would not match. Removing the capability of the transmitter to generate the CRC minimizes the possibility that a message that results from a CC fault would have a proper header CRC.

The CC that is responsible for the reception of a frame shall perform the CRC computations required to check the correctness of the Header CRC field relative to the other information that is received in the frame.

The variable vCheckHeaderCRC_x denotes the result of the check for the respective communication channel. The check may be described by the following pseudocode.

The value of the protocol constants cHCrcSize, cHCrcInit, and cHCrcPolynomial are defined as follows:

| FlexRay header CRC calculation: | |
|---|---|
| cHCrcSize = 11; | // size of the register is 11 bits |
| cHCrcInit := (1A)$_{HEX}$; | // initialization vector of Header CRC for both channels |
| cHCrcPolynomial := (3 85)$_{HEX}$; | // hexadecimal representation of the Header CRC polynomial |

Short description: Initialize the CRC shift register with the appropriate initialization value. As long as bits (vHNextBit_x) from the Sync Bit, Frame ID and Payload Length fields of the frame are available the while-loop is executed. The number of bits available is fixed (at 20) by to the frame format definition. The bits of the indicated fields are fed into the CRC register by using the variable vHNextBit_x, bit by bit, in network order, i.e., the Sync Bit followed by the most significant bit of the Frame ID field followed by subsequent bits of the Frame ID, followed by the most significant bit of the Payload Length field, and followed by subsequent bits of the Payload Length field. Transmitters use the bit sequence that will be fed into the coding algorithm. Receivers use the decoded sequence as received from the decoding algorithm (i.e., after the removal of any coding sequences, etc.).

The same procedure is used as described in Procedure 1 except starting with:

vNextBit_x=vHNextBit_x;
cCrcSize=cHCrcSize;
cCrcInit=cHCrcInit;
cCrcPolynomial=cHCrcPolynomial;

The following comparison is only done in the receiver:

```
if (vCrcReg_x == fHeaderCRC_x)        // compare fHeaderCRC_x
                                       (Header CRC received on
    vCheckHeaderCRC_x = "T";           // channel x) with Header
                                       CRC register content
else
    vCheckHeaderCRC_x = "F";
end;
```

The following covers the frame processing, and in particular frame reception procedure of the FlexRay protocol.

Overview

The protocol engine related frame processing consists of three steps: The first step is called frame decoding. In this step frame decoding takes place. Frame decoding shall occur according to the decoding rules specified above. The next step is called the frame reception. In this step the syntactical correctness of the frame is assured. The last step is called frame acceptance. In this step the protocol specific data that is contained in the header of each frame such as the cycle count is checked against reference values.

Frame Reception

Frame reception specifies how the syntactical correctness of a frame is established.

Syntactical Correctness

In general a frame is considered syntactically correct if no coding violations are detected during the reception of the frame, the header CRC is valid, the frame CRC is valid, and the number of bytes received corresponds to the frame length that is contained in the frame header.

Thus a frame shall be considered as syntactically correct when all of the following conditions are met:
1. Beginning with the start of the reception the five frame header bytes are received without a coding error. The violation of this condition is considered to be a header-coding error (S_HeaderCodingError).
2. The header CRC verification according to the CRC calculation procedure returned with the result 'valid'. The violation of this condition is considered to be an invalid-header-CRC error (S_InvalidHeaderCRCError).
3. The remaining (2*fPayloadLength+3) bytes of the frame are received without a coding error using the fPayloadLength value extracted from the header of the frame. The violation of this condition is considered to be a frame-coding error (S_FrameCodingError).
4. The frame CRC verification according to the CRC calculation procedure returned with the result 'valid'. The violation of this condition is considered to be an invalid-frame-CRC error (S_InvalidFrameCRCError).
5. The frame end is reached without a coding error. The violation of this condition is considered to be a frame-coding error (S_FrameCodingError).
6. The node does not initiate an own transmission while reception is ongoing on the same channel. The violation of this condition is considered to be a transmission-conflict error (S_TransmissionConflictError).

The error-free reception of five frame header bytes, i.e. condition 1 of a syntactically correct frame is met, is considered to be a successful-header reception (S_SuccessfulHeaderReception).

A syntactically correct frame is considered to be a correct frame (S_CorrectFrame).

Frame Reception State Diagram

Figure 36:
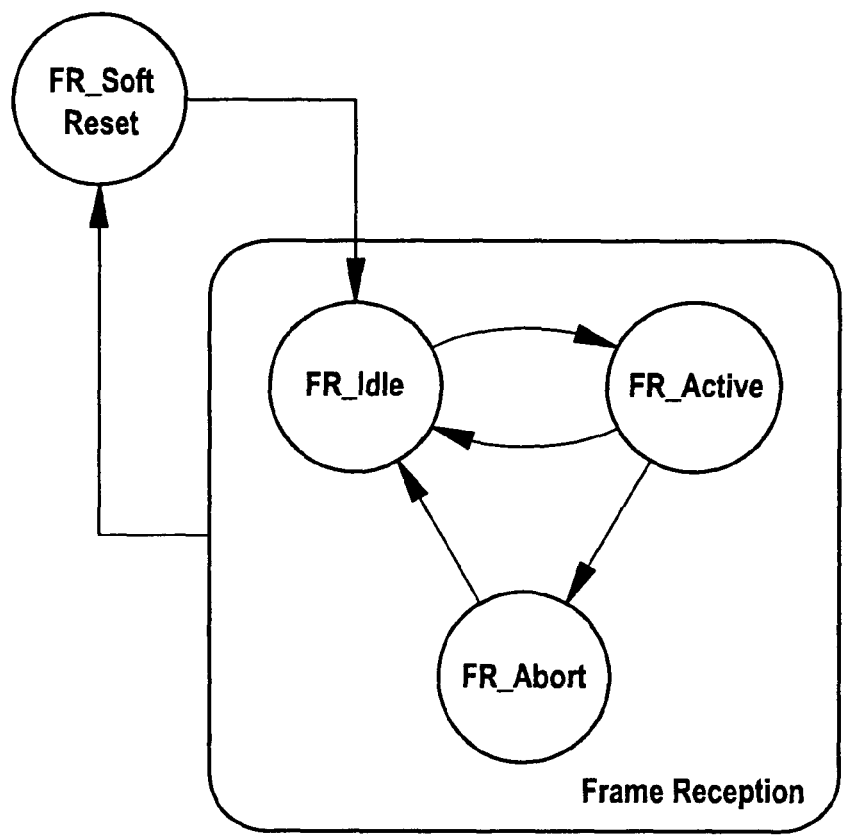
FIG. 36 illustrates a frame reception state diagram.

FIG. 36 shows the frame reception state diagram. The transitions are summarized in Table 8.

TABLE 8

Frame Reception State Transitions

| Transition Direction | | | Action taken |
|---|---|---|---|
| from | to | Condition for Transition | on Transition |
| FR_Idle | FR_Active | Transition of the channel state from channel idle to channel active | |

TABLE 8-continued

Frame Reception State Transitions

| Transition Direction | | Condition for Transition | Action taken on Transition |
|---|---|---|---|
| from | to | | |
| FR_Active | FR_Idle | Transition of the channel state from channel active to channel idle. In this case a syntactically correct frame was received. | |
| FR_Active | FR_Abort | header-coding error detected OR invalid-header-CRC error detected OR frame-coding error detected OR invalid-frame-CRC error detected | |
| FR_Abort | FR_Idle | Transition of the channel state from channel active to channel idle | |
| FR_Soft Reset | FR_Idle | Soft reset released AND channel is in the channel idle state | |
| All states | FR_Soft Reset | Soft reset initiated | |

FR_Idle State

The reception state machine shall remain in the FR_Idle state as long as the channel is idle. In this state the node waits for the start of a reception, which occurs once the channel becomes active. The start of a reception shall cause a transition to the FR_Active state.

FR_Active State

Frame reception occurs in the FR_Active state. Hereby the syntactical correctness of a frame shall be established. The occurrence of a S_HeaderCodingError, S_InvalidHeaderCRCError, S_FrameCodingError, S_InvalidFrameCRCError shall cause a transition to the FR_Abort state.

The detection of idle at the end of a syntactically correct frame shall cause a transition to the FR_Idle state.

FR_Abort State

The reception state machine shall remain in the FR_Abort state until the channel idle state is reached on the respective channel. Once the channel idle state is reached the reception state shall change to FR_Ready.

FR_SoftReset State

The reception state machine shall remain in the FR_SoftReset state as long as the communication controller is in the CC_SoftReset state and the respective communication channel is not in the idle state.

Frame Acceptance

Frame acceptance differs depending on the current protocol phase. Whether a frame is accepted in a specific phase or not depends on the outcome of a number of checks.

FlexRay distinguishes between the startup acceptance criteria, the static segment acceptance criteria and the dynamic segment acceptance criteria.

Startup Acceptance Criteria

The startup acceptance criteria are applied when the node is in the integration path of the startup phase.

Thus a frame shall be considered compliant with the startup acceptance criteria when all of the following conditions are met that are applied to a correct frame:

1. The frame ID included in the header of the frame is not larger than the number of the last static slot gNumberOfStaticSlots.
2. The sync bit is set.
3. The payload length included in the header of the frame is equal to the globally configured value of the payload length of a static frame held in gPayloadLengthStatic. The violation of this constraint is considered to be a payload-length-static error (S_PayloadLengthStaticError).

A frame that complies with the startup acceptance criteria is considered to be a valid-startup frame (S_ValidStartupFrame).

If the cycle count value included in the header of a valid-startup frame is even then the frame is considered to be a valid-even-startup frame (S_ValidEvenStartupFrame).

If the cycle count value included in the header of a valid-startup frame is odd then the frame is considered to be a valid-odd-startup frame (S_ValidOddStartupFrame).

Static Segment Acceptance Criteria

The static segment acceptance criteria are applied when the node is operating in the static segment prior to having the schedule in place.

Figure 37:
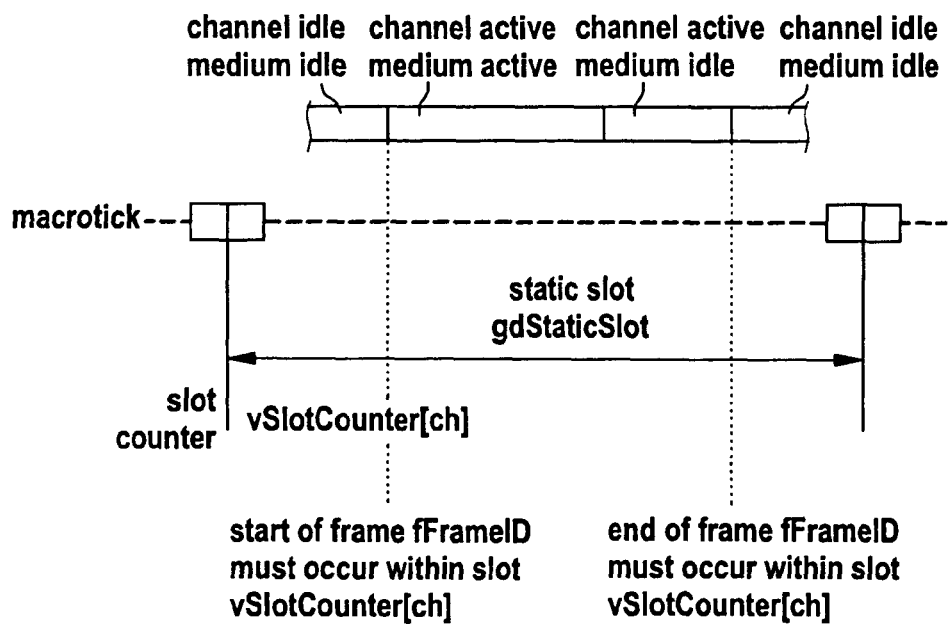
FIG. 37 illustrates a frame acceptance timing in a static segment of a communication cycle.

A frame shall be considered compliant with the static segment acceptance criteria when all of the following conditions are met that are applied to a correct frame:

1. The payload length included in the header of the frame is equal to the globally configured value of the payload length of a static frame held in gPayloadLengthStatic. The violation of this constraint is considered to be a payload-length-static error (S_PayloadLengthStaticError).
2. The frame ID included in the header of the frame is equal to the value of the slot counter vSlotCounter[ch] both at the start of the frame as well as at the end of the frame. The violation of this constraint is considered to be a frame-ID error (S_FrameIDError). FIG. 37 illustrates this constraint.
3. The cycle count included in the header of the frame is equal to the value of the cycle counter vCycle both at the start of the frame as well as at the end of the frame. The violation of this constraint is considered to be a cycle-count error (S_CycleCountError).

A frame that complies with the static segment acceptance criteria is considered to be a valid-static frame (S_ValidStaticFrame).

Dynamic Segment Acceptance Criteria

The dynamic segment acceptance criteria are applied when the node is operating in the dynamic segment.

Figure 38:
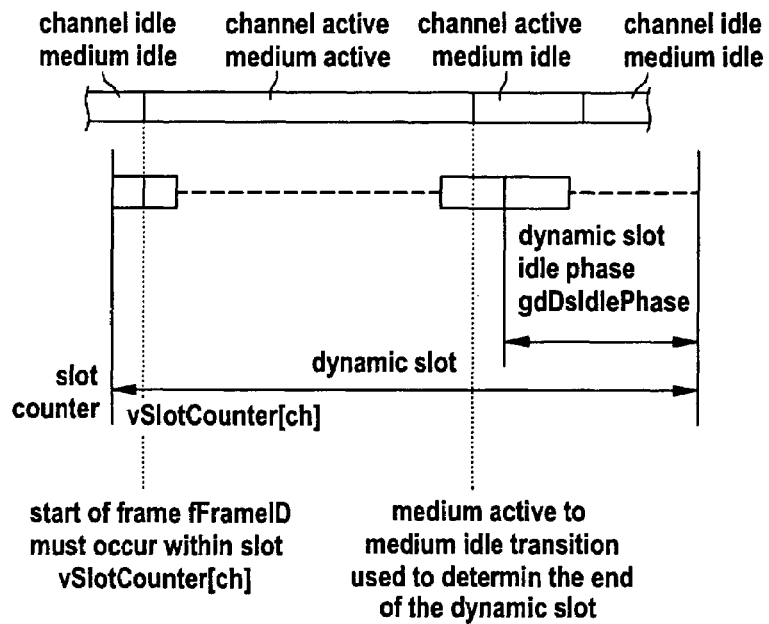
FIG. 38 illustrates a frame acceptance timing in a dynamic segment of a communication cycle.

A frame shall be considered compliant with the dynamic segment acceptance criteria when all of the following conditions are met that are applied to a correct frame:

1. The frame ID included in the header of the frame is equal to the value of the slot counter vSlotCounter[ch] at the start of the frame. The violation of this constraint is called a frame-ID error (S_FrameIDError). FIG. 38 illustrates this requirement.
2. The cycle count included in the header of the frame is equal to the value of the cycle counter vCycle both at the start of the frame as well as at the end of the frame. The violation of this constraint is considered to be a cycle-count error (S_CycleCountError).
3. The sync bit included in the header is set to '0'. The violation of this constraint is considered to be a sync-bit error (S_SyncBitError).

A frame that complies with the dynamic segment acceptance criteria is considered to be a valid-dynamic frame (S_ValidDynamicFrame).

Clock Synchronization

Introduction

In a distributed communication system every node has its own clock. Due to temperature fluctuations, voltage fluctuations, and production tolerances of the timing source (e.g. oscillator), the internal time base diverges between the nodes after a short time, even if all internal time bases of the nodes are started concurrently.

A basic assumption for a time-triggered system is that every node in the cluster has practically the same view of time and this common global view of time is used as the local time base for each node. In this context, "the same" means that the differences between any two nodes' views of the global time are bounded to a specified tolerance limit and that the maximum value for this difference is known as the precision.

The primary task of the clock synchronization function is to ensure the time differences between the nodes of a cluster stay within the precision.

Two types of time differences between nodes can be distinguished:
  Offset (phase) differences and
  Rate (frequency) differences To synchronize the local time base of different nodes, methods are known for offset correction and for rate correction. In FlexRay a combination of both methods is used.

Clock Synchronization Modes

FlexRay supports both time-triggered and event-triggered clock synchronization. This chapter describes the time-triggered modes. Further on it is described how the event-triggered mode works. The appropriate clock synchronization mode should be chosen based upon the requirements of the applications to be supported by the cluster. The cluster must then be configured accordingly. Table 9 illustrates the cluster configuration conditions for the various clock synchronization modes.

FlexRay supports two modes for performing time-triggered clock synchronization.

TABLE 9

Configuration Rules for Various Clock Synchronization Modes

| | Operation Mode: | | |
|---|---|---|---|
| | FlexRay | | byteflight |
| Synchronization mode: | Multi-Master, distributed clock sync | Single-Master, with rate correction | Single-Master, without rate correction |
| Number of Sync Nodes: | [2 . . . 16] | 1 | 1 |
| Number of Static Slots: | ≧ number of sync masters | ≧1 | 0 |
| Number of Sync Frames: | = number of sync nodes | 1 | 0 |
| Number of Cold Starters | at least one | exactly one | exactly one |

Single-Master Clock Synchronization

With Single Master Clock Synchronization, each node individually synchronizes itself to the cluster by observing the timing of transmitted sync frames from the clock sync master.

Single-master clock synchronization shall be performed if the static segment is configured with only one static slot (gNumberOfStaticSlots=1).

The node that owns the static slot must transmit sync frames in this slot in every cycle. This node is the only node in the cluster that transmits sync frames. It is the clock synchronization master and the remaining nodes are slaves.

All other nodes shall receive the sync frames and perform the clock synchronization algorithm as if the node were in a cluster using distributed clock synchronization (see below).

The behavior in case of a fault is described further on. The conditions to signal an fault are different for the master and for the salves and they are listed in Table 10 below.

Distributed Clock Synchronization

With Distributed Clock Synchronization, each node individually synchronizes itself to the cluster by observing the timing of transmitted sync frames from other nodes. A fault-tolerant algorithm is used.

Distributed clock synchronization shall only be performed if the cluster is configured with a static segment (gNumberOfStaticSlots>1).

At least two nodes shall transmit sync frames.

The time representation and the principles of the (distributed) clock synchronization are described in detail below.

Differences Between Distributed and Single Master Clock Synchronization

In both modes (single-master and distributed clock synchronization) the same clock synchronization algorithm is used. Differences between both modes exist in the configuration (see Table 6),
in the start-up (see further on) and
signaling of a fault to the error management.

The following tables list the relevant differences for the error signaling.

TABLE 10

Differences in the Error Signaling Between Distributed and Single Master Clock Synchronization

| Synchronization mode: | | Multi-Master, distributed clock sync | Single-Master, with rate correction |
|---|---|---|---|
| Missing Rate Correction Signal (MRCS) set to 1 | master | no sync frame pair in an even/odd double cycle | never |
| | slave | | no sync frame pair in an even/odd double cycle |
| Missing Offset Correction Signal (MOCS) set to 1 | master | no sync frame in odd cycle | never |
| | slave | | no sync frame in odd cycle |
| Clock Correction Limit Reached (CCLR) set to 1 | master | calculated offset or rate correction value outside the specified limits | never |
| | slave | | calculated offset or rate correction value outside the specified limits |

Time Representation

Local Time Representation

Internally, nodes can time their behavior with microtick resolution. Microticks are time units derived from the (external) oscillator clock tick, optionally using a prescaler. Microticks are controller-specific units. They may have different durations in different controllers. The precision of a node's local time difference measurements is a microtick.

Local controller time is based on cluster-wide synchronized cycle and macrotick values provided by the distributed clock synchronization mechanism. Finer resolution local timing shall be done using the node-specific microtick. The value vMacrotick.vMicrotick represents the controller local view of time within a given cycle.

vCycle is the (controller-local) cycle number and is increased once every communication round. At any given time all nodes should have the same value for vCycle (except due to imperfect synchronization at cycle boundaries).

Cycle counter values (vCycle) range from zero $(00\ 0000)_2$ to cCycleMax $(11\ 1111)_2$.

Figure 39:
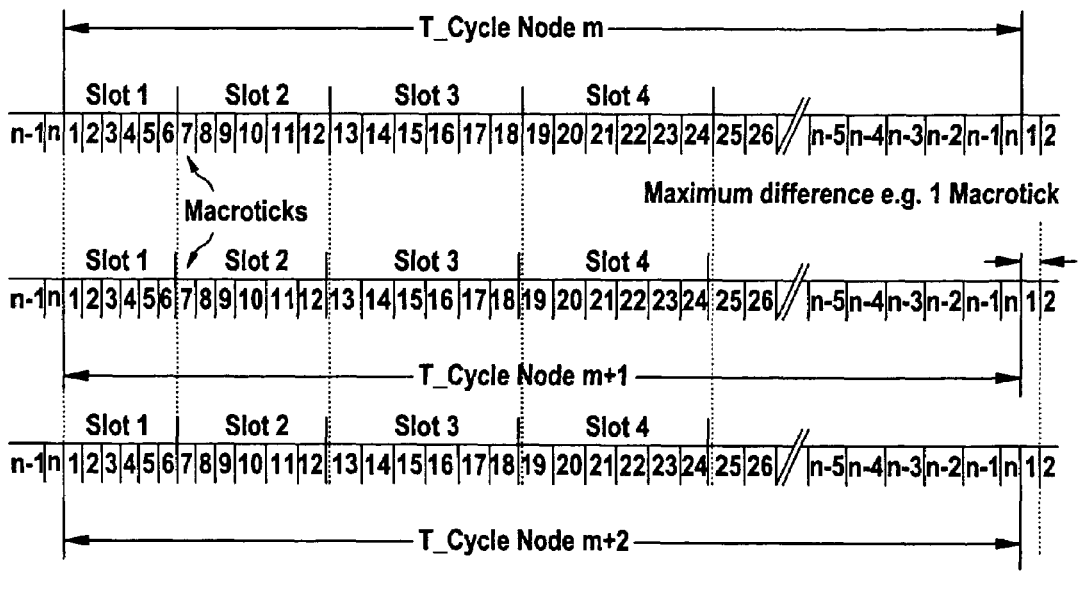
FIG. 39 illustrates a diagram with local timing of three nodes and their relation to each other.

When cCycleMax is reached, the cycle counter vCycle shall be reset to zero $(00\ 0000)_2$ in the next communication cycle (see Procedure 3)

vMacrotick is the current value of the (controller-local) macrotick counter.

gMacroPerCycle defines the (integer) number of macroticks per cycle (see FIG. 39).

Within tolerances, the duration of a macrotick is constant throughout the cluster on synchronized nodes.

Every node in the cluster has its own local view of the global time. The local view of global time is represented by a vector consisting of the current cycle number (vCycle) and the current macrotick value (vMacrotick). The value vCycle.vMacrotick is the (controller-local) view of the global time in the cluster. It is visible to the application.

pMicroPerMacroNom is the (controller-specific) nominal number of microticks per macrotick.

vRateCorrection is the (integer) number of microticks that shall be added to the pMicroPerMacroNom*gMacroPerCycle microticks in the current cycle to produce the correct cycle length. vRateCorrection may be negative. The value of vRateCorrection is determined by the clock synchronization algorithm. It may only change once (usually at the beginning) per cycle.

pMicroOverheadPerCycleNom is the initial configuration value of vRateCorrection.

The duration of the current controller-local macrotick is an integer multiple of controller-local microticks and is represented by vMicroPerMacroCorr. The value of vMicroPerMacroCorr within one controller may change from macrotick to macrotick.

In any given cycle, vRateCorrection microticks shall be distributed across the gMacroPerCycle macroticks comprising the cycle in order to adjust the cycle length to the proper duration. Consequently, vMicroPerMacroCorr does not remain constant. In general, vRateCorrection is nonzero and is not a multiple of gMacroPerCycle. Consequently, the process of distributing the vRateCorrection microticks across the gMacroPerCycle macroticks conceptually introduces fractional macroticks.

At the beginning of the first communication cycle the "local time variables" shall be initialized (see Procedure 2).

Procedure 2: Initialization of a Node

```
[vCycle, vMacrotick, vMicrotick, vMicroPerMacroCorr] =
                                          NodeInitialization( ) //
    vCycle = 0;                    // reset cycle counter
    vMacrotick = 0;                // reset macrotick counter
    vMicrotick = 0;                // reset microtick counter
    vMicroPerMacroCorr =           // set the predefined
    pMicroPerMacroNom;
    vRateCorrection =              // value for
    pMicroOverheadPerCycleNom;
                                   // microticks per macrotick
```

The initialization of the first three values differs if the node reintegrates into a running cluster (see Chapter "Wakeup, Startup and Reintegration").

Procedure 3: Incrementing the Cycle Count

```
[vMacrotick, vCycle] = ChangeOfCycleCount(vMacrotick, vCycle)
    if vMacrotick ≧ gMacroPerCycle    //
        vCycle++;                     // increment cycle counter
        vMacrotick = 0;               // reset macrotick counter
        if vCycle > cCycleMax         //
            vCycle = 0;               // reset cycle counter
        end;                          //
end;                                  //
```

The host shall be able to read the cycle counter and the macrotick counter. The update of the cycle counter shall be atomic with the macrotick counter. An atomic action is an action where no interruptions is possible.

The duration of a Macrotick shall be an integer number of a Microticks, however, the number of microticks per macrotick may differ from macrotick to macrotick. Before the first correction value is calculated the clock synchronization algorithm shall work with nominal macroticks, using vMicroPerMacroCorr=pMicroPerMacroNom+pMicroOverheadPerCycleNom (see Procedure 4).

The number of microticks per nominal macrotick may differ between nodes and depends on the oscillator frequency and the prescaler.

The duration of one cycle shall be an integer number of macroticks. The number of macroticks per cycle is intended to be identical in all nodes in a cluster (see FIG. 39).

Procedure 4: Incrementing the Macrotick Counter

```
[vMicrotick, vMacrotick] = IncrementMacrotickCounter(vMicroPerMacroCorr, vMicrotick,
vMacrotick)
                                                           // uses microtick pulses
        while(1)                                           //
            wait(Microtick_duration);                      // every microtick increase
            vMicrotick++;                                  // microtick counter by one
            if vMicrotick ≧ vMicroPerMacroCorr //
                vMicrotick = 0;                            // Reset microtick counter
                vMacrotick++;                              // Increment macrotick
                                                                                counter
            end;                                           //
        end;                                               //
```

For a given cycle (without offset correction) the average length of a macrotick is given by pMicroPerMacroNom+vRateCorrection/gMacroPerCycle.

Procedure 5: Uniform Distribution of Microticks

The following example only addresses the distribution of microticks over the macroticks comprising the cycle. The more complete solution must also deal with offset corrections and is described in Procedure 10.

```
InitRateStartOfCycle(vRateCorrection)              // execute at beginning of
                                                                              cycle
                                                   // sufficient every second
                                                                              cycle
    vMicroPerCycle = gMacroPerCycle * pMicroPerMacroNom    // total
                                                                  number of microticks
        + vRateCorrection;                         // for this cycle
    vRatioMicroMacro = vMicroPerCycle/gMacroPerCycle;     // real
                                                              division, not integer
    vIntegerRatio = Int[vRatioMicroMacro];         // Integer part of ratio
    vRest = vRatioMicroMacro − vIntegerRatio; // Fractional part of
                                                                              ratio
    vRemainingSumOfFractionalParts = vRest; // Initialization values
    vDeltaCorrect=0;                               // for variables
                                                   //
DistributeMicroOverMacroRate                       //
while(1)                                           //
    vMicroPerMacroRateCorr = vIntegerRatio + vDeltaCorrect;
                                                   // Calculate new MicroPerMacro
    vRemainingSumOfFractionalParts = vRemainingSumOfFractionalParts + vRest;
                                                   // fractional history term
    if vRemainingSumOfFractionalParts ≧ 1          // If sum of fractional
        vDeltaCorrect = 1;                         // parts becomes greater
        vRemainingSumOfFractionalParts = vRemainingSumOfFractionalParts −1;
                                                   // increase macrotick length by 1
    else                                           //
        vDeltaCorrect = 0                          //
        vMicroPerMacroCorr = vMicroPerMacroRateCorr;   // if no offset
                                                                 correction present
    end;                                           //
[vMicrotick, vMacrotick] = IncrementMacrotickCounter(vMicroPerMacroCorr, vMicrotick,
vMacrotick)
```

Notes on the above Procedure:

Offset correction has an additional influence. Therefore there is a difference between the variables vMicroPerMacroCorr and vMicroPerMacroRateCorr.

Since there is no real division available in hardware, the implementation will not precisely replicate the above procedure. Most likely the variable vMicroPerMacroCorr will not be explicitly calculated in hardware.

As is typically true with pseudocode, the above procedure provides insight into the behavior of the mechanism, but not its implementation.

Global Time Representation

In a FlexRay node activities, including communication, shall be based on the concept global time, even though each individual node maintains its own view of it. It is the clock synchronism mechanism that differentiates the FlexRay cluster from other node collections with independent clock mechanisms. The global time is a vector of two values, the cycle ((cycle counter)) and the macrotick counter ((cycle time)).

General Concepts

The node (or nodes in the case of a startup with collisions) that transmits the first CAS during startup, shall initialize the cycle counter and the cycle time to zero at the beginning of the communication cycle following the transmission of the CAS. See above for details.

The duration of a static slot gdSlot, a communication cycle gdCycle, and the idle time at the end of a communication cycle gdNetworkIdle shall be all expressed as an integer number of macroticks.

Each node with pChannels==gChannels that is configured to send in the static segment of the communication cycle may send at most one frame per communication cycle with the sync bit set.

The sync bit may only be set in frames that are transmitted on all channels (gChannels—one or two channel configuration).

Not all nodes that are configured to send in the static segment of the communication cycle need to send frames with the sync field set.

The communication controller shall count all correctly received frames where the sync bit is set. The counter is reset at the start of the communication cycle. This number of the correct received sync frames of the previous communication cycle is presented by vValidSyncFrameCount and shall be accessible to the host.

If a controller receives more than gSyncNodeMax the first gSyncNodeMax shall be used for clock synchronization.

The calculation of the correction values shall take place every second communication cycle during the network idle time (NIT).

Figure 40:
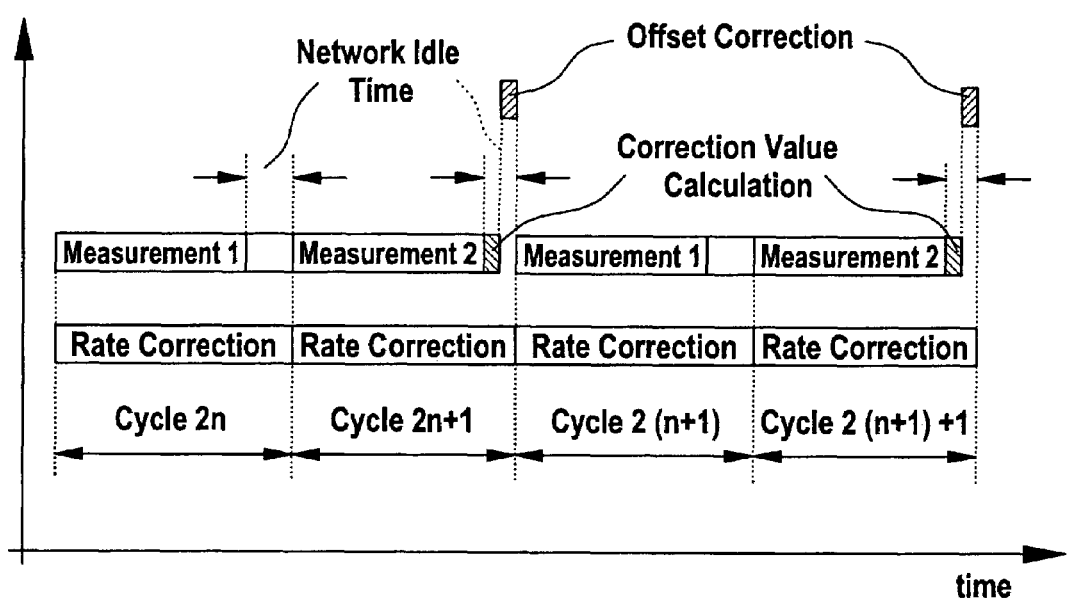
FIG. 40 illustrates a relative execution timing of a clock synchronization mechanism.

The clock synchronization can be realized with four processes called measurement, calculation, offset correction, and rate correction. The offset correction, measurement, and calculation processes are performed sequentially. Rate correction is performed in parallel to the other three. FIG. 40 shows the relative execution timing of these four processes.

Figure 41:
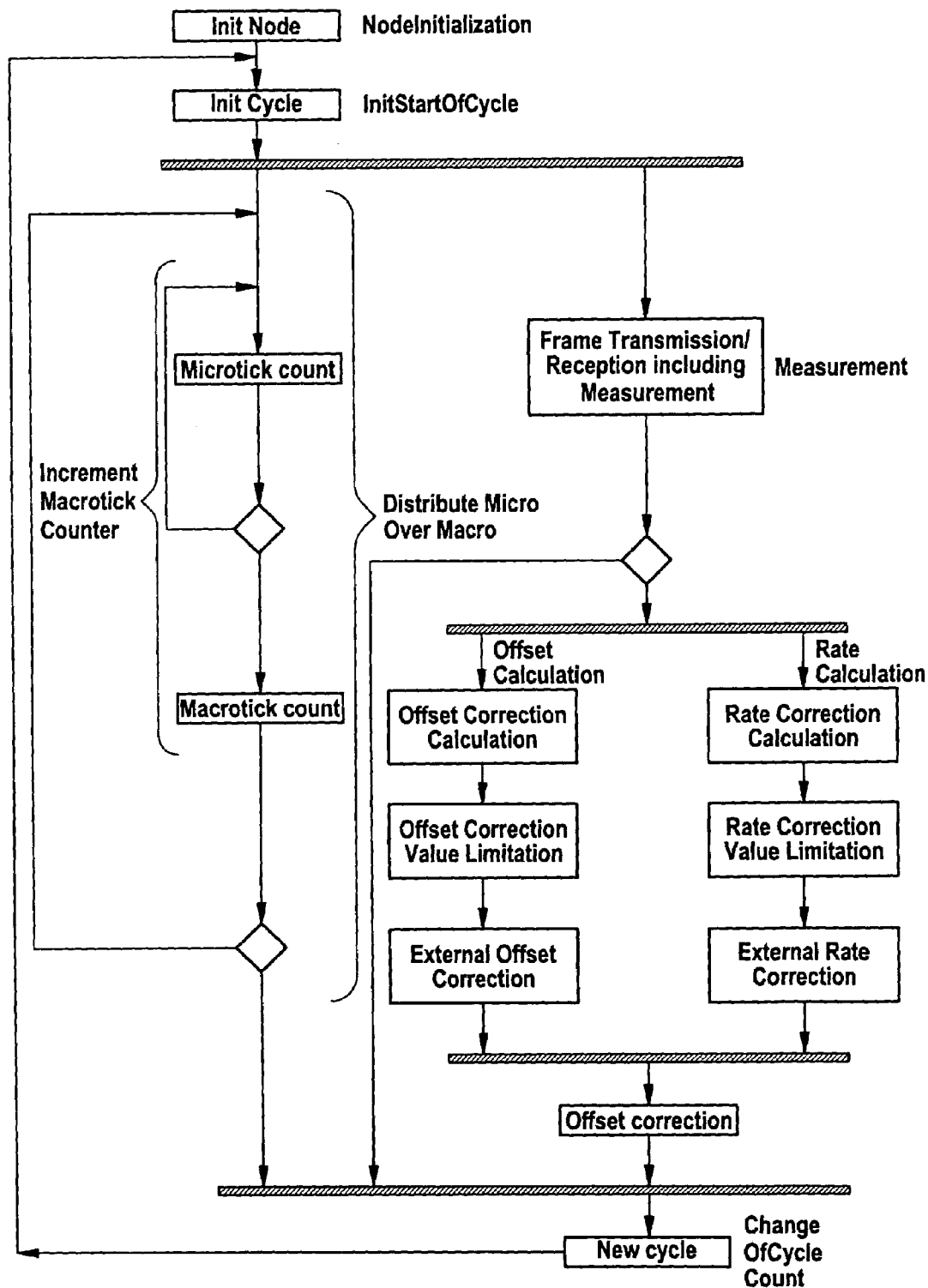
FIG. 41 illustrates a node internal execution of clock synchronization procedures.
Figure 42:
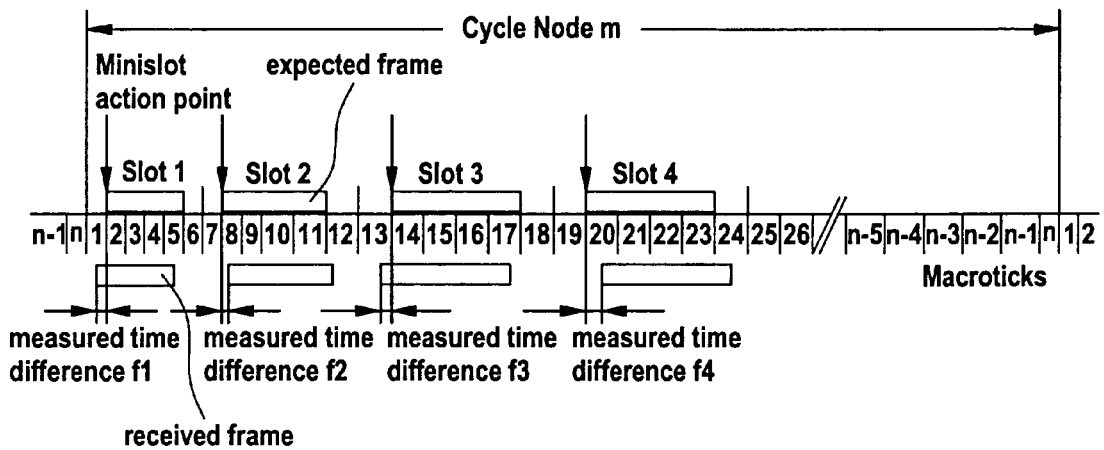
FIG. 42 illustrates a time difference measurement (expected vs. observed arrival times)

FIG. 41 illustrates the internal structure of the clock synchronization mechanism in more in detail. The blocks in the illustration correspond to the pseudocode procedures in this chapter. The black boxes describe the tasks performed and the adjacent blue text gives the corresponding procedure name.

Note: For boxes with no corresponding procedure name (no blue text) there is no procedure that corresponds precisely to the task. Pseudocode fragments for these tasks are interspersed with the text.

Time Measurement

Every node shall measure and store, by channel, the time differences vMeasureChx (in microticks) between the expected and the observed arrival time of all sync frames received during the static segment. Difference observations are marked as invalid until the frame is received completely and has passed the required validity checks.

The expected arrival time of a frame is the Minislot action point of the corresponding slot. It is represented by vExpectedArrivalTime=vMacrotick$_{Expected}$·vMicrotick$_{Expected}$, where vMacrotick$_{Expected}$ and vMicrotick$_{Expected}$ are the macrotick and microtick timer values at the instant of the minislot action point.

The observed arrival time of a frame is the instant of reception of the 1/0-edge in the middle of the first Byte Start Sequence after the Frame Start Sequence. It is represented by vObservedArrivalTimeChx=vMacrotick$_{observed}$,vMicrotick$_{Observed}$, where vMacrotickObserved and vMicrotick$_{Observed}$ are the macrotick and microtick timer values at the instant of reception of this edge.

The time difference between expected and observed arrival time is calculated as follow:

vMeasureChx=vObservedArrivalTimeChx−vExpectedArrivalTime−gdFrameStartSequence−1 gdbit−pDelayCompensationChx The global parameters gdFrameStartSequence and gdBit are specified in units of bit times that can differ between nodes if clock sources with different frequencies are used. Internally these parameters are represented in microticks.

The sync frame validity checks used during startup and reintegration and during normal operation are described in Section "Frame Processing".

The time difference measurement shall be done for all channels p-channels.

If there are time difference measurements from more than one channel for a given sync frame, the smallest value shall be taken.

If only one valid frame is received within a given static slot, this single observation shall be used for the Time Difference Measurement.

Every node has to be able to store measurement values with their associated Frame IDs for gSyncNodeMax sync nodes. A counter vValidSyncFrameCount is increased when a valid sync frame is received. If a node receives more than gSyncNodeMax sync frames in one communication cycle it is communication to the Error Management but uses the first gSyncNodeMax observations for the calculation of the rate and drift correct values. The counter vValidSyncFrameCount is set to zero when a new communication cycle starts.

Note, the Frame Identifiers of sync frames expected to be received are not stored in the configuration of a node.

Individual delay compensation values pDelayCompensationChA and pDelayCompensationChB can be configured for each channel. The compensation values should be set to the minimum propagation delay time experienced by any node in the cluster.

Procedure 6: Measurement

The following procedure shall be executed during normal operation following the reception of each frame in the static segment.

```
[vsMeasureOddList, vsMeasureEvenList] = Measurement(vCycle, vsMeasureOddList,
vsMeasureEvenList);
    if fSyncBit == 1;                              // sync bit in message set
        if messageChA == valid                     // message is valid
            vMeasureChA = vObservedArrivalTimeChA –    // measurement on
                                                               channel A
            vExpectedArrivalTimeChA – gdFrameStartSequence –   // minus
                                                       compensation value
            1 gdBit – pDelayCompensationChA;       //
        else                                       //
            vMeasureChA = 'invalid';               // mark message as invalid
        end;                                       //
        if messageChB == valid                     // message is valid
            vMeasureChB = vObservedArrivalTimeChB –    // measurement on
                                                               channel B
            vExpectedArrivalTimeChB – gdFrameStartSequence –   // minus
                                                       compensation value
            1 gdBit – pDelayCompensationChB;       //
        else                                       //
            vMeasureChB = 'invalid';               // mark message as invalid
        end;                                       //
        if vMeasureChA == 'invalid'                //
            if vMeasureChB == 'invalid'            //
                vMeasureMin = 'invalid';           //
            else                                   //
                vMeasureMin = vMeasureChB;         //
            end;                                   //
        else                                       //
            if vMeasureChB == 'invalid'            //
                vMeasureMin = vMeasureChA;         //
            else                                   //
                vMeasureMin = MIN(vMeasureChA, vMeasureChB); // save the
                                                       minimum value of
                                                   // both
        if vMeasureMin ~= 'invalid'                //
            if MODULO(vCycle, 2) == 1              // separate in odd and even
                                                   // cycles
                vsMeasureOddList = [vsMeasureOddList; [fFrameID, vMeasureMin]];
                                                   // to list
            else                                   // measured value
                vsMeasureEvenList = [vsMeasureEvenList; [fFrameID, vMeasureMin]];
            end;                                   // measured value
        end;                                       //
    end;                                           //
```

Correction Term Calculation

Fault-Tolerant Midpoint Algorithm

Figure 43:
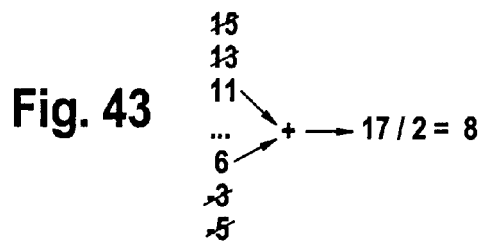
FIG. 43 illustrates an algorithm for clock correction value calculation.

The technique used for the calculation of the correction terms is a fault-tolerant midpoint algorithm (FTA/FTM). The algorithm works as follows (see FIG. 43 and Procedure 7):

1. The measured values are sorted and the n largest and the n smallest values are discarded.
  7. The value of n is adapted dynamically to the number of values in the sorted list.

TABLE 11

FTA/FTM Term Deletion as a Function of List Size

| Number of Values | n |
|---|---|
| 1-2 | 0 |
| 3-7 | 1 |
| 8-16 | 2 |

8. The largest and the smallest of the remaining values are averaged for the calculation of the midpoint value. The resulting value is assumed to represent the node's deviation from the global time base and serves as the correction term (see FIG. 43).

Procedure 7: FTM/FTA Algorithm

```
function: vCorrectValue = Midterm(list);

n = LENGTH(list);          // number of elements in the list if n > 0                   // list = SORT(list);     // order list by values if n < 3               // k=0 vCorrectValue = (list(1) + list(n)) / 2; // choose largest
                                              and smallest value else                   //
            if n < 8           // k=1
                vCorrectValue = (list(2) + list(n-1)) / 2; // choose
                                              second largest and second
            else               // smallest value
                               // k=2
                vCorrectValue = (list(3) + list(n-2)) / 2; // choose
                                              third largest and third smallest value
            end;               //
        end;                   //
    else                       //
        vCorrectValue = 0;     //
    end;                       //
```

If the list contains only one value this value is used for clock synchronization.

Calculation of the Offset Correction Value

1. The Offset Correction Value vOffsetCorrection is a (signed) integer indicating by how many microticks the node should shift its start of the cycle.

2. Offset calculation shall be finished before start of cycle, and it may only start after end of last synchronization slot.

3. The node's own offset value (most likely zero, depending on the measurement principle used) shall be included if it transmits a sync Frame.

4. The calculation of the offset correction value shall be done every communication cycle, but the offset correction shall be only done in the odd numbered cycles. In even numbered cycles no offset correction shall be done.

5. The calculated offset correction value shall be checked against the limit values every cycle. If the calculated offset correction value outside of the allowed range a warning shall be raised to the host (further behavior is specified in the following text).

6. If the node transmits sync frames, its own offset time shall be included by adding one instance of the value zero (depending on measurement method) to the list of measured time difference values from the last cycle.

7. The offset correction value shall be determined by applying the FTA/FTM to the list of measured time differences.

Procedure 8: Offset Correction Value Calculation

```
vOffsetCorrection = OffsetCalculation(vsMeasureOddList)
    list = [ ];                                 // initialize list
    list = vsMeasureOddList(:,2)                // take all measure values without
                                                // frame ID in a list (:,2) = all
                                                // lines, second colum)
    if LENGTH(vsMeasureOddList) == 0 AND SingleMaster == 0  // if no
                                                    sync frame in the odd cycle
        MOCS = 1;                               // was received set the Missing
                                                                            Offset
    else                                        // Correction Signal to 1 for the
                                                                            Error
        MOCS = 0;                               // Signaling otherwise to 0
    end;                                        //
                                                //
    if sync_master == 1 AND ErrorState == 'green' AND OperationState ==
('ColdStartICW' OR 'ColdStartVCW' OR 'NormalOperation')
                                                // if node is a sync master (means the
                                                // node transmits sync messages)
        list = [list, 0];                       // add one zero value to the list
    end;                                        //
    if LENGTH(list) > 0                         // at least one value
        vOffsetCorrection = Midterm(list);      // calculate offset
                                                                    correction term
    else                                        //
        vOffsetCorrection = 0;                  // no offset correction
    end;                                        //
```

Calculation of the Rate Correction Value

1. The calculation of the rate correction value shall be done after every second communication cycle, in the odd numbered cycles (see FIG. 44).
2. The rate correction value shall be determined by comparing the corresponding measured time differences from two successive cycles. Specifically, a new list of values shall be created whose elements are calculated by taking the differences between the most recent cycle's measured time difference and the previous cycle's measured time difference. Only time values corresponding to frames passing the validity checks on both channels shall be used.
3. If the node transmits sync frames its own rate correction influence shall be considered by adding an instance of the value zero to the list of calculated time difference.
4. In the next step the FTA/FTM algorithm described above shall be applied to the list of time difference values built in the previous two steps.
5. After calculating the correction term, the stored measurement values shall be deleted so that the next calculation starts with a new set of values.
6. The ideal new rate correction value is the sum of the value calculated in the previous step and the current correction value.
7. To prevent cluster drift that can result from an accumulation of rounding errors the rate correction term actually used is not the ideal rate correction, but a slight modification of this term towards the configuration value. The modification term is a positive integer pClusterDriftDamping that is part of node's static configuration.

Procedure 9: Rate Correction Value Calculation

```
vRateCorrection = RateCalculation(vsMeasureOddList, vsMeasureEvenList, vCycle,
    vRateCorrection)
if MODULO(vCycle, 2) == 1                                   // if cycle number is odd
    for i=1 to LENGTH(vsMeasureOddList)                     // for all elements of list1
        for j=1 to LENGTH(vsMeasureEvenList)                // and list2
            if vsMeasureOddList(i,1) = vsMeasureEvenList(j,1)
                                                            // if same frameID
                diff = vsMeasureOddList(i, 2) – vsMeasureEvenList(i, 2);
                                                            // build difference
                vsMeasureDiffList = [vsMeasureDiffList, diff];
                                                            // and save in difference list
            end;                                            //
        end;                                                //
    end;                                                    //
                                                            //
    if LENGTH(vsMeasureDiffList) == 0 AND SingleMaster == 0
                                                // if no sync frame pair was received
        MRCS = 1;                               // set the Missing Rate Correction
    else                                        // Signal to 1 for the Error Signaling
        MRCS = 0;                               // otherwise to 0
```

-continued

```
        end;                                     //
                                                 //
    if sync_master == 1 AND ErrorState == 'green' AND OperationState == ('ColdStartICW'
OR 'ColdStartVCW' OR 'NormalOperation')
                                                 // if node is a sync master
        vsMeasureDiffList = [vsMeasureDiffList, 0]; // add one instance
                                                                       of zero to list
        end;                                     //
                                                 // number of sync frames pairs used
        vValidSyncFramesCount = LENGTH(vsMeasureDiffList) // for rate
                                                                  correction calculation is
                                                 // supported to the host
    if LENGTH(vsMeasureDiffList) > 0             // at least one value in the list
        vIdealRateCorrection = Midterm(vsMeasureDiffList) +
                                                 // calculate the rate correction term
                              vRateCorrection;   // plus old correction value
        if vIdealRateCorrection ≧ pMicroOverheadPerCycleNom + pClusterDriftDamping
            vRateCorrection = vIdealRateCorrection - pClusterDriftDamping;         //
        elseif vIdealRateCorrection ≦ pMicroOverheadPerCycleNom - pClusterDriftDamping
            vRateCorrection = vIdealRateCorrection + pClusterDriftDamping;         //
        else                                     //
            vRateCorrection = vIdealRateCorrection;   // no damping
        end;                                     //
    else                                         // no valid sync frames
        vRateCorrection = vRateCorrection;       // no new rate correction
                                                                         value,
    end;                                         // take old value; no damping;
end;                                             // warning!
``` pClusterDriftDamping should be configured in a way that the damping value in all controllers has nearly the same duration. A configuration value is used to adapt in case of different Microtick duration in different controllers.

After calculation of the rate correction value the memory for the measurement values is cleared and marked empty. It should be clear that the offset correction value is calculated before the memory is cleared.

External Clock Synchronization (Optional)

During normal operation, two independent clusters can drift significantly (e.g., by the damping factor of each cluster). If synchronous operation is desired across the two clusters, external synchronization is necessary; even though the nodes within each cluster are synchronized. This can be accomplished with the synchronous application of host-deduced rate and offset correction terms to both clusters.

External clock synchronization is an optional feature of a FlexRay controller that means is not required for any controller to meet protocol conformance. However, if this feature is used in a cluster all nodes in this cluster should support this feature in order to make it useful.

External offset correction shall be performed in the same cycle in all nodes of a cluster; external rate correction shall be performed in the same double cycle in all nodes of a cluster.

The external correction terms (offset and rate correction terms) available to the communication controller when the network idle time starts are the values that are used. If no values are available the external correction values shall be set to zero for the next double cycle.

The external correction terms shall be checked against limits and applied following the corresponding tasks are performed for the internal correction terms. This shall take place during the Network Idle Time.

Following the Network Idle Time, an aggregate rate correction term consisting of correction components from the internal and external rate correction terms, shall be applied during the next two communication cycles.

The aggregate offset correction term, consisting of correction components from the internal and external offset correction terms, shall be applied in the remainder of the Network Idle Time, before the next cycle starts.

In soft reset, the initial external rate correction may be accomplished by setting the external rate correction term by the host.

Value Limitations

Figure 45:
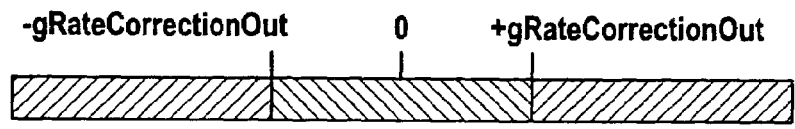
FIG. 45 illustrates an assessment of a calculated rate correction value.
Figure 46:
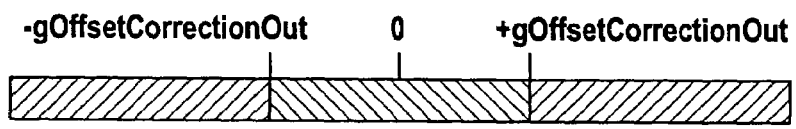
FIG. 46 illustrates an assessment of a calculated offset correction value.

Before applying them, the calculated correction values shall be checked against pre-configured limits. These limits define two regions that are referred to as the "red" and "green" regions, where the colors reflect the acceptability of the calculated value (see FIG. 45). The green region is between −gRateCorrectionOut and +gRateCorrectionOut and the red region is outside these boundaries.

If correction values are in the green region, the node is fully synchronized. No further actions are necessary.

If one of the correction values is in the red region, the node is out of synchronization. This corresponds to an error condition. Information on the handling of this situation is specified further on in the text.

The correction values are in the green region if:
 −gRateCorrectionOut≦vRateCorrection≦+gRateCorrectionOut AND
 −gRateCorrectionOut≦vRateCorrection+vRateCorrectionExtern≦+gRateCorrectionOut−
 gOffsetCorrectionOut≦vOffsetCorrection≦+gOffsetCorrectionOut AND
 −gOffsetCorrectionOut≦vOffsetCorrection+vOffsetCorrectionExtern≦+gOffsetCorrectionOut If both correction values are in the green area the correction is done.

−gRateCorrectionOut is the lower boundary and +gRateCorrectionOut is the upper boundary of the green area for the rate correction.

−gOffsetCorrectionOut is the lower boundary and +gOffsetCorrectionOut is the upper boundary of the green area for the offset correction.

The correction value is in the red region if
- −gRateCorrectionOut>vRateCorrection OR
- +gRateCorrectionOut<vRateCorrection OR
- −gRateCorrectionOut>vRateCorrection+vRateCorrectionExtern OR
- +gRateCorrectionOut<vRateCorrection+vRateCorrectionExtern
- −gOffsetCorrectionOut>vOffsetCorrection OR
- +gOffsetCorrectionOut<vOffsetCorrection OR
- −gOffsetCorrectionOut>vOffsetCorrection+vOffsetCorrectionExtern OR
- +gOffsetCorrectionOut<vOffsetCorrection+vOffsetCorrectionExtern The significance of having correction values in the red region depends on whether the node is in the process of startup, or not. During normal operation this is to be considered a fault condition. If vRateCorrection OR vRateCorrection+vRateCorrectionExtern is outside the specified area the error signal CCLR is set to 1. If vOffsetCorrection OR vOffsetCorrection+vOffsetCorrectionExtern is outside the specified area the error signal CCLR is set to 1, too. During startup and reintegration this condition is treated differently (see further on in the text).

The values of gRateCorrectionOut and the gOffsetCorrectionOut are identically specified for all nodes in the cluster. They are defined in terms of macroticks or fractions of a macrotick. From these cluster-wide values the configuration data for each node shall be calculated (measured in microticks). These values shall be included in the configuration interface. These calculations are summarized as follows:

$$pOffsetCorrectionOut = gOffsetCorrectionOut * pMicroPerMacroNom$$

$$pRateCorrectionOut = gRateCorrectionOut * pMicroPerMacroNom$$

Clock Correction

Once calculated, the correction terms shall be used to modify the local clock in a manner that synchronizes it more closely with the global clock. This shall be accomplished by using the correction terms to adjust the number of microticks in each macrotick.

Rate correction shall be accomplished by modifying the value of vRateCorrection (see Procedure 9), which shall be subsequently distributed over the macroticks comprising the next cycle.

Offset correction shall be accomplished by modifying the value of vOffsetCorrection (see Procedure 8), which shall be subsequently distributed over the macroticks comprising the current Network Idle Time.

Rate Correction

Figure 44:
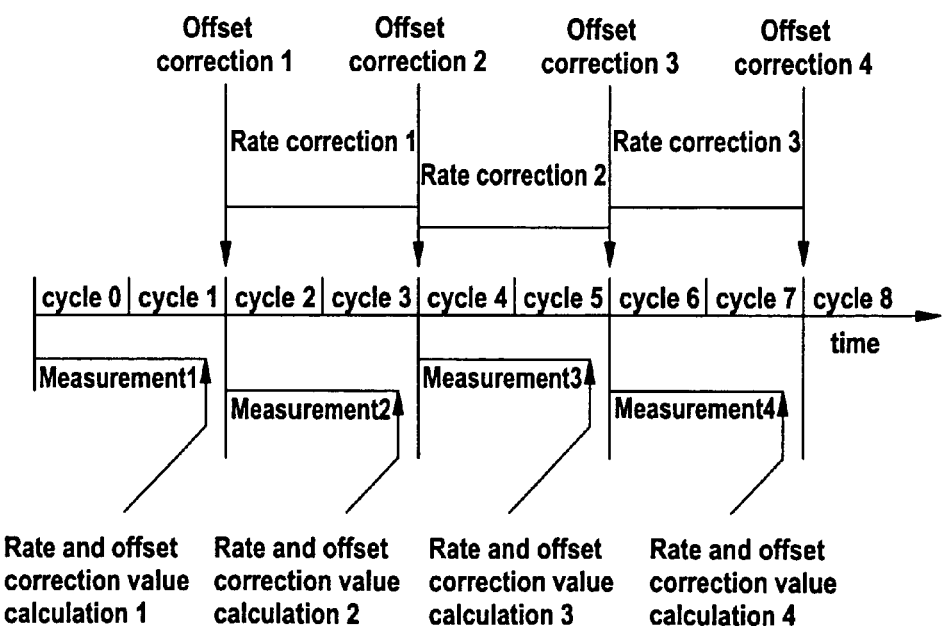
FIG. 44 illustrates a timing of measurement and correction.

The rate correction term shall be uniformly distributed over the entire cycle (see FIG. 44).

Procedure 10: Distribution of Microticks over Macroticks

```
[vIntergerRatio, vRest, vRemainingSumOfFractionalParts, vDeltaCorrect, vOffsetRemainder]
= InitStartOfCycle(vRateCorrection, vOffsetCorrection, vRateCorrectionExtern,
vOffsetCorrectionExtern)
                                    // This replaces InitRateStartOfCycle
                                    // execute at the beginning of every
       vMicroPerCycle = gMacroPerCycle * pMicroPerMacroNom // second cycle
              + vRateCorrection + vRateCorrectionExtern;      //
       vRatioMicroMacro = vMicroPerCycle / gMacroPerCycle; //
       vIntegerRatio = Int[vRatioMicroMacro];              //
       vRest = vRatioMicroMacro − vIntegerRatio; // value between 0 and 1
       vRemainingSumOfFractionalParts = vRest;             //
       vDeltaCorrect = 0;                                  //
       vOffsetRemainder = vOffsetCorrection + vOffsetCorrectionExtern;
                                    // Additional variable
[vMicroPerMacroCorr, vIntegerRatio, vDeltaCorrect, vRemainingSumOfFractionalParts, vRest,
vOffsetRemainder] = DistributeMicroOverMacro(vIntegerRatio, vDeltaCorrect,
vRemainingSumOfFractionalParts, vRest, vOffsetRemainder)
                                    // This replaces DistributeMicroOver
                                    // MacroRate
while(1)                            //
       vMicroPerMacroRateCorr = vIntegerRatio + vDeltaCorrect;
                                    // Rate correction part
       vRemainingSumOfFractionalParts = vRemainingSumOfFractionalParts + vRest;
       if vRemainingSumOfFractionalParts ≧ 1
              vDeltaCorrect = 1;
              vRemainingSumOfFractionalParts = vRemainingSumOfFractionalParts −1;
       else
              vDeltaCorrect = 0;
       end;
       if vMacrotick > OffsetCorrectionStart AND vMacrotick < OffsetCorrectionEnd
              vMicroPerMacroCorr = OffsetCorrection(vOffsetRemainder,
vMicroPerMacroRateCorr)
       else
              vMicroPerMacroCorr = vMicroPerMacroRateCorr;
       end;
       [vMicrotick, vMacrotick] = IncrementMacrotickCounter(vMicroPerMacroCorr,
vMicrotick,
              Macrotick)
end;
[vMacrotick, vCycle] = ChangeOfCycleCount(vMacrotick, vCycle)
```

Procedure Notes:
  This is only an example.
  As previously mentioned, it seems to be unlikely that the variable vMicroPerMacroRateCorr can be calculated explicitly in hardware. It is more likely that the IncrementMacrotickCounter procedure will be an intrinsic part of at least the rate part of the microtick distribution state machine.

Offset Correction
  Offset correction shall be done during the network idle time by increasing or decreasing the size of macroticks depending on the value of vOffsetCorrection.
  It is not required that all controllers perform their offset correction identically. However, they shall perform the offset correction in the Network Idle Time. The offset correction should be completed at least one macrotick before the end of the NIT and therefore before the communication cycle ends.
  The offset correction term, vOffsetCorrection, is a signed integer that shall be visible to the application. The maximum number of microticks by that a macrotick can be increased (due to offset correction and rate correction combined) shall be bounded by a configuration constant pMicroPerMacroMax. The offset correction term, vOffsetCorrection, shall be distributed across the first, and subsequent macroticks to the limit allowed by pMicroPerMacroMax, until the total offset term is distributed.
  The maximum number of microticks by that a macrotick can be decreased (due to offset correction and rate correction combined) shall be bounded by a configuration constant pMicroPerMacroMin. The offset correction term, vOffsetCorrection, shall be distributed across the first, and subsequent macroticks to the limit allowed by pMicroPerMacroMin, until the total offset term is distributed.
  pMicroPerMacroMax is the maximum length of a macrotick in microticks.
  pMicroPerMacroMin is the minimum length of a macrotick in microticks.

Procedure 11: Offset Correction

```
[vMicroPerMacroCorr] = OffsetCorrection(vOffsetCorrection, vMicroPerMacroRateCorr)
if networkIdleTime == true                                                    //
    if vOffsetCorrection > 0                                                  // positive offset
        if vOffsetCorrection > pMicroPerMacroMax - vMicroPerMacroRateCorr;
            vMicroPerMacroCorr = pMicroPerMacroMax;
            vOffsetCorrection = vOffsetCorrection -
                (pMicroPerMacroMax - vMicroPerMacroRateCorr);
        else                                                                  //
            vMicroPerMacroCorr = vOffsetCorrection + vMicroPerMacroRateCorr;
            vOffsetCorrection = 0;                                            //
        end;                                                                  //
    else                                                                      //
        if (vMicroPerMacroRateCorr - pMicroPerMacroMin) < |vOffsetCorrection|
            vMicroPerMacroCorr = pMicroPerMacroMin;
            vOffsetCorrection = vOffsetCorrection +
                (vMicroPerMacroRateCorr - pMicroPerMacroMin);
        else
            vMicroPerMacroCorr = vMicroPerMacroRateCorr + vOffsetCorrection;
            vOffsetCorrection = 0;                                            //
        end;                                                                  //
    end;                                                                      //
else                                                                          //
    vMicroPerMacroCorr = vMicroPerMacroCorr;                                  //
end;                                                                          //
```

Clock Synchronization Parameters
  The following parameters are specific to clock synchronization

| Name | Description | Range/Value | Units |
|---|---|---|---|
| vDeltaCorrect | Additional microticks per macrotick necessary as a result of clock rate correction | | µT |
| vIntegerRatio | The integer portion of the corrected microtick to macrotick ratio vRatioMicroMacro. | | — |
| vMicroOverhead-PerCycle | The integral number of microticks that must be added to (or subtracted from, if negative) the current cycle in order for the cycle to have the correct length. | | µT |
| vMicroPerMacro-RateCorr | | | µT |
| vOffsetRemainder | | | |
| vRatioMicroMacro | Floating-point number representing the ratio of the number of microticks to the number of | | — |

-continued

| Name | Description | Range/Value | Units |
|---|---|---|---|
| | macroticks per cycle. vRatioMicroMacro = vIntegerRatio + vRest | | |
| vRemainingSumOfFractionalParts | Floating-point number used for clock rate correction that indicates the total fractional microticks that have not yet been corrected by the insertion or deletion of a microtick from a macrotick. When the absolute value exceeds 1 a microtick is added or removed. | | μT |
| vRest | Floating-point number indicating the fractional portion of vRatioMicroMacro. | | — |

Wakeup, Startup, and Reintegration

Introduction

This section describes the FlexRay wakeup and startup mechanisms. Before the startup can be performed, the cluster has to be awake, so the wakeup has to be completed before startup can commence.

First a simplified description of both processes is given. The intent of these descriptions is to provide an overview of the process to facilitate a basic understanding. The technical details are intentionally deferred to later in the chapter.

Afterwards, the wakeup is described in more detail. Two examples are provided to give insights into the combined effort of the Hosts and communication controllers of the cluster in performing the wakeup.

After the wakeup section, the startup is described, first for FlexRay cluster in one of the time-triggered protocol modes, then for FlexRay cluster using the byteflight protocol mode or the event-triggered protocol mode extension.

FlexRay Wakeup and Startup—A Functional Description

This section explains the principal workings of the FlexRay wakeup and startup procedure using high-level flow charts and textual description. Later in this chapter the wakeup and startup processes are defined using state machines, giving an exact definition of those details that were left intentionally out of this section.

Wakeup

Figure 47:
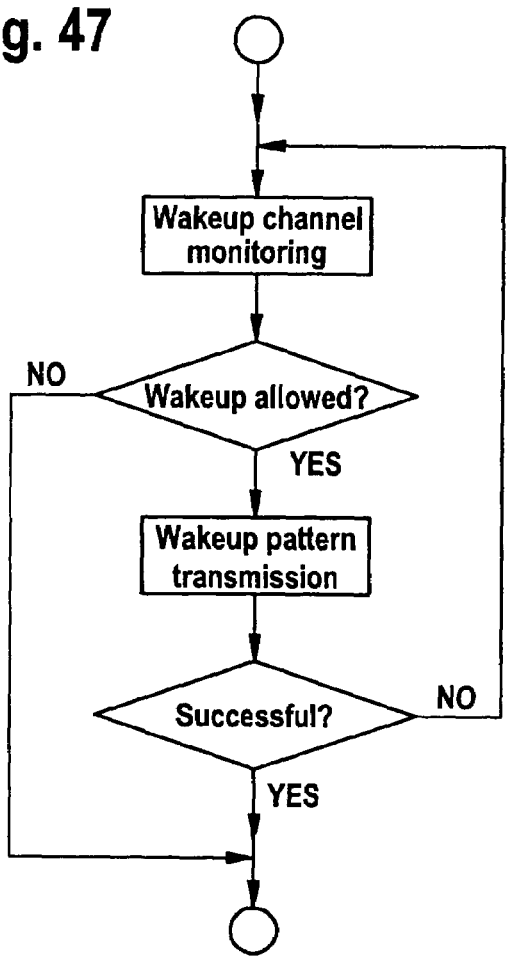
FIG. 47 illustrates a global structure of a wakeup procedure.

FIG. 47 shows a global structure of the Wakeup. At any point in time some nodes (possibly all but one) in the FlexRay cluster may be in a power-saving mode. At least one of those nodes that are awake may want to initiate a startup of the whole cluster. However, before a node can communicate with the other nodes, they must be awake, so the wakeup process must precede the startup process.

The protocol defines a wakeup pattern that, if sent over the bus without error, causes all other nodes to wake up. The communication controller provides the Host a procedure to transmit this pattern on its channels. To limit the dangers of disturbing ongoing communication, the communication controller is only allowed to transmit this pattern on one of its possibly two connected channels at a time.

The Host initiates the wakeup process, whereupon the communication controller monitors its channels for meaningful communication consisting of frames, wakeup symbols, or CAS symbols. The result of this monitoring determines further wakeup behavior. If nothing meaningful is received, the wakeup pattern is transmitted; otherwise the communication controller aborts the wakeup attempt with an error message to the Host. The transmission of the wakeup pattern is aborted if a collision is sensed during the transmission. In this case the communication controller monitors the channel(s) again to determine the reason for the collision.

The FlexRay protocol does not support partial networks, i.e., networks in which some nodes are awake and some nodes are asleep. This implies that the wakeup process attempts to wake all nodes on all available channels before startup is initiated. It also implies that a cluster that is already communicating is already fully awake and does not require any further wakeup procedures.

Wakeup Channel Monitoring

Figure 48:
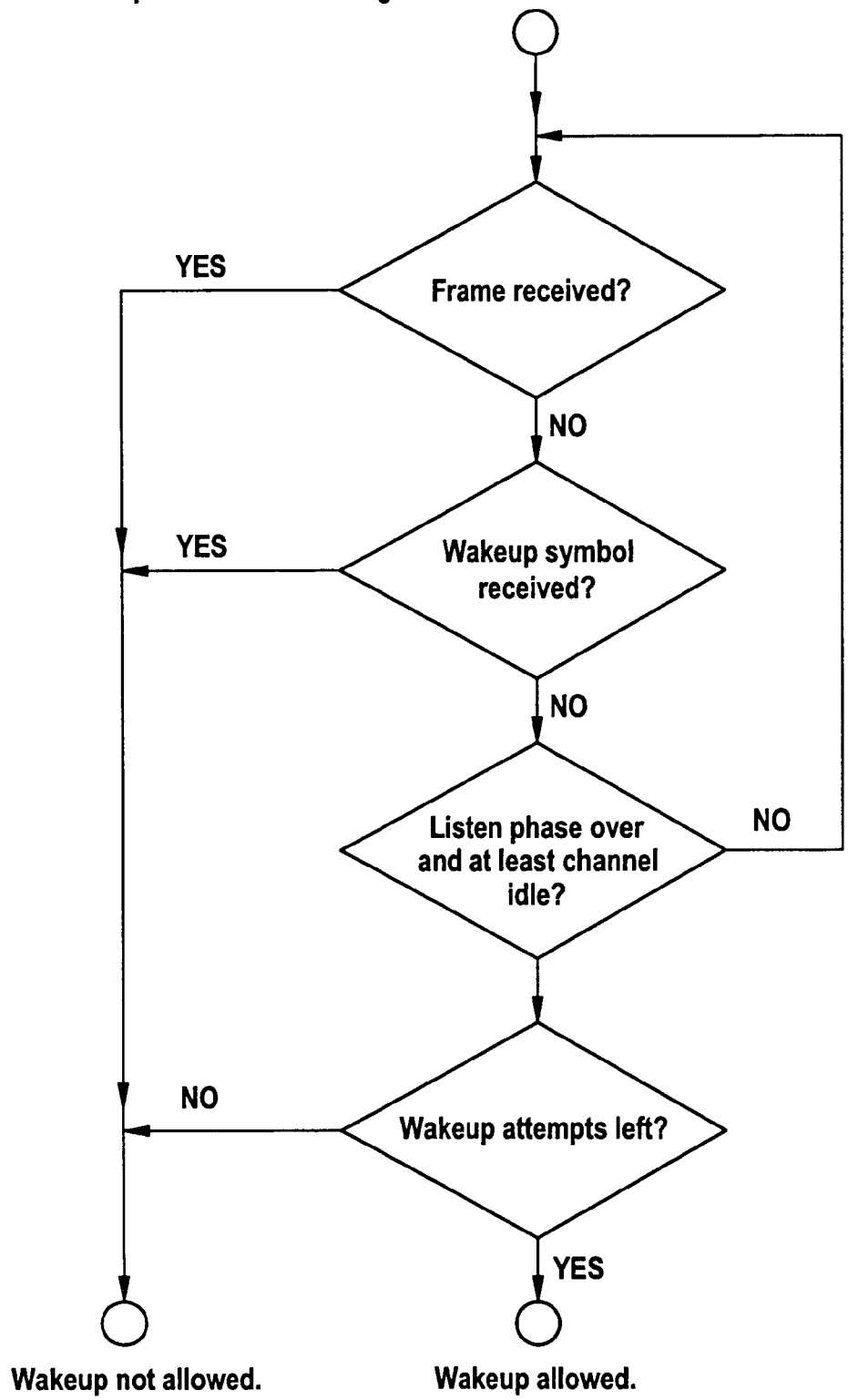
FIG. 48 illustrates a structure of a wakeup channel monitoring procedure.

FIG. 48 shows a structure of the Wakeup Channel Monitoring. For easier presentation, the process of listening for frames and wakeup symbols has been depicted serially, while these processes should actually run concurrently.

The 'Wakeup channel monitoring' phase ensures that no ongoing communication is disturbed by the transmission of the wakeup pattern. A listen time is defined, during which the communication controller tries to detect meaningful communication on its connected channels.

If frames are received, the wakeup is immediately aborted. A 'received frame' within this context is considered to have occurred if the S_SuccessfulHeaderReception event occurs for one of the configured channels. Since other nodes are already communicating with one another, no wakeup is necessary (whoever initiated the cluster startup ensured that all available channels are awake). The same applies if a wakeup symbol is received on the channel that the communication controller is attempting to awaken.

The reception of a CAS symbol prolongs the listen phase. As is described in the following sections, a frame can be expected to follow soon after the CAS if it really was a CAS symbol and not noise, so the reception of that frame is relied upon to trigger the abort. This reduces the sensitivity of the process to noise because noise perceived as a CAS symbol does not abort the process.

When the listen phase is over, the communication controller waits for at least one channel to become idle. This reduces the risk of interrupting communication that is just received. It cannot be required that both channels in a two-channel system be idle since then a faulty, noisy channel could prevent the system wakeup. Most symbols and frames, especially during the startup phase where communication is more sparse and thereby more easily overlooked than during later phases, occur on both channels at the same time. E.g. the CAS symbol is transmitted simultaneously on both channels. Requiring at least one channel to be idle prevents the wakeup from beginning to transmit while such a symbol is received on both channels but before it is recognized. The communication controller allows only a predefined number of attempts to transmit the wakeup pattern. If this number is exceeded, the wakeup process is aborted.

Wakeup Pattern Transmission

Figure 49:
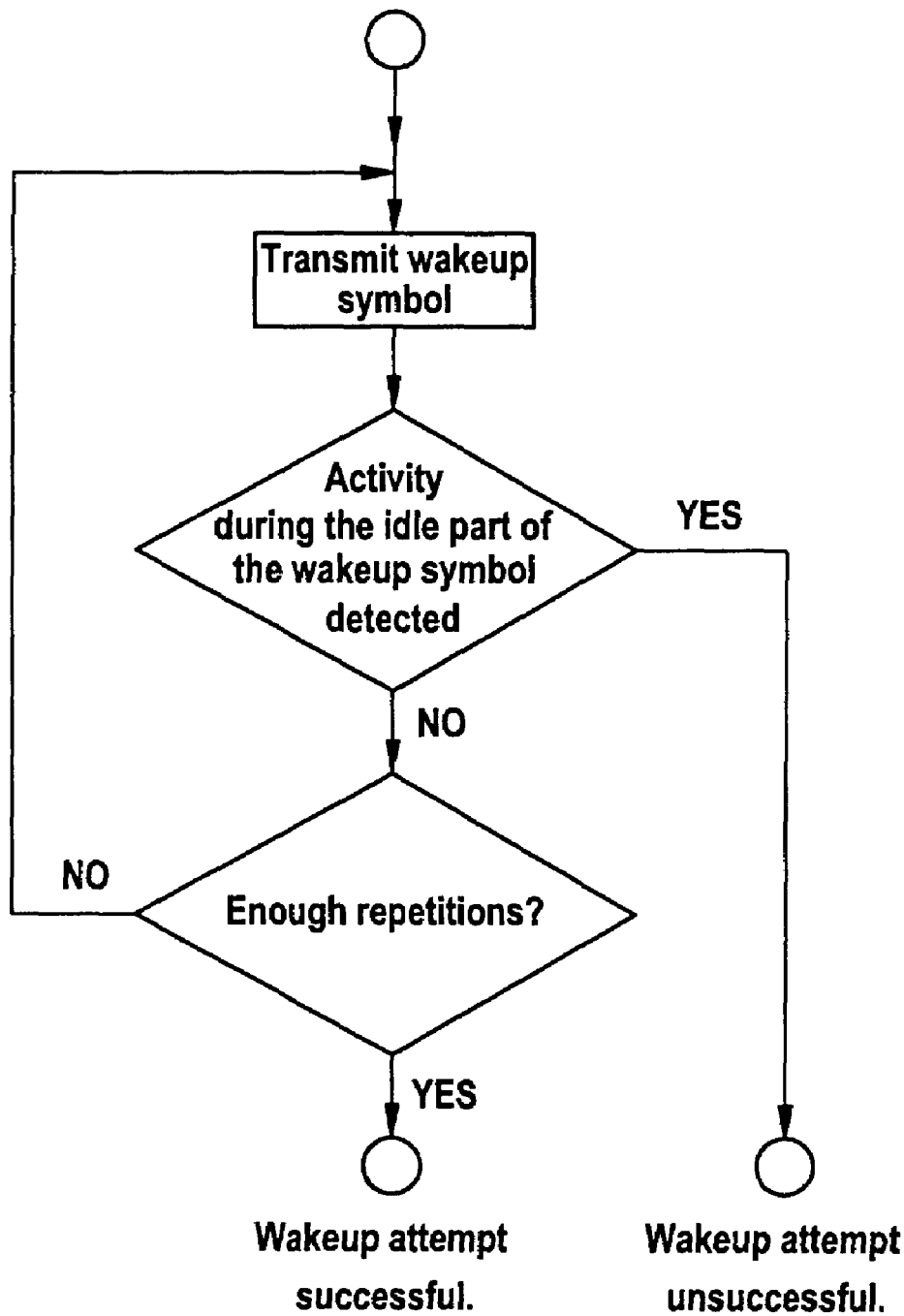
FIG. 49 illustrates a structure of a wakeup pattern transmission procedure.

FIG. 49 shows a structure of a Wakeup Pattern Transmission. The wakeup pattern consists of several repetitions of the wakeup symbol. The wakeup symbol (defined above) consists of an active and an idle period. The communication controller listens during the idle period for channel activity. If this activity exceeds a threshold, the transmission is aborted. This mechanism resolves collisions between several nodes beginning to transmit the wakeup pattern at nearly the same time. This threshold is chosen to ensure that at least one node continues transmitting the pattern. While the wakeup pattern itself is collision resilient and is still recognizable when two such patterns collide, it is this sensing in the idle period that makes the wakeup mechanism robust against any number of collisions.

If such a collision is sensed, the communication controller returns to the 'channel monitoring' phase. There, a collision with another wakeup pattern can be verified and signaled to the Host.

After successful transmission of the wakeup pattern or the abort of the wakeup attempt, the communication controller returns to its reset state and awaits instructions from the Host.

FlexRay Startup—Time-Triggered Protocol Mode

Startup assumes all nodes in the cluster are awake (at least in the error-free case). Only nodes connected to all available channels may be configured as sync nodes (which are allowed to start up the cluster). Thus, in the absence of faults, the transmissions of a sync node are visible to every node in the cluster.

Startup establishes a global timing scheme that—within certain bounds—is the same within all nodes in the cluster. The ability to calculate the proper point in time for transmitting and/or receiving each frame relies on it. Also, the clock synchronization algorithm relies on this basic timing scheme so that all nodes can apply clock correction terms simultaneously (at the end of odd-numbered cycles).

The maximum clock drift that can occur between any two nodes in the cluster within one cycle has to be known in order to configure the necessary listen timeouts.

Figure 50:
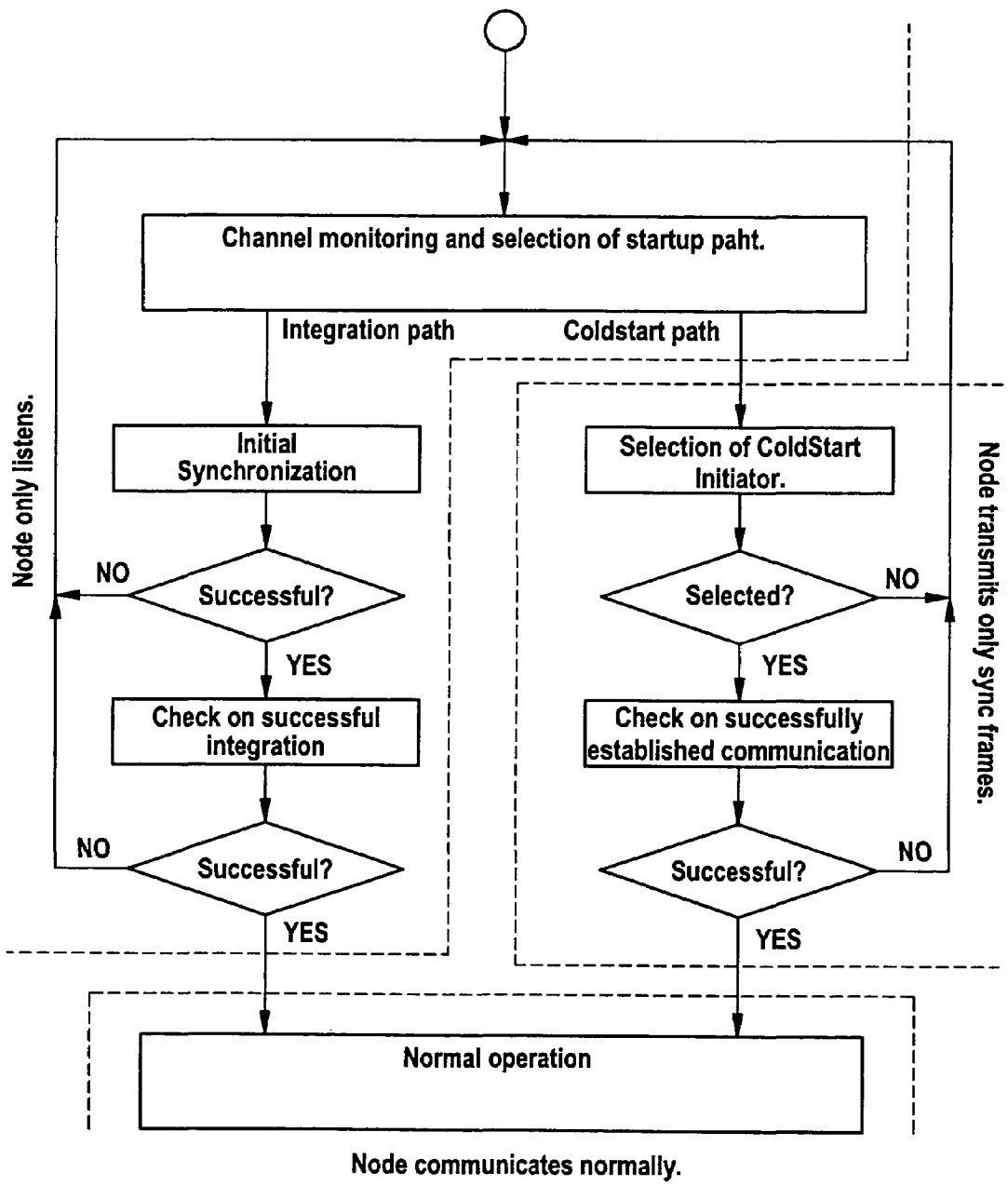
FIG. 50 illustrates a global structure of a startup procedure.

Until a node enters the protocol operation phase that succeeds the protocol startup phase (see below), its message buffers do not need to be updated. No data frame transmission and reception is possible before that time. FIG. 50 shows a global structure of startup.

Each correctly configured node begins the startup process (after finishing the wakeup process for coldstart capable nodes) by entering the 'channel monitoring and selection of startup path' phase. Each node that is allowed to start up the cluster monitors its connected channels and participates in the process of selecting the initiator of the coldstart process. This process is designed to eliminate all but one sync node, which then assumes the responsibility for performing the coldstart. This coldstart initiator traverses the right path in FIG. 50.

All other nodes passively wait for the selected node to initiate communication. The reception of a sync frame with an even cycle counter (indicated by S_ValdEvenStartup-Frame) causes them to enter the integration path shown on the left of FIG. 50.

After the designated check has been successful, the node enters normal operation and is allowed to transmit data frames.

Channel Monitoring and Selection of Startup Path

Figure 51:
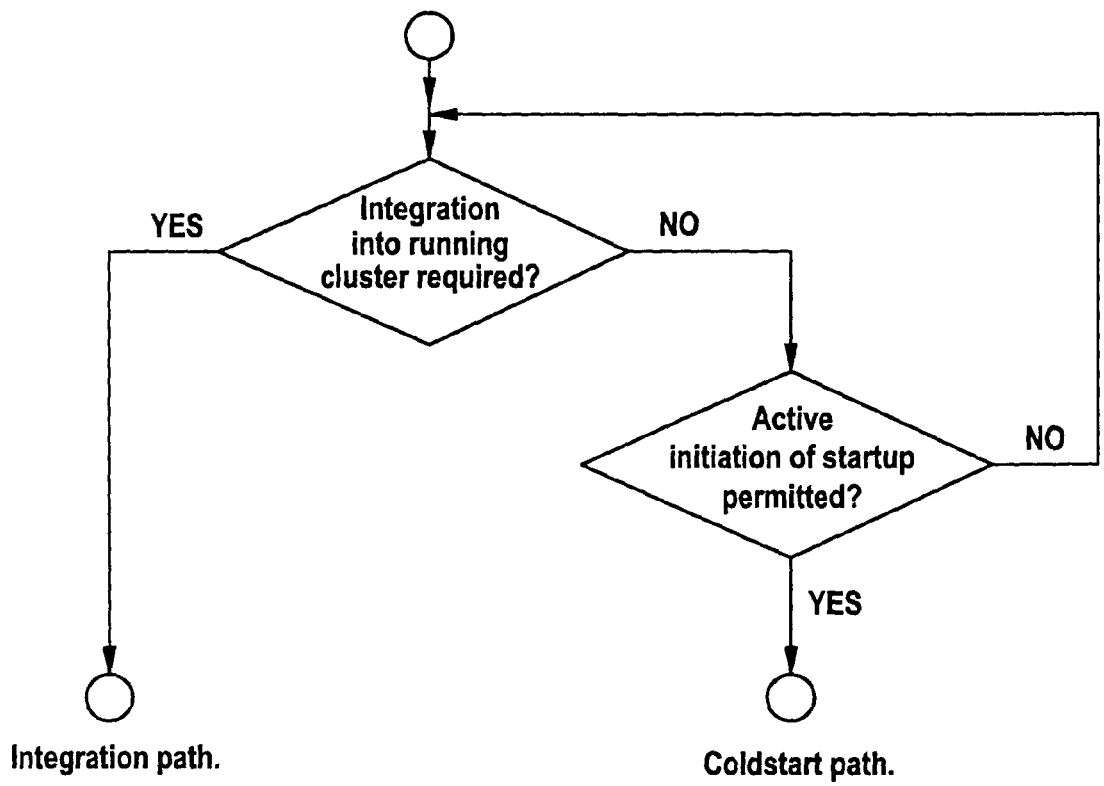
FIG. 51 illustrates a structure of a channel monitoring and of a selection of a startup path.

FIG. 51 shows a structure of the Channel Monitoring and Selection of a Startup Path. The 'startup channel monitoring' phase is similar to the channel monitoring phase of the wakeup. Each node listens to its connected channels and tries to recognize ongoing communication. If an S_ValidEvenStartupFrame is received, the node enters the integration path. The sync nodes that are allowed to start up the cluster wait for their listen time-out to expire. A received frame (S_SuccessfulHeaderReception) or CAS symbol (S_CASReception) prolongs the time-out. When the time-out expires, the node enters the coldstart path. In case no activity at all is detected, a special timeout expires and thereby enables a fast startup.

Selection of ColdStart Initiator

Figure 52:
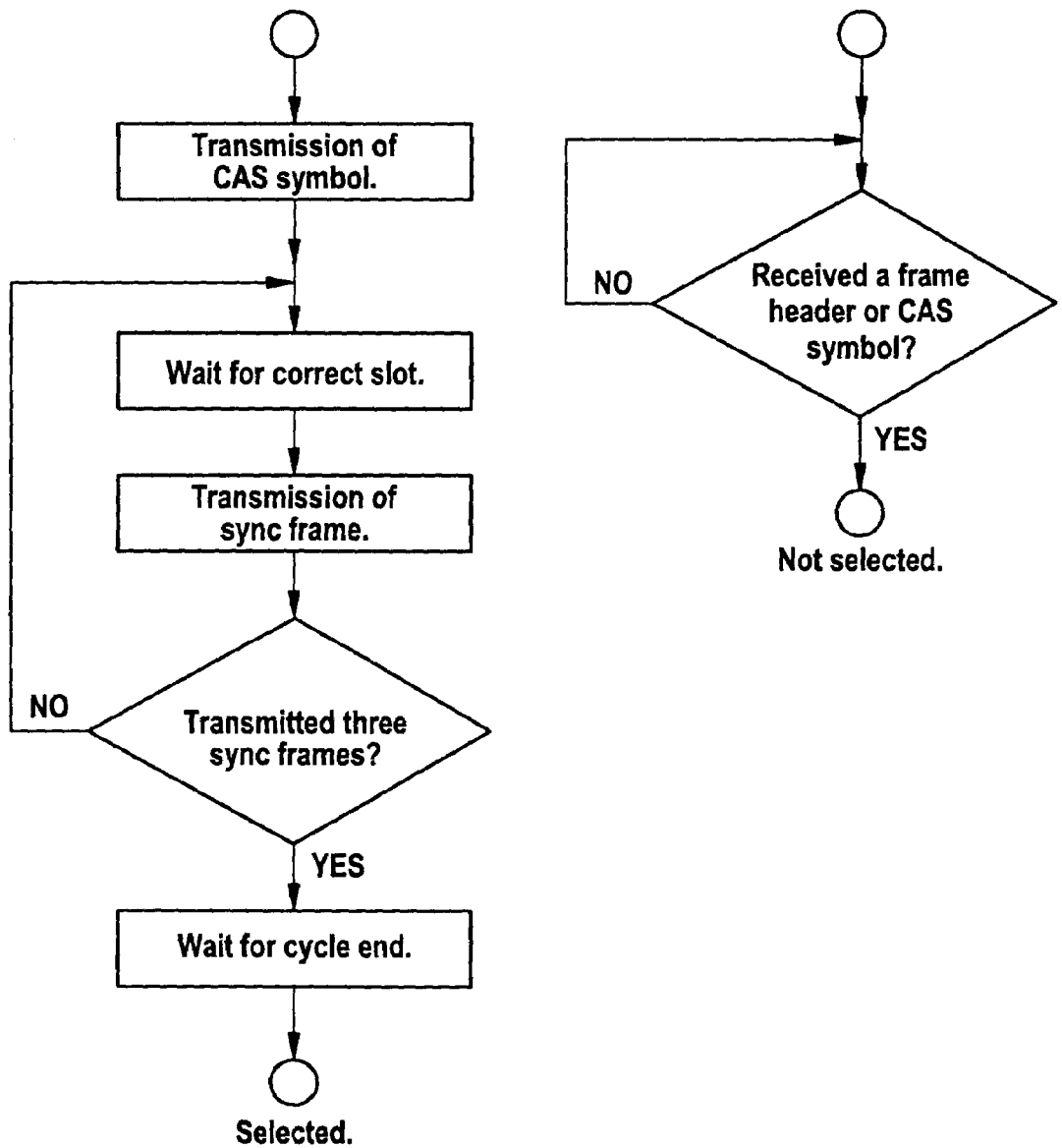
FIG. 52 illustrates a structure of a selection of a cold start initiator.

FIG. 52 shows a structure of the Selection of a ColdStart Initiator. After the expiration of the listen timeout in the channel monitoring phase, the sync nodes configured to do so, transmit a CAS symbol. This CAS symbol resets the listen-timeout of other potential coldstart initiators still in the listening phase, causing them to remain in the monitoring phase. After the transmission, these nodes initialize their communication schedule and await their assigned slot, where they will transmit a sync frame with cycle counter zero. This sync frame will force all nodes in the monitoring phase to enter the integration path.

Several nodes may enter the selection phase nearly simultaneously and transmit their CAS symbol at nearly the same time. This situation is resolved by requiring nodes in this phase to reenter the monitoring phase if they receive a sync frame or a CAS symbol. Due to the unambiguous assignment of slots to the various nodes, all nodes but one (usually the one the earliest slot) will leave this phase after at most three cycles (clock oscillator deviations may require a second or third cycle for collision resolution).

After three cycles the node enters the 'Communication established' check.

Check on Successfully Established Communication

Figure 53:
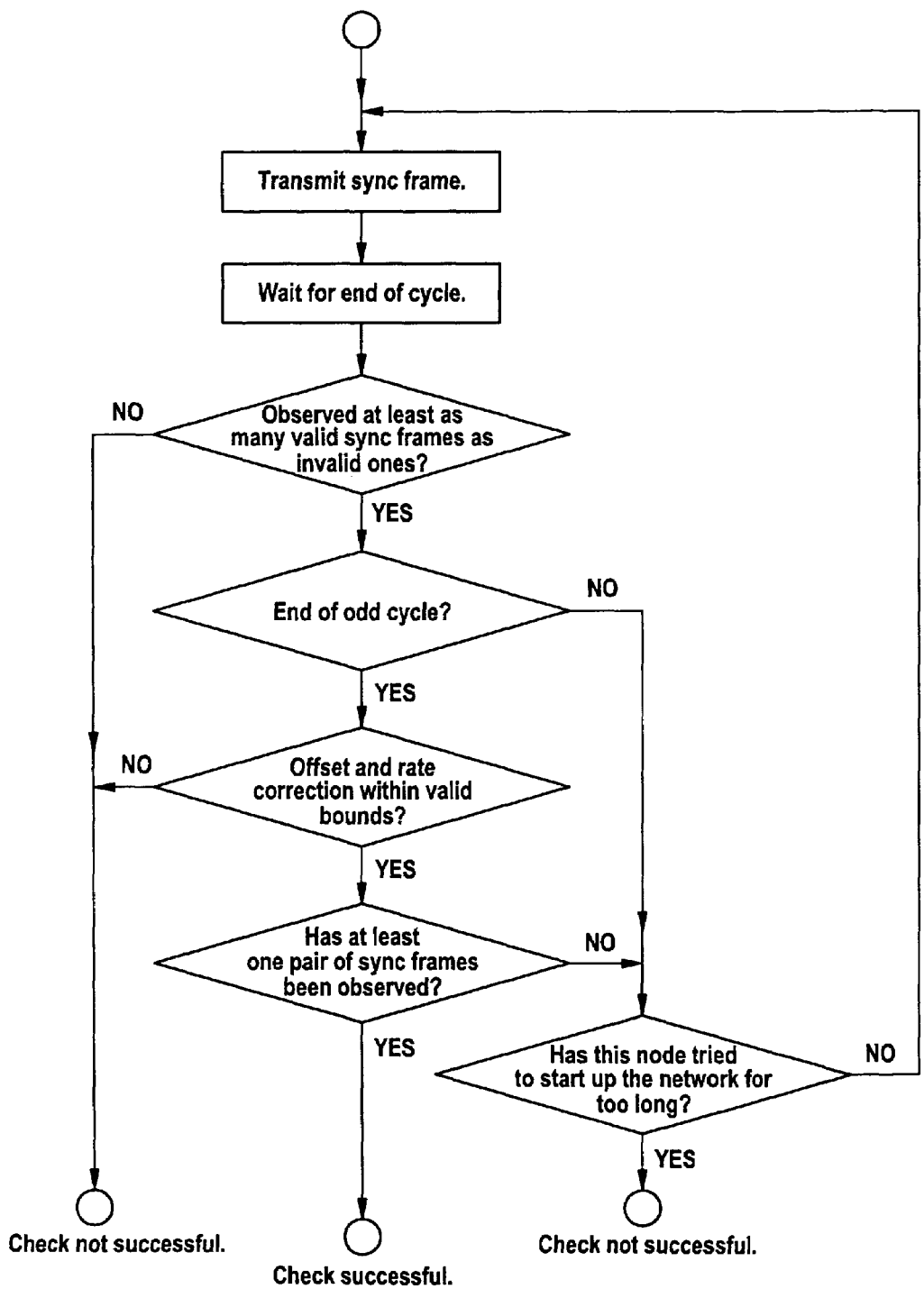
FIG. 53 illustrates a structure of a check on a successfully established communication.

FIG. 53 shows a check on a successfully established communication. The coldstart initiator has transmitted three sync frames without being interrupted. Now it can expect the first replies of other sync nodes. It continues transmitting its sync frame in the designated slot.

At the end of each cycle it reviews the sync frames it has received during the current cycle. If it has received more sync frames that do not fit into its communication schedule than sync frames that do, it aborts the startup and reenters the monitoring phase. This behavior prevents the creation of several cliques with disagreeing perceptions of time.

At the end of each odd cycle, the coldstart initiator performs additional tests. If at least one pair of sync frames has been received, it performs the clock synchronization using these pairs (see Chapter "Clock Synchronization"). If the resulting correction values are outside specified bounds, it aborts the coldstart and reenters the monitoring phase. If the values are within the specified bounds, and at least one pair of sync frames has been received, it enters normal operation mode. This ensures that at least two sync nodes agree upon the timing schedule before any data frames may be transmitted. It enables stable clock synchronization for the two nodes and all other nodes that subsequently integrate into the now established communication.

A counter observes how many cycles the coldstart initiator spends in the coldstart path. If too many cycles pass without this node entering the normal operation mode, startup is aborted and the node may not again try to start up the cluster. This prevents faulty nodes from persistently disturbing the startup.

Initial Synchronization

Figure 54:
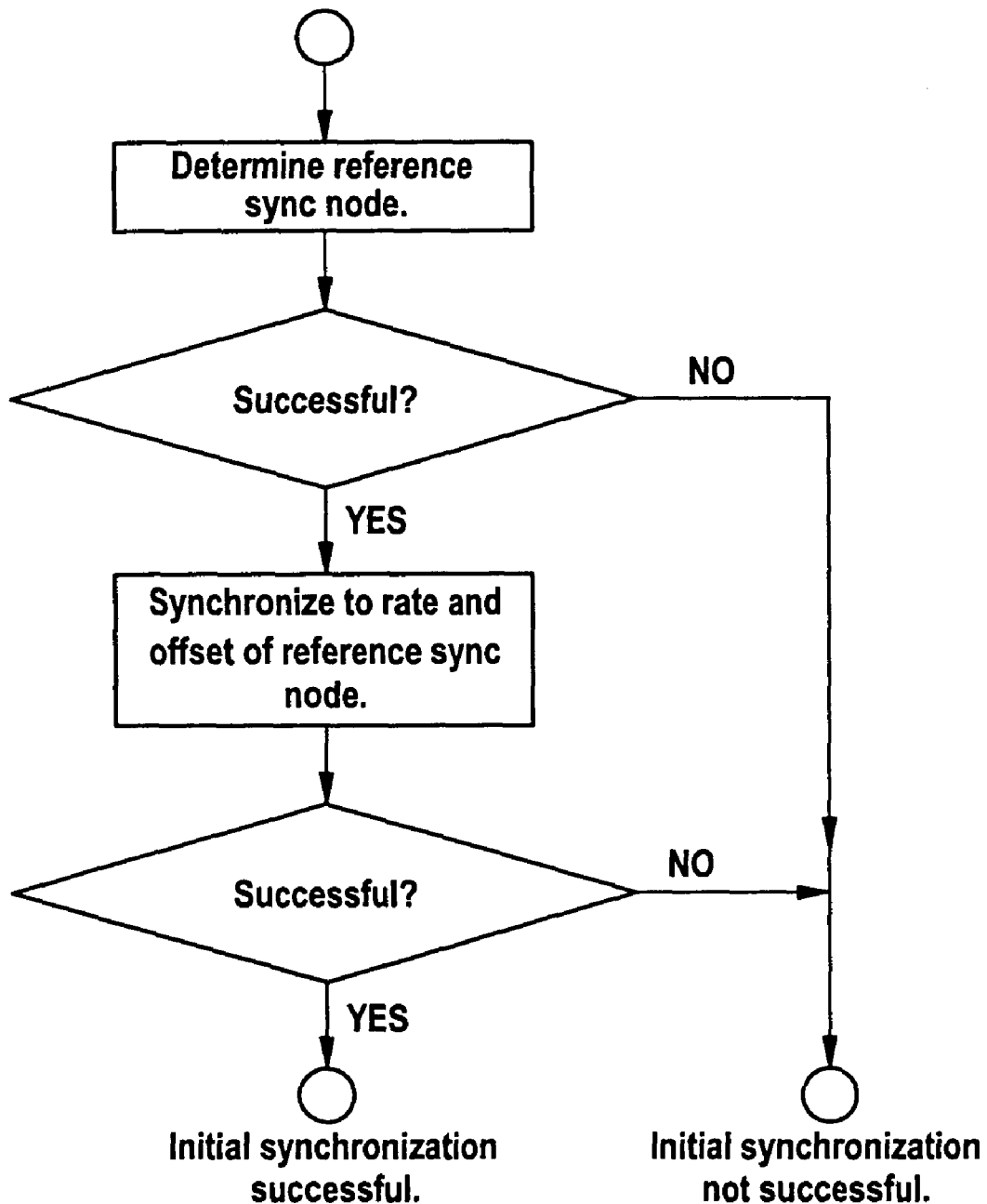
FIG. 54 illustrates a structure of an initial synchronization.

FIG. 54 shows a structure of an initial synchronization. If a node in the monitoring phase receives a sync frame with even cycle counter (S_ValidEvenStartupFrame), it enters the integration path. The node that has transmitted the sync frame automatically becomes the reference node for the receiver.

If this reference node has been the reference node in a previous unsuccessful integration attempt, it is not selected and another sync frame is awaited. If no sync frame from another node is received within a specified amount of time, the previously unsuccessful reference node is given another chance.

The integrating node sets its own cycle counter to the value received in the sync frame and awaits the sync frame of the reference node in the following odd cycle. Using this pair of frames, the integrating node corrects its clock towards the timing of the transmitter of these frames. If no sync frame with an odd cycle counter follows the even-numbered frame that triggered the integration attempt, the node aborts the integration.

Check on Successful Integration

Figure 55:
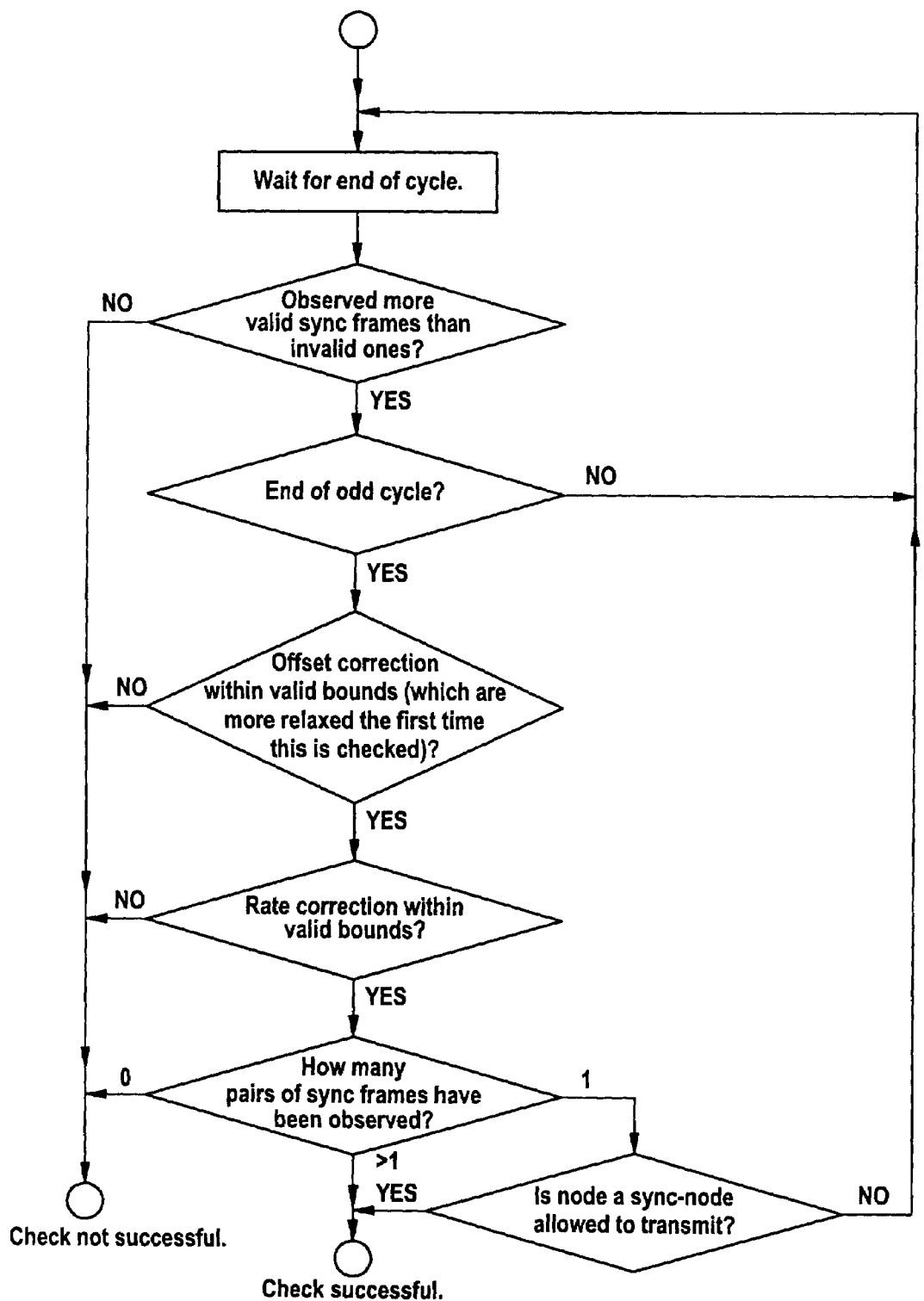
FIG. 55 illustrates a structure of a check on a successful integration.

FIG. 55 shows a check on a successful integration. During this check phase, the node is still not allowed to transmit any frames. It now has an understanding of time derived from its reference node. During the subsequent cycle it listens for sync frames from all nodes, not just from its reference node. The node checks the timing information that it has derived from the reference node against all observable communication, considering sync frames only.

At the end of each cycle, it determines if the majority of the observed sync frames are consistent with the timing scheme it has derived. If not, it declares its integration attempt failed and reenters the monitoring phase. Note that it tries to select another sync node as reference node for the ensuing new integration attempt as described above.

At the end of each odd cycle, it performs the offset clock correction as described in Chapter "Clock Synchronization". The calculated clock correction terms for offset and rate are compared to specified boundaries. The boundaries for the offset correction are more relaxed during the first time the correction is performed after entering this check phase. If either rate or offset correction value is outside the defined boundaries the integrating node aborts the integration attempt and reenters the monitoring phase.

Also at the end of each odd cycle, the node counts the number of slots where it has received even/odd cycle pairs of sync frames. If no pairs have been received the node aborts the integration attempt because sync frames should have been received from the reference node if nothing else. If more than one pair has been received, the node enters the normal operation mode. If the integrating node is allowed to transmit sync frames itself and one pair of sync frames has been received, it also enters normal operation. In normal operation, i.e. during protocol operation phase, the node is allowed to transmit data and sync frames (if not configured otherwise).

Wakeup and Startup Modes—Global Structure

Figure 56:
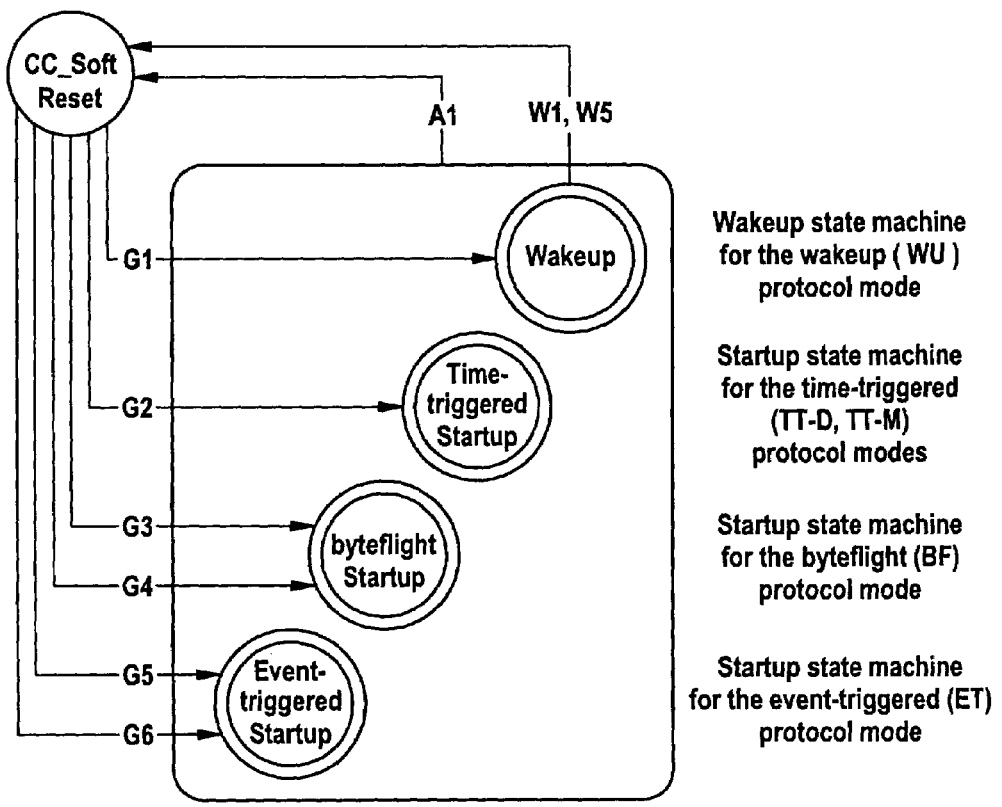
FIG. 56 illustrates a global structure of a protocol state diagram.

From the CC_SoftReset state, the host shall be able to initiate the cluster wakeup via the transition G1 (see FIG. 56). For wakeup as well as for the distinct startup procedures the communication controller operates in the top-level HW state CC_Normal. Furthermore, from the CC_SoftReset state one of three distinct startup state machines shall be entered depending on how the configuration settings are chosen.

In the time-triggered protocol modes mode, i.e., the time-triggered distributed (TT-D) mode and the time-triggered master-controlled (TT-M) mode, a startup mechanism based on sync frames shall be triggered by the transition G2.

For FlexRay clusters running in TT-D mode a fault-tolerant, distributed startup shall be performed. In TT-M mode a master controlled startup shall be performed, but still all mechanisms build on a time-triggered communication cycle.

For the byteflight (BF) protocol mode and the event-triggered (ET) protocol mode the necessary startup machine transition (G3, G4 or G5, G6 respectively) depends on whether a node is configured as a master node or not.

For the event-triggered protocol mode, the startup behavior is described further on.

TABLE 12

Global Startup State Transitions and Respective Conditions for Execution

| State Transition | Transition Direction from | to | | Condition for Transition | Actions taken on Transition |
|---|---|---|---|---|---|
| G1 | CC_SoftReset | CC_WakeUpListen | | soft reset released (in the respective control register) | vWakeupCount, vdWakeup and vdWakeupNoise are set |
| | | | AND | wakeup mode configured | to zero. The wakeup status vector is cleared (vWakeupFrameHeader Received, vWakeupSymbolReceived, vWakeupFailed and vWakeupComplete). |
| G2 | | CC_StartupListen | | soft reset released (in the respective control register) | vdStartup, vdStartupNoise and |
| | | | AND | static, mixed or dynamic mode configured (gNumberofStaticSlots greater than or equal one) (A minimum of at least two static slots is required for a static or mixed configuration in FlexRay mode; only one static slot is configured in dynamic mode.) | vColdStartCount are set to zero. The startup status vector is cleared (vCCMS, vSMMS, vOpViaColdstart, vColdstartAborted and vColdstartNoise) Error flags vMRCS and vCCLR are cleared |

TABLE 12-continued

Global Startup State Transitions and Respective Conditions for Execution

| State Transition | Transition Direction from | to | Condition for Transition | Actions taken on Transition |
|---|---|---|---|---|
| G3 | | CC_byteflightListen | soft reset released (in the respective control register) AND byteflight mode configured AND slave role configured (pMaster not set) | |
| G4 | | CC_Send Symbol | soft reset released (in the respective control register) AND byteflight mode configured AND master role configured (pMaster set) | |
| G5 | | | describe further on | |
| G6 | | | describe further on | |

Transitions W1 and W5 are described in Table 13 and transition A1 is described in Table 14.

Cluster Wakeup

This section describes the wake-up path preceding the communication startup.

Any node entering startup that has coldstart capability shall first execute the wakeup procedure. Otherwise it cannot be ensured, that the cluster is awake (or at least that the wakeup has been triggered) before the node begins the startup procedure.

The Host completely controls the wake-up procedure. The communication controller provides the Host the ability to transmit a special wake-up pattern (see above) on each of its available channels. It ensures that ongoing communication on this channel is not disturbed. The communication controller cannot guarantee that all Nodes connected to this channel wake up due to the transmission of the wakeup pattern (For example, the transmission unit of the bus driver might be defective.), since these nodes cannot give feedback until the startup phase. The Host has to be aware of possible failures of the wakeup and act accordingly.

The wakeup procedure enables single-channel devices in a two-channel system to trigger the wakeup, by only transmitting the wakeup pattern on the single channel to which they are connected. Another node then assumes the responsibility for waking the other channel. Any node that has coldstart capability must wake both channels before entering startup.

Any node without coldstart capability connected to two channels must wake both channels, if it wants to wake up the cluster.

The wakeup procedure tolerates any number of nodes simultaneously trying to wake up a single channel and resolves this situation such that only one node transmits the pattern. Additionally the wakeup pattern is collision resilient, so even in the presence of one faulty node also transmitting a wakeup pattern, the wakeup can be assured.

Waking One Channel

The wakeup of the FlexRay system has to be initialized by a Host. The Host of a Node may command its communication controller to send a Tx-wakeup pattern on channel vWakeupChannel, while the communication controller itself is in the CC_SoftReset state. The communication controller then enters its wakeup mode and tries to transmit a Tx-wakeup pattern on the configured channel. Finally, it signals back the status of the wakeup attempt to the Host (refer to the wakeup status vector further on in the text).

Figure 57:
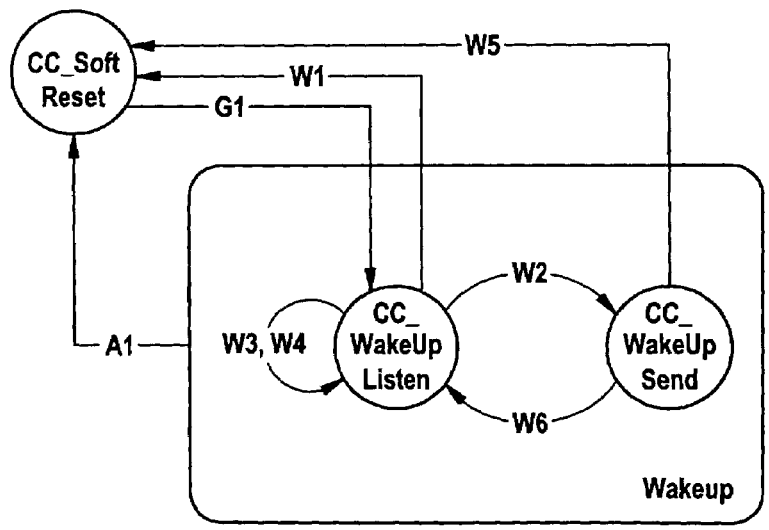
FIG. 57 illustrates a structure of a communication controller wakeup state machine of a node of the communication system.

The wakeup mode of the communication controller involves three states:
  CC_SoftReset
  CC_WakeupListen
  CC_WakeupSend Wakeup State Diagram The structure of the Communication Controller Wakeup State Machine is shown in FIG. 57.

TABLE 13

Wakeup State Transitions and Corresponding Conditions for Execution.

| State Transition | Transition Direction from | to | Condition for Transition | Action taken on Transition |
|---|---|---|---|---|
| W1 | CC_Wakeup Listen | CC_Soft Reset | Reception of a frame header without coding violation (S_SuccessfullHeaderReception) on any of the configured channels. OR Reception of a valid Rx-wakeup symbol on channel vWakeupChannel (S_CheckRxWakeupSymbol occurred). OR ( vWakeupCount == gWakeupMax. | Set the flag corresponding to the exit condition (refer to the wakeup status vector described further on). |

TABLE 13-continued

Wakeup State Transitions and Corresponding Conditions for Execution.

| State Transition | Transition Direction from | Transition Direction to | Condition for Transition | Action taken on Transition |
|---|---|---|---|---|
| | | | AND At least one channels is in idle state.<br>AND( Listen-timeout vdWakeup expired (vdWakeup == gdWakeup).<br>OR Listen-timeout with noise vdWakeupNoise expired (vdWakeupNoise == gWakeupNoise * gdWakeup).<br>) | |
| W2 | | CC_Wakeup Send | W1 not fulfilled.<br>AND vWakeupCount < gWakeupMax.<br>AND At least one channels is in idle state.<br>AND( Listen-timeout vdWakeup expired (vdWakeup == gdWakeup).<br>OR Listen-timeout with noise vdWakeupNoise expired (vdWakeupNoise == gWakeupNoise * gdWakeup).<br>) | Increase vWakeupCount by one. |
| W3 | CC_Wakeup Listen | CC_Wakeup Listen | Reception of channel activity on either channel. | vdWakeup is reset to zero. |
| W4 | | CC_Wakeup Listen | Reception of a valid CAS symbol on either channel (S_CASReception occurred) | vdWakeupListen is reset to zero. |
| W5 | CC_Wakeup Send | CC_Soft Reset | Transmission of Tx-wakeup pattern completed. is set in the | vWakeupComplete startup status vector |
| W6 | | CC_Wakeup Listen | Continuous 'active low' of more than gdWakeupMaxCollision detected during an idle phase of the Tx-wakeup pattern (S_CheckWakeupCollision occurred). | vdWakeup and vdWakeupListen are reset to zero. |

The CC_SoftReset state is part of the overall protocol state diagram. Only in the CC_SoftReset state can the Host configure the communication controller and initialize wakeup on channel vWakeupChannel (G1). After the wakeup, the communication controller returns into the CC_SoftReset state and signals to the Host the result of the wakeup attempt:

Abort because the communication controller has received a frame header without coding violation, which is signaled by setting the vWakeupFrameHeaderReceived flag (W1).

Abort because the communication controller has received a valid Rx-wakeup symbol on channel vWakeupChannel, which is signaled by setting the vWakeupSymbolReceived flag (W1).

Abort due to too many wakeup attempts, which is signaled by setting the vWakeupFailed flag (W1).

The complete transmission of the Tx-wakeup pattern, which is signaled by setting the vWakeupComplete flag (W5).

The parameter gWakeupMax defines the maximum number of wakeup attempts allowed. The parameter vWakeupChannel defines the channel that the communication controller shall wake.

CC_WakeupListen State

The purpose of this state is to ensure that the transmission of the Tx-wakeup pattern does not disturb existing communication on channel vWakeupChannel.

The counter vWakeupCount is set to zero upon transition G1 from the CC_SoftReset to the CC_WakeupListen state.

Two timers are defined:
vdWakeup
vdWakeupNoise

Both timers are set to zero upon entering the CC_WakeupListen state.

The vdWakeup timer expires upon reaching gdcycle+gdMaxDrift (one cycle length plus a safety margin). The vdWakeupNoise timer expires upon reaching the amount of time, during which the cluster is able to keep the clock synchronization within the maximum specified tolerance band.

The vdWakeup timer is reset, whenever activity is received on either channel.

The vdWakeupNoise timer is reset, whenever a valid CAS symbol is received on any channel (S_CASReception occurred). A CAS symbol is—depending on the bitrate—rather short, so noise could be misinterpreted as a CAS symbol. To prevent an abort of the wakeup procedure due to noise, only the counter is reset when a CAS symbol is received. Only the frame following the CAS symbol will trigger the abort. Furthermore, it could be difficult to distinguish a CAS symbol from the first portion of a Tx-wakeup pattern.

If the communication controller receives a frame header without coding violation on any channel (indicated by S_SuccessfulHeaderReception), it reenters the CC_SoftReset state and sets the vWakeupFrameHeaderReceived flag (W1). A communication controller must not transmit a Tx-wakeup pattern when ongoing communication is detected. The reception of a frame header without a coding violation is sufficiently robust for the detection of ongoing communication.

If the communication controller receives a valid Rx-wakeup symbol on channel vWakeupChannel, it reenters the CC_SoftReset state and sets the vWakeupSymbolReceived flag (W1). (The detection shall be more relaxed than the rigid definition of the Rx-wakeup symbol to take topology effects, collisions and different clock speeds into account.) An Rx-wakeup symbol on the other channel (if available) is ignored.

If either of the timers expires and (vWakeupCount<gWakeupMax) and at least one channel is in idle state, the communication controller enters the CC_WakeupSend state (W2). All meaningful communication during startup is transmitted on both channels at the same time. By requiring one channel to be idle, it is ensured that no such transmission is interrupted by the transmission of the CAS symbol (within the uncertainty of the transmission delay). It cannot be required that both channels were idle, since one channel could be defective and noisy thereby preventing any wakeup and startup attempt.

If either of the timers expires and (vWakeupCount==gWakeupMax) and at least one channel is in idle state, the communication controller reenters CC_SoftReset and sets vWakeupFailed in the wakeup status vector (W1). The wakeup is only aborted after reaching the maximal number of tries when a timer expires. This gives the communication controller time to listen to the network for ongoing communication or wakeup patterns after it stepped back from the CC_WakeupSend state.

CC WakeupSend State

In this state, the communication controller transmits the Tx-wakeup pattern on the configured channel and checks for collisions.

Upon entering the CC_WakeupSend state, vWakeupCount is increased by one.

The Tx-wakeup pattern as described above is sent on the channel vWakeupChannel.

During the idle phases of the Tx-wakeup pattern, the communication controller listens for activity on the bus. If the communication controller receives more than gdWakeupMaxCollision of continuous 'active low' during an idle phase (This check is described in detail above and the occurrence of this event is signaled by S_CheckWakeupCollision.), it immediately steps back into the CC_WakeupListen state (W6). Without this listening and aborting, not all collisions would lead to recognizable wakeup symbols (remember that the Tx-wakeup pattern itself is only resilient against collisions of up to two such patterns). The smaller pdWakeupMaxCollision is, the better the collision detection gets, but the EMC robustness degrades. A lower bound on the value might be the equivalent to 400 ns for a 10 Mbit/s system.

After a complete, non-aborted transmission of the Tx-wakeup pattern, the communication controller reenters the CC_SoftReset state and sets the vWakeupComplete flag in the wakeup status vector (W5).

Wakeup Application Notes

Since the Host is closely involved in the wakeup of the FlexRay cluster, in this section the required Host behavior is described. The Host has to coordinate the bus guardian and the communication controller wakeup modes. It has to coordinate the wakeup of a two channels and to decide whether, or not, to wake a specific channel.

Bus Guardian

In systems that have a bus guardian installed, the Host has to command the appropriate bus guardian to enter its wakeup mode before it commands the communication controller to perform a wakeup. After the communication controller returns to the CC_SoftReset state, the bus guardian must be commanded to leave its wakeup mode.

Nodes with Coldstart Capability

Each node that is configured to perform a coldstart must perform a wakeup as described above before continuing with startup. For two-channel clusters it is generally advisable to use the procedure described below.

For FlexRay clusters in TT-D mode this includes all sync nodes that are not configured in a listen only mode. For FlexRay clusters in TT-M mode this includes the Master Node.

Actions of the Host to Initialize the Wakeup

A Host that wants to perform a wakeup of the cluster has first to check its bus driver(s) to see if they have received Rx-wakeup patterns. If the bus driver of a channel did not receive an Rx-wakeup pattern, the Host must try to wake this channel.

Each communication controller that is configured with coldstart capability relies upon its Host to have awakened the cluster prior to letting it enter the startup phase. Only the Host can ensure that the wakeup phase is completed before any startup attempt is performed.

The Host must not wake channels whose bus drivers have received an Rx-wakeup symbol unless startup is not possible without an additional wakeup of those channels. This is done to speed up the wakeup process and to limit the amount of traffic on the channels; thereby, the number of collisions during this phase is reduced.

The Host has to command the bus guardian (if available) of the channel vWakeupChannel to enter its wakeup mode. Then the Host uses the procedure described above to initialize a wakeup of channel vWakeupChannel. The communication controller may return several different status conditions that are described in the following section. Before evaluating these conditions, the Host must command the bus guardian of channel vWakeupChannel to leave its wakeup mode. If the Host does not cause the BG to leave its wakeup mode (BG_WakeUp), the BG leaves it after a fixed, non-configurable amount of time and enters the BG_FailSilent mode.

Reactions of the Host to the Status Flags Signaled by the Communication Controller This section defines the various status conditions that the communication controller can return to the Host as outcomes of its wakeup attempt and the recommended reactions of the Host. These conditions are generally mutually exclusive, but in two-channel systems an Rx-wakeup symbol could be received on channel vWakeupChannel while a valid frame header is received on the opposite channel at the same time. The wakeup still fulfills its function when the exit conditions are given a precedence and are thereby made mutually exclusive (highest to lowest priority): Transmission complete, a frame header without coding violation has been received, an Rx-wakeup symbol has been received, the allowed number of wakeups has been exceeded.

A Frame Header without Coding Violation has been Received

When a frame header without coding violation is received by the communication controller on either available channel during CC_WakeupListen, the communication controller aborts the wakeup, even if channel vWakeupChannel is still silent.

The Host must not configure the communication controller to perform additional wakeup attempts, since this may disturb ongoing communication. Instead, it shall configure the communication controller to enter the start-up to integrate into the already running cluster.

An Rx-wakeup Symbol has been Received

The communication controller has received an Rx-wakeup symbol on channel vWakeupChannel during its CC_WakeupListen state. This means, that another Node is already waking this channel. To prevent collisions of Tx-wakeup patterns on channel vWakeupChannel, the communication controller aborts the wakeup.

If another channel is available that is not already awake, the Host shall configure the communication controller to wake this channel. Otherwise, it shall configure the communication controller to enter startup.

The Transmission has been Completed

The communication controller has transmitted the complete Tx-wakeup pattern on channel vWakeupChannel.

If another channel is available that is not already awake, the Host shall configure the communication controller to wake this channel. Otherwise, it shall configure the communication controller to enter startup.

The Allowed Number of Wakeup Attempts has been Exceeded

The communication controller was not able to transmit a complete Tx-wakeup pattern because each of its gWakeupMax attempts to transmit it resulted in at least gdWakeupMaxCollision occurrences of continuous 'active low' during an idle phase of the pattern. Two possible reasons for this are heavy EMC disturbances on the bus or a babbling node. One cause, not responsible for this abort, is the collision with another Tx-wakeup pattern. Such a collision can be recognized after reentering the CC_WakeupListen state and would be signaled by setting the flag vWakeupSymbolReceived.

Since no complete Tx-wakeup pattern has been transmitted, it cannot be assumed that all nodes have received an Rx-wakeup symbol. The Host may use the retransmission procedure described below.

Waking Two Channels

This section describes how the Host can wake both channels of a two-channel system.

It is forbidden for a communication controller to send a Tx-wakeup pattern on both channels at the same time. (This rule was established to ensure that an erroneous communication controller couldn't disturb ongoing communication by transmitting wakeup patterns on both channels at the same time.) So, if it is necessary to wake both channels, the host must wake them one at a time. The Host can use the procedure for sending a Tx-wakeup pattern on one channel (see above) twice—once for the first channel and after that for the second channel.

For an example of this procedure, see below.

Retransmission of Wakeup Symbols

Some events may prevent a cluster wakeup by a Tx-wakeup pattern without the transmitting communication controller being able to immediately detect it (E.g. an erroneous star that needs significantly more time to start up and to be able to forward messages.). After a defined amount of time, the Host can detect such an error when the cluster does not start up after wakeup as expected, or the Host's own communication controller's attempt to start up the cluster fails.

The Host may then perform a retransmission of the Tx-wakeup pattern. It has to command the bus guardian (if available) of the chosen channel into its wakeup mode. The communication controller has to be brought into the CC_SoftReset state; then the procedure described above can be used to transmit a Tx-wakeup pattern on channel vWakeupChannel. Afterwards, the bus guardian must be commanded to leave its wakeup mode.

Note that this may disturb ongoing communication of other nodes if the node performing the wakeup procedure experiences an incoming link failure.

Transition to Startup

It may be several hundred milliseconds (depending on the hardware used) before all nodes and stars are completely awakened and configured. To perform a startup in the FlexRay time-triggered distributed protocol mode, at least two sync-Nodes are needed. A node is called a sync node if the host has set pSyncNode in the host interface. For a non-sync node, pSyncNode is set to false. The configuration parameter can only be set or cleared in the CC_SoftReset state. The transmission of more than one sync frame by a node within one cycle has to be prevented by the communication controller. For this protocol mode, sync-Nodes shall generally not enter the CC_StartupListen state immediately after performing the wakeup unless the vColdStartInhibit flag is set. A communication controller without the vColdStartInhibit flag set will try to start up the cluster, but may fail, since no other communication controller may be ready to join the communication before the coldstart initiator aborts the startup attempt because it has reached the maximum number of cold start attempts allowed. (This scenario will still result in a successful start-up, as long as some of the other sync nodes are configured to initialize the start-up. The node that has woken the network and failed to start-up will still join the communication started by another node.) The Host must clear this flag after sufficient time has passed to allow the other nodes in the cluster to awaken.

Transmission of Wakeup Symbols During Normal Operation

During normal operation, the Host can set the payload of frames that it transmits to a pattern that mimics two consecutive Tx-wakeup symbols (This applies only for NRZ coding defined above). Note that since the wakeup symbol has a fixed length, the number of bits necessary to construct a payload that is equivalent to two such wakeup symbols depends on the bit rate of the system. It may not be feasible to construct such a payload for every combination of allowed bit rate and static slot length (especially short ones). However, in this case it may still be possible to construct a dynamic frame with this payload if the dynamic segment is sufficiently long to allow it. Depending on the system configuration, it may even be possible to use two consecutive static frames.

EXAMPLES

This section describes in more detail the Host-communication controller interaction for the wakeup in two typical situations. Firstly, it is described, how one Host wakes both channels of a two-channel system. Secondly, it is described, how one node connected to only one channel of a two-channel system wakes this channel and how a sync node (connected to both channels) wakes the other channel.

Since also the transition between wakeup and startup is described, the examples may be more readily understood with a prior understanding of FlexRay startup, which is described in subsequent sections.

Two Channel Wakeup by One Node

Figure 58:
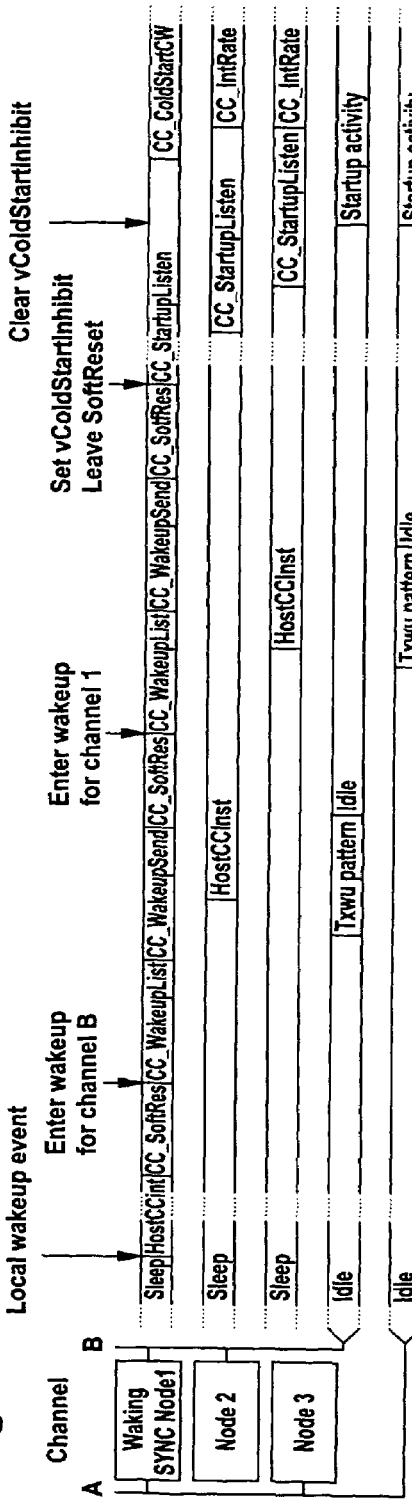
FIG. 58 illustrates a simple wakeup, whereas the larger amount of times within a millisecond-range are represented by dotted lines.

FIG. 58 shows a Simple Wakeup. Larger (ms range) amount of times are represented by dotted lines.

This section describes a FlexRay system with two channels configured and operating in time-triggered distributed protocol mode. It is described how one sync-node first wakes the cluster and then performs the startup.

Node 1 is awake. It has decided to wake up the cluster. Node 2 and Node 3 are in a power-saving sleep mode.

The Host of Node 1 (Host 1) checks for wakeup activity by checking if one of its bus drivers has received an Rx-wakeup symbol. Since neither of them has, Host 1 must wake both channels.

Host 1 commands BG 1B (the bus guardian of Node 1 and channel B) to enter its wakeup mode.

Host 1 commands CC 1 (the communication controller of Node 1) to wake up channel B by setting vWakeupChannel to channel B and setting/clearing the needed bits in the CC-Host interface (for a more detailed description, see further on in the description).

CC 1 enters the CC_WakeupListen state. It does not receive any activity on either channel. So the timer vdWakeup expires. The CC 1 enters the CC WakeupSend state.

During the CC WakeupSend state, the Tx-wakeup pattern is transmitted on channel B. During the idle phases of the Tx-wakeup pattern, CC 1 detects no activity on channel B. After complete transmission, the CC 1 sets vWakeupComplete and reenters CC_SoftReset.

Host 1 commands BG 1B to leave its wakeup mode.

The wakeup pattern has triggered the wakeup receiver of the bus driver of Node 2 (which is connected only to channel B). Node 2 initializes.

Host 1 has meanwhile read the wakeup status vector of CC 1 and continues waking the other channel.

Host 1 commands BG 1A to enter its wakeup mode.

Host 1 sets vWakeupChannel to channel A and commands CC 1 to execute the wakeup mode.

CC 1 again enters the CC_WakeupListen state. It does not receive any activity on either channel. So the timer vdWakeup expires. The CC 1 enters the CC WakeupSend state.

During the CC WakeupSend state, the Tx-wakeup pattern is transmitted on channel A. During the idle phases of the Tx-wakeup pattern, CC 1 detects no activity on channel A. After the complete transmission, the CC 1 sets vWakeupComplete and reenters CC_SoftReset.

Host A commands BG 1A to leave its wakeup mode.

The wakeup pattern has triggered the wakeup receiver of the bus driver of Node 3 (which is connected only to channel A). Node 3 initializes.

Host A reads out the wakeup status vector of CC 1 and decides to continue with the startup, since both channels have been awakened. It sets the vColdStartInhibit flag and commands CC 1 to enter the CC_StartupListen state.

After some time, Node 2 and Node 3 are completely configured. Neither are sync nodes and each is only connected to one of two channels. Additionally, their bus drivers signal that they have received Rx-wakeup patterns, so their Hosts must not perform a wakeup of their own. Instead, both Hosts command their communication controllers to begin Startup. Both CC 2 and CC 3 remain in the CC_StartupListen state.

Finally Node 1 decides that enough time has passed to allow the other Nodes in the cluster to wake up and configure themselves. It clears the vColdStartInhibit flag of its communication controller and allows it thereby to enter the CC_ColdStartICW state.

See below for details on the startup procedure.

Wakeup Forwarding by One Node

Figure 59:
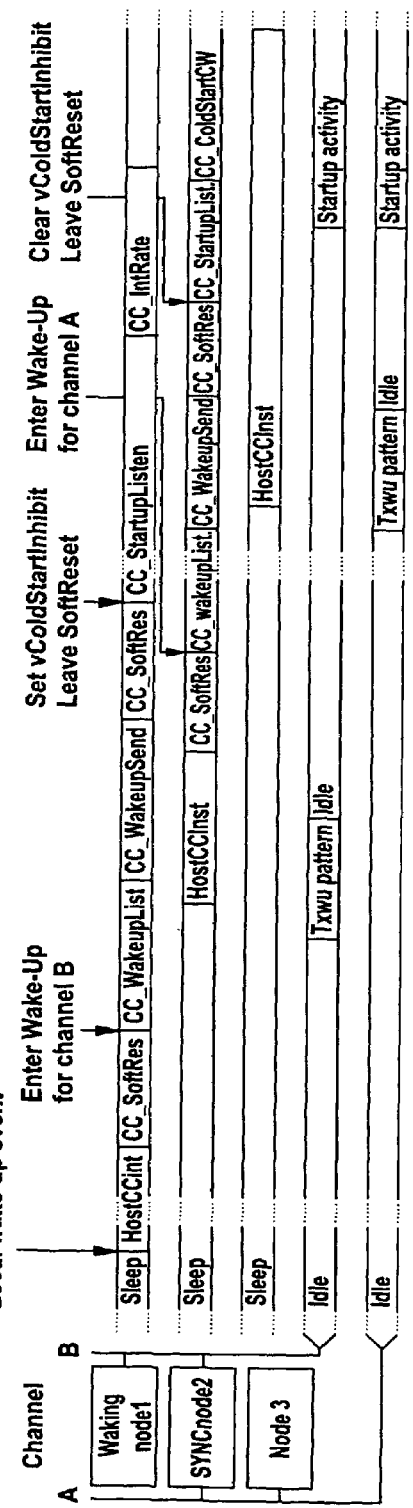
FIG. 59 illustrates a simple wakeup with forwarding, whereas the larger amount of times within a millisecond-range are represented by dotted lines.

FIG. 59 shows a Simple Wakeup with Forwarding. Larger (ms range) amount of times are represented by dotted lines.

This section describes a FlexRay system with two channels configured and operating in time-triggered distributed protocol mode. It is described, how first a non-sync node connected to only one channel wakes its channel, and how then a sync node forwards the Tx-wakeup pattern to the opposite channel and initiates the communication.

Node 1 is awake. It has decided to wake up the cluster. Node 2 and Node 3 are in a power-saving sleep mode.

The Host of Node 1 (Host 1) checks for wakeup activity by checking if its bus driver has received an Rx-wakeup symbol. Since it has not, Host 1 decides to wake its channel. Since this node is not a sync node, the Host does not have to wake its channel before entering the startup. In this example, the application demands it anyway.

Host 1 commands BG 1B (the bus guardian of Node 1 and channel B) to enter its wakeup mode.

Host 1 commands CC 1 (the communication controller of Node 1) to wake up channel B by setting vWakeupChannel to channel B and setting/clearing the needed bits in the CC-Host interface (for a more detailed description, see the following description).

CC 1 enters the CC_WakeupListen state. It does not receive any activity on its channel. So the timer vdWakeup expires. The CC 1 enters the CC_WakeupSend state.

During the CC_WakeupSend state, the Tx-wakeup pattern is transmitted on channel B. During the idle phases of the Tx-wakeup pattern, CC 1 detects no activity on channel B. After complete transmission, the CC 1 signals this by setting the vWakeupComplete flag and reenters the CC_SoftReset state.

Host 1 commands BG 1B to leave its wakeup mode.

The wakeup pattern has triggered the wakeup receiver of the bus driver of Node 2 (which is connected to both channels). Node 2 initializes.

Host 1 reads the wakeup status vector of CC 1. It notices that CC 1 completed the transmission and commands CC 1 to enter the CC_StartupListen state. Node 1 is not a sync Node and has now to wait for some other Node to initialize startup.

Meanwhile, Node 2 has awakened. Node 2 is a sync Node and is allowed to perform a coldstart, so it must perform a wakeup before entering startup.

Host 2 checks for wakeup activity by evaluating if one of its bus drivers has received an Rx-wakeup symbol. It notes that the bus driver of channel B has received an Rx-wakeup symbol and so only has to wake channel A.

Host 2 commands BG 2A to enter its wakeup mode.

Host 2 sets vWakeupChannel to channel A and commands CC 2 to execute the wakeup process.

CC 2 enters the CC_WakeupListen state. It does not receive any activity on either channel. So the timer vdWakeup expires. The CC 2 enters the CC_WakeupSend state.

During the CC_WakeupSend state, the Tx-wakeup pattern is transmitted on channel A. During the idle phases of the Tx-wakeup pattern, CC 2 detects no activity on channel A. After the complete transmission, the CC 2 signals this by setting the vWakeupComplete flag and reenters the CC_SoftReset state.

Host 2 commands BG 2A to leave its wakeup mode.

The wakeup pattern has triggered the wakeup receiver of the bus driver of Node 3 (which is connected only to channel A). Node 3 initializes.

Host 2 reads out the wakeup status vector of CC 2 and decides to continue with the startup. Since some other Node had already awakened channel B, Host 2 assumes that other Nodes are already awake and initialized. It clears the vColdStartInhibit flag and commands CC 2 to enter the CC_StartupListen state.

See below for detailed information on the startup procedure.

Communication Startup and Reintegration

Corresponding to the supported protocol modes, three different mechanisms for communication startup are specified. Clusters operating in the time-triggered distributed (TT-D) mode follow a fault-tolerant, distributed startup strategy; for the time-triggered master-controlled (TT-M) mode this is reduced to a master controlled system behavior (refer to transitions indicated by prefix 'S'; see FIG. 62). A cluster configured in byteflight (BF) mode or event-triggered (ET) mode performs an event driven, master controlled startup (state transitions with prefix 'B' (byteflight; see FIG. 63) and 'E' (event driven; see the following description), respectively). The protocol operations related to synchronization of the running communication schedule, integration of further nodes to a running cluster, media access rules, and error handling are different for the configuration alternatives. Therefore, configuration-specific state diagrams are given in the following sections for each of these configurations, including state descriptions and state transitions.

The cluster wake-up must precede the communication startup in order to ensure that all mechanisms defined for the startup work properly. After initial wake-up the whole network behaves like a broadcast medium.

Startup—Time-Triggered Protocol Mode (TT-D and TT-M)

In general, a node may enter communication (i.e., the CC_NormalOperation state) via the coldstart path (CC_ColdStartICW and CC_ColdStartVCW state sequence) initiating the schedule synchronization, or via the integration path (CC_InitSync and CC_IntegrationVCW state sequence) integrating into an existing communication schedule. Only sync nodes are allowed to enter via the coldstart path, and they have to check in advance whether there is already channel activity, or not (see below).

In order to establish a global media access schedule, the initial synchronization of the periodic TDMA schedule must be coordinated among all connected communication nodes. Since any sync node is permitted to initiate schedule synchronization, simultaneously started and conflicting attempts by different sync nodes must be resolved. Each node initially transmits a Collision Avoidance Symbol (CAS, see above) specifically for this purpose, before initiating the periodic schedule. This symbol represents a kind of arbiter, which is used to resolve initial collisions of nodes simultaneously attempting to set up the communication schedule.

Both non-sync nodes and sync nodes start passive integration via the integration path as soon as they receive sync frames from which to derive the TDMA schedule information. During integration the node has to adapt its own clock to the global clock (rate and offset) and has to make its cycle time consistent with the global schedule observable at the network. Afterwards, these settings are checked for consistency with all available network nodes. Only if these checks are passed, can the node leave the integration phase and actively participate in communication.

Several modes are supported that restrict the node's ability to communicate or to initiate startup actively (see below). These modes are configurable by the host and are explained within in their respective sections.

Startup Timeouts

A sync node shall maintain two different timers supporting two timeout values, vdStartup and vdStartupNoise. The expiration of either of these timers causes the node to leave the initial sensing phase (CC_StartupListen state) with the intention of starting up communication. Even though the following description is based on the assumption that these timers increment their values (starting with a reset value of zero), it is allowable for the implementation to choose another realization (e.g. counter decrement).

The node local listen-timeout vdStartup shall have the same length (gdStartup) for each node in the system that is configured to send an initial CAS during startup (sync node). The upper bound gdStartup limits the listen time used by a node to determine if there is already communication between other nodes or at least one sync node actively requesting the integration of others.

Due to the initial clock drift between the set of nodes that are already actively communicating (transmitting sync frames), and the node that is attempting to integrate, the listen-timeout must consider the maximum accumulated drift over the length of one cycle. Therefore the time-out interval gdStartup shall be constrained by the following inequality (gdStartup is derived internally from the configuration parameters gdCycle and gdMaxDrift. In addition, the upper boundary for the listen timeout, vdStartupNoise, is a multiple of gdStartup and is configurable using the parameter gStartupNoise.):

$$gdStartup \geq gdCycle + gdMaxDrift$$

The maximum allowable drift between any two clocks in the network is an important system parameter and is known at design time. This 'worst case' period has to be covered by configuring gdMaxDrift (unit: macroticks) accordingly.

While counting is based on macrotick granularity, the reset of the timer vdStartup shall be performed asynchronously to the macrotick clock. The timer vdStartup shall be reset (vdStartup=0) upon entering the CC_StartupListen state.

Figure 60:
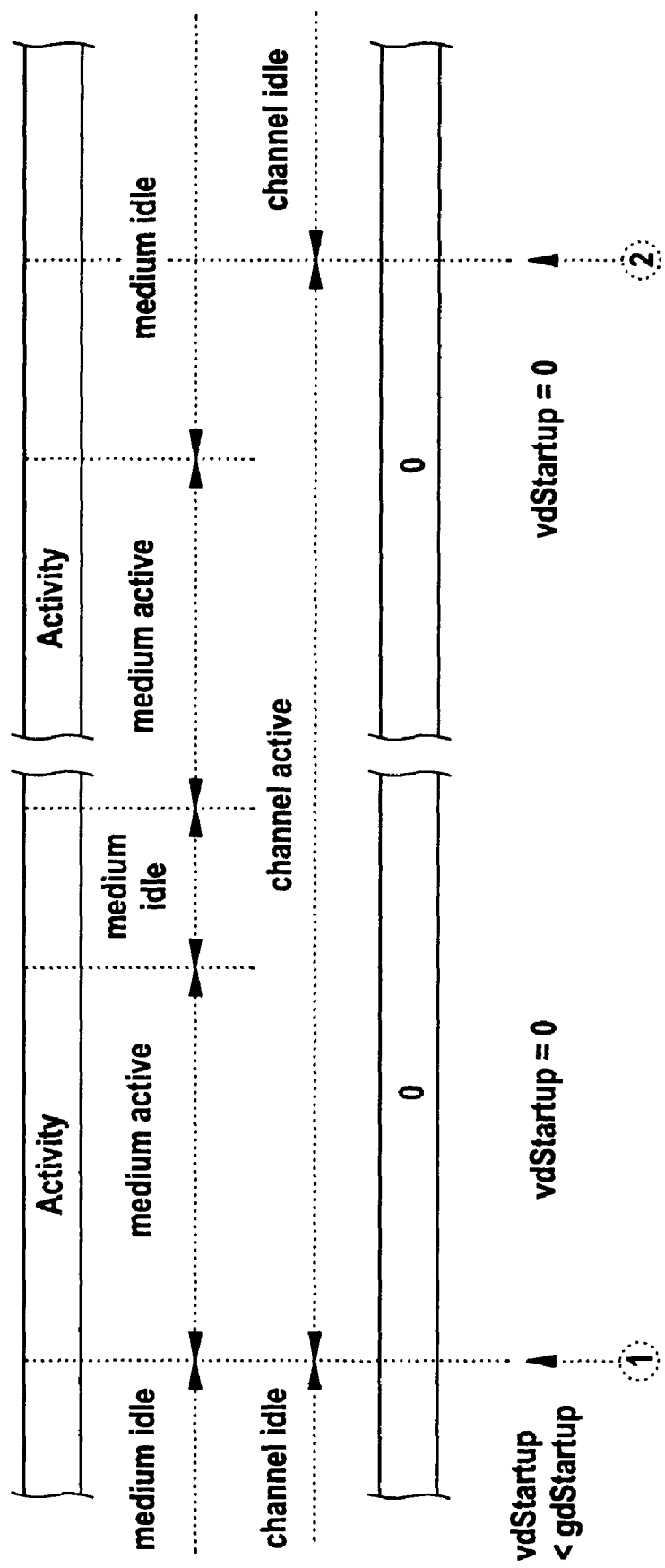
FIG. 60 illustrates a listen-timeout of a first timer value vdStartup.

Further reset conditions for the timer vdStartup are defined as follows (see also FIG. 60):

1. If communication channel activity (Any signal edge detectable at the receiver (i.e., a signal edge, which has passed the glitch filter) is referred to as "channel activity" (channel state machine has entered the active state).) is detected on one of the configured pChannels channels while the node is in the CC_StartupListen state, the listen-timeout vdStartup shall be reset.

2. As long as the channel status of one of the configured pChannels channels is active the timer is continuously reset. The timer shall resume counting once the channel idle state is reached for all pChannels channels and the node is still in the CC_StartupListen state.

Once the listen-timeout vdStartup expires (vdStartup=gdStartup), neither an overflow nor a cyclic restart of the timer shall be performed. The status has to be kept for further processing by the startup state machine (see Table 14).

At the same time the listen-timeout vdStartup is started for the first time (transition from CC_SoftReset to the CC_StartupListen state), a second timeout vdStartupNoise shall be started with vdStartupNoise=0. This additional timeout is used to improve reliability of the startup procedure in the presence of noise.

While counting is based on macrotick granularity, the reset of the timer vdStartupNoise shall be performed asynchronously to the macrotick clock. The timer vdStartupNoise shall be reset upon entering the CC_StartupListen state.

Figure 61:
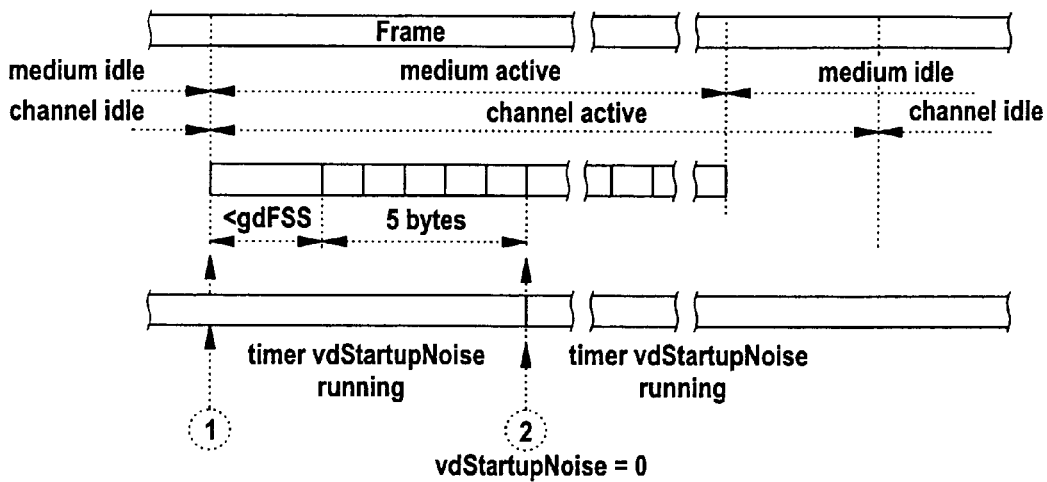
FIG. 61 illustrates listen-timeouts of a second timer value vdStartupNoise.

Further reset conditions for the timer vdStartupNoise and its behavior are defined as follows (see also FIG. 61):

1. The transition from channel idle to channel active shall not influence the timer. The node has to receive a certain pattern (s. below) in order to reset the timer vdStartupNoise.
2. If S_SuccessfulHeaderReception or S_CASReception occur for any channel while the node is in the CC_StartupListen state, the listen-timeout vdStartupNoise shall be reset.

Once the listen-timeout vdStartupNoise expires (vdStartupNoise=gStartupNoise*gdStartup), neither an overflow nor a cyclic restart of the timer shall be performed. The status has to be kept for further processing by the startup state machine (see Table 13).

Since the timeout vdStartupNoise won't be reset if channel activity is sensed (see FIG. 61), this timeout defines the fallback solution that guarantees that a node will try to start up the communication cluster even in the presence of noise. On the other hand, by having defined certain reset conditions, the synchronization of the coldstart entry is still guaranteed. The expiration of vdStartupNoise and the resulting entry into the coldstart path is captured in the variable vNoise (vNoise is set to 'true').

Listen-Only Mode

A FlexRay node shall support a listen-only mode. In listen-only mode, the node shall be able to receive all frames after successful integration to the running communication; i.e. the node is fully synchronized and performs the clock synchronization in order to keep this status. In comparison to the normal operation mode (CC_NormalOperation state) the node does not actively participate in communication, i.e. neither symbols nor frames are transmitted.

Setting vListenOnly to true while in the CC_SoftReset state configures the listen-only mode. vListenOnly cannot be set to true after leaving the CC_SoftReset state, but can be cleared at any time.

This mode supports communication diagnosis ('monitoring') as well as dedicated wake-up strategies, which require host interaction (vListenOnly subsequently cleared) in order to actively participate in communication after wake-up.

In listen-only mode, sync nodes behave like non-sync nodes during startup. Specifically, this applies to the prerequisites for transitioning from CC_IntegrationVCW to CC_PassiveOperation. Passing the validation check requires that at least two different sync nodes are already synchronized and able to communicate. Please refer to the description of the validation check described below.

ColdStart-Inhibit Mode

A FlexRay node shall support a coldstart inhibit mode. In coldstart inhibit mode the node shall be prevented from initializing the TDMA communication schedule. If the host has set vColdStartInhibit, the node shall not be allowed to initialize the cluster communication after having checked on existing communication, i.e. entering the coldstart path is prohibited. The node shall be allowed to integrate to a running cluster or to acknowledge another node, which initially tries to start the cluster communication.

Coldstart inhibit mode vColdStartInhibit can be set in the CC_SoftReset state only. vColdStartInhibit cannot be set after leaving the CC_SoftReset state, but can be cleared at any time. vColdStartInhibit can be mapped to the gColdStartMax configuration parameter, which utilizes the zero value to keep the node from starting the network on its own initiative (refer to the chapter "host interface"). It has to be checked whether the parameter gColdStartMax can be accessed during run time, i.e., after leaving CC_SoftReset state, as this is required for the "coldstart inhibit" function.).

Once the node is synchronized, vColdStartInhibit shall not restrict the node's ability to receive frames or to transmit frames.

Startup State Diagram—Time-Triggered Protocol Mode (TT-D and TT-M)

Figure 62:
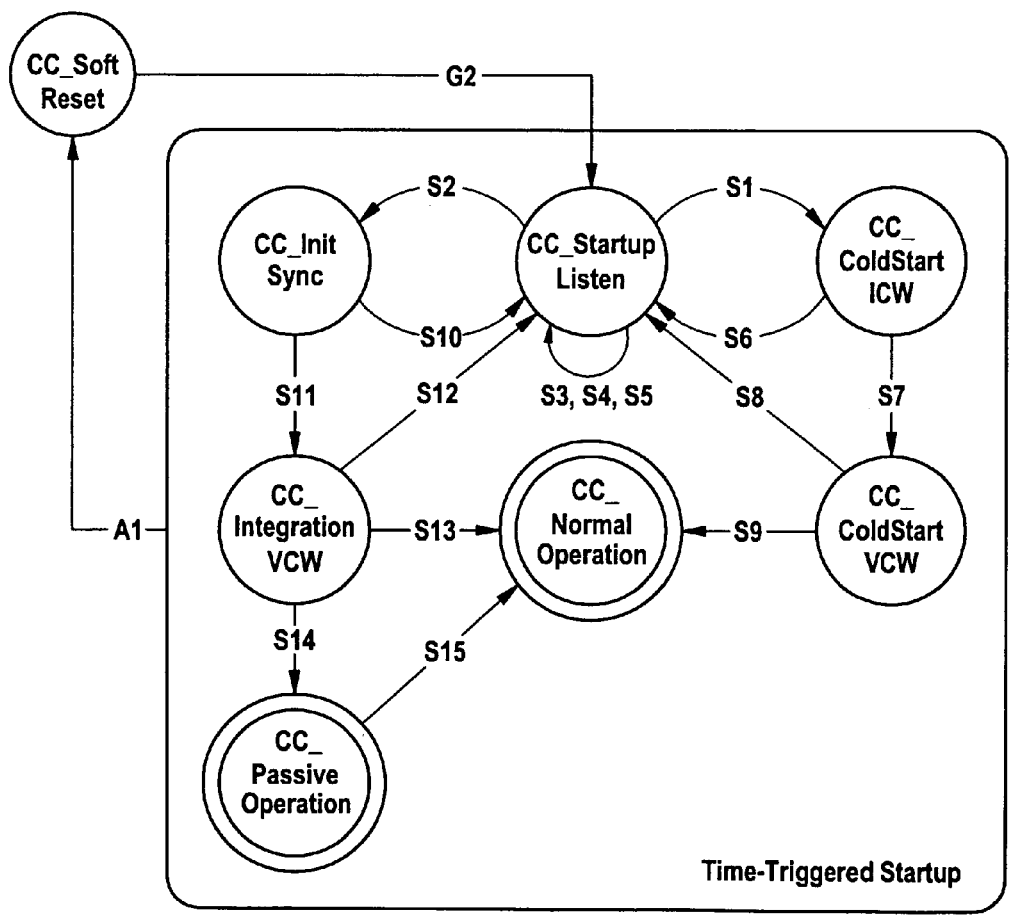
FIG. 62 illustrates a startup state diagram in a time triggered protocol mode.

FIG. 62 shows a Startup State Diagram—Time-Triggered Protocol Mode (TT-D and TT-M)

TABLE 14

State Transitions and Corresponding Conditions for Execution

| State Transition | Transition Direction from | to | | Condition for Transition | Action taken on Transition |
|---|---|---|---|---|---|
| S1 | CC_Startup Listen | CC_ColdStart ICW | | node is configured as a sync node (pSyncNode == true; gColdStartMax > 0) | Reset vdInitial ColdStartPhase to zero. |
| | | | AND | vColdStartCount < gColdStartMax | Immediately |
| | | | AND | vListenOnly is false | transmit CAS |
| | | | AND | vColdStartInhibit is false | symbol and start |
| | | | AND | not S2 | cycle timing. Start |
| | | | AND | ( | transmitting the |
| | | | | at least one channel is in channel idle state | sync frame according to the slot |

TABLE 14-continued

State Transitions and Corresponding Conditions for Execution

| State Transition | Transition Direction from | to | | Condition for Transition | Action taken on Transition |
|---|---|---|---|---|---|
| | | | | AND at least one of the following timers expired: listen-timeout vdStartup (vdStartup == gdStartup) listen-timeout with noise vdStartupNoise expired ) | schedule. Increment vColdStartCount by one. If vdStartupNoise has expired, the auxiliary variable vNoise is set |
| S2 | CC_Startup Listen | CC_Init Sync | AND | Reception (The frame reception comprises the detection of channel idle state after the frame) of an S_ValidEvenStartupFrame on one of pChannels channels ( vRefSync == 0 (no integration history available) OR fFrameID is different from vRefSync OR TT-M mode enabled ) | Set vRefSync to fFrameID of S_ValidEvenStartup Frame |
| S3 | | CC_Startup Listen | | vdCycleWithHistory expired (vdCycleWithHistory == gdStartup) | Reset vRefSync to zero. |
| S4 | | CC_Startup Listen | OR | reception of a frame header on one of pChannels channels ( S_SuccessfulHeaderReception occurred) reception of a valid CAS symbol on one of pChannels channels (S_CASReception occurred) | Reset vdStartupNoise to zero. |
| S5 | | CC_Startup Listen | | reception of channel activity on any channel | Reset vdStartup to zero. |
| S6 | CC_ColdStartup ICW | CC_Startup Listen | OR OR | reception of a valid CAS symbol on one of pChannels channels (S_CASReception occurred) reception of a frame header on one of pChannels channels (S_SuccessfulHeaderReception occurred) ( end of current cycle (derived from local cycle time) AND vColdStartCount is equal to gColdStartMax ) Note: Due to this definition it is possible that a node stops current startup process (re-enter CC_StartupListen from CC_ColdStartICW), even though there hasn't been any possibility for other nodes to answer until then. | vdStartup and vdStartupNoise are reset to zero. If vRefSync is not zero, reset vdCycle-WithHistory to zero. Set the flag vColdStartAborted or vCCMS, respectively. Stop timing and transmitting the sync frame. |
| S7 | | CC_ColdStart VCW | AND AND | not S6 end of current cycle (derived from local cycle time) vdInitialColdStartPhase expired (vdInitialColdStartPhase == gdInitialColdStartPhase) | Start clock synchronization. Increment vColdStartCount by one. |
| S8 | CC_ColdStartup VCW | CC_Startup Listen | ( ) OR ( ) OR ( | end of current cycle (derived from local cycle time) AND vColdStartCount is equal to gColdStartMax AND not S9 end of current cycle (derived from local cycle time) AND vInvalidSyncCount[ch] ≧ vValidSyncCount[ch] for any channel ch end of current cycle (derived from local cycle time) | vdStartup and vdStartupNoise are reset to zero. If vRefSync is not zero, reset vdCycle-WithHistory to zero. If gColdStartMax was reached, the flag vCCMS is set. If the majority was missed for validation, the vSMMS flag is set. If the rate or offset correction value |

TABLE 14-continued

State Transitions and Corresponding Conditions for Execution

| State Transition | Transition Direction from | Transition Direction to | | Condition for Transition | | Action taken on Transition |
|---|---|---|---|---|---|---|
| | | | | AND | \|vOffsetCorrection\| > pOffsetCorrectionOut | exceeded its limit, the vCCLR flag is set. |
| | | | ) OR ( | | | Stop timing, clock synchronization and transmitting the sync frame. |
| | | | | | end of current cycle (derived from local cycle time) | |
| | | | | AND | \|vRateCorrection\| > pRateCorrectionOut | |
| | | | | | Note: It is assumed that the vOffsetCorrection is set to zero for cycles with even cycle counter value [(vCycle MOD 2)=0] by the clock synchronization unit | |
| | | | ) | | | |
| S9 | | CC_Normal Operation | | | end of current cycle (derived from local cycle time) | Enable the transmission of data frames. |
| | | | AND | | (vCycle MOD 2) == 1 | The flag vOpViaColdstart is set. |
| | | | AND | | vInvalidSyncCount[ch] < vValidSyncCount[ch] for all ch | If vNoise is set, the flag vColdstartNoise is set. |
| | | | AND | | \|vOffsetCorrection\| ≦ pOffsetCorrectionOut | The flags vMRCS and vCCLR are cleared. |
| | | | AND | | \|vRateCorrection\| ≦ pRateCorrectionOut | |
| | | | AND | ( | | |
| | | | | | TT-M mode enabled | |
| | | | | OR | vSyncPairs is at least one | |
| | | | ) | | | |
| S10 | CC_Init Sync | CC_Startup Listen | | | S_ValidOddStartupFrame with fFrameID = vRefSync too late | vdStartup and vdStartupNoise are reset to zero. |
| | | | OR | | S_ValidOddStartupFrame with fFrameID = vRefSync too early | If vRefSync is not zero, reset vdCycle-WithHistory to zero. |
| | | | | | Note: During the CC_InitSync state, the node tries to catch the corresponding S_ValidStatupFrameOdd, which belongs to the initial S_ValidEvenStartupFrame. Besides the check on the matching frame identifier, the derived correction value for the rate adoption must not exceed certain limits. The parameter pRateCorrectionInitOut determines these boundaries, and the terms 'too late' and 'too early' relate to this definition. | The flag vMRCS is set. |
| S11 | | CC_Integration VCW | | | end of current cycle (derived from local cycle time) | Start clock synchronization. |
| | | | AND | | (vCycle MOD 2) == 1 | The flag vOffsetOut is cleared. |
| S12 | CC_Integration VCW | CC_Startup Listen Listen | ( | | | vdStartup and vdStartupNoise are reset to zero. |
| | | | | | end of current cycle (derived from local cycle time) | If vRefSync is not zero, reset vdCycle-WithHistory to zero. |
| | | | | AND | vInvalidSyncCount[ch] ≧ vValidSyncCount[ch] for any ch | |
| | | | ) OR ( | | | If the majority was missed for validation, the vSMMS flag is set. |
| | | | | | end of current cycle (derived from local cycle time) | |
| | | | | AND | (vCycle MOD 2) == 1 | If the rate or offset correction value exceeded its limit, the vCCLR flag is set. |
| | | | | AND | vOffsetOut == true (an offset correction value greater than pOffsetCorrectionOut has already been accepted once) | |
| | | | | AND | \|vOffsetCorrection\| > pOffsetCorrectionOut | If the transition was triggered due to the vSyncPairs value, the flag vMRCS is set. |
| | | | ) OR ( | | | |
| | | | | | end of current cycle (derived from local cycle time) | |
| | | | | AND | (vCycle MOD 2) == 1 | Stop clock synchronization. |
| | | | | AND | \|vOffsetCorrection\| > pOffsetCorrectionInitOut | |

TABLE 14-continued

State Transitions and Corresponding Conditions for Execution

| State Transition | Transition Direction from | to | Condition for Transition | Action taken on Transition |
|---|---|---|---|---|
| | | | ) OR ( end of current cycle (derived from local cycle time) AND (vCycle MOD 2) == 1 AND \|vRateCorrection\| > pRateCorrectionOut ) OR ( end of current cycle (derived from local cycle time) AND (vCycle MOD 2) = = 1 AND value of vSyncPairs not big enough (refer to section 0) ) | |
| S13 | | CC_Normal Operation | not S12 AND end of current cycle (derived from local cycle time) AND (vCycle MOD 2) == 1 AND vInvalidSyncCount[ch] < vValidSyncCount[ch] for all relevant ch (A channel with vInvalidSyncCount[ch] == vValidSyncCount[ch] == 0 is disregarded for validation analysis) AND vSyncPairs is big enough (refer to section 0) AND vListenOnly is false AND \|vOffsetCorrection\| ≦ pOffsetCorrectionOut AND \|vRateCorrection\| ≦ pRateCorrectionOut | Enable the transmission of data frames. The flags vMRCS and vCCLR are cleared. |
| S14 | CC_Integration VCW | CC_Passive Operation | not S12 AND end of current cycle (derived from local cycle time) AND (vCycle MOD 2) == 1 AND vInvalidSyncCount[ch] < vValidSyncCount[ch] for all relevant ch AND vSyncPairs is big enough (refer to section 0) AND vListenOnly is true AND \|vOffsetCorrection\| ≦ pOffsetCorrectionOut AND \|vRateCorrection\| ≦ pRateCorrectionOut | The flags vMRCS and vCCLR are cleared. |
| S15 | CC_Passive Operation | CC_Normal Operation | end of current cycle (derived from local cycle time) AND vListenOnly is false | Enable the transmission of data frames. |
| A1 | All States | CC_SoftReset SoftRes | soft reset initiated (in the respective control register) | |

CC_StartupListen State

A FlexRay node shall enter the CC_StartupListen state from the CC_SoftReset state when the communication controller is ready to attempt communication startup or enter a running network. If the communication controller is capable of initiating a startup attempt, the Host shall first ensure that the cluster is awake before letting the communication controller enter the CC_StartupListen state.

When entering the CC_StartupListen state from CC_SoftReset or re-entering from any other state of the startup state machine other than the CC_StartupListen state itself, sync nodes shall (re-)start their listen-timeout vdStartup and their listen-timeout with noise vdStartupNoise (see above).

The global cluster constant gColdStartMax defines the number of cycles a node shall be permitted to attempt a coldstart, i.e. the number of cycles a node may reside in coldstart path. Once vColdStartCount is equal to gColdStartMax the node shall not enter the coldstart path (This could be achieved by preventing the restart of the listen-timeouts vdStartup and vdStartupNoise.). vColdStartCount is only reset upon entering the CC_StartupListen state from the CC_SoftReset state.

Non-sync nodes shall not enter the coldstart path, because these nodes are not allowed to initiate communication on their own. This could be achieved by several means, e.g. for non-sync nodes gColdStartMax is configured to zero, or the listen-timeouts vdStartup and vdStartupNoise are not maintained.

Upon the reception of an S_ValidEvenStartupFrame the integration path shall be entered via the CC_InitSync state. Furthermore, vRefSync must be zero (see strategy defined in order to prevent a node from repetitively choosing a faulty node as a reference). fFrameID shall be stored to vRefSync, in order to store the identifier of the reference frame, and thereby a representation of the corresponding sync node for further processing (see below).

If at least one of the channels is in channel idle state, at least one of the listen-timeouts vdStartup or vdStartupNoise has expired and the entry condition to the integration path is not fulfilled, the node shall enter the CC_ColdStartICW state.

A node that failed to integrate to the reference node that was selected to derive initial rate and offset information, shall not utilize the same node for an integration attempt during the next communication cycle. Therefore, a node shall maintain a history of reference nodes it has attempted to use in order to avoid repetitive selection of the same reference node. It must be ensured that a node in the CC_StartupListen state selects a sync node different from the former reference node if present.

If an integration attempt fails with a selected reference node the reference node shall not be permanently excluded from the list of potential reference nodes. Due to a transient disturbance the integration might have failed even though the reference node operated fault-free (A corrupted sync frame might prevent the transition in CC_InitSync state or CC_IntegrationVCW state). Therefore, the following strategy shall be applied after an integration attempt has failed (see below).

- A node entering CC_StartupListen shall reset and start a timer with the timeout value vdCycleWithHistory, if vRefSync is nonzero. This timer shall encompass the same time period gdStartup as the vdStartup timeout.
- The timeout vdCycleWithHistory shall not be reset due to channel activity in the CC_StartupListen state
- Upon the expiration of timeout vdCycleWithHistory, vRefSync shall be cleared. This setting (vRefSync=0) prevents the restart of vdCycleWithHistory
- The node shall only enter integration path (via the CC_InitSync state), if the fFrameID of a received S_ValidEvenStartupFrame is not equal to the ID stored in vRefSync. Since there is only one sync node available in TT-M mode, it is counterproductive to attempt to sync to a different node.

In TT-M mode, a non-sync node shall not perform the above-defined strategy. In TT-M mode, a single sync node, i.e. the master exists. All non-sync nodes and their synchronization are fully dependent on the master node. Therefore, this node is never excluded as a potential reference. When entering the CC_StartupListen state from any other state, vRefSync is cleared (i.e., set to zero).

When re-entering the CC_StartupListen state from any state, the rate correction value shall be reinitialized with pMicroOverheadperCycleNom.

CC_ColdStartICW (Initial Check Window) State

Only sync nodes shall be allowed to enter the coldstart path via the CC_ColdStartICW state. The phase, for which a sync node is in the CC_ColdStartICW state, shall be used for the following purposes:

- It has to be ensured that a single sync node is going to start the communication cluster. Therefore, other sync nodes have to be prevented from entering the coldstart path. When multiple nodes enter simultaneously the CC_ColdStartICW state, a resolution mechanism ensures that all but one return to CC_StartupListen state.
- In the CC_ColdStartICW state the coldstart initiating node is expected to have exclusive access to the channels in the fault-free case. Other nodes that are integrating based on the sync frame reception of the coldstart initiator always follow a defined procedure that ensures that for initial cycles in the integration path these nodes stay passive. Consequently, the node initiating the coldstart should not receive any responses while in the CC_ColdStartICW state. Therefore, any frame reception during the CC_ColdStartICW state is due to another node having entered coldstart path at the same time (refer to bullet above) or to an error scenario.

In the CC_ColdStartICW state, a sync node shall transmit an initial CAS symbol and shall then transmit its configured sync frame periodically to enable the startup of the entire network. By starting the first communication cycle after CAS transmission, the cycle counter is initialized to zero; thus the first sync frame is transmitted with fCycleCount equal to zero. By transmitting the CAS symbol, other sync nodes are prevented from entering the coldstart path. If more than a single sync node transmits the CAS symbol simultaneously, those nodes all enter the CC_ColdStartICW state simultaneously. However, their cycle timing is inherently synchronized so this scenario is resolvable during the next cycles while in CC_ColdStartICW state.

The reception of a valid CAS symbol (S_CASReception occurred) or a frame header (indicated by S_SuccessfulHeaderReception) on any channel shall cause the node to re-enter CC_StartupListen state immediately.

In the CC_ColdStartICW state a node shall not transmit normal data frames, which are frames without sync bit set.

A node shall remain in the CC_ColdStartICW state for a certain period determined by the initial coldstart phase (gdInitialColdStartPhase). A timer vdInitialColdStartPhase shall be reset and started, when CC_ColdStartICW is entered. This timer shall cover the initial slot used for CAS transmission as well as three complete communication cycles (refer to the definition of gdInitialColdStartPhase in the following part of the description). Thereby, gdInitialColdStartPhase determines the time a node stays in the CC_ColdStartICW state before entering CC_ColdStartVCW.

Upon the transition into another state the timer vdInitialColdStartPhase shall be stopped.

A node in time-triggered distributed (TT-D) mode with an "incoming link failure" shall stop transmission after a pre-defined interval of time. Thereby other sync nodes are enabled to take over responsibility of starting the communication for the cluster.

For this feature the additional counter vColdStartCount shall be maintained.

- With the transition into the CC_ColdStartICW state the variable vColdStartCount shall be incremented by one.
- With each new cycle-start in the CC_ColdStartICW state, vColdStartCount shall be incremented by one.
- At the end of each cycle, vColdStartCount is compared to the allowed maximum gColdStartMax. If vColdStartCount is equal to gColdStartMax, the node shall re-enter the CC_StartupListen state. In this case, the node that initiates the coldstart has not been able to achieve communication with another node (transition to CC_NormalOperation state) within gColdStartMax cycles.
- Once this condition had become true, the sync node shall not be able to enter the coldstart path again. Only the host can reset this status (by forcing the transition to the CC_SoftReset state).

A node in time-triggered master-controlled (TT-M) mode shall not maintain the vColdStartCount counter.

CC_ColdStartVCW (Validation Check Window) State

In the CC_ColdStartVCW state, the node shall maintain periodic transmission of its sync frame on cycle basis—but no other frames shall be scheduled for transmission. In addition, the node shall perform a validation check at the end of each cycle in order to assess the network image perceived for the current cycle. Depending on the result of the validation check, the node shall remain in the CC_ColdStartVCW state, if no response has been received at all (and vColdStartCount is smaller than gColdStartMax), shall step back to the CC_StartupListen state, if the response does not fit to the node-local communication schedule, shall enter normal operation (the CC_NormalOperation state), if the response is in accordance with the node-local communication schedule.

This list applies for sync nodes in time-triggered distributed (TT-D) mode. For FlexRay clusters operating in time-triggered master-controlled (TT-M) mode, the coldstart initiator is the only node configured to send sync frames. Therefore, this node shall not wait for any response and shall perform the transition into the CC_NormalOperation state at the end of the cycle.

By transmitting the sync frame, the coldstart initiator requests other nodes to join into the given communication schedule. Once these nodes (At a minimum, the joining of one further sync node is required for TT-D protocol mode.) become active, the coldstart initiator shall leave the coldstart path by entering normal operation, i.e. the protocol operation phase (POP). In order to transfer a coldstart initiator in TT-D mode into the CC_NormalOperation state, the response of other active nodes must pass certain validation criteria. The term 'response' and the validation check rules are described in detail below.

Two different mechanisms shall contribute to the validation check.

First, received sync frames must be in accordance to the node-local communication schedule Furthermore, the correction terms of the clock synchronization must not exceed the configured boundaries.

To prepare for the validation check, the node shall observe and assess the communication over one cycle. Two event counters per channel (vValidSyncCount[ch] and vInvalidSyncCount[ch]) shall be administrated in order to support decision-making. In accordance with the static segment acceptance criteria (refer to Chapter 'Frame Processing' above), a clear distinction between several possible cases can be made for each slot. These slot scenarios shall be judged and counters shall be incremented according to the following rules:

```
if (S_ValidStaticFrame with sync bit set is received on channel ch)
    vValidSyncCount[ch]++ ;
end;
elseif [(an S_CorrectFrame with sync bit failed the static segment
        acceptance due to
        S_PayloadLengthStaticError, S_FrameIDError
        or S_CycleCountError on channel ch) and
        (no sync frame with fFrameID has already been taken into
        account for counter increment during current cycle)]
    vInvalidSyncCount[ch]++;
end;
```

The validation check counters shall be initialized for all configured pChannel channels upon each new cycle start as follows:

vValidSyncCount[ch]=1;
vInvalidSyncCount[ch]=0;

The node shall consider itself to operate correctly and shall therefore initialize the counters vValidSyncCount[ch] accordingly (pre-set to one).

The validation check shall be passed, if vValidSyncCount[ch] is greater than vInvalidSyncCount[ch] for all configured channels. The transition to CC_NormalOperation shall be only permitted, if the check is passed with vValidSyncCount[ch]>1 on at least one of the pChannel channels.

With the transition to CC_ColdStartVCW and with each new cycle start in CC_ColdStartVCW, the variable vColdStartCount shall be incremented by one. At the end of each cycle, vColdStartCount shall be compared to the allowed maximum gColdStartMax. If vColdStartCount is equal to gColdStartMax, the node shall re-enter the CC_StartupListen state.

In CC_ColdStartVCW, the node shall execute the global clock synchronization for offset and rate according to the regular rules. CC_ColdStartVCW is the latest point in time the clock synchronization including measurement and correction phase has to be active. The node could perform clock synchronization already in the ColdStartICW state. This might be advantageous for the TT-M protocol mode and the establishment of the two-cycle based rate measurement phase. According to the definition of the regular rate measurement phase, all sync frames shall be registered and pair-wise (sync frames with same frame identifier) evaluated for clock synchronization. The offset measurement phase shall be applied in accordance to the regular scheme, too. This means that for each cycle with an odd cycle counter value the related sync frames shall be used to determine next offset correction term. The sync frames received from nodes that have integrated upon the coldstart attempt are delayed by two times the overall (network) propagation delay. This has to be considered for the setting of the offset correction term boundary (anyway).

The node in the CC_ColdStartVCW state requires at least one additional matching pair of sync frames suitable for rate measurement (same frame identifier, consecutive occurrence in 'even/odd' cycle order), in order to fulfill one of the necessary prerequisites for entering CC_NormalOperation. Upon reception of two valid, matching frames (S_ValidStaticFrame) in even/odd cycle order, the node in CC_ColdStartVCW shall increment the counter vSyncPairs. As long as the node does not receive a response, it performs the clock correction based on one "pair of matching sync" frames, namely its own transmissions (this is taken into account by using the value 0 as 'measurement sample'). The introduction of vSyncPairs is done in order to ease the description of several distinctions to be made in the specification. As an auxiliary variable, it is not required that this parameter is used for an implementation of a FlexRay protocol controller. With the beginning of each rate measurement phase in CC_ColdStartVCW state, the counter vSyncPairs shall be reset to zero.

In addition to the prerequisite that necessary sets of measurement samples are available (vSyncPairs is greater than zero), the quality of the resulting correction terms for clock synchronization shall be assessed. The node is only permitted to execute transition into the CC_NormalOperation state if the correction terms for both rate and offset are within the configured limits

|vOffsetCorrection|≦pOffsetCorrectionOut

|vRateCorrection|≦pRateCorrectionOut

If one of the correction terms violates the limit settings, the node shall re-enter the CC_StartupListen state.

CC_InitSync State

A node shall enter CC_InitSync after having received an S_ValidEvenStartupFrame on one of the configured pChannel channels in the CC_StartupListen state. In the CC_InitSync state, the node shall not schedule any transmission.

The node variable vRefSync shall contain the frame identifier of the sync frame that has been used to enter the integration path. The sync node corresponding to this reference frame is called the reference node.

In the CC_InitSync state an initial rate correction value shall be determined in order to adjust the local macrotick timing to the timing given by the reference node (referred to as "rate adoption"). To accomplish this, the time between the initial occurrence of the reference frame and its next occurrence is measured and the difference from the nominal cycle length shall be applied as the rate correction term.

In order to improve robustness of the entire integration process against temporary disturbances, the reception of S_ValidStartupFrame is tracked for each channel separately. That means that if the initial sync frame has been received on channel A and the next sync frame on this channel is missing, the node shall remain in the CC_InitSync state if the rate adoption can still be based on the other channel, i.e. on channel B. This requires the correct reception of a valid pair of S_ValidStartupFrame (starting with S_ValidEvenStartupFrame) on the second channel. In no case a pair of frames shall be constituted out of measurements picked from different channels, i.e. cross-channel measurement is prohibited.

The node shall administer means to ensure that a transition back into the CC_StartupListen state is performed, if S_ValidOddStartupFrame is received too early on one of the channels ch, for which an S_ValidEvenStartupFrame has already been received no S_ValidOddStartupFrame is received within a defined period on any of the channels ch for which an S_ValidEvenStartupFrame has already been received In essence, the captured initial rate correction value must not exceed a configured limit, which is given by pRateCorrectionInitOut.

Once a valid rate correction term has become available, the node shall run with the corrected rate (direct application of the correction term).

Furthermore, S_ValidOddStartupFrame shall be used to determine the nominal schedule position. This operation shall be based on the received identifier fFrameID. The node shall set its local cycle time accordingly, i.e., it shall synchronize the micro- and macrotick counters to the first BSS (falling edge) of the received sync frame. The cycle counter value fCycleCount of the received sync frame shall be extracted and used to initialize the local cycle counter.

In this manner, the local schedule is established according to the information derived from the reference node. The node shall follow the local schedule until the end of the current cycle without transmitting actively.

Any further reception shall be ignored and neither rate nor offset measurements shall be performed. At the end of the cycle, the node shall transit into CC_IntegrationVCW state.

CC_IntegrationVCW State

In the CC_IntegrationVCW state, the node shall not schedule any transmission.

In CC_IntegrationVCW the node shall confirm the settings copied from the reference node with the overall network communication scheme. For this purpose the node shall perform a cycle-based validation check similar to the check defined for the CC_ColdStartVCW state (see above). Since the node still behaves passively, the initialization of the administered counters differs from that for a node in CC_ColdStartVCW (which transmits a sync frame and thus participates actively in the validation check).

The validation check counters shall be initialized for all configured pChannel channels upon each new cycle start as follows:

vValidSyncCount[ch]=0;

vInvalidSyncCount[ch]=0;

Counter increment shall be performed according to the following rules:

--- if (S_ValidStaticFrame with sync bit set is received on channel ch)
    vValidSyncCount[ch]++;
end;
elseif [(an S_CorrectFrame with sync bit failed the static segment
        acceptance due to S_PayloadLengthStaticError,
        S_FrameIDError
        or S_CycleCountError on channel ch) and
        (no sync frame with fFrameID has already been taken into
        account for counter increment during current cycle)]
    vInvalidSyncCount[ch]++;
end;

---

The validation check shall be considered to be passed if vValidSyncCount[ch] is greater than vInvalidSyncCount[ch] for all channels except those for which vValidSyncCount[ch]==vInvalidSyncCount[ch]==0. If both the vInvalidSyncCount and the vValidSyncCount are equal to zero for all configured channels, the validation check fails.

The transition into CC_NormalOperation can only take place if the validation check has been passed, but additionally further conditions must be satisfied (see clock correction term assessment and next paragraphs, respectively). The validation check shall run concurrently with these additional checks until the validation check itself fails or a state transition due to another condition is executed.

When the node enters CC_IntegrationVCW, a regular measurement phase for the next rate correction term shall be started. According to the definition of the regular rate measurement phase, all sync frames shall be registered and pairwise (sync frames with same frame identifier) evaluated for clock synchronization. The offset measurement phase shall be applied in accordance to the regular scheme, too. This means that for each cycle with an odd cycle counter value the related sync frames are used to determine next offset correction term.

An integrating sync node requires at least one matching pair of sync frames suitable for rate measurement (same frame identifier, consecutive occurrence in 'even/odd' order) in order to fulfill one of the necessary prerequisites to enter CC_NormalOperation state. Using this pair of sync frames, the node can acknowledge an existing node in CC_ColdStartVCW or simply integrate to a synchronized cluster. The number of matching pairs of sync frames shall be accumulated in vSyncPairs.

The counter vSyncPairs shall be evaluated at the end of an odd cycle.

For sync nodes that do not operate in listen-only mode (vListenOnly is false) vSyncPairs needs to be at least one, otherwise no integration shall be possible. In that case, the node shall re-enter the CC_StartupListen state. This characterizes the scenario, where the original reference node does not maintain proper sync frame transmission for the entire integration phase.

This holds also for nodes in TT-M mode, which are going to integrate to the 'master'-driven schedule. The parameter vSyncPairs needs to be at least one; otherwise no integration shall be possible. In that case, the node shall re-enter the CC_StartupListen state.

If a sync node is configured as a listen-only node (vListenOnly is true), it has to fulfill the same condition as non-sync nodes in TT-D protocol mode. These nodes need to receive at least two matching pairs of sync frames suitable for rate measurement (same frame identifier, consecutive occurrence). Only if there is already a communication established comprising at least two sync nodes (nodes in the CC_NormalOperation state) can non-sync nodes (or sync nodes in listen-only mode) join in. For these nodes vSyncPairs needs to be at least two, otherwise no integration shall be possible. The node shall re-enter the CC_StartupListen state, if vSyncPairs is zero.

With the beginning of each rate measurement phase in the CC_IntegrationVCW state, the variable vSyncPairs shall be reset to zero.

In addition to the prerequisite that necessary sets of measurement samples are available (vSyncPairs is large enough, see above), the quality of the resulting correction terms for clock synchronization must be acceptable. A node shall be allowed to join active communication (transition into the CC_NormalOperation state), only if the correction terms for both rate and offset are within the configured limits

|vOffsetCorrection|≦pOffsetCorrectionOut

|vRateCorrection|≦pRateCorrectionOut.

If one of the correction terms violates the limit settings, the node has to re-enter CC_StartupListen.

The only exception to this rule is for the first time an offset correction value is available in the CC_IntegrationVCW state. In this special case the correction value vOffsetCorrection may exceed the configured limit pOffsetCorrectionOut, which is applied during regular clock synchronization. The initial offset correction value shall be compared against the limit pOffsetCorrectionInitOut.

|vOffsetCorrection|≦pOffsetCorrectionInitOut

If this more relaxed requirement can be met, the node shall remain in the CC_IntegrationVCW state, but shall not transit into the CC_NormalOperation state.

After the application of the initial offset correction term (and the check against the pOffsetCorrectionInitOut limit) in the CC_IntegrationVCW state, the next offset correction term has to meet the regular pOffsetCorrectionOut limit. That means the described exception is only made once, i.e., when the first offset correction term is available.

In order to ensure proper processing, a flag vOffsetOut shall be set to true once the initial offset correction term check has been performed. The introduction of vOffsetOut is done in order to ease the description in the specification. As an auxiliary variable it is not required that this parameter is used for an implementation of a FlexRay protocol controller. This flag shall be always evaluated, if a new offset correction term should be checked against the configured limit settings. The flag vOffsetOut is initialized to false, if CC_IntegrationVCW is entered from the CC_InitSync state.

The combination of all these checks ensures that the node only becomes an active transmitter if the local time base (including the cycle counter and the clock synchronization parameters) is consistent with the global time as represented by the majority of active sync nodes in the system.

CC_NormalOperation State

As soon as the node that transmitted the first CAS symbol (resolving the potential access conflict and entering startup via coldstart path) and one additional node have entered the CC_NormalOperation state, the startup phase is finished for a cluster in TT-D protocol mode.

In TT-M protocol mode, the single sync node enters the CC_NormalOperation state without any communication counterpart. This is due to its master role in the time-triggered master-controlled mode.

In the CC_NormalOperation state, all configured messages will be scheduled for transmission. This includes all data frames as well as the sync frame.

CC_PassiveOperation State

In the CC_PassiveOperation state a node shall not transmit any of its configured frames. Nevertheless, the node shall not stop all activities—it shall perform clock synchronization based on the received sync frames, the reception of messages and the full support of the host interface.

In addition, the CC_PassiveOperation state is used to support the 'listen only' protocol feature, where nodes are fully synchronized and receive all available frames (including receive buffer update), but shall not transmit anything. This mode shall be indicated by vListenOnly, which can be set by the host in the CC_SoftReset state only. As soon as the host clears vListenOnly, the CC_NormalOperation state shall be entered at the beginning of the next cycle.

Startup—byteflight Protocol Mode (BF)

A correctly configured sync master communication controller (pMaster is true) shall enter the startup sequence via the transition from CC_SoftReset to CC_byteflightMaster.

A single node should be configured as the sync master node, which must send a status symbol on all gChannels channels. For the sync master node pChannels must be equal to gChannels.

A correctly configured slave node communication controller (pMaster is false) shall enter the startup sequence via the transition from CC_SoftReset to CC_byteflightListen.

All slave nodes shall synchronize to the status symbol transmitted by the sync master node. If that node does not start, the system does not start up.

Slave nodes start their communication cycle on both channels with the reception of the first valid status symbol on one of the pChannels channels.

For a detailed description of the byteflight protocol mode, please refer to M. Peller, J. Berwanger, and R. Greissbach, byteflight Specification, version 0.5, BMW Corporation 1999, available at http//www.byteflight.com.

Startup State Diagram—byteflight Protocol Mode (BF)

Figure 63:
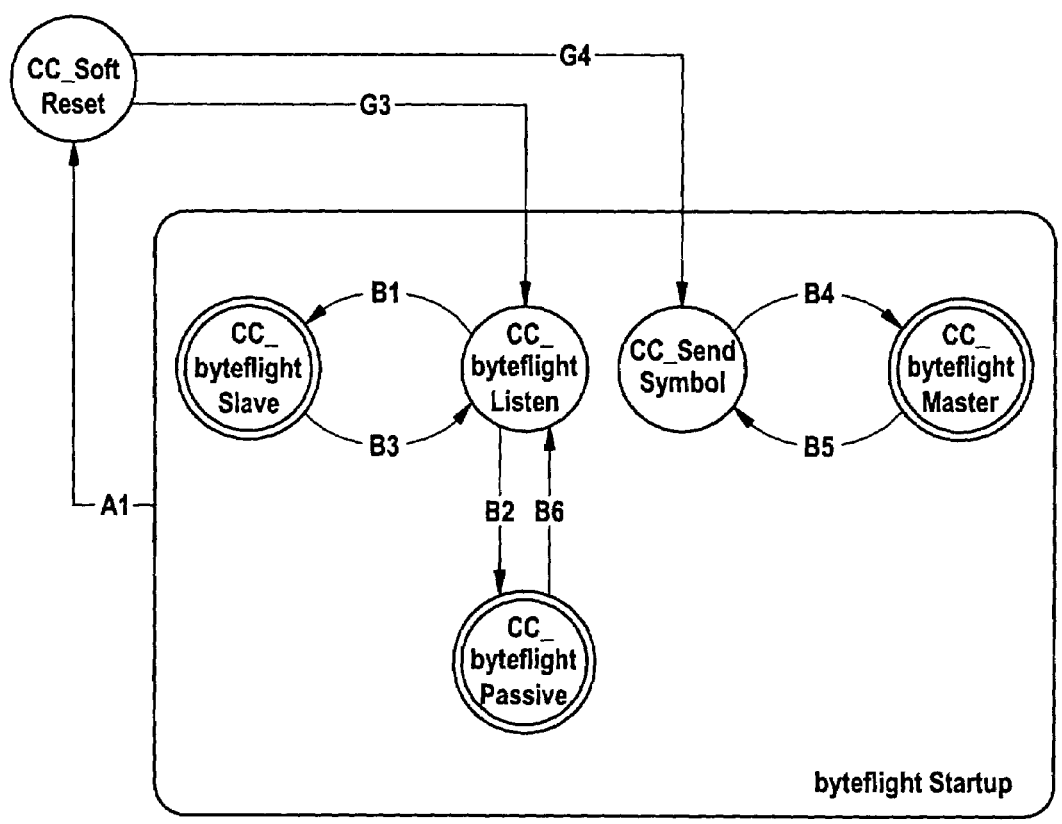
FIG. 63 illustrates a startup state diagram in a byteflight protocol mode.

FIG. 63 shows a Startup State Diagram of the byteflight Protocol Mode (BF)

TABLE 15

State Transitions and Corresponding Conditions for Execution

| State Transition | State Direction from | to | Condition for Transition | Action taken on Transition |
|---|---|---|---|---|
| B1 | CC_byteflightListen | CC_byteflightSlave | reception of a valid status symbol at one of pChannels channels AND vListenOnly is false | |
| B2 | | CC_byteflightPassive | reception of a valid status symbol at one of pChannels channels AND vListenOnly is true ('Listen-only' mode is an invalid configuration for the master node!) | |
| B3 | CC_byteflightSlave | CC_byteflightListen | network idle time reached (vMacrotick == gdCycle − gdNIT; based on local timers) | |
| B4 | CC_SendSymbol | CC_byteflightMaster | transmission of the status symbol finished | |
| B5 | CC_byteflightMaster | CC_SendSymbol | end of current cycle (derived from local cycle time) | |
| B6 | CC_byteflightPassive | CC_byteflightListen | network idle time reached (vMacrotick== gdCycle-gdNIT; based on local timers) | |
| A1 | All States | CC_SoftReset | soft reset initiated (in the respective control register) | |

CC_SendSymbol State

A single node that has been configured as sync master (pMaster is set) shall send a status symbol. With the end of the transmission the timers (of the receiver unit) shall be started according to the definitions in the byteflight specification (see M. Peller, J. Berwanger, and R. Greissbach, byteflight Specification, version 0.5, BMW Corporation 1999, available at http://www.byteflight.com) and the node shall enter the CC_byteflightMaster state.

When a node enters the CC_SendSymbol state while a frame reception is ongoing the reception process is stopped.

CC_byteflightMaster State

A node shall send and receive messages in the CC_byteflightMaster state according to its configuration. Upon entering the CC_byteflightMaster state, i.e. after the transmission of the status symbol, the startup phase is completed. The master node does not need any acknowledgement from other nodes.

CC_byteflightListen State

All slave nodes (pMaster is false) shall wait in the CC_byteflightListen state for the reception of a valid status symbol. All configured pChannels channels shall be independently monitored. The transition into CC_byteflightSlave and therefore the synchronization of both channels to the master shall be done on reception of the first valid status symbol. After initialization of the wait timers, all configured channels shall operate asynchronously with respect to the required frame mini-slotting on each of the pChannels channels.

CC_byteflightSlave State

Slave nodes shall synchronize to a valid status symbol and transmit and receive messages in the CC_byteflightSlave state according to their configuration.

CC_byteflightPassive State

In CC_byteflightPassive a node shall not transmit any of its configured frames. The node shall not stop all activities, but shall continue performing synchronization to status symbols (via the CC_byteflightListen state) and the reception of messages.

The CC_byteflightPassive state is used to support the 'listen only' protocol feature, where the node shall be fully synchronized and shall receive all available frames (including receive buffer update), but shall not transmit anything. This mode shall be indicated by vListenOnly, which can be set by the host in the CC_SoftReset state only. As soon as the host clears vListenOnly, the CC byteflightSlave state shall be entered with beginning of the next cycle.

Since the communication controller performs the transition to CC_byteflightListen state with every communication cycle, it is still synchronized to the master node. Therefore, the node is allowed to directly re-enter CC_byteflightSlave from CC_byteflightListen (at the beginning of the next cycle), if the host sets vListenOnly to false.

Startup—Event-Triggered Protocol Mode (ET)

The node's behavior during startup is described further on in the description.

Startup Examples—Time-Triggered Protocol Mode (TT-D)

For all startup sequences described in this chapter the assumption is made that the correction terms for clock synchronization exactly match the limit settings of the quality assessment criterion (see above). Therefore, the node is allowed to proceed directly into normal operation (CC_NormalOperation state) after having performed the offset measurement, correction phase, and regular rate measurement phase the first time.

Startup without Collisions

Figure 64:
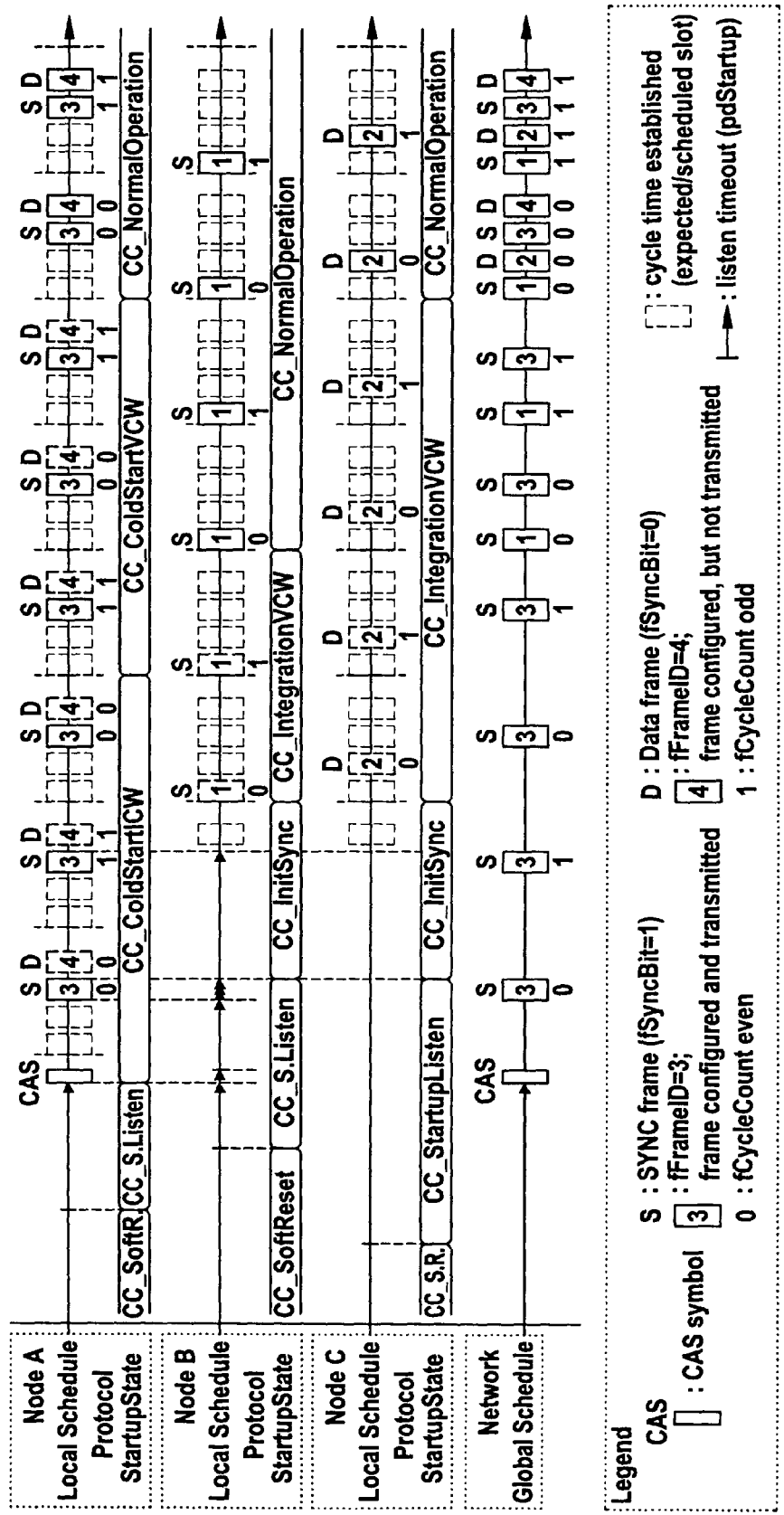
FIG. 64 illustrates a diagram of a collision-free startup.

The scenario illustrated in FIG. 64 depicts three nodes with two of them configured to initiate the startup actively (sync nodes A and B). Node C is not configured to schedule any sync frames and therefore is not allowed to enter CC_ColdStartICW. The first cycle counter value received by nodes B and C is in the sync frame sent by node A and it is even.

Node A enters CC_ColdStartICW and transmits the initial CAS before any other node. Triggered by the related channel activity, node B restarts its listen-timeout vdStartup. On the reception of the CAS symbol, the listen-timeout vdStartupNoise is restarted. With the first sync frame (fFrameId=3) is sent by node A all other nodes enter CC_InitSync. At this point Node A becomes the reference node (vSyncRef=3) and the measurement phase for initial rate correction term is started. The next occurrence of node A's sync frame stops the rate measurement phase. Nodes B and C directly determine and apply the rate correction term to their local clock rate (i.e. to their local macrotick generation unit). In addition, the actual schedule position is determined based on the reference frame ID, and the micro- and macrotick timers are synchronized using the falling edge of the leading BSS of the received sync frame.

Nodes B and C follow the current schedule until cycle end and then transition into the CC_IntegrationVCW state. Still these nodes behave passively, i.e., they do not participate the communication schedule with their own frames. After one complete rate measurement period (2 cycles) and the corresponding offset measurement and correction phase (during the second cycle), the sync node B is allowed to enter normal operation. The validation checks evaluated in the CC_IntegrationVCW state are passed because on the reception of the reference sync frame vValidSyncCount[ch] is incremented, while vInvalidSyncCount[ch] remains unchanged. Consequently, with the start of next cycle, node B enters CC_NormalOperation and starts to transmit messages according to its configuration. On reception of the sync frame pair sent by another node (node B), which is synchronized to its own, the node that initially sent the CAS (node A) then enters CC_NormalOperation at the start of next communication cycle (after a whole rate measurement period has been concluded). In CC_NormalOperation all configured frames are scheduled for transmission. As soon as the node that initially sent the CAS and one other node have entered the CC_NormalOperation state, the startup phase is concluded.

Node C enters CC_NormalOperation in the same cycle as node A, as soon as it performs the regular rate measurement phase based on 2 (or more) pairs of corresponding sync frames.

Startup with Initial Collision

Figure 65:
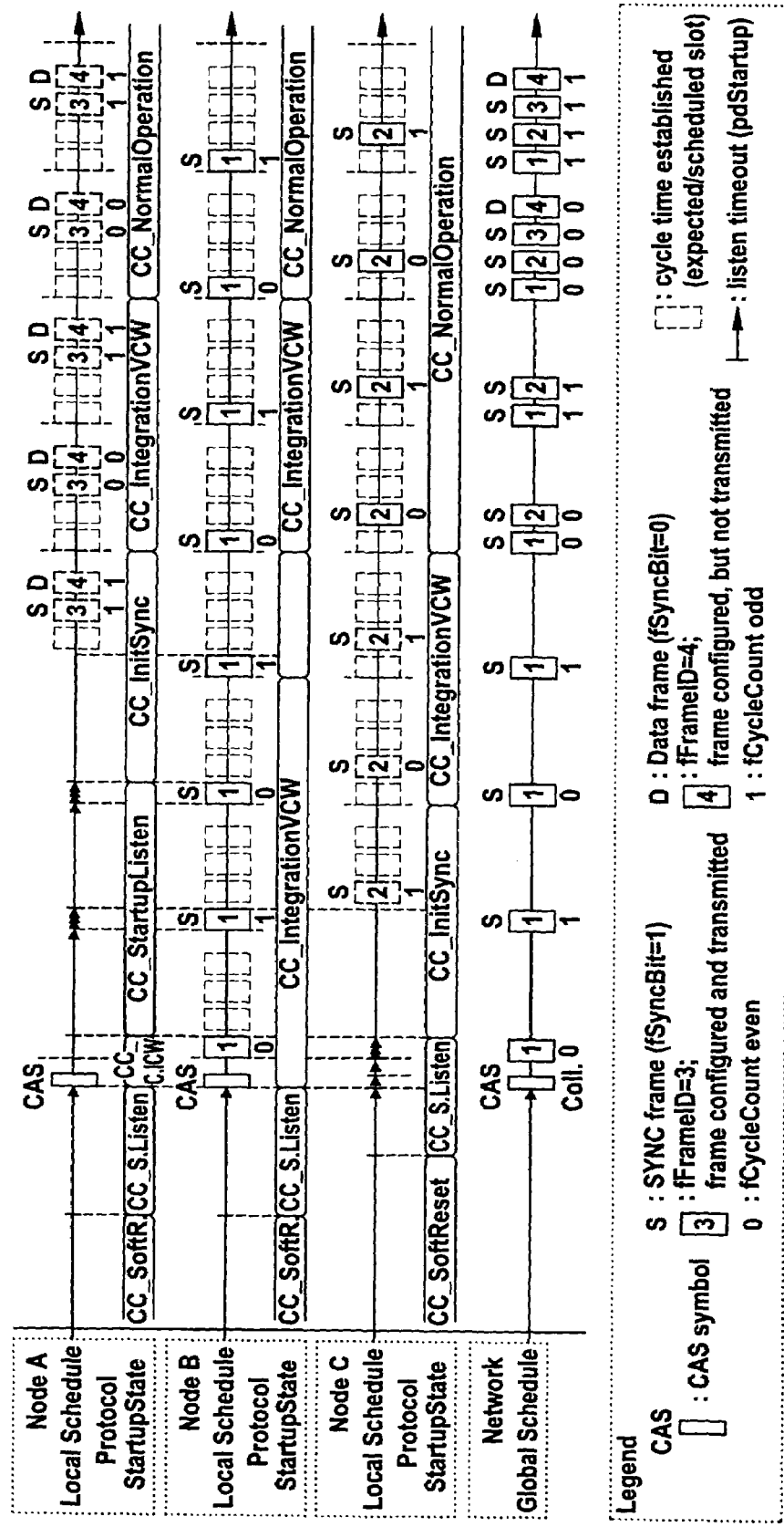
FIG. 65 illustrates a diagram of a startup with a collision on a collision avoidance symbol.

FIG. 65 shows a Startup with a collision on the CAS symbol. The scenario illustrated in FIG. 65 depicts three nodes with all of them configured to initiate the startup actively (sync nodes). A collision during startup results when two sync nodes leave the CC_SoftReset state at the same, or nearly the same time. In this case, two nodes (nodes A and B) enter CC_ColdStartICW simultaneously and send their initial CAS at the same, or nearly the same time. Both nodes are then prepared to send their first sync frame. The node with the sync frame having the lower identifier sends its frame first (node B; fFrameID=1). On reception of this sync frame, the other node (node A), which currently resides in the CC_ColdStartICW state, returns to CC_StartupListen and awaits the next S_ValidEvenStartupFrame. The figure depicts the case where a node A integrates in the sixth cycle after the cycle in which the collision occurred.

Startup with Nodes Failed Due to the Validation Check

Figure 66:
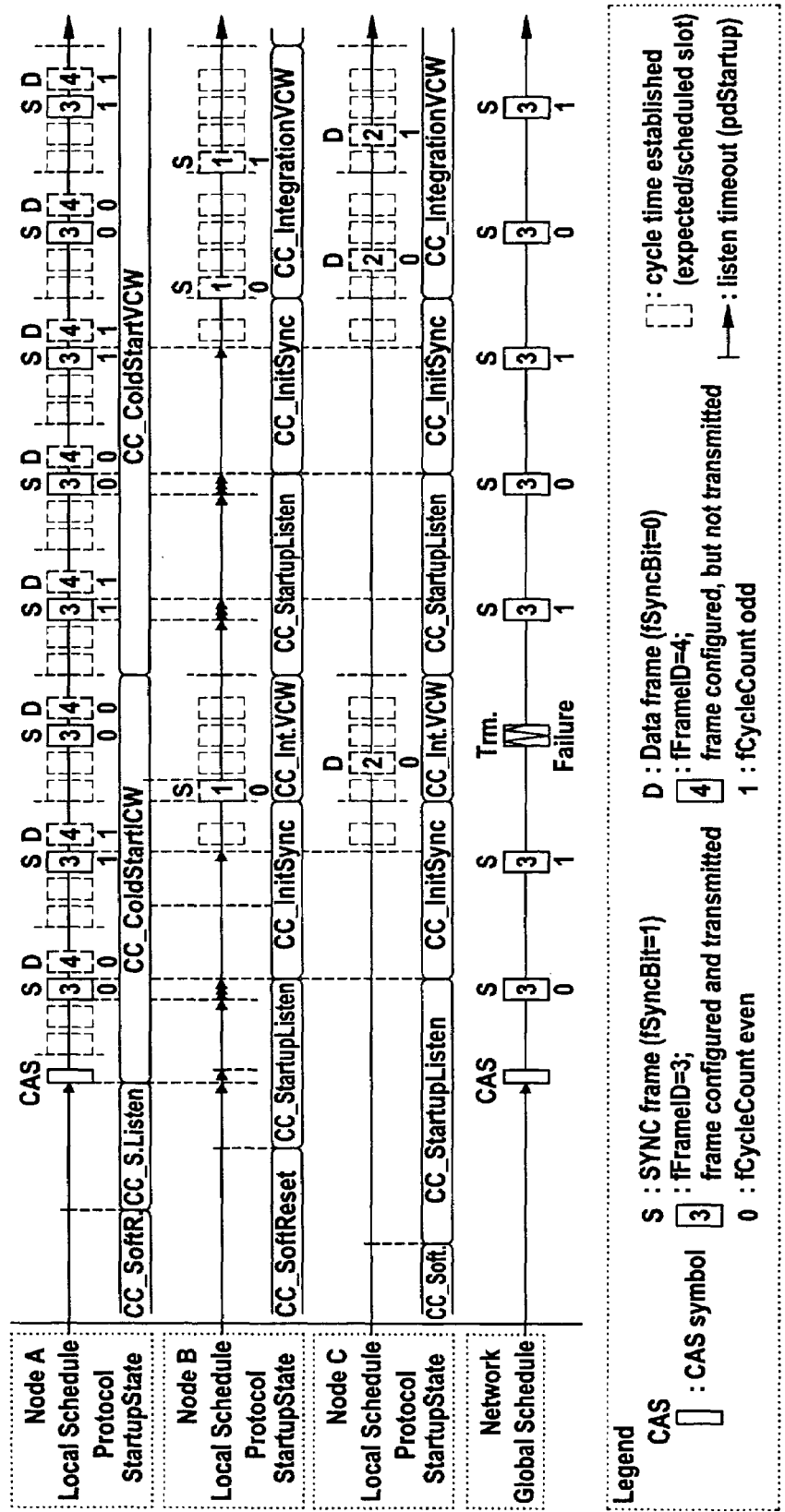
FIG. 66 illustrates a diagram of a startup with a validation check in a CC_IntegrationVCW state failed, in which state a node of the communication system does not schedule any transmission.

FIG. 66 shows a Startup with Validation Check in CC_IntegrationVCW Failed. The scenario illustrated in FIG. 66 depicts nodes B and C starting integration to the reference node (node A). While nodes B and C are in the CC_IntegrationVCW state the reception of the sync frame transmitted by the reference node fails at both nodes. Thus, the validation check at both nodes fails, too. At the end of this cycle both nodes have to re-enter the CC_StartupListen state. Since vRefSync is different from 0 (vRefSync=3), the first sync frame from the former reference node (node A) is ignored. Because no other sync frame occurs during gdCycleWithHistory, vRefSync is cleared at the end of this cycle. With the next occurrence of the sync frame sent by node A (vRefSync is set to 3 again), node B and C start another integration attempt. Via the integration path, both nodes finally synchronize on timing of node A. Meanwhile, Node A remains in the CC_ColdStartVCW state for the entire period because it does not detect a valid response.

Requirements for Hardware States

Introduction

This chapter describes the HW states whose support is required by the CC, BG, electrical and optical BD, and the active star. Additionally, some desirable optional transitions are described. The state names are prefixed with a two/three-letter acronym corresponding to the hardware component to which the state pertains (i.e., CC, BG, BDe or BDo). State transition names contain one of two prefixes as follows:

State transitions with prefix 'V' corresponding to certain voltage levels

State transitions with prefix 'L' indicate states transitions corresponding to logical conditions The remainder of this chapter consists of sections corresponding to each of the FlexRay hardware components. Each of these sections consists of two subsections; a descriptive overview of the component's states followed by a more formal behavioral description in the form of a state diagram accompanied by a table detailing the transitions in the diagram.

Voltage Levels

In general three different voltage levels and corresponding HW states have to be distinguished:

PowerOff—The supply voltage is not available or is below a pre-defined level. Consequently, some integrated circuits are not able to keep their pins in a defined state, e.g. tri-state. The semiconductor manufacturer has to guarantee that during power up/power down no disturbances occur or has to specify the affected pins and their behavior.

PowerOn—The supply voltage level is high enough to guarantee a defined state of the pins, where no disturbances occur.

Operating/Normal—The supply voltage level allows full operation (note: Operating/Normal is a substate of PowerOn).

HW States of the CC

Overview

The following overview describes the CC behavior in various states. Conditions for entering and exiting these states are described in the table following the subsequent state diagram.

Support for monitoring of the voltage levels (brown-out detection) is only required for standalone controllers. This allows monitoring to be done by external monitoring hardware.

CC_PowerOff State

The voltage is below a pre-defined threshold for proper operation

Halt of all CC internal clocks

The CC must not drive any pins

CC_PowerOn State

The voltage level is above a threshold to guarantee a defined state of the pins

CC_HWReset State

All controller clocks halt immediately

The CC must not drive any pins

CC_Operating State

The CC supports regular communication function

CC_Awake State

CC_SoftReset State

Immediately halt all CC internal clocks except those that are needed for operating the host interface.

CC_Normal State

Regular communication shall be supported

CC_ShutdownComplete State

When this state is present communication is inactive

CC_Standby State

Figure 67:
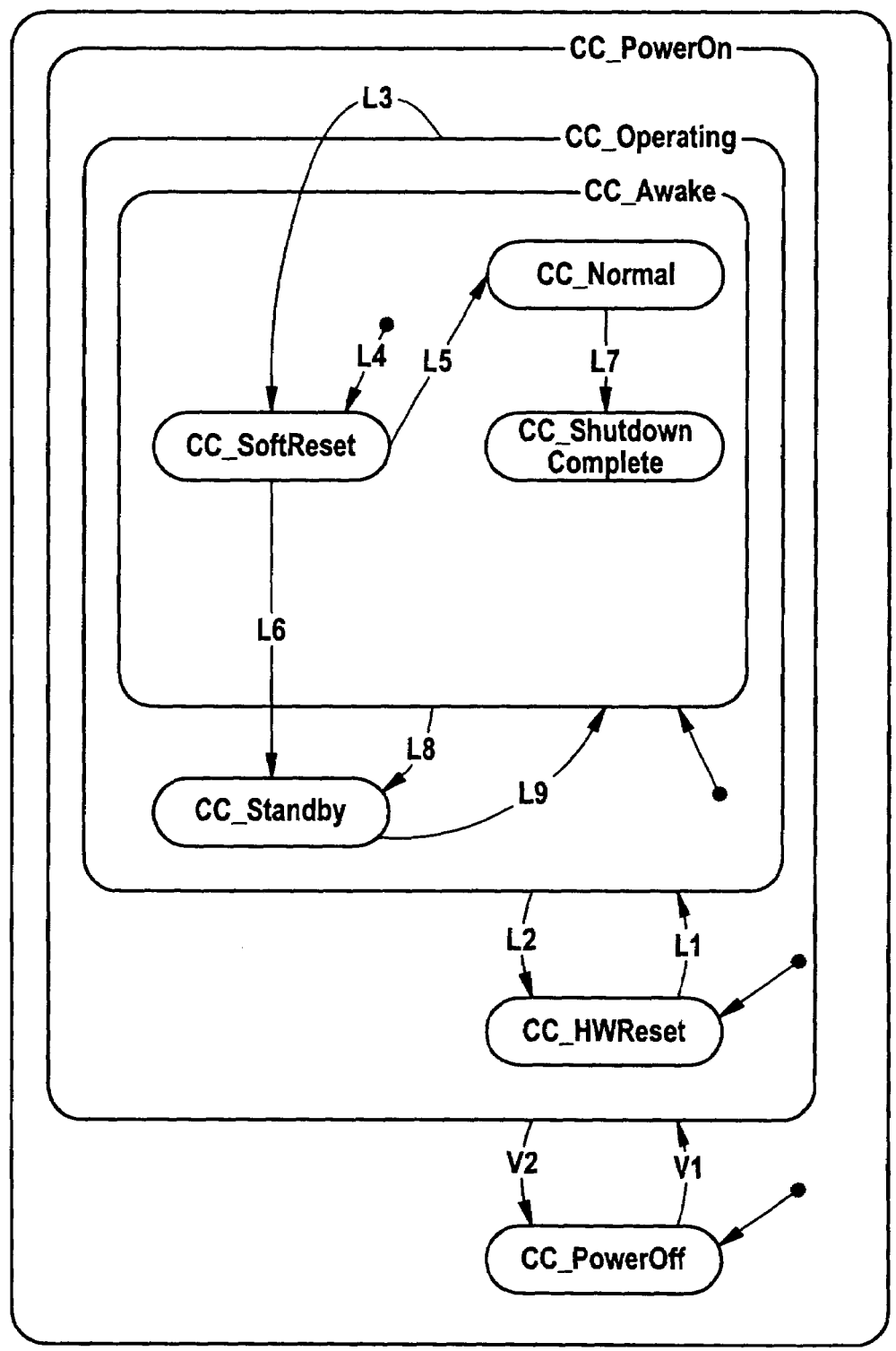
FIG. 67 illustrates a state transition diagram of a communication controller of a node of the communication system.

The power consumption of the electrical CC is significantly reduced compared to CC_Normal All CC clocks off except those that are needed for wakeup detection Configuration data will remain unchanged Communication Controller (CC) State Diagram FIG. 67 shows a Communication Controller (CC) state transition diagram. Table 16 is a CC state transition table.

TABLE 16

CC state transition table.

| State Transition | Transition Direction | | | Conditions for Transition | | Action taken on Transition |
|---|---|---|---|---|---|---|
| | From State | To State | | | | |
| V1 | CC_PowerOff | CC_PowerOn | | CC supply voltage rises above CC_U1 | | |
| V2 | CC_PowerOn | CC_PowerOff | | CC supply voltage drops below CC_U2 | | |
| L1 | CC_HWReset | CC_Operating | | CC external reset signal is inactive | | After hard reset (power-up reset or via dedicated reset pin) all initialization data are cleared |
| | | | (AND) opt. | Supply voltage is greater than CC_U3 for at least CC_$t_{V3}$ | | |
| L2 | CC_Operating | CC_HWReset | | External reset signal is active | | Disable ability to drive pins, all clocks halt immediately |
| | | | (OR) opt. | Supply voltage drops below CC_U4 for at least CC_$t_{V4}$ | | |
| L3 | CC_Operation | CC_SoftReset | | A CC_Reset is requested by the host | | Immediately halt all CC internal clocks except those that are needed for operating the host interface. All configuration data shall be retained. |
| L4 | | CC_SoftReset | | Initialization is finished | | |
| L5 | CC_SoftReset | CC_Normal | | CC_SoftReset is deactivated by the host | | The interrupt status shall be cleared |
| | | | (AND) opt. | CC optional soft checks are passed | | |
| L6 Optional | CC_SoftReset | CC_Standby | | CC_SoftReset is deactivated | | |
| | | | AND | Optional soft checks did fail | | |
| L7 | CC_Normal | CC_ShutdownComplete | | Current communication round is finished | | Communication is inactive |
| | | | AND | Host requests a shutdown (e.g. by setting the Shutdown Request bit) | | |

TABLE 16-continued

CC state transition table.

| State Transition | Transition Direction | | Conditions for Transition | Action taken on Transition |
| --- | --- | --- | --- | --- |
| | From State | To State | | |
| L8 | CC_Awake | CC_Standby | Host issues a CC Sleep Command (OR) opt. Severe failure condition being detected by the error management of the CC (failure conditions are specified in Chapter "Error Signaling and Error Handling") | The ongoing frame transmission or reception will be finished and the configuration data shall be retained |
| L9 | CC_Standby | CC_Awake | Host issues a CC Wakeup Command OR The CC detects activity on any of the RX pins | CC shall signal a wakeup interrupt to the host |

The constants CC_U1, CC_U2, CC_U3, CC_U4, CC_$t_{v3}$ and CC_$t_{v4}$ are product specific and have to be defined in the CC product specification.

Note: CC_U1<CC_U3, CC_U2<CC_U4

HW States of the Electrical Bus Driver (BD)

Overview

The following overview describes the electrical BD behavior in various states. Conditions for entering and exiting these states are described in the table following the subsequent state diagram.

Support for monitoring of the junction temperature is optional.

BDe_PowerOff State

The voltage is below a pre-defined threshold for proper operation

The BD must not drive any pins (e.g., no reverse current).

BDe_PowerOn State

The voltage level is above a threshold to guarantee a defined state of the pins

BDe_Operating State

The BD supports regular communication function

BDe_Normal State

Regular communication shall be supported

BDe_Standby State

The power consumption of the electrical BD is significantly reduced compared to BDe_Normal The BD is not capable of transmitting regular messages The BD's wakeup monitoring function is active.

BDe_Sleep State

The BD does not support regular communication

The BD enters low power consumption mode, e.g. all clocks stopped and only low power wakeup receiver active. The power consumption is significantly reduced compared to BDe_Normal The BD's wakeup monitoring function is active BDe_BusOff State The BD's channel output is in high impedance state, e.g. it doesn't drive the idle level on the bus (is floating instead)

BDe_BusNormal State

The BD outputs regular bus levels for communication

BD State Diagram (Electrical BD)

Figure 68:
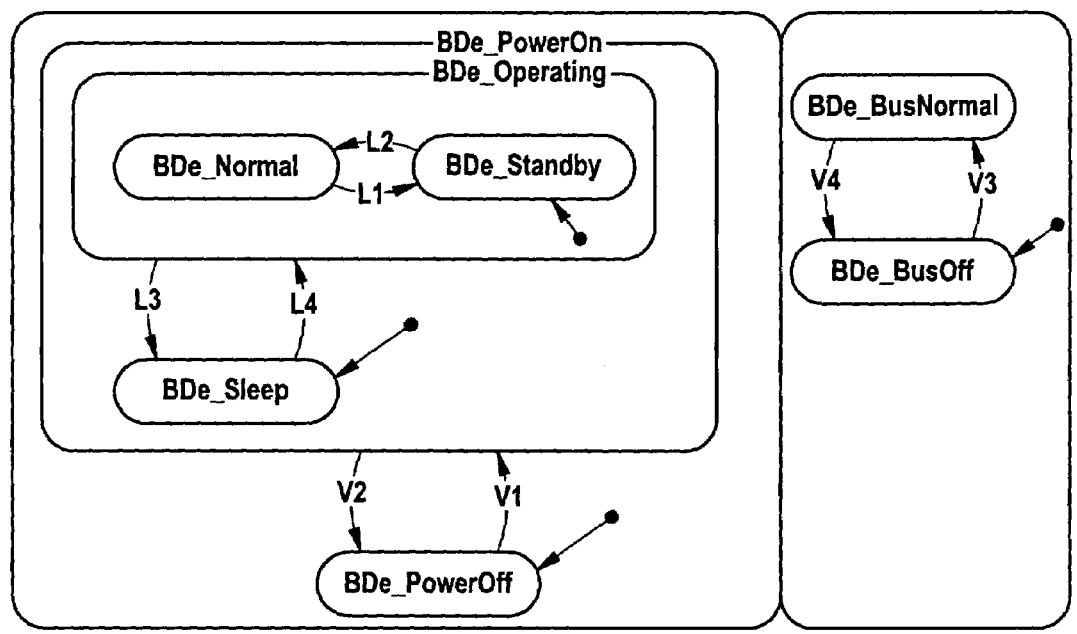
FIG. 68 illustrates a state transition diagram of a bus driver of a node of the communication system (the optical bus guardian states are not shown)

FIG. 68 shows a bus driver (BD) state transition diagram for an electrical BD. Table 17 is a BD state transition table for an electrical BD. For the optical bus guardian states refer to FIG. 69.

TABLE 17

BD state transition table (electrical BD).

| State Transition | Transition Direction | | Conditions for Transition | Action taken on Transition |
| --- | --- | --- | --- | --- |
| | From State | To State | | |
| V1 | BDe_PowerOff | BDe_PowerOn | BD Supply voltage rises above BDe_U1 | |
| V2 | BDe_PowerOn | BDe_PowerOff | BD Supply voltage drops below BDe_U2 | |
| V3 | BDe_BusOff | BDe_BusNormal | BD Supply voltage rises above BDe_U5 for at least BDe_$t_{v5}$ | |

TABLE 17-continued

BD state transition table (electrical BD).

| State Transition | Transition Direction | | | Conditions for Transition | Action taken on Transition |
|---|---|---|---|---|---|
| | From State | To State | | | |
| V4 | BDe_BusNormal | BDe_BusOff | | BD Supply voltage drops below BDe_U6 for at least BDe_$t_{v6}$ | |
| L1 | BDe_Normal | BDe_Standby | | Host commands change to BDe_Standby State (e.g. via SPI command) | |
| L2 | BDe_Standby | BDe_Normal | | Host commands change to BDe_Normal State (e.g. via SPI command) | |
| | | | OR | BD has detected a valid Wakeup event (local or via bus) | |
| L3 | BDe_Operating | BDe_Sleep | | Host commands change to BDe_Sleep State (e.g. via SPI command) | The transmitter will be disabled, signaling to the host |
| | | | OR | No databus activity detected for more than BDe_$t_1$ | |
| | | | OR | BD Supply voltage drops below BDe_U4 for at least BDe_$t_{v4}$ | |
| | | | (OR) opt. | BD junction temperature raises above BDe_$K_{T1}$ ° C. | |
| L4 | BDe_Sleep | BDe_Operating | | BD has detected a valid Wakeup event (local or via bus) | The transmitter will be released, signaling to the host |
| | | | AND | BD Supply voltage is above BDe_U3 for at least BDe_$t_{v3}$ | |
| | | | (AND) opt. | BD junction temperature is below BDe_$K_{T1}$ ° C. | |

The constants BDe_U1, BDe_U2, BDe_U3, BDe_U4, BDe_U5, BDe_U6, BDe_$t_1$, BDe_$t_{v3}$, BDe_$t_{v4}$, BDe_$t_{v5}$, BDe_$t_{v6}$ and BDe_$K_{T1}$ are product specific and have to be defined in the BD product specification.
Note: BDe_U1<BDe_U3, BDe_U2<BD2_U4

HW States of the Optical BD

Overview

The following overview describes the optical BD behavior in various states. Conditions for entering and exiting these states are described in the table following the subsequent state diagram.

BDo_PowerOff State

The voltage is below a certain threshold for proper operation

The CC must not drive any pins

BDo_Normal State

The BD supports regular communication

BDo_Sleep State

The BD does not support regular communication

The BD is in low power consumption mode, e.g. all clocks stopped and only low power wakeup receiver active The BD's wakeup monitoring function is active

BD State Diagram (Optical BD)

Figure 69:
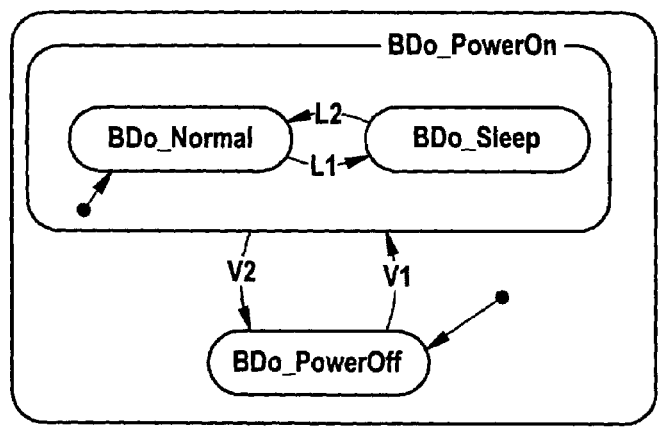
FIG. 69 illustrates a state transition diagram of an optical bus driver of a node of the communication system.

FIG. 69 shows a bus driver (BD) transition diagram for an optical BD. Table 18 is a BD state transition diagram for an optical BD.

TABLE 18

BD State Transition Table (optical BD).

| State Transition | Transition Direction | | Conditions for Transition | Action taken on Transition |
|---|---|---|---|---|
| | From State | To State | | |
| V1 | BDo_PowerOff | BDo_PowerOn | BD Supply voltage raises above BDo_U1 | |

TABLE 18-continued

BD State Transition Table (optical BD).

| State Transition | Transition Direction | | Conditions for Transition | Action taken on Transition |
|---|---|---|---|---|
| | From State | To State | | |
| V2 | BDo_PowerOn | BDo_PowerOff | BD Supply voltage drops below BDo_U2 | |
| L1 | BDo_Normal | BDo_Sleep | Host commands change to BDo_Sleep State OR No databus activity detected for more than BDo_$t_1$ | |
| L2 | BDo_Sleep | BDo_Normal | Host commands change to Bdo_Normal State OR BD has detected a valid Wakeup event (local or via bus) | |

The constants BDo_U1, BDo_U2 and BDo_$t_1$ are product specific and have to be defined in the BD product specification.

HW States of the BG

Overview

The following overview describes the BG behavior in various states. Conditions for entering and exiting these states are described in the table following the subsequent state diagram.

Support for monitoring of the voltage levels (brown-out detection) is only required for stand-alone controllers, whereas the monitoring can also be done by an external monitoring hardware.

BG_PowerOff State
    The voltage is below a certain threshold for proper operation
    Halt of all BG internal clocks
    The BG must not drive any pins BG_PowerOn State
    The voltage level is above a threshold to guarantee a defined state of the pins BG_HWReset State
    All clocks halt immediately
    The BG must not drive any pins BG_Operating State
    The BG supports regular function BG_Awake State BG_SoftReset State
    Enabling of the BD transmitter for an ongoing frame transmission will be hold, afterwards immediately halt of BG internal clocks except those that are needed for operating the host interface and disabling of the BD.

BG_Normal State
    Regular function is supported

BG_Standby State
    The power consumption of the BG is significantly reduced compared to BG_Normal
    All BG clocks off except those that are needed for operating the host interface
    Configuration data will be held
    An explicit shutdown support for the BG is not required.

BG State Diagram

Figure 70:
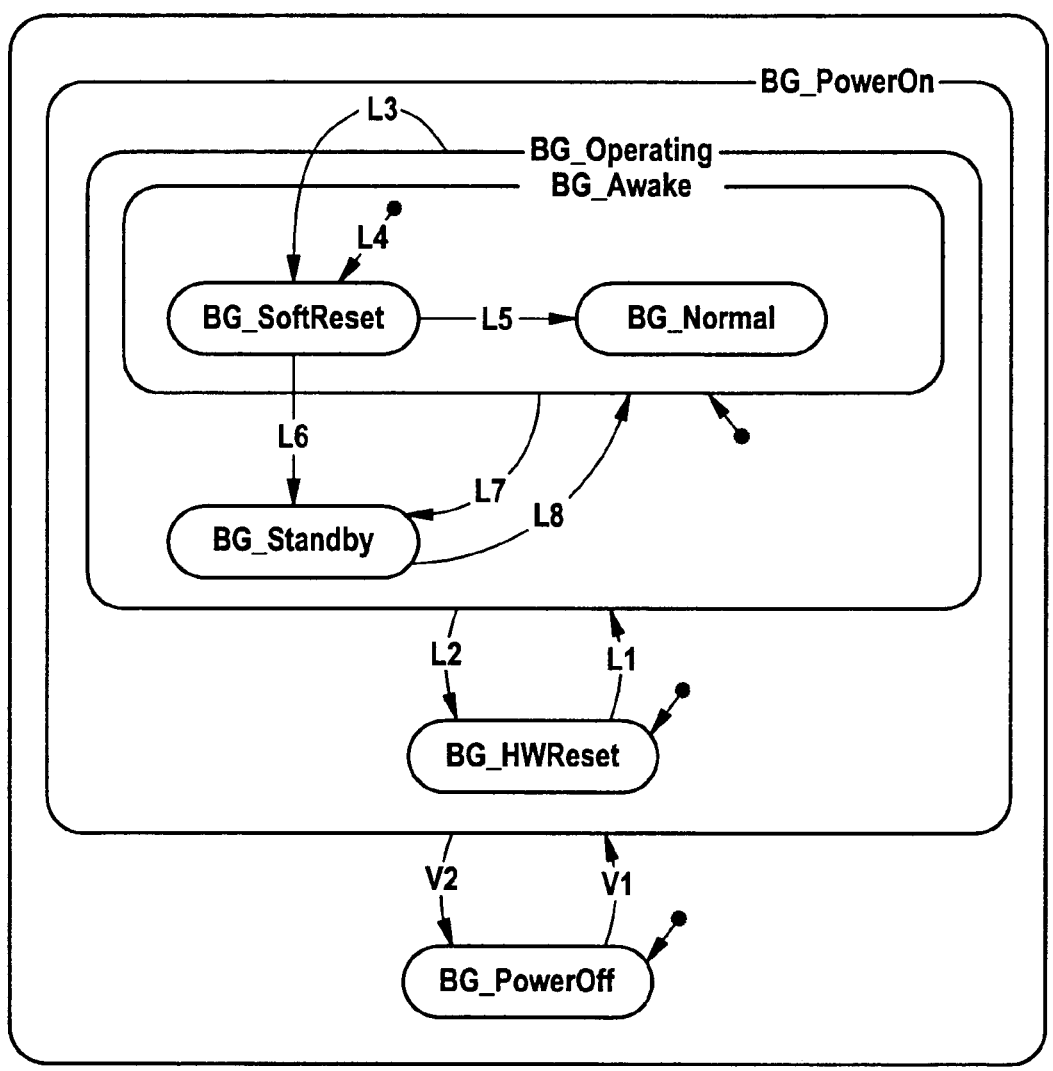
FIG. 70 illustrates a state transition diagram of a bus guardian of a node of the communication system.

FIG. 70 shows a Bus Guardian (BG) state transition diagram. Table 19 is a BG state transition table.

TABLE 19

BG State Transition Table.

| State Transition | Transition Direction | | | Conditions for Transition | Action taken on Transition |
|---|---|---|---|---|---|
| | From State | To State | | | |
| V1 | BG_PowerOff | BG_PowerOn | | BG Supply voltage raises above BG_U1 | |
| V2 | BG_PowerOn | BG_PowerOff | | BG Supply voltage drops below BG_U2 | |
| L1 | BG_HWReset | BG_Operating | (AND) opt. | CC external reset signal is inactive Supply voltage is greater than BG_U3 for at least BG_$t_{V3}$ | After hard reset (power-up reset or via dedicated reset pin) all initialization data are cleared |
| L2 | BG_Operating | BG_HWReset | (OR) opt. | External reset signal is active Supply voltage drops below BG_U4 for at least BG_$t_{V4}$ | disable ability to drive pins, all clocks halt immediately |

TABLE 19-continued

BG State Transition Table.

| State Transition | Transition Direction | | Conditions for Transition | Action taken on Transition |
|---|---|---|---|---|
| | From State | To State | | |
| L3 | BG_Operating | BG_SoftReset | A BG_Reset is requested by the host | The ongoing guarding action will be finished and the configuration data shall be retained |
| L4 | | BG_SoftReset | Initialization is finished | |
| L5 | BG_SoftReset | BG_Normal | BG_Reset is deactivated by the host (AND) BG optional soft checks are passed | The interrupt status shall be cleared |
| L6 Opt. | BG_SoftReset | BG_Standby | Soft reset is deactivated AND BG optional soft checks did fail | |
| L7 | BG_Awake | BG_Standby | Host issues Sleep Command | |
| L8 | BG_Standby | BG_Awake | Host issues Wake-up Command | |

The constants BG_U1, BG_U2, BG_U3, BG_U4, BG_$t_{v3}$ and BG_$t_{v4}$ are product specific and have to be defined in the BG product specification.

Note: BG_U1<BG_U3, BG_U2<BG_U4

Active Star State Diagram

Figure 71:
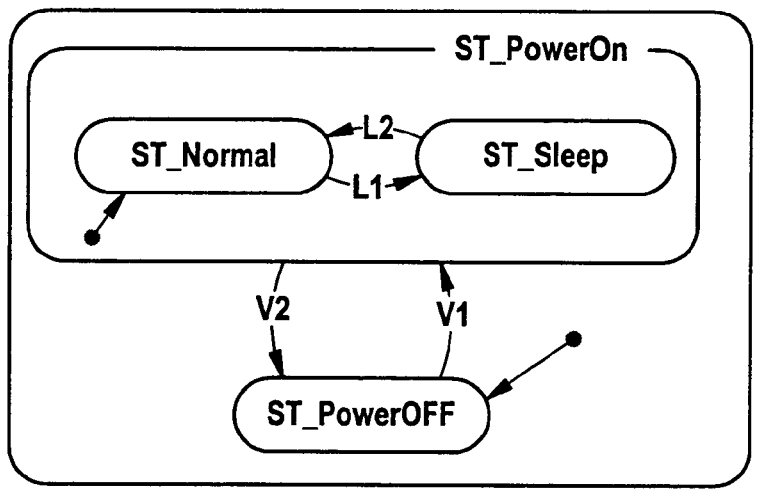
FIG. 71 illustrates a state transition diagram of an active star communication system topology.

FIG. 71 shows an Active Star state transition diagram. Table 20 is an Active Star state transition table.

TABLE 20

Active Star State Transition Table.

| State Transition | Transition Direction | | Conditions for Transition | Action taken on Transition |
|---|---|---|---|---|
| | From State | To State | | |
| V1 | ST_PowerOff | ST_PowerOn | ST Supply voltage raises above ST_U1 | |
| V2 | ST_PowerOn | ST_PowerOff | ST Supply voltage drops below ST_U2 | |
| L1 | ST_Normal | ST_Sleep | ST did not detect and message-like patterns for more than ST_$t_{S1}$ | |
| L2 | ST_Sleep | ST_Normal | ST has detected a valid wake-up symbol/pattern | |

The constants ST_U1, ST_U2 and ST_$t_{S1}$ are product specific and have to be defined in the star product specification.

HW States of the Active Star

Overview

The following overview describes the Active Star behavior in various states. Conditions for entering and exiting these states are described in the table following the subsequent state diagram.

ST_PowerOff State

The voltage is below a certain threshold for proper operation

The active star must not drive any pins

ST_PowerOn State

ST_Normal State

The voltage regulator is active

ST_Sleep State

The voltage regulator is off

Error Signaling and Error Handling

Error Signaling

This chapter describes the error signaling mechanisms of FlexRay protocol. These mechanisms are intended to enable the host application or any other higher level software to learn about the presence of unexpected protocol conditions. In some cases, the host may want to take particular action when being notified of certain types of errors. This protocol specification, however, makes no requirement for the host application to react to any of the error conditions described in this chapter.

Error signaling refers to the presentation of filtered and/or unfiltered protocol error condition information from the Communication Controller to the host.

Frame Reception and Validation

Several error signaling mechanisms described in this chapter make use of the status of the reception process of various frames by the frame processing portion of the protocol engine. Refer to the above description for the details of these mechanisms and the signals they provide to the Error Signaling/Error Handling mechanisms.

Symbol Reception and Validation

Several error signaling mechanisms described in this chapter make rely on the detection of various protocol symbols by the symbol processing portion of the protocol engine. Refer to the above description for the details of these mechanisms and the signals they provide to the Error Signaling/Error Handling mechanisms.

Error Signals and Error Counters

This section describes the error signals and error counters of the FlexRay Protocol. Error signals are used to indicate a detected fault to the host. Error counters are used to count faults, and information related to the number of faults is passed on to the host. In all cases the error counters are not allowed to be incremented past their maximum value, i.e., the counters shall not "wrap around" back to zero, but rather shall remain at their maximum value.

Table 21 and Table 22 list the error signals and error counters of the FlexRay protocol. The following sections provide detailed descriptions of the various signals and counters.

TABLE 21

Error Signals and Error Counters for FlexRay Operating Mode

| | Abbreviation |
|---|---|
| Frame and Channel Status/Error Signals | |
| Channel Status and Error Information | CSEI |
| Frame Status and Error Information | FSEI |
| General Error Signals | |
| Coldstart Count Maximum Signal | CCMS |
| Missing Rate Correction Signal | MRCS |
| Missing Offset Correction Signal | MOCS |
| Clock Correction Limit Reached | CCLR |
| Reference Frame too Early | RFEE |
| Reference Frame Lost | RFLE |
| Bus Guardian Schedule Monitor Error | BGME |
| Error Counters | |
| Clock Correction Failed Counter | CCFC |

TABLE 22

Error Signals for byteflight Operating Mode

| Error Signals | Abbreviation |
|---|---|
| SOC too Early | SOCE |
| SOC Lost | SOCL |
| Illegal Pulse | ILLPIF |

Frame Status and Error Information (FSEI)

A FlexRay Communications Controller shall provide a classification of the slot status per channel for each slot that is booked to receive a frame. A slot is booked to receive a frame if a filter (concerning frame ID, cycle counter and channel—see the following description) for this slot is set.

Table 23 lists the possible status and error information for a booked slot. The determination of these statuses is based on the presence or absence of certain frame reception status signals as defined in the sections above.

TABLE 23

Error Signals Related to FSEI

| Frame Status and Error Information | Set condition: Frame processing produces any of the following signals | Static Segment | Dynamic Segment |
|---|---|---|---|
| Byte Coding Error/CRC Error | S_HeaderCodingError<br>S_InvalidHeaderCRCError<br>S_FrameCodingError<br>S_InvalidFrameCRCError<br>S_InvalidDTSError<br>S_ChannelIdleCodingError | Applies | Applies |
| Slot Mismatch | S_FrameIDError | Applies | Applies |
| Cycle Counter Mismatch | S_CycleCountError | Applies | Applies |
| Length Mismatch | S_InvalidFrameLengthError<br>S_PayloadLengthStaticError | Applies | — |
| | S_InvalidFrameLengthError | — | Applies |
| Null Frame | S_ValidStaticFrame and the fNullFrameIndicationBit is set in the frame. | Applies | — |
| Empty Slot | At the end of a booked slot no error signal (i.e., S_HeaderCodingError, S_InvalidHeaderCRCError, S_FrameCodingError, S_InvalidFrameCRCError, S_InvalidDTSError, S_ChannelIdleCodingError, S_FrameIDError, | Applies | — |

TABLE 23-continued

Error Signals Related to FSEI

| Frame Status and Error Information | Set condition: Frame processing produces any of the following signals | Static Segment | Dynamic Segment |
|---|---|---|---|
| | S_CycleCountError, S_InvalidFrameLengthError, S_PayloadLengthStaticError) and no valid frame signal (i.e., S_CorrectFrame or S_ValidStaticFrame) was signaled from frame processing and frame processing is currently in the FR_Idle state | | |
| Transmission Conflict | S_TransmissionConflictError | Applies | Applies |

Transmission Conflict is Only detected if the node tries to send a frame while it receives. The error signal belongs to the slot ID of the sent frame. If a receive buffer is configured to use the "pick first valid" style of channel filtering (see below), the following additional information on the status of the channel that was not selected for payload storage shall be summarized in the FSEI:

TABLE 24

Additional FSEI Error Signals for "Pick First Valid" Channel Filtering

| Frame Status and Error Information | Set condition: Frame processing produces any of the following signals | Static Segment | Dynamic Segment |
|---|---|---|---|
| Receive Error on Second Channel | S_HeaderCodingError S_InvalidHeaderCRCError S_FrameCodingError S_InvalidFrameCRCError S_InvalidDTSError S_ChannelIdleCodingError S_FrameIDError S_CycleCountError S_InvalidFrameLengthError S_PayloadLengthStaticError | Applies | Applies |
| Empty Slot on Second Channel | At the end of a booked slot no error signal (i.e., S_TSSError, S_HeaderCodingError, S_InvalidHeaderCRCError, S_FrameCodingError, S_InvalidFrameCRCError, S_InvalidDTSError, S_ChannelIdleCodingError, S_FrameIDError, S_CycleCountError, S_InvalidFrameLengthError, S_PayloadLengthStaticError) and no valid frame signal (i.e., S_CorrectFrame or S_ValidStaticFrame) was signaled from frame processing and frame processing is currently in the FR_Idle state | Applies | — |

S_InvalidDTSError applies only during frame reception in the dynamic segment. Each slot booked to receive a frame has a corresponding FSEI. The FSEI shall be reset to zero when the CC performs the state transition L5 or L6 of the HW state machine (see the previous chapter). The FSEI's shall begin to be updated once a CC successfully passed the protocol startup phase (see above).

The FSEI is always updated once the receive frame processing is finished (see above). The received data content shall only be provided to the data storage corresponding to the booked slot if none of the above listed error information was set (if channel filter "pick first valid" is configured, at least one channel's FSEI lists no error information). In all other cases, only the current FSEI shall be provided to the data storage.

It shall be possible during configuration of the CC to define a subset of the FSEI components [Byte Coding/CRC Error, Slot Mismatch, Cycle Counter Mismatch, Length Mismatch, Null Frame, Empty Slot, Transmission Conflict, Receive Error on Second Channel, Empty Slot on Second Channel] to be the trigger condition for an interrupt to the host. This subset applies to all booked slots.

Channel Status and Error Information (CSEI)

A FlexRay Communications Controller shall provide an accumulated classification of the slot status of all frames received on a given channel. This implies that a FlexRay CC that supports communication on two channels shall provide two such sets of information. The Channel Status and Error Information (CSEI) summarizes the status of all frames received on the communication channel, including those frames which are not booked and therefore have no corresponding data or status storage in the CHI. Table 25 lists the contents of the CSEI and describes the mapping of the frame and symbol processing status symbols described above.

when the CC performs the state transition L5 or L6 of the HW state machine (see Chapter 'Requirements for Hardware States'). The CCMS is set to one only during protocol startup phase if vCCMS was set (see Chapter 'Wakeup, Startup, and Reintegration'). Once set to one, the CCMS remains set until the CC performs the state transition L5 or L6 of the HW state machine next time.

Clock Related Error Signals and Counters

Startup Majority Missed Signal (SMMS)

The Startup Majority Missed Signal (SMMS) shall be set to indicate that the CC has received a set of sync frames during startup that did not result in a majority of the sync frames agreeing with the local view of the system time (see

TABLE 25

Error Signals Related to CSEI

| Error | Condition | Symbol Window | Static Segment | Dynamic Segment |
|---|---|---|---|---|
| Byte Coding Error/CRC Error | S_HeaderCodingError S_InvalidHeaderCRCError S_FrameCodingError S_InvalidFrameCRCError S_InvalidDTSError S_ChannelIdleCodingError | — | Applies | Applies |
| Slot Mismatch | S_FrameIDError | — | Applies | Applies |
| Cycle Counter Mismatch | S_CycleCountError | — | Applies | Applies |
| Length Mismatch | S_InvalidFrameLengthError S_PayloadLengthStaticError | — | Applies | — |
|  | S_InvalidFrameLengthError | — | — | Applies |
| Unaccepted Symbol | Unexpected symbol reception (in symbol window or even outside) Together with S_TSSError | Applies | Applies | Applies |

S_InvalidDTSError applies only during frame reception in the dynamic segment. The CSEI is readable by the host via the Controller Host Interface (CHI). All components of the CSEI shall be reset (for example, all components set to zero) when the CC performs the state transition L5 or L6 of the HW state machine (see above). The components of the CSEI shall begin to be updated once a CC successfully passes the protocol startup phase (see above).

The components of the CSEI are updated upon the completion of the frame processing of each communication slot (see Chapter 'Frame Processing'). The components of the CSEI shall also be updated at the completion of symbol processing (see Chapter 'Symbol Processing').

If a CSEI component is already set due to an earlier update, the component shall remain set. This allows the CSEI to report the aggregate status of all frames on the communication channel. All components of the CSEI shall be reset by a host read operation.

It shall be possible during configuration of the CC to define a subset of the CSEI components [Byte Coding Error/CRC Error, Slot Mismatch, Cycle Counter Mismatch, Length Mismatch, Unaccepted Symbol] to be the trigger condition for an interrupt to the host. This subset applies to all channels.

Coldstart Count Maximum Signal (CCMS)

The Coldstart Count Maximum Signal (CCMS) shall be set to indicate that the CC has reached the maximum number of allowed coldstart retries (see specification of coldstart in Chapter 'Wakeup, Startup, and Reintegration'). The CCMS follows the value of vCCMS. CCMS shall be reset to zero Chapter 'Wakeup, Startup, and Reintegration'). The SMMS follows the value of vSMMS. The SMMS shall be reset to zero when the CC performs the state transition L5 or L6 of the HW state machine (see Chapter 'Requirements for Hardware States'). The SMMS is set to one if vSMMS was set in protocol startup phase.

Once set to one, the SSMS remains set until the host clears this signal.

Missing Rate Correction Signal (MRCS)

The Missing Rate Correction Signal (MRCS) indicates the inability to calculate a clock synchronization rate correction value due to the lack of any matching pairs of sync frames in the even and odd communication cycles. The MRCS follows the value of vMRCS. MRCS shall be set if vMRCS was set by the clock synchronization mechanism (see Chapter 'Clock Synchronization'). In the dynamic media access mode the set condition is given if the node has not received an even and an odd reference frame. Since the reference frame provides all timing information in a system operating in the dynamic media access mode, the node providing the reference frame in such a system will never indicate an MRCS error.

The signal shall remain set to one until the clock synchronization algorithm is able to compute a valid rate correction term and therefore resets vMRCS.

The MRCS shall be set to zero when the CC performs the state transition L5 or L6 of the HW state machine (see Chapter 'Requirements for Hardware States').

During protocol startup phase MRCS shall be set to one if the signal vMRCS was set by startup (see Chapter 'Wakeup, Startup, and Reintegration'). For non-sync nodes and for a sync node in listen-only mode this signal indicates that a second pair of matching sync frames is missing. The MRCS remains set to one until the host clears this signal or the protocol startup phase was passed successfully.

It shall be possible during configuration of the CC to define that MRCS is a trigger of an interrupt to the host.

Missing Offset Correction Signal (MOCS)

The Missing Offset Correction Signal (MOCS) indicates the inability to calculate an offset correction value due to a lack of sync frames in an odd communication cycle by the clock synchronization mechanism (see Chapter 'Clock Synchronization'). The MOCS follows the value of vMOCS. MOCS shall be set if vMOCS was set by the clock synchronization mechanism (see Chapter 'Clock Synchronization'). In the dynamic media access mode this occurs if the node does not receive a reference frame in an odd cycle. The node providing the reference frame will never indicate an MOCS error.

The signal remains set to one until the clock synchronization algorithm can compute a valid offset correction term and therefore resets vMOCS.

The MOCS shall be set to zero when the CC performs the state transition L5 or L6 of the HW state machine (see Chapter 'Requirements for Hardware States').

During protocol startup phase, the MOCS shall remain at its initial value. No update of this signal is possible until the node successfully exits protocol startup phase.

It shall be possible during configuration of the CC to define that MOCS is a trigger of an interrupt to the host.

Clock Correction Limit Reached (CCLR)

The Clock Correction Limit Reached (CCLR) indicates an inability to apply a clock synchronization rate or offset correction because the computed correction has exceeded the limiting values. The CCLR follows the value of vCCLR. The CCLR shall be set to one if the limit checks on the rate and offset correction values indicate either or both of these parameters are in the red region and vCCLR was set (see Section 0). The CCLR signal shall remain set to one until the node is able to compute rate and offset correction terms that are both in the green area and therefore the clock synchronization mechanism resets vCCLR to zero. The CCLR error signal shall also be set to zero when the CC performs the state transition L5 or L6 of the HW state machine (see Chapter 'Requirements for Hardware States').

Note that the red/green region determinations are performed after taking into account any external clock corrections provided by the host (see Section 'External Clock Synchronization (Optional)'). Because of this, the vCCLR is based on the aggregate of the internal and external clock correction terms (if any). As a result, a system that would not normally experience CCLR due to internal clock synchronization (for example, the reference node in a system operating in the dynamic media access node) may still experience such errors as a result of external rate correction.

During protocol startup phase, the CCLR will be set to one if the vCCLR is set during protocol startup phase (see Chapter 'Wakeup, Startup, and Reintegration'). CCLR signal remains set to one until the CC can compute valid rate and offset correction values and the protocol startup phase was passed successfully and therefore vCCLR was reset to zero (see Chapter 'Wakeup, Startup, and Reintegration'). CCLR can be reset to zero by the host before the end of protocol startup phase was reached.

It shall be possible during configuration of the CC to define that CCLR is a trigger of an interrupt to the host.

Clock Correction Failed Counter (CCFC)

The Clock Correction Failed Counter (CCFC, range [0 . . . 15]) allows the host to monitor the duration of the inability of a node to compute clock correction terms after the CC passed protocol startup phase. t shall be incremented by one at the end of any odd communication cycle where either MOCS or MRCS is set. The CCFC shall be reset to zero at the end of an odd communication cycle if neither the MOCS nor the MRCS are active. The CCFC stops incrementing at 15 (i.e., incrementing the counter at its maximum value shall not cause it to "wraparound" back to zero). The CCFC shall be reset to zero when the CC performs the state transition L5 or L6 of the HW state machine (see Chapter 'Requirements for Hardware States').

Summary

The following tables summarize the conditions and applicability of the various clock-related error signals and counters

TABLE 26

Clock Synchronization Error Signals and Counters During CC_Normal Operation and CC_Passive Operation

| Error signal/counter | Triggered by/Increment condition | Every Communication Cycle | After an Even/Odd Communication Cycle |
|---|---|---|---|
| Clock Correction Failed Counter (CCFC) | MRCS or/and MOCS | — | Applies |
| Missing Rate Correction Signal (MRCS) | vMRCS set by clock synchronization | — | Applies |
| Missing Offset Correction Signal (MOCS) | vMOCS set by clock synchronization | — | Applies |
| Clock Correction Limit Reached (CCLR) | vCCLR set by clock synchronization | — | Applies |

TABLE 27

Clock Synchronization Error Signals and Counters During Protocol startup phase

| Error signal/counter | Triggered by/Increment condition | Every Communication Cycle | After an Even/Odd Communication Cycle |
|---|---|---|---|
| Clock Correction Failed Counter (CCFC) | not updated during protocol startup phase | — | — |
| Missing Rate Correction Signal (MRCS) | vMRCS set by startup | — | Applies |
| Missing Offset Correction Signal (MOCS) | not updated during protocol startup phase | — | — |
| Clock Correction Limit Reached (CCLR) | vCCLR set by startup | Applies | Applies |
| Startup Majority Missed Signal (SMMS) | vSMMS set by startup | — | Applies |

Bus Guardian Schedule Monitor Error (BGME)

The Bus Guardian Schedule Monitor Error (BGME) is used to signal that the CC has detected that the static segment transmission pattern enforced by the bus guardian does not match the static segment transmission pattern configured into the communication controller. The BGME follows the value of the vBgsmError parameter defined in the description of the BG Schedule Monitoring (see Section 'BG Schedule Monitoring Service').

The BGME shall be set to zero when the CC performs the state transition L5 or L6 of the HW state machine (see Chapter 'Requirements for Hardware States'). The BGME shall be set to one whenever vBgsmError=TRUE (see specification in Chapter 'Bus Guardian Interface'). (For the behavior during protocol startup phase, please refer to Chapter 'Bus Guardian Interface' as well).

BGME shall be set to zero as soon as the host acknowledges the BG schedule mismatch by an active acknowledgement via the signal vBgsmErrorAck (see Chapter 'Bus Guardian Interface').

Certain systems do not make use of the BG Schedule monitoring service. There is no requirement for the CC to provide a mechanism to allow this service to be disabled—non-applicable results must be ignored by the host.

It shall be possible during configuration of the CC to define that BGME is a trigger of an interrupt to the host.

TABLE 28

Error Signals Related to BG Schedule Monitoring

| Error signal/counter | Triggered by | Static Segment | Dynamic Segment |
|---|---|---|---|
| Bus Guardian Schedule Monitor Error (BGME) | VBgsmError = TRUE | Applies | Applies |

Error Signals Related to SOC/ILLPIF (byteflight Mode)

The following error signals may be used to allow the host to monitor the status of the periodic SOC symbol and to detect the occurrence of illegal pulses instead of SOC symbols for systems operating in the byteflight media access mode.

In byteflight mode the byteflight master CC controls the communication schedule by its SOC symbol and therefore the following error signals are not applicable to a node operating as the byteflight master.

SOC Early

This error signal shall be set if the end of a correct SOC (symbol passed the check set "ValidSOC") occurs before gdCycleMin. This error signal is reset by a host read operation.

SOC Lost

This error signal shall be set if the end of a valid SOC does not occur before gdCycleMax (no symbol passed the check set "ValidSOC" before gdCycleMax). This error signal is reset by a host read operation.

Illegal Pulse Error (ILLPIF)

This error signal shall be set if either of the following conditions are met gdCycleMin has not expired since the last valid SOC symbol (symbol passed check set "ValidSOC") and a sequence of logic "0" with a duration of between 21*gdBit and 29*gdBit or a duration of more than 31*gdBit has been received, OR gdCycleMin has expired since the last correct (valid) SOC symbol (symbol passed check set "ValidSOC") and some bus activity was recognized other than a valid SOC symbol.

This error signal is reset by a host read operation.

TABLE 29

Error Signals related to SOC/ILLPIF in byteflight mode

| Error signal | Triggered by | Byteflight mode | Static Segment | Dynamic Segment |
|---|---|---|---|---|
| SOC Early | ValidSOC before gdCycleMin | Applies | — | — |
| SOC Lost | GdCycleMax without ValidSOC | Applies | — | — |
| ILLPIF | Illegal Pulse before gdCycleMin | Applies | — | — |
| ILLPIF | Illegal Pulse instead ValidSOC | Applies | — | — |

Error Handling

Error handling denotes the behavior of the lower protocol layers when irregular protocol conditions have been detected. Depending on the nature and duration of the error condition, the protocol controller enters certain states to deal with such conditions. In some cases, higher layer program command activity is required for the protocol controller to resume normal operation.

The error handling concept described in this document is intended to ensure communication between non-affected nodes can be maintained in the presence of a lower layer protocol error in a single node. It is also intended to maintain communication when a host behaves in a non-optimal way in the absence of an error in the local lower layer protocol.

Protocol Error States

The error handling mechanisms described here are aimed maintaining communication as long as possible even in the presence of errors.

The error handling is based on three error states with an associated fault hypothesis and an associated strategy for the next steps (behavior) of the CC (see Table 30). These error states correspond to a traffic light model [green, yellow, red].

TABLE 30

Protocol Error States [Green, Yellow, Red]

| State | Activity |
|---|---|
| Green | CC: full operation.<br>CHI: error signals might be set indicating a detected fault (Errors have been detected, but they are still consistent with the fault hypothesis implicit in the green state.).<br>Frame processing: Normal operation.<br>BG: remains synchronized with the CC.<br>Fault Hypothesis: CC external faults, such as electromagnetic interference, are assumed to be much more probable than CC internal faults. The BG is assumed to be functional and would prevent schedule violation of its CC.<br>Strategy: The strategy is to stay fully synchronized and support the cluster wide clock synchronization. No immediate effect on protocol operation by a detected error assumed. The host is just informed of any error condition(s) by error signaling. |
| Yellow | CC: reduced operation - no frame transmission and no active contribution to the cluster wide clock synchronization.<br>CHI: error signal(s) set indicating a detected fault.<br>Frame processing: The CC stops transmitting frames, but received frames are still processed. Clock synchronization mechanisms are continued based on received frames.<br>BG: Remains synchronized as the CC continues to provide the ARM, MT, and BGT signals.<br>Fault Hypothesis: An external or internal (CC-related) fault is assumed to be present. The fault causing the error was non-fatal - only partial defects in registers, memory or CC logic is assumed.<br>The clock synchronization of the CC may not be working correctly. As a consequence, it is possible that both the CC and its BG could follow an incorrect macrotick over several cycles and therefore the BG no longer prevents schedule violations of its CC.<br>Strategy: The CC shall process incoming frames but shall stop sending frames. Once the CC reaches clock agreement with other CCs it may resume normal operation without host intervention. |
| Red | CC: Operation halted - no receive frame processing and clock synchronization processing shall take place. All signals to the bus driver and bus guardian are set to their defined states.<br>CHI: error signaling for detected error(s). Access to the CHI shall be possible for the host.<br>Frame processing: All signals to the bus driver and the bus guardian shall be frozen at their last states.<br>BG: BG will enter FailSilent state due to lack of transitions of the ARM, MT, or BGT signals.<br>Fault Hypothesis1: An internal (CC related) fault has happened, e.g. internal parameter check(s) failed.<br>Fault Hypothesis2: The CC was not able to self-rescue based on the yellow fault hypothesis and a fatal fault shall to be assumed.<br>Strategy: CC shall disable any transmissions. A reset from the host is required to resume operation. |

Overview of Transitions in the FlexRay Error State Machine

The following sections and tables summarize the required relations between the error signals, the values of the error counters and the transitions within the protocol error states [green, yellow, red]. The states reflect the FlexRay error handling based on the three-state fault hypothesis of the protocol. Section 'Error Handling for TT-D and TT-M Protocol Modes' covers the transitions during protocol operation for the Time-Triggered Distributed Protocol Mode and Time-Triggered Master-Controlled Protocol Mode, and section 'Error Handling for Protocol Operation in byteflight Protocol Mode' covers the transitions during protocol operation in the byteflight Protocol Mode.

Error Handling for TT-D and TT-M Protocol Modes

This section describes the central error handling mechanism for FlexRay nodes operating in the static, mixed, and dynamic media access modes. The protocol error state is set to green when the CC performs the state transition L5 or L6 of the HW state machine (see Chapter 'Requirements for Hardware States'), independent of the configured FlexRay mode (static, dynamic, or mixed).

If the CCFC value is less than gMaxWithoutClockCorrectionPassive (range [1 . . . 7]) then the error state shall be in green state, unless some other error causes a yellow or red state.

If the CCFC becomes equal to gMaxWithoutClockCorrectionPassive the fault hypothesis of yellow state shall be assumed (unless some other condition would cause the error state to be red). The clock correction might not work correctly and therefore the CC shall not send any frames. It is possible that also the BG is not synchronized to the cluster's schedule. As long as CCFC does not reach gMaxWithoutClockCorrectionFatal (range [≧gMaxWithoutClockCorrectionPassive . . . 15]) the CC remains in the yellow error state. If CCFC becomes reset again (see section 0), the green state shall become active, unless some other error causes a yellow or red state. The CC was able to resynchronize and is fully operational.

If the CCFC becomes equal to gMaxWithoutClockCorrectionFatal the fault hypothesis of the red state shall be assumed. The CC was not able to resynchronize to the cluster. The CC shall only be reset by its host. The parameter gMaxWithoutClockCorrectionFatal is considered to be a user-defined threshold that is used to control the change of fault hypothesis and sets the threshold of when to change from yellow state into red state. If the node is configured with gMaxWithoutClockCorrectionPassive=gMaxWithoutClockCorrectionFatal then the node shall enter the red state as soon as the CCFC equals their common value. This configuration may be desirable for certain types of systems.

If the CCLR is set (see section 0) the CC shall immediately enter the red protocol error state. The CC shall remain in the red state until the host resets the CC.

During protocol startup phase the CCLR shall not influence the error handling mechanism.

The transitions described above are used in all FlexRay media access modes. The dynamic mode has some special situations, however. In the dynamic mode only one static slot with the purpose of sending the reference frame is defined and therefore the system operates in a master/slave configuration. All CCs acting as slaves in the cluster have to accept the reference frame and its content as the sole data source for their clock synchronization algorithms. This results in a clock synchronization algorithm that is based upon the receipt of just one sync frame (see Chapter 'Clock Synchronization'). The mechanism itself, including rate and offset correction calculation, can deal with this (i.e., the single sync node case is just a special case of the general clock synchronization algorithm). Therefore nodes operating in the dynamic media access mode shall use the same clock synchronization error handling mechanisms as would be used in the other media access modes. An MRCS on such a system means that the even and/or odd reference frame was missing and no rate correction value could be calculated. An MOCS means that no odd reference frame was received and no offset correction term could be calculated. The CCFC shall be incremented according its specification in section 'Clock Correction Failed Counter (CCFC)', and therefore the error state machine shall follow the behavior defined above. Special attention shall be given to the configuration of the values for gMaxWithoutClockCorrectionPassive and gMaxWithoutClockCorrectionFatal. As defined, a slave will stop sending any data frame as soon as it enters the yellow state.

The same is true for the limit checks at the slaves. If the reference frame deviates too much from the slave's local view of the global time and invalid correction activity (in rate and/or offset) becomes necessary, the CCLR signal shall be set and the protocol error state machine shall move into the red state.

As the master CC controls the timing of the complete cluster by its reference frame no error handling activity concerning CCFC shall influence the master CC during normal operation (see Chapter 'Clock Synchronization'). The error handling of the master node shall only be influenced by the CCLR signal if external clock synchronization is applied. The external rate and/or offset correction values might result in a limit violation of the rate and offset correction values (see Chapter 'Clock Synchronization').

Table 31 summarizes the transitions for the static, mixed and dynamic media access modes.

TABLE 31

Error Management State Machines Transitions for Time-Triggered Distributed Protocol Mode and Time-Triggered Master-Controlled Protocol Mode

| State Transition | Transition Direction | | Conditions for Transition |
|---|---|---|---|
| | From State | To State | |
| F1 | CC_SoftReset | Green | Soft reset released (L5 or L6 of Chapter 'Requirements for Hardware States') |
| F2 | Green | Yellow | ( CC in "Protocol Operation Phase" AND End of odd Cycle (after clock correction calculation) |

TABLE 31-continued

Error Management State Machines Transitions for Time-Triggered Distributed
Protocol Mode and Time-Triggered Master-Controlled Protocol Mode

| State Transition | Transition Direction | | Conditions for Transition | | |
|---|---|---|---|---|---|
| | From State | To State | | | |
| | | | AND | CCFC = gMaxWithoutClockCorrectionPassive | |
| | | | AND | CCFC < gMaxWithoutClockCorrectionFatal | |
| | | | AND | CCLR is not set | |
| | | | ) | | |
| F3 | | Red | | CC in " CC in "Protocol Operation Phase" | |
| | | | AND | End of odd Cycle (after clock correction calculation) | |
| | | | AND ( | | CCLR set |
| | | | | OR | CCFC = gMaxWithoutClockCorrectionFatal |
| | | | ) | | |
| F4 | Yellow | Red | | CC in "Protocol Operation Phase" | |
| | | | AND | End of odd Cycle (after clock correction calculation) | |
| | | | AND ( | | CCLR set |
| | | | | OR | CCFC = gMaxWithoutClockCorrectionFatal |
| | | | ) | | |
| F5 | | Green | ( | CC in "Protocol Operation Phase | |
| | | | AND | End of odd Cycle (after clock correction calculation) | |
| | | | AND | CCFC has been set to zero | |
| | | | AND | CCLR is not set | |
| | | | ) | | |

Figure 72:
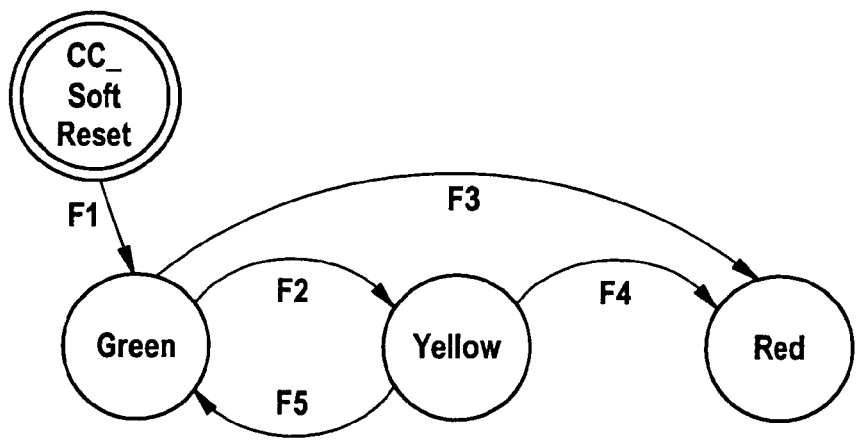
FIG. 72 illustrates an error management state transition diagram for a time-triggered distributed protocol mode and a time-triggered master-controlled protocol mode.

FIG. 72 shows an error management state transition diagram for the time-triggered distributed protocol mode and for the time-triggered master-controlled protocol mode.

Error Handling for Protocol Operation in byteflight Protocol Mode

This section describes the central error handling mechanism for byteflight mode.

Each time the host gives the "clear command" while the CC is in configuration state the protocol error state is set to green. By the definition of in the byteflight specification (see M. Peller, J. Berwanger, and R. Greissbach, byteflight Specification, version 0.5, BMW Corporation 1999, available at http://www.byteflight.com), the reception of an SOC is always the trigger to start a new communication cycle and the CC starts operation (protocol startup phase is finished).

If a communication cycle is still ongoing and an SOC is received (SOC before gdCycleMin), a new communication cycle has to be started (the master sent the SOC and therefore has to be accepted by all nodes). The CC remains in the green state.

If a communication cycle is already finished and the next SOC is missing (gdCycleMax has passed), the CC does not start a new communication cycle until the SOC is detected. Within that time, the CC remains passive (yellow state).

If an ILLPIF is detected instead of an SOC (between gdCycleMin and gdCycleMax) or even during an ongoing communication cycle, the CC enters the yellow state. The detection of an SOC causes the CC to switch into green state anyway.

Table 32 summarizes the transitions for byteflight mode.

TABLE 32

Error Management State Machines Transitions for byteflight Protocol Mode

| State Transition | Transition Direction | | Conditions for Transition | |
|---|---|---|---|---|
| | From State | To State | | |
| B1 | CC_SoftReset | Green | | Soft reset released (L5 or L6 of Chapter 'Requirements for Hardware States') |
| | | | AND | byteflight mode configured (gNumberofStaticSlots equal to zero) |
| B2 | Green | Green | | SOC before gdCycleMin |
| B3 | | Yellow | | GdCycleMax reached without SOC |
| | | | OR | Illegal Pulse before gdCycleMin |
| | | | OR ( | Illegal Pulse after gdCycleMin |
| | | | AND | Illegal Pulse before gdCycleMax |
| | | | ) | |
| B4 | Yellow | Green | | SOC received |

Figure 73:
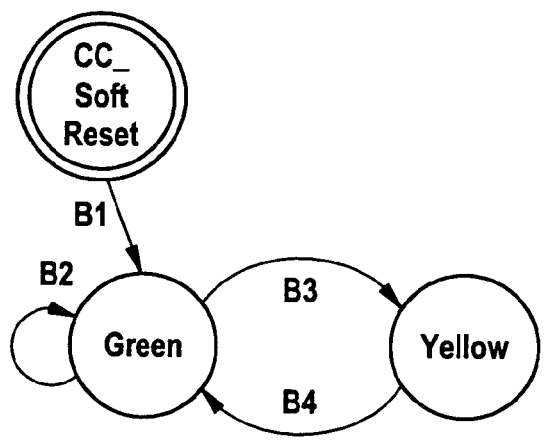
FIG. 73 illustrates an error management state transition diagram for a byteflight protocol mode.

FIG. 73 shows an error management state transition diagram for the byteflight protocol mode.

Protocol Error State Signal

The host shall have the possibility to read the current protocol error state (PESS, range [Green, Yellow, Red]) at any time.

It shall be possible during configuration of the CC to define that a change within PESS is a trigger of an interrupt to the host.

Controller Host Interface

Introduction

Purpose and Scope

The purpose of this chapter is to describe the conceptual structure and required functions and properties of the controller host interface that handles the control and data flow between the host processor and FlexRay controller protocol engine.

The scope of is chapter reaches from the host processor interface to the protocol engine interface. FlexRay protocol functions are not described.

Definitions, Acronyms and Abbreviations

This chapter and the following Chapter contain a number of requirements but also introductions, comments, explanations, etc. All requirements are documented in following format:

Requirement 1<text for requirement one>

Text in a different format does not constitute a requirement and is therefore not subject to conformance testing.

CHI elements—are the seven elements of the CHI: Host processor interface, control data handling, status data handling, message data handling, configuration data handling, CHI services, protocol engine interface Configuration data—is used to program a FlexRay communication controller in order to communicate with other FlexRay controllers. Configuration data has a constant impact on the behavior of protocol implementation during NormalOperation unless changed by the host. This characteristic distinguishes the configuration data from the control data that has only temporal impact during NormalOperation. Moreover the host processor is the only source for configuration data.

Controller state—is the superset of protocol state and other states of the controller which are not determined by the protocol state machine (e.g. HardReset state, Configuration, Standby, etc.)

Interrupt—is an event triggered by a FlexRay controller and propagated to the host processor by a dedicated communication link in order to indicate that a specific condition has become true in the FlexRay controller. Note that in interrupts are generated by the CHI element Host interrupt service but its propagation to the host processor is controlled by the CHI element Status data handling.

Message memory—is memory that contains information contained in a received frame or a frame that was or will be transmitted.

Message status memory—is memory that contains status information about a received or transmitted frame.

Message control field—is a field the host can use to control the use of a message memory.

Message data—is a subset of data contained a FlexRay frame. It does not include FrameID nor FrameCRC. It includes the following data: ReservedBits, NMIndicationBit, PayloadLength, HeaderCRC, CycleCount, FData[0 . . . 254].

NormalOperation—is the state where the controller can participate in or initiate the cluster communication by receiving or transmitting frames. This state includes the listen-only mode.

Status data—is all kind of data the controller determines without interaction with the host by receiving information from the FlexRay Physical Layer or Bus Guardian or by controller internal mechanisms.

Slot-channel tuples—determine the allocation of transmission bandwidth on a specific channel and slot for transmission in the static segment. This is necessary as two controllers may share a single slot—one for each channel.

Data blocks—are sets of data bytes which belong together, namely the fNMVector, fData, fFrameID, fHeaderCRC, vStatusVector, vInterruptStatusVector Static frame—is a frame with fFrameID smaller or equal to gNumberOfStaticSlots Dynamic frame—is a frame with fFrameID larger than gNumberOfStaticSlots Application requirements—a set of requirements determined by a concrete application or a group of similar applications CC Configuration state—a state where the host can configure the FlexRay controller. Neither transmission nor reception is possible during this state. This state is not left unless the host explicitly requests the FlexRay controller to exit it.

HardReset state—the state entered automatically by the FlexRay controller after power has been turned on or after activation of a dedicated hard reset trigger. After initialization of registers and memories with default values the FlexRay controller automatically transits to the CC configuration state.

Controller state—is the combination of the protocol state with all states of state machines operating in parallel in a controller implementation.

Passive state—a state where the FlexRay controller does not transmit any data but keeps receiving data. It also continues to perform the clock synchronization.

Freeze state—a state where the FlexRay controller does neither transmit nor receive data, clock synchronization is stopped and all data accessible for host through the CHI remains constant unless a change is performed by host itself.

Overview of the CHI

Conceptual Architecture

The controller host interface (CHI) manages the data and control flow between the host processor and the FlexRay protocol engine.

Conceptually the CHI consists of seven CHI constituent components. These are the host processor interface and the protocol engine interface, the four data handling units—status data handling, control data handling, message data handling and configuration data handling—, and the CHI services. Note that the hardware architecture of a controller implementation can be quite different than this conceptual architecture.

Figure 74:
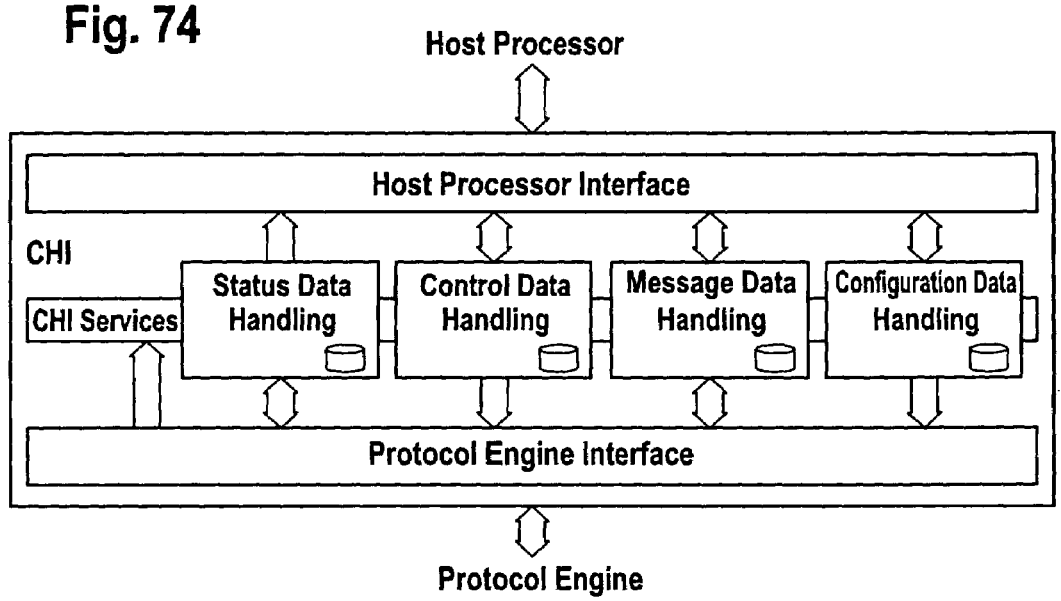
FIG. 74 illustrates a conceptual architecture of a controller host interface of a node of the communication system.

FIG. 74 illustrates the conceptual architecture of the controller host interface and its seven components. The components are described in Sections 'Host Processor Interface' through 'Protocol Engine Interface' and in Section 'CHI Services'.

Host Processor Interface

The host processor interface provides the host processor with control means and gives it access to data held in the four CHI data handling units. In general, FlexRay does not enforce a particular way of how this interface is realized. It can be realized in different ways, for example, as a parallel processor bus or as serial communication link such as SPI.

Configuration Data Handling

The configuration data handling unit contains the functions and memory required to handle and store the communication controller related configuration data. The configuration data written by the host processor is used to derive all configuration parameters required by the protocol engine. The protocol engine has to use protocol parameters as provided by this CHI element. The configuration data handling unit may also conduct sanity checks of the configuration data.

FlexRay distinguishes between two subsets of configuration data:

constant configuration data—may only be changed while the FlexRay protocol is in the CC configuration state, it remains constant during NormalOperation. The ability of the host to modify this data is disabled as long as transmission and/or reception on at least one communication channel is enabled.

variable configuration data—must be set by the host in the CC configuration state unless initialized with valid default values by the FlexRay controller. This data can be modified by the host at any time when the hard reset condition is not given e.g. also when NormalOperation is active.

Note that configuration data has a constant impact on the behavior of protocol implementation during NormalOperation unless changed by the host. This characteristic distinguishes constant as well as variable configuration data from control data that has only temporal impact during NormalOperation. Moreover, the host processor is the only source for configuration data, but control data may be affected by the protocol engine as well (e.g., interrupt indicators are set by the protocol engine but reset by the host).

Control Data Handling

This CHI element processes control commands from the host processor. This CHI element also handles control commands for other CHI elements, e.g. for CHI services.

Status Data Handling

This CHI element collects status data from the protocol engine and CHI services, processes it and provides it to the host processor on request. It handles status data of messages. It propagates interrupt requests triggered by the Host interrupt service to the host processor interface. It contains memory to store status data.

Message Data Handling

This CHI element transfers message data and provides it to the host processor interface as well as to the protocol engine interface. It contains memory to store message data.

Memory associated with one message's data is called a message buffer. A message buffer that is configured to store data for frames to be transmitted is called a transmit buffer. A message buffer that is configured to store data for received frames is called a receive buffer.

Note that this CHI element does not handle status data of messages.

Requirement 1: The FlexRay controller may not modify a transmit buffer's content during NormalOperation nor during Configuration State. Note that the protocol engine may append the padding pattern to the payload section of frames to be transmitted which contain more payload data than can be stored in the corresponding transmit buffer. This does not modify the transmit buffer's content.

Protocol Engine Interface

The protocol engine interface provides the protocol engine with a means of control and gives it access to data held in the four CHI data handling units. Moreover it allows the protocol engine to interoperate with the CHI services. This interface is not visible to the host.

Requirement 2: The protocol engine interface shall provide atomic data read operations, so that once a read operation is initiated the transferred data is guaranteed not to be changed until the read operation has concluded.

Requirement 3: The protocol engine interface shall provide atomic data write operations, so that during a write operation to a memory cell of a CHI element no other CHI element can read an inconsistent value from or write to this memory cell.

Note that the previous two requirements are necessary but not sufficient. For further message data handling requirements see below.

CHI States

Figure 75:
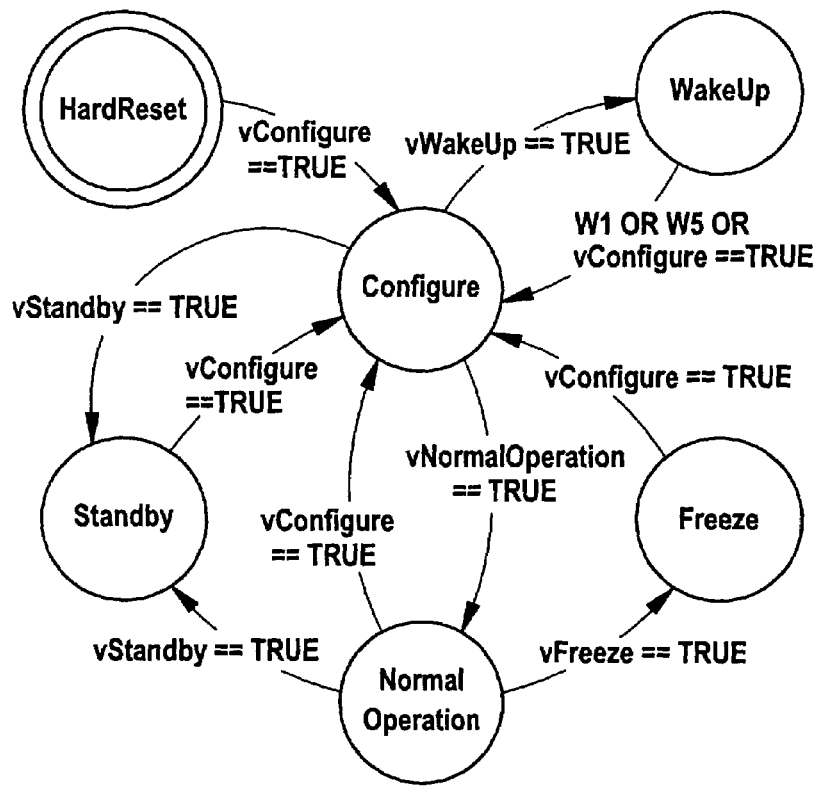
FIG. 75 illustrates a state diagram of a controller host interface.

FIG. 75 shows various Controller Host Interface (CHI) States.

CHI state transition triggers (Transitions W1 and W5 are described in Table 13):

vConfigure in {TRUE, FALSE}
vWakeUp in {TRUE, FALSE}
vNormalOperation in {TRUE, FALSE}
vFreeze in {TRUE, FALSE}
vStandby in {TRUE, FALSE}

CHI state description:

HardReset state: Reached after the hard reset of the controller was triggered. Initializes controller with a default state.

Configuration state: Puts protocol engine in Configure state. Enables host processor to change configuration data. Sets all CHI state transition triggers to FALSE.

WakeUp state: Sets vWakeup to FALSE. Puts protocol engine in WakeUpListen state. The protocol engine may transit to WakeUpSend state. State transitions to Configure state are described in Chapter 'Wakeup, Startup, and Reintegration'.

NormalOperation state: Sets vNormalOperation trigger to FALSE. On entry initializes controller internal states according to configuration, then triggers startup in protocol engine. Note that this state contains all protocol states where the protocol engine has an interaction with other FlexRay nodes via the FlexRay bus. Protocol state changes can be requested within this state, e.g. the protocol engine can be requested to transit to Passive state in order to prepare further state transitions (e.g. shutdown, standby, etc.).

Standby state: Sets vStandby trigger to FALSE. Puts controller in a low power mode. The minimal required functionality is that CHI is able to detect when the host sets the vConfigure trigger.

Freeze state: Sets vFreeze trigger to FALSE. Stops any interaction of the protocol engine with other FlexRay nodes. All protocol parameters including the complete protocol state are frozen. This mode allows the host processor to perform diagnosis.

CHI Services

Figure 76:
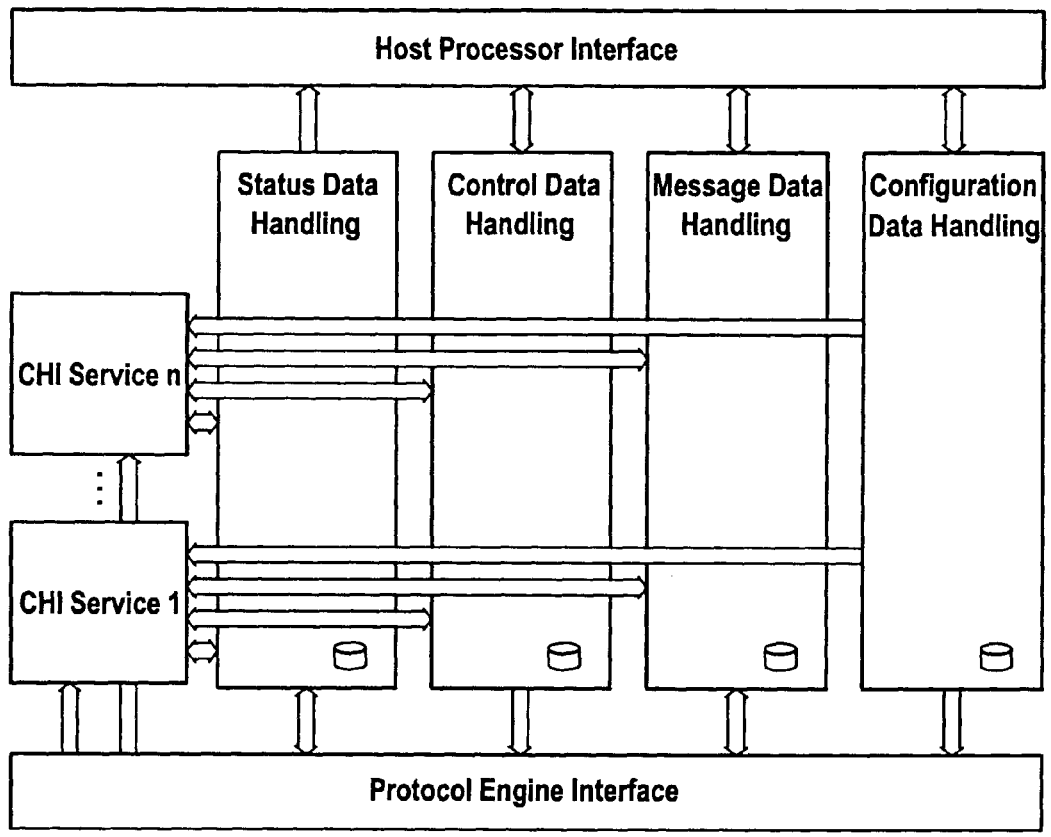
FIG. 76 illustrates interactions of controller host interface services with controller host interface elements.

FIG. 76 shows vaious interactions of CHI services with CHI elements. CHI services receive data from the protocol engine about received and transmitted communication elements as well as about the protocol and error status. They may use data stored in the status, control, message or configuration interface.

CHI services may affect data stored in the status, control or message interface. They may not affect data stored in the configuration interface.

CHI services do not affect the protocol engine's operation, neither directly nor indirectly through one of status, control or message data handling elements.

General Requirements

Requirement 4: It shall be assured that the concurrent operation of CHI elements cannot cause deadlocks.

Requirement 5: In case of concurrent access of different CHI elements to shared CHI elements the host processor interface and the protocol engine interface shall have priority over other CHI elements.

Requirement 6: In case of concurrent access of the host processor interface and the protocol engine interface to shared CHI elements the protocol engine interface shall have priority. An exception is Requirement 7 (Rationale: Necessary in order to assure that timeliness of all protocol engine operations.).

Requirement 7: In case the host processor requests a protocol state change to FreezeState or to ConfigurationState through RequestStateChange it has priority over the protocol engine interface.

Requirement 8: The data bandwidth of communication within the CHI shall be fast enough to support 100% bus utilization on each of its channels during NormalOperation of the protocol engine. Note that this requirement addresses only the internal communication of the CHI, so it is not affected by performance limitations of the implemented host processor interface.

Assumptions and Dependencies

All assumptions and dependencies are documented where they apply. There are no additional general assumptions or dependencies.

Host Processor Interface

The following set of requirements must be met by every instantiation of the host processor interface.

Requirement 9: The host processor interface shall provide an atomic data read operation from memory cells such that once a read operation is initiated by the host the transferred data is guaranteed not to be changed until the read operation has concluded.

Requirement 10: The host processor interface shall provide an atomic data write operation such that during a host processor write operation to a memory cell of a CHI element no other CHI element can read an inconsistent value from this memory cell.

Note that the previous two requirements are necessary but not always sufficient for consistent data access, e.g. for message buffer access further mechanisms are necessary (see section 'Message Data Handling Interaction').

Requirement 11: The host processor interface shall provide at least one dedicated interrupt signal.

Requirement 12: The host processor interface shall trigger an interrupt request to the host processor via the interrupt signal whenever requested by the status data handling.

It is also possible to provide a FlexRay communication controller with multiple host processor interfaces. If a FlexRay controller implementation supports multiple instances of host processor interfaces (e.g. a parallel bus and a serial communication link or different multiple parallel busses) then the following additional two requirements apply:

Requirement 13: A mechanism shall be provided that allows the selection of exactly one host processor interface instance before the communication between FlexRay controller and host processor begins.

Requirement 14: A change of this selection shall become effective only by putting the FlexRay controller in HardReset state. If the selection changes during other states (except PowerOff state or Standby state.) it may not result in a change of the host processor interface.

Configuration Data Handling Interaction

Relationship Between Configuration Data and Protocol Parameters

In a FlexRay controller the configuration data will usually be comprised of a set of registers and memories. However there is not necessarily a one-to-one mapping between this set and the protocol parameters it determines. This is the case because there are protocol parameters, which can be derived from other protocol parameters. Moreover, a FlexRay controller may require parameters in a different representation than specified further on (Example: pSamplePeriod [ns]=gdBit [ns]/pSamplesPerBit)).

Configuration Data Handling Requirements

Interaction with the configuration data handling must meet the following requirements Requirement 15: Configuration data shall not be changed by the FlexRay controller except as result of the activation of hard reset trigger or after power has been applied.

It is assumed that the host in any case will have means to determine whether a mechanism such as "HardReset" have modified configuration data. Moreover, no protocol mechanism will ever change any configuration data under any circumstance.

Requirement 16: After activation of the hard reset or after power on the configuration data shall be initialized by configuration data handling with default configuration values assuring that the FlexRay controller does not transmit data on the FlexRay bus. When the host processor requests a state change to NormalOperation without changing any configuration data no data may be transmitted on the FlexRay bus independent of the resulting protocol state. Rationale: This is a fail silence requirement for the case of a fault causing a hard reset or power up where the host would not write any configuration data.

Requirement 17: Configuration data shall be designed in a way that all protocol parameters are determined unambiguously.

Requirement 18: Configuration data shall be designed in a way that all protocol parameters are determined with at least the resolution given further on. The resolutions and units of all configuration data shall be done in a way that all this resolution is achieved for all valid configurations.

Requirement 19: It shall be assured that the FlexRay controller never transmits more than one sync frame per communication cycle, even when the host has attempted to configure the FlexRay controller to do so. The FlexRay controller shall employ special measures to prevent this from happening.

Requirement 20: At least the following parameters shall be determined by constant configuration data:
  1. All cluster constants (This covers several parameters, e.g. gdStartup, gStartupNoise, etc.)
  2. All node constants (This covers several parameters, e.g. pdWakeupPattern, etc.)

3. Timing parameters
4. In case pSyncNode is TRUE the value of pSyncSlot
5. Frame identifiers, transmission channels and cycle counter filters of all static frames that may be transmitted (Note that this deals only with configuration data and determines which slot-channel tuples are allocated for transmission by one FlexRay Controller. It does not imply that message memory is provided in the message data handling element for every slot-channel tuple.)
6. Physical layer (optical or electrical), encoding Requirement 21: The host shall have write access to constant configuration data only when the protocol is in the CC configuration state. When the protocol is in any other state this data shall be write protected against access by the host processor.

Requirement 22: Appropriate mechanisms shall be provided that support changes of variable configuration data during NormalOperation. These mechanisms shall ensure that the subset of configuration data to be changed is not used by the protocol engine during the duration of the change process. Indirectly this requires a locking mechanism for all cases where an atomic change is not possible.

Requirement 23: Variable configuration data shall be clustered in configuration subsets of configuration data belonging together in a way that that an update of one subset cannot cause an inconsistent configuration during or after the update.

Requirement 24: At least the following parameters are determined by variable configuration data
1. Frame identifiers of messages in the dynamic segment
2. vColdStartInhibit Requirement 25: The following parameters shall be determined by exactly one of variable configuration data or constant configuration data.
1. (currently no parameter identified for this category)

Requirement 26: The host shall have read access to all configuration data in all controller states except Power-Down state and HardReset state.

Control Data Handling Interaction

Control of Protocol Parameters
Requirement 27: Means shall be provided to determine and change the following protocol parameters during NormalOperation state:
1. vOffsetCorrectionExtern, vRateCorrectionExtern
2. vBgsmErrorAck (Can be discarded if locked parameter is used for BgsmError)
3. vColdStartInhibit Control Commands for the Host Processor
Requirement 28: At least the following control commands shall be provided to the host processor: (TBD wording)
1. ChangeControllerState (handles superset of changes to protocol engine interface—maybe better ChangeControllerState to cover non-protocol state changes as well)
2. EnableInterrupt (<interrupt_type>)
3. DisableInterrupt (<interrupt_type>)
4. EnableCHIService (<CHI_service>, <CHI_service_feature>)
5. DisableCHIService (<CHI_service>, <CHI_service_feature>)

TABLE 33

ChangeControllerState

ChangeControllerState ( <requested_controller_state> )

| | | |
|---|---|---|
| Purpose | Control command for the host processor to requests a change of the controller state | |
| Arguments | requested controller state | |
| | <requested_controller_state> | [HardReset state, CC Configuration state, NormalOperation state, Freeze state, WakeUp state, Standby state] |
| Return values | None | |
| Operation | Depending on the requested controller state a request is generated to the protocol engine through the ChangeProtocolState interface. The CHI waits for the protocol engine to perform the requested state transition. Subsequently the appropriate CHI state trigger is set to TRUE. | |

TABLE 34

Impact of Controller State Change on Protocol Engine and CHI (The maximum latency is before entering the state assuming that the requested transition is legal; the maximum latency in the controller state NormalOperation depends on the performance of controller implementation; this assumes that controller internal states must be initialized depending on configuration.)

| Requested controller state | Argument for ChangeProtocolState | CHI state trigger | Maximum latency |
|---|---|---|---|
| Freeze | Freeze | Sets vFreeze to TRUE | 100 ns |
| Configuration | Configuration | Sets vConfiguration to TRUE | 100 ns |

TABLE 34-continued

Impact of Controller State Change on Protocol Engine and CHI (The maximum latency is before entering the state assuming that the requested transition is legal; the maximum latency in the controller state NormalOperation depends on the performance of controller implementation; this assumes that controller internal states must be initialized depending on configuration.)

| Requested controller state | Argument for ChangeProtocolState | CHI state trigger | Maximum latency |
| --- | --- | --- | --- |
| Standby | Freeze | Sets vStandby to TRUE | 100 ns |
| NormalOperation | NormalOperation | Sets vNormalOperation to TRUE | 150 us |
| WakeUp | WakeUpListen | Sets vWakeup to TRUE | 100 ns |

Note that Table 34 is not subject to conformance testing. Specific FlexRay controller implementations may have deviating maximum latency values. However, these values must be determined, documented and constant.

TABLE 35

| EnableInterrupt/DisableInterrupt (Further interrupt types may be supported but are not required) EnableInterrupt ( <interrupt_type> )/ DisableInterrupt ( <interrupt_type> ) | |
| --- | --- |
| Purpose | Enable/disable specific interrupts |
| Arguments | interrupt type to enable/disable<interrupt_type> <interrupt_type> [RXInterrupt, TXInterrupt, ErrorSignalingInterrupt] |
| Return values | None |

TABLE 36

| EnableCHIService/DisableCHIService EnableCHIService ( <CHI_service>, <CHI_service_feature> ) DisableCHIService ( <CHI_service>, <CHI_service_feature> ) | |
| --- | --- |
| Purpose | Enable/disable optional CHI services and CHI service features |
| Arguments | interrupt service; if <CHI_service_feature> equals "ALL" enable/disable complete service with all features<br><CHI_service> [message_filtering, message_FIFO, network_management, timer, error_signaling, symbol_handling, host_interrupt, optical_diagnosis]<br>CHI service feature to enable/disable; if the CHI service does not have features or all features should be enabled/disabled use "ALL"<br><CHI_service_feature> [ALL, frame_ID_filtering, channel_filtering, cycle_counter_filtering, message_ID_filtering, receive_FIFO, NM_vector_extraction, NM_function_filtering, media_access_test_symbol_handling, status_symbol_handling, timer_interrupt, error_signaling_interrupt, NM_function_interrupt] |
| Return values | None |

Status Data Handling Interaction

Status data is derived from controller internal state variables which serve as their source. There are two types of status data:

1. Free status indicators that can change their value whenever their source values change. Unless differently stated all indicators below are free status indicators.
2. Locked status indicators that change their value if a specific condition of the source value is fulfilled for a short time (typically in the range of one to several controller clock cycles) and keep this value even if the condition is no more fulfilled.

Some status indicators may be combined in a super state which may not be accessible by one atomic host operation. Likewise for status indicators which are too large to be accessed by an atomic read operation. Dedicated status consistency mechanisms may be required to assure that they can be read consistently by the host processor with a non-atomic sequence of read operations.

Requirement 29: Free status indicators shall be read-only for the host processor. Attempts by the host processor to overwrite free status indicators may not affect them.

Requirement 30: Locked status indicators shall be set if a specific internal state is reached, they shall not be set upon request of the host processor.

Requirement 31: Locked status indicators shall be reset only upon request of the host processor, they shall not be reset upon change of the adjacent internal state.

Requirement 32: All status indicators shall be reset upon exit from the CC configuration state.

Requirement 33: The current controller state shall be provided on read request of the host.

Requirement 34: The current error status vector shall be provided on read request of the host.

Requirement 35: A mechanism shall be provided that enables the host to read the protocol state consistently.

Requirement 36: A mechanism shall be provided that enables the host to read the error status vector consistently.

Requirement 37: If a host interrupt is generated by the host interrupt service, and if this interrupt is enabled, it shall be indicated to the host processor interface.

Requirement 38: Interrupts that are disabled shall not be propagated to the host processor interface.

Requirement 39: The status data handling shall provide a mechanism for the host processor to selectively enable and disable each interrupt.

Requirement 40: A dedicated status indicator shall be provided for each receive buffer to indicate when a receive buffer is updated through the PutFrame interface.

Requirement 41: The following protocol variables shall be provided (sets of status data belonging together are combined in one bullet):
  1. vColdStartCount
  2. vValidSyncCount
  3. vCycle, vMacrotick, vCurrentSlot, vErrorHandlingLevel
  4. results of BG monitor checks
  5. results of Media Access Test Requirement 42: The following results of the clock synchronization algorithm which is performed during NIT of cycle n shall be provided throughout cycle n+1 and cycle n+2
  1. vOffsetCorrection, vRateCorrection
  2. an indicator for impossible rate or offset correction term calculation
  3. number of sync frame pairs used for the last clock correction term calculation Requirement 43: A startup status vector shall be provided containing
  1. An indicator set only when vColdStartMax is equal to gColdStartMax
  2. An indicator that plausibility check has failed
  3. An indicator that normal state was entered via coldstart path
  4. An indicator that coldstart path has been entered due to expiration of pStartupNoise Requirement 44: For each receive buffer a corresponding status vector shall be provided containing at least the following status information
  1. Semantically valid frame received
  2. Syntactically correct null frame received
  3. Syntactically correct sync frame received
  4. Empty slot—idle was detected throughout the slot on the reception channel
  5. Cycle counter mismatch detected
  6. Length mismatch detected (PayloadLength in static frame does not match gPayloadLengthStatic)

Requirement 45: The status vector for a receive buffer shall be updated whenever this buffer is selected by the message selection process. (Note that this does not imply that the receive buffer's data is updated as well.)

Requirement 46: A locked indicator shall be set on detection of a wakeup pattern, that is, when the flag vWakeupSymbolReceived is set.

Requirement 47: A locked indicator shall be set when vWakeupFrameHeaderReceived is set.

Requirement 48: A locked indicator shall be set when the flag vWakeupFailed is set.

Requirement 49: A locked indicator shall be set when the flag vWakeupComplete is set.

Message Data Handling Interaction

The host can book a slot-channel tuple for transmission. Note that the booking does not include further conditions like subscription (e.g. cycle counter filtering) even though transmit buffers may support additional conditions to determine which data is transmitted during the booked slot-channel tuples. The booking of a specific slot-channel must be unique in the cluster. The host can also subscribe a slot-channel tuple for reception. Depending on the FlexRay controller implementation the subscription may include further conditions e.g. a matching cycle counter, etc. Identical subscriptions may coexist in the same cluster.

Requirement 50: In order for the host to manipulate the content of message buffers at least the following interface functions shall be supported (Further interface functions may be supported to improve efficiency):
GetMessage
PutMessage

TABLE 37

| | GetMessage |
|---|---|
| | GetMessage ( <message_buffer> ) |
| Purpose | Interface function for the host processor to retrieve data from a (receive) message buffer. |
| Arguments | Select the message buffer |
| | <message_buffer>  (values depend on controller implementation) |
| Return values | TRUE if the selected message buffer contains valid data, FALSE otherwise |
| | <valid_data>  [ TRUE \| FALSE ] |
| | Received message data |
| | <message_data>  (FrameID, ReservedBits, SyncBit, NMIndicationBit, CycleCount, PayloadLength, HeaderCRC, FData[0..254]) |
| | (Does not contain FrameCRC) |

TABLE 38

| | PutMessage |
|---|---|
| | PutMessage ( <message_buffer>, <message_data> ) |
| Purpose | Interface function for the host processor to change a (transmit) message buffer's content |
| Arguments | selected message buffer |
| | <message_buffer>  (values depend on controller implementation) |
| | data to be put in the selected message buffer |
| | <message_data>  (ReservedBits, NMIndicationBit, PayloadLength, HeaderCRC, FData[0..254]) (Does not contain SyncBit; also FrameID is determined by message buffer's adjacent slot-channel tuple) |
| Return values | None |

Requirement 51: The host shall have read access to all message buffers with valid message data. The Message data may not be valid while the message buffer is accessed by the protocol engine.

Requirement 52: An indicator shall be provided for each receive message buffer if it contains data of a semantically valid frame.

Requirement 53: After activation of the hard reset or after power on this indicator shall be initialized by message data handling to indicate that the receive message buffer does not contain data of a semantically valid frame.

Requirement 54: A mechanism shall be provided that ensures access to consistent message data by the host. This means that while the host is accessing a message buffer's data that data shall not be changed by other CHI elements.

Requirement 55: Transmit buffers shall contain the following data: ReservedBits, NMIndicationBit, FrameID, PayloadLength, HeaderCRC, CycleCount, FData[0. . . pMaxPayloadLength-1]

Requirement 56: In case of a request through the GetFrame interface by the protocol engine cPaddingValue shall be set in FData[pMaxPayloadLength . . . PayloadLength-1] in case pMaxPayloadLength is smaller than PayloadLength and <frame_data_found> is TRUE. The padding feature shall be supported only by controller implementations that have message buffers which cannot store 254 bytes of payload data. It shall be possible to inhibit padding by a dedicated configuration parameter.

Requirement 57: A mechanism shall be provided for the host to commit transmit buffers for scheduling for transmission.

Requirement 58: The host shall have write access to transmit buffers only when they are not scheduled for transmission.

Requirement 59: The host shall not have write access to receive buffers.

Requirement 60: Each receive buffer shall provide the following message data:

ReservedBits, NMIndicationBit, NullFrameIndicationBit, SyncBit, FrameID, PayloadLength, HeaderCRC, CycleCount, FData[0. . . pMaxPayloadLength-1], reception channel. (Note: If the reception channel is determined by configuration data the reception channel is not required to be stored in the receive buffer.)

Requirement 61: Receive buffers shall be updated by the protocol engine only with data of semantically valid frames.

Requirement 62: The message data of valid frames that are stored in a receive buffer shall be accessible through GetMessage in the same sequence as the frames are detected as valid.

Requirement 63: For valid static frames received in slot x the earliest possible access to the message data through GetMessage shall be within 1 µs after the end of slot x if they are subscribed.

Requirement 64: For valid dynamic frames which end in minislot x the earliest possible access to the message data through GetMessage shall be within 1 µs after the end of minislot x if they are subscribed.

Protocol Engine Interface

Communication with Protocol Engine

TABLE 39

Protocol Engine Interface

| Interface type | Interface function | Purpose |
| --- | --- | --- |
| control interface | RequestStateChange | Request a protocol state change at the protocol engine |
| data interface | PutFrame | Service for the protocol engine to process received frames |
| | GetFrame | Service for the protocol engine that provides frame data for a specific slot and channel. |
| | PutProtocolState | Service for the protocol engine to process protocol state data |
| | PutErrorStatusVector | Service for the protocol engine to process the error status vector |
| | GetConfigurationData | Service for the protocol engine to read configuration data |

The protocol engine interface is split into a control and a data interface. The control interface is used to request a protocol state change at the protocol engine (see below). The data interface provides services which can be requested by the protocol engine. These services are described further on.

RequestStateChange

TABLE 40

RequestStateChange

RequestStateChange ( <requested_protocol_state> )

| | |
| --- | --- |
| Purpose | Request a protocol state change at the protocol engine |
| Arguments | requested protocol state |
| | <requested_protocol_state>    [ PowerUp, Configuration, Wakeup, NormalOperation, Passive, Freeze ] |
| Return values | None |

Operation: The state change request is propagated to the protocol engine. It is in the responsibility of the protocol engine to react accordingly, e.g. some state change requests have to be followed immediately while others allow to complete an ongoing transmit or receive process. The protocol engine confirms the request by using the PutProtocolState interface to report its transition to the requested state.

PutFrame

TABLE 41

| PutFrame |  |
|---|---|
| PutFrame ( <frame_data>, <RX_channel>, <frame_status> ) | |
| Purpose | Service for the protocol engine to process received frames |
| Arguments | Data content of the received frame |
| | <frame_data>    ReservedBits, NMIndicationBit, NullFrameIndicationBit, SyncBit, FrameID, PayloadLength, HeaderCRC, CycleCount, FData[0..254] |
| | Reception channel |
| | <RX_channel>    [A \| B] |
| | Result of the frame checks performed by the protocol engine - any combination of error values is possible |
| | <frame_status>    [ CorrectFrame \| { CRCMismatch, IllegalLength, CycleCountMismatch, FrameIDMismatch, IllegalNMIndicationBit, IllegalSyncBit} ] |
| Return values | none |

Operation: The data provided by the protocol engine is forwarded to all CHI services and to message data handling. These CHI elements interact with each other to determine if the provided data should be stored in the message data memory—if so determine the storage location if reception of this very message should be indicated to host processor (e.g. via interrupt)

if pMaxPayloadLength is smaller than PayloadLength discard FData[pMaxPayloadLength..PayloadLength-1], however do not change PayloadLength (Consequently a message buffer may contain less FrameData than indicated by PayloadLength.)

if and which status data to be updated if there is an impact on control data (e.g. reset an indicator set by the host if it has read a specific message)

if in case of an error indication maybe an interrupt should be triggered others depending on further CHI services GetFrame

TABLE 42

| GetFrame |  |
|---|---|
| GetFrame ( <FrameID>, <TX_channel> ) | |
| Purpose | Service for the protocol engine that provides frame data for a specific slot and channel. |
| Arguments | FrameID of the frame to be transmitted; 0 for construction of a special collision avoidance frame during startup |
| | <FrameID>    [0..cMaxFrameID] |
| | Channel to transmit the frame |
| | <TX_channel>    [A \| B] |
| | Current cycle counter |
| | <cycle_counter>    [0..63] |
| Return values | TRUE if valid frame data was found, FALSE otherwise |
| | <frame_data_found>    [ TRUE \| FALSE ] |
| | TRUE if the configuration data contains at least one message configuration with a matching <FrameID> for transmission on <TX_channel> |
| | <slot_is_booked>    [ TRUE \| FALSE ] |
| | Frame data to be transmitted |
| | <frame_data>    (ReservedBits, SyncBit, NMIndicationBit, PayloadLength, HeaderCRC, FData[0..254]) (Not all data contained in a frame is covered by this data set: FrameID, CycleCount and FrameCRC are known or generated by the protocol engine.) |

Operation: The protocol engine requests frame data through this interface for every slot and channel.

If no slot-channel tuple for transmission is contained in the configuration data the value of <slot_is_booked> shall be FALSE and the protocol engine will try to receive a frame.

If a slot-channel tuple for transmission is contained in the configuration data, though, <slot_is_booked> shall be TRUE, and a frame or null frame will be transmitted if <frame_data_found> is TRUE respectively FALSE.

In case both <slot_is_booked> and <frame_data_found> are TRUE message data handling assures that cPaddingValue is set in FData[pMaxPayloadLenth ... PayloadLength-1] in case pMaxPayloadLength is smaller than PayloadLength.

PutProtocolState

TABLE 43

PutProtocolState

PutProtocolState ( <current_protocol_state> )

| | | |
|---|---|---|
| Purpose | Service for the protocol engine to process protocol state data | |
| Arguments | Current protocol state | |
| | <current_protocol_state> | [PowerUp, Configuration, Wakeup, NormalOperation, Passive, Freeze ] |
| Return values | none | |

Operation: This interface is used by the protocol engine whenever the protocol state changes. This information is provided to all CHI services, status data handling, which interact accordingly to
- Determine if a the state change needs to be reflected in status data
- Determine if control data needs to be updated (e.g. reset/set specific state change or transmission requests
- Check if interrupt requests should be triggered PutErrorStatusVector

TABLE 44

PutErrorStatusVector

PutErrorStatusVector ( <error_status_vector> )

| | | |
|---|---|---|
| Purpose | Service for the protocol engine to process the error status vector | |
| Arguments | Current protocol error status vector | |
| | <error_status_vector> | Error status according to Chapter <Error Signaling and Error Handling > |
| Return values | none | |

GetConfigurationData

TABLE 45

GetConfigurationData

GetConfigurationData ( <requested_protocol_parameter> )

| | | |
|---|---|---|
| Purpose | Service for the protocol engine to read configuration data | |
| Arguments | identifies which protocol parameter's value shall be provided | |
| | <requested_protocol_parameter> | [ pSyncSlot, ... ] (This list is implementation specific) |
| Return values | value of the requested protocol parameter | |
| | <protocol_parameter_value> | number (The format of the returned value is implementation specific) |

Operation: Whenever the protocol engine requires a specific protocol parameter it uses this interface to request the value. The configuration data handling element may extract it directly from the configuration data or calculate the value from the configuration data.

Status Data Handling Interaction

The protocol engine must provide all indicators required for CHI which cannot be generated by one of the CHI elements.

Message Data Handling Interaction

Requirement 65: A mechanism shall be provided that ensures access to consistent message data by the protocol engine. This means that while the protocol engine is accessing a message buffer's data it may not be changed by other CHI elements Controller Host Interface Services Overview The controller host interface services (CHI services) provide different services to the host processor. Conceptually the CHI service is required if it provides at least one required CHI service feature.

A CHI service may also build on other CHI services. In this case a CHI service is required if it provides a dependency for at least one other CHI service.

The CHI services interact with the host processor through the four data handling units. This way the service status is indicated to the host processor and the host processor can control and configure the service. In addition a CHI service can act on message data provided by either the host processor or the protocol engine to the message data handling unit.

Currently eight CHI services are defined. Table 46 lists the eight CHI services along with any potential CHI service features and the respective classifications.

The protocol engine interface propagates all data provided by the protocol engine via PutFrame, PutProtocolStatus, PutErrorStatusVector to all CHI services. Upon this data the CHI services perform all operations and checks necessary to fulfill their functions.

TABLE 46

Required and Optional CHI Services and Features

| Service name | Service feature | Classification | Comment |
| --- | --- | --- | --- |
| Message filtering service | Frame ID filtering | Required | |
| | Channel filtering | Required | |
| | Cycle counter filtering | Required | |
| | Message ID filtering | Optional | |
| Message FIFO service | Receive FIFO | Optional | |
| Network management service | NM vector extraction | Optional | |
| | NM function filtering (Currently not required nor described) | Optional | Requires NM vector extraction |
| Timer service | — | Required | Essential for time triggered distributed applications |
| Error signaling service | — | Required | |
| Symbol handling service | Media access test symbol handling | Required | Essential to perform the media access test |
| | Status symbol handling | Optional | |
| Host interrupt service | Timer interrupt | Required | Essential for accurate synchronization of time triggered applications with the global time |
| | Error signaling interrupt | Optional | |
| | NM function interrupt | Optional | Requires network management service |
| Optical diagnosis service | — | Optional | |

CHI services can be seen as an additional service layer that builds on the protocol services provided by the protocol engine.

CHI services of higher complexity like the Message filtering service fall apart in different CHI service features. Specific CHI service features may require other CHI service features as prerequisite.

Each CHI service is classified as either required or optional. All services, i.e. those classified as required as well as those classified as optional, however, must adhere to the requirements defined in this chapter. In addition a CHI service may contain a set of different subservices. Each CHI service feature in turn is also classified as either required or optional.

Message Filtering Service

The message filtering service provides a means for retrieving message data from message buffers for transmission, respectively for storing received message data to message buffers, depending on specific filter conditions. In order to provide this service the protocol engine accesses each message buffer via a message filter. Each message filter can assess one or more filter conditions. The message filter checks whether the message data meets the defined filter conditions or not. Message filters may be used with receive buffers as well as with transmit buffers.

Currently filtering conditions are defined for the frame ID, the channel ID, the cycle counter and the message ID.

The following transmit buffer related requirements must be met independently from the filtering condition:

Requirement 66: In the case of a transmit buffer the buffer contents shall only be made available to the protocol engine for transmission if the transmit buffer contains message data that meets all respective filter conditions.

Requirement 67: If multiple filters match then a transmit buffer shall be selected in a deterministic way.

The following receive buffer related requirements must be met independently from the filtering condition:

Requirement 68: In the case of a receive buffer the message data contained in a valid frame shall only be stored in the receive buffer if the message data contained in the frame meets all respective filter conditions.

Requirement 69: If multiple filters match then a receive buffer shall be selected in a deterministic way independently of the protocol state and message data.

Frame ID Filtering

Within Frame ID filtering the filter condition is applied to the frame ID. Frame ID filtering applies to transmit and receive buffers.

Requirement 70: For transmit buffers the filter shall consider the respective slot counter for which data is requested by the protocol engine, for receive buffers the filter shall consider the frame ID contained in the valid frame. The slot counter is always associated with a channel ID. A slot is assigned to the node for a specific channel if both the frame ID filter and the channel ID filter match for a buffer.

Requirement 71: Each filter shall be configured by means of a frame ID filter value and an optional frame ID filter mask.

Requirement 72: Each frame ID filter configuration shall be determined by static configuration data.

Requirement 73: The frame ID filter shall match if the considered frame ID is equal to the frame ID filter value. If the filter holds a frame ID filter mask then the frame ID filter mask shall be applied to the considered frame ID prior to the comparison with the frame ID filter value.

Channel Filtering

Within channel filtering the filter condition is applied to the channel. Channel filtering applies to transmit and receive buffers.

Requirement 74: For transmit buffers the filter shall consider the channel for which data is requested by the protocol engine, for receive buffers the filter shall consider the channel on which the valid frame was received. The channel ID is always associated with a slot counter. A slot is assigned to the node for a specific channel if both the frame ID filter and the channel ID filter match for a buffer.

Requirement 75: Each filter shall be configurable by means of a channel filter set that equals one of the following sets: {A}, {B}, {A,B}, { }.

Requirement 76: Each channel filter configuration shall be determined by static or by variable configuration data.

Requirement 77: The channel filter shall match if the considered channel is contained in the channel filter set.

Message ID Filtering

Within message ID filtering the filter condition is applied to the message ID. Message ID filtering applies only to receive buffers.

Requirement 78: The filter shall consider the message ID contained in the valid frame only if the payload length of the frame contains at least one word. If the payload length contains 0 words then the filter shall not match.

Requirement 79: Each filter shall be configurable by means of a message ID filter value and a message ID filter mask.

Requirement 80: The message ID filter shall match if the result after applying the considered message ID to the message ID filter mask is equal to the message ID filter value.

Requirement 81: The message ID filter configuration shall be determined by constant or by variable configuration data.

Cycle Counter Filtering

Within cycle count filtering the filter condition is applied to the cycle count. Cycle count filtering applies to transmit and receive buffers.

Requirement 82: For transmit buffers the filter shall consider the cycle counter for which data is requested by the protocol engine, for receive buffers the filter shall consider the cycle count contained in the valid frame.

Requirement 83: Each filter shall be configurable by means of a cycle set. A cycle set $C_{b,c}$ contains all cycle numbers $$C_{b,c} = \{x | x = (b + n*2^c) \bmod (cCycleMax+1); n \in N_0; 0 <= b < 2^c <= cCycleMax+1\}$$

with
b: Base cycle
c: Cycle repetition
b, c in $N_0$

Requirement 84: The cycle counter filter configuration shall be determined by constant or variable configuration data.

Requirement 85: A cycle counter filter shall match if the considered cycle count is contained in the cycle set $C_{b,c}$.

Allowable Filtering Combinations

Requirement 86: Transmit buffers shall allow either a combination of frame ID filtering and channel ID filtering or a combination of frame ID filtering, channel ID filtering and cycle counter filtering.

Requirement 87: Receive buffers shall allow either a combination of frame ID filtering and channel ID filtering, or a combination of frame ID filtering, channel ID filtering and cycle counter filtering, or a combination of message ID filtering and channel ID filtering, or a combination of message ID filtering, channel ID filtering, and cycle counter filtering. Frame ID filtering and Message ID filtering are mutually exclusive for receive buffers, i.e. it is not possible to activate frame ID filtering and message ID filtering at the same time.

Requirement 88: If the configuration of a filter is changed during runtime while the protocol is in the NormalOperation state then the filter shall not match until the configuration is completed.

Message FIFO Service

Description

Message FIFO's are used to store and receive frame contents according to the "first-in first-out" principle. Currently only receive FIFO's are defined.

The receive FIFO stores the content from valid frames received by the protocol engine. The host processor consumes the messages from the FIFO by reading from the FIFO.

Interaction with Protocol Engine Interface

Receive FIFO: Stores the provided message data upon a PutFrame request if no dedicated message buffer can be found and the frame is accepted by optional filters.

Interaction with Configuration Data Handling

Message filters may be configured in static or variable configuration data for select specific message for storage in receive FIFOs. These message filters may accept or reject specific frame Ids or message Ids.

Interaction with Status Data Handling

Requirement 89: A Boolean free indicator shall be provided to determine if there are messages stored in the FIFO.

Requirement 90: A Boolean locked indicator shall be provided to determine if the FIFO has lost message data due to overflow.

Interaction with Message Data Handling

Message FIFOs are used to store/retrieve message data only when no dedicated message buffer is configured for a specific message and the frame is accepted by optional filters.

Requirement 91: The sequence of messages from a specific channel stored in a receive FIFO shall be identical to the sequence of these message on the FlexRay bus.

Note that if more than one channel is fed into one receive FIFO, then the message sequence in the FIFO will be consistent with the message sequence for each channel individually, however no specific storage sequence is defined between messages of different channels.

Network Management Service

Description

The Network management service provides means for the host to handle the network management vector that can be transmitted in a FlexRay frame.

Constraints

The network management service is functional only during NormalOperation.

Interaction with Protocol Engine Interface

This CHI service scans each frame provided by the protocol engine through PutFrame. If NMIndicationBit is set it becomes active.

Interaction with Configuration Data Handling

Requirement 92: The value of NMIndBit in frames to be transmitted shall be determined by static configuration data.

Interaction with Control Data Handling

Requirement 93: If a specific controller implementation supports interrupt triggering on specific NM events it shall be possible for the host to disable these interrupts.

Interaction with Status Data Handling

Requirement 94: A network management (NM) vector vGloNMVec of gNetworkManagementVectorLength bytes length shall be provided during NormalOperation.

It is not required that vGloNMVecis valid in operation modes other than the NormalOperation.

It is up to the application to use only a subset of the gNetworkManagementVectorLength bytes for NM. In this case it is the responsibility of the application to mask the unused bits.

Requirement 95: An updated vGloNMVecshall be provided at the beginning of each communication cycle.

Requirement 96: The value of a vGloNMVec provided at the beginning of a communication cycle shall be equal to a logical OR operation of all fLocNMVec contained in correctly received frames with the NM indication bit set during the previous communication cycle. Note that the extraction of fLocNMVec depends on the use of message identifiers. This may be different for different frames. If message ID filtering is disabled in the message buffer to store a received frame the fData[0 . . . 8] are used as fLocNMVec. If message ID filtering is enabled fData[2 . . . 10] are used as fLocNMVec. Note that the logical OR combination applies also for different fLocNMVec values received on the two channels in the same slot. At the beginning of the first communication cycle in NormalOperation a NM vector initialized to 0 shall be provided.

Requirement 97: A mechanism shall be provided that either provides vGloNMVec in a consistent way, or indicates either explicitly or implicitly if an inconsistent vGloNMVec was read by the host.

An implicit indication could be the cycle counter value of the communication cycle the NM vector was generated from. The host could read and store this value, read the NM vector and verify if the cycle counter value matches the stored value. If this check fails, the NM vector read is possibly not consistent. If the check succeeds the NM vector is consistent. This is only true if the host takes less than 64 cycles to read the NM vector, because the cycle counter values repeat after 63 cycles.

Requirement 98: If NMIndicationBit is set but the PayloadLength of the frame is not large enough to hold the complete NM vector an error shall be indicated and vGloNMVec shall not be changed.

Requirement 99: If NMIndicationBit is set and the NullframeIndicationBit is set an error shall be indicated and vGloNMVec shall not be changed Interaction with Message Data Handling Requirement 100: The message interface shall provide means for the host processor to determine the values of the NM vector (fLocNMVec) in frames to be transmitted.

For all received frames provided to the host the message interface shall also provide the values of fNMIndBit and fLocNMVec. fNMIndBit and fLocNMVec represent the values for NM indication bit and NM vector contained in the (received) frame.

Timer Service

Description

This service allows the synchronization of the application with the global time in the FlexRay cluster. Timers may be absolute (specific cycle and macrotick) or relative (to the time when they are started), and they may repetitive or single shot timers.

Interaction with Protocol Engine Interface

Timer events are triggered depending on the latest values of vMacrotick and vCycle.

Interaction with Configuration Data Handling

Requirement 101: Timer events shall be contained in static or variable configuration data.

Requirement 102: A timer event shall be defined unambiguously so that the time (cycle number and macrotick) of activation can be determined.

Interaction with Control Data Handling

Timers as well as the timer interrupt can be enabled or disabled during NormalOperation.

Interaction with Status Data Handling

Requirement 103: A dedicated interrupt shall be provided to the host processor that is triggered when a timer has elapsed.

Error Signaling Service

Interaction with Control Data Handling

Requirement 104: Error signaling data shall be reset upon exit of the CC configuration state.

Interaction with Status Data Handling

Requirement 105: An locked status indicator shall be provided that is set when vOffsetCorrection has reached the red region (vOffsetCorrection>gOffsetCorrectionOut).

Requirement 106: A locked status indicator shall be provided that is set if vBgsmError is TRUE. This status indicator shall be reset when vBgsmErrorAck is TRUE.

Requirement 107: A locked status indicator shall be provided that is set when a media access test symbol (MTS) was received during the symbol window Symbol Handling Service Description This service allows to control which symbols are transmitted during the symbol window. Moreover it provides information to the host processor about the symbol received during the symbol window. This service has the following features:

Media access test symbol handling—is a required feature to perform the media access test.

Status symbol handling—is an optional feature to handle status normal symbol and status alarm symbol.

Interaction with Protocol Engine Interface

The value of vTXSymbol shall provided on request through the GetConfigurationData interface if the argument is "vTXSymbol". (TBD—formalize and standardize description)

Interaction with Configuration Data Handling

The length of the symbol window is a cluster constant and therefore determined by static configuration.

Interaction with Control Data Handling

Requirement 108: Means shall be provided to control the value of vTXSymbol.

Interaction with Status Data Handling

Requirement 109: The value of vRXSymbol shall be provided as free indicator to the host processor interface.

Host Interrupt Service

Description

This service checks conditions to generate interrupt requests as well as conditions to reset these requests.

Interaction with Protocol Engine Interface

Depending on the interrupts a FlexRay controller implementation supports this CHI service may check conditions for interrupt generation or reset upon data provide through PutFrame, upon the protocol state provided through PutProtocolState and on the error status vector provided by PutErrorStatusVector.

Interaction with Configuration Data Handling

None required.

Interaction with Control Data Handling

Requirement 110: Means shall be provided to control data handling to selectively enable and disable every interrupt generated by this service.

Interaction with Status Data Handling

Requirement 111: This CHI service generates a timer interrupt request upon request of the Timer service.

Depending on the additional interrupts a FlexRay controller implementation supports further interrupt requests are generated.

Interaction with Message Data Handling

Depending on the additional interrupts a FlexRay controller implementation supports upon reception or transmission of specific frames.

Optical Diagnosis Service

Description

This service provides information provided by the optical transceiver indicating if the optical power is below a given threshold.

Interaction with Protocol Engine Interface

Requirement 112: An interface function PutOpticalDiagnosisFlags shall be provided.

TABLE 47

| PutOpticalDiagnosisFlags | |
|---|---|
| PutOpticalDiagnosisFlags ( <flag_A>, <flag_B> ) | |
| Purpose | Indicate that too low of an optical power is received by the optical transceivers |
| Arguments | values of the optical diagnosis flags; TRUE if the optical power is sufficient |
| | <flag_A>  [TRUE, FALSE ] |
| | <flag_B>  [TRUE, FALSE ] |
| Return values | None |

Interaction with Status Data Handling

Requirement 113: One optical diagnosis indicator is provided for each channel.

Interaction with Message Data Handling

Depending on the additional interrupts a FlexRay controller implementation supports upon reception or transmission of specific frames.

Bus Driver Interface

Introduction

This chapter describes the interface to the electrical FlexRay Bus Driver (BDe). This interface comprises three components, the interface to the FlexRay Communication Controller (CC), the interface to the FlexRay Bus Guardian (BG) and the interface to the host. A description of the BDe operation can be found in *FlexRay Electrical Physical Layer Preliminary Functional Specification*, v1.0, Philips Corporation, 2002 and in Chapter 'Requirements for Hardware States'.

Bus Driver—Communication Controller Interface

Overview

Figure 77:
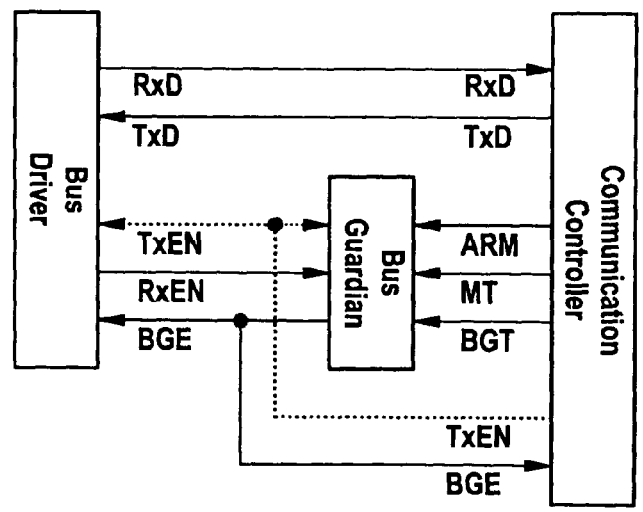
FIG. 77 illustrates a bus driver—communication controller interface of a node of the communication system.

The Bus Driver—Communication Controller Interface is shown in FIG. 77. The interface between the BDe and the CC comprises three digital electrical signals, two that are inputs to the BDe from the CC (named TxD and TxEN), and one that is an output from the BDe to the CC (named RxD).

The following description is valid, when the BDe is in BDe_Normal mode.

TxEN is an input to the BDe from the CC. It is used by the CC to enable the BDe to drive the Data_0 or Data_1 state onto the channel.

While the CC maintains a logical HIGH state on TxEN, the BDe signals Idle onto the channel.

While the CC maintains a logical LOW state on TxEN, the BDe drives Data_0 or Data_1 onto the channel (depending on TxD input, see below), but only if the BG concurrently permits the BDe to do so (see below). If the BG does not permit this, the BDe continues to signal Idle onto the channel.

TxD is an input to the BDe from the CC used by the CC to transfer the actual signal sequence to the BDe for transmission onto the channel. This signal sequence is the signal stream to be transmitted. With a logical LOW state on TxD the BDe drives Data_0 and with a logical HIGH state on TxD the BDe drives Data_1 onto the channel, when the BDe has the permission from the BG and is enabled by the CC via TxEN.

RxD is an output from the BDe to the CC used by the BDe to transfer the actual received signal sequence to the CC. It is the received data stream. RxD is driven to a logical LOW state when the channel signals Data_0. When the channel signals Idle or Data_1, RxD is driven to a logical HIGH state.

When the BDe is not in BDe_Normal mode, it signals Idle onto the channel.

Bus Driver—Bus Guardian Interface

Overview

Figure 78:
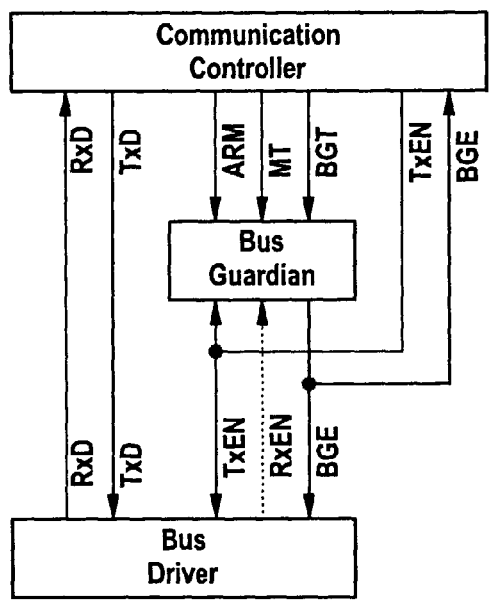
FIG. 78 illustrates a bus driver—bus guardian interface.

The Bus Driver—Bus Guardian Interface is shown in FIG. 78. The interface between the BDe and the BG comprises two digital electrical signals, one input to the BDe (named BGE) and one output from the BDe (named RxEN).

BGE is an input to the BDe from the BG. It is used by the BG to permit the BDe to drive the states Data_0 and Data_1 onto the channel.

While the BG maintains a logical LOW state on BGE, the BDe signals Idle onto the channel.

While the BG maintains a logical HIGH state on BGE, the BDe is permitted to drive Data_0 or Data_1 onto the channel depending on TxD and TxEN input (see above).

The following description is valid, when the BDe is in BDe_Normal mode.

RxEN is an output from the BDe to the BG used by the BDe to indicate whether the channel is in the Idle state or not.

While the channel is in the Idle state RxEN is driven to a logical HIGH state.

While the channel signals Data_0 or Data_1 RXEN is driven to a logical LOW state.

When the BDe is not in BDe_Normal mode, then RxD and RXEN shall be in a logical HIGH state.

Bus Driver—Host Interface

The bus driver host interface is a product specific interface. It enables the host to control the operating modes of the BDe and to read error conditions from the BDe. This interface also has to signal the waking source (local wake-up event or remote wake-up via wake-up symbol on the bus).

The interface may be realized with a serial communication interface (e.g. "SPI") or using hard wired signals (e.g. dedicated pins for operating mode control and error signaling).

A description of the BDe operating modes is provided in Chapter 'Requirements for Hardware States'.

Interface Signal Timing

BDe Output Signals: RxD and RxEN

Figure 79:
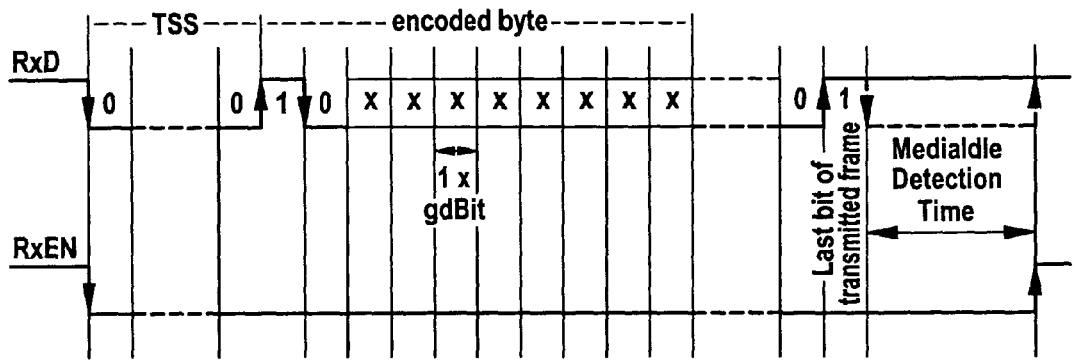
FIG. 79 illustrates behavior of two signals RxD and RxEN for receiving a data frame transmitted in a static segment of the communication cycle according to a first example.

The expected timing of RxD and RxEN is depicted in FIG. 79 (frame transmitted in the static part of the communication cycle).

The Transmission Start Sequence (TSS) that a node receives may be shorter than the TSS that was originally sent. The reason for this is that active stars may truncate a portion of the TSS. RxEN will stay on logical LOW state after the last transmitted bit for the duration of the MediaIdleDetectionTime. (See Chapter 'Coding and Decoding' for more information about the TSS and the document *FlexRay Electrical Physical Layer Preliminary Functional Specification*, v1.0, Philips Corporation, 2002 for the effect of truncation)

A node that transmits a frame can read back its own transmission on RxD if loop back is provided by the BDe. In case that the last bit was transmitted as Data_1 (frames in static and dynamic part, symbols: EIS, SNS, or SAS), only the transmitting node may see a different behavior (depicted in red) of RxD after the end of its own frame or symbol than all other receivers in the network. This happens when common mode chokes are used with a significant stray inductance.

Figure 80:
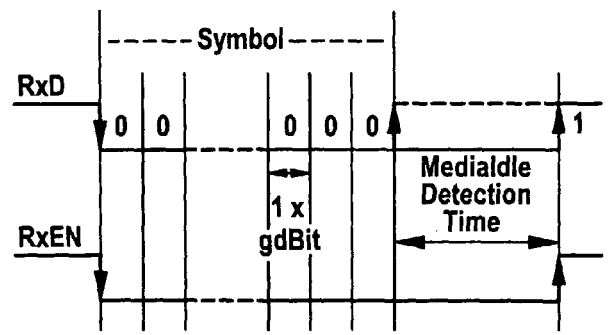
FIG. 80 illustrates behavior of two signals RxD and RxEN for receiving a data frame according to a second example.

Since the symbols WU, CAS, MTS end on Data_0 the situation is slightly different in these cases. The RxD and RxEN behavior is shown in FIG. 80.

The Transmission Start Sequence (TSS) that a node receives may be shorter than the TSS that was originally sent (see above). This effect might not be compensated by the effect of enlarging the symbol by the MediaIdleDetectionTime. The transmitting node may see, when reading back its own transmission, the behavior that is depicted by the dotted red line, when common mode chokes with a significant stray inductance are used.

BDe Input Signals: TxD and TxEN

Figure 81:
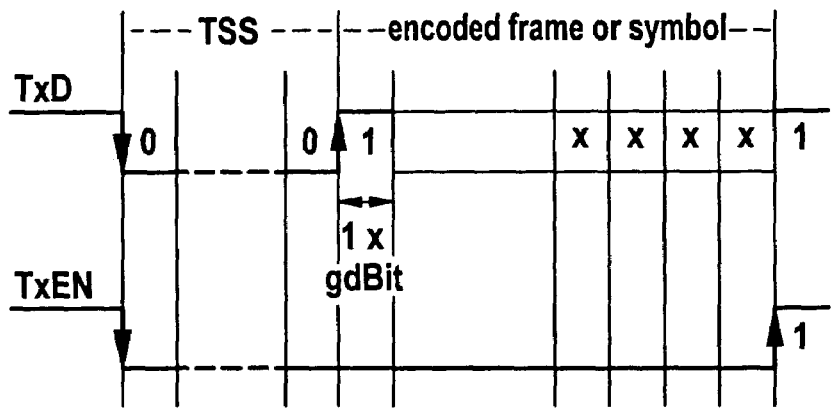
FIG. 81 illustrates required timing of two signals TxD and TxEN for transmitting a data frame.

The required timing of TxD and TxEN is depicted in FIG. 81.

With the start of the first bit to be transmitted the TxEN is switched to logical LOW state and returned to logical HIGH state at the end of the last bit that was to be transmitted. Edges in TxEN are expected to be synchronous with the first and last edge within the TxD signal.

Bus Guardian Interface

Introduction

This chapter covers conformance requirements that apply to the interface between the communication controller (CC) and de-centralized bus guardian (BG) functional blocks. The decentralized bus guardian protects the communication channel(s) from improper transmissions by a faulty or misconfigured communication controller that attempts to transmit outside of its pre-configured schedule. The bus guardian has independent knowledge of the node's communication schedule and restricts transmission to only those times allowed by the schedule.

This chapter specifies the interface between the bus guardian and the communication controller and gives an overview of the bus guardian scheduling scheme. It also establishes the requirements on the BG and CC behavior with respect to the interface signals between the BG and CC. For a detailed functional specification of the bus guardian please refer to *FlexRay Bus Guardian Preliminary Functional Specification*, v1.2, Philips Corporation, 2002.

The second part of this chapter contains a specification of the BG schedule monitoring service provided by the communication controller. The purpose of this service is to supervise the bus guardian schedule and inform the host when a mismatch is detected between the communication schedule of the BG and CC.

BG-CC Interface Signals

Figure 82:
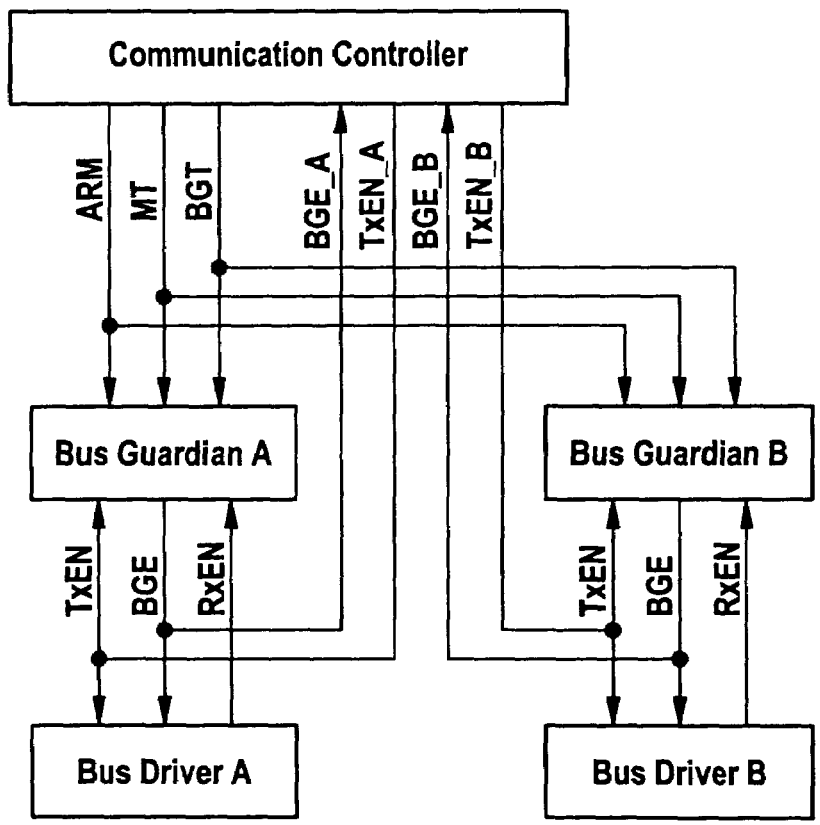
FIG. 82 illustrates a block diagram of a bus guardian—communication controller interface.

Table 48 shows a list of bus guardian inputs and outputs at the interface between the bus guardian and the communication controller. The block diagram shown in FIG. 82 describes how bus guardians are connected to a communication controller in a dual-channel FlexRay node. Note that the signals TxEN and BGE are associated with the particular channel. There must be dedicated TxEN and BGE signals for each channel (Refer to FlexRay Requirements Specification, Req. 219 G: The bus guardian must not disable access to more than one channel, i.e., one bus guardian per channel is required.). In addition to the BG-CC interface signals the block diagram also shows the RxEN signal from the bus driver, which is required for local evaluation of the media access test.

BG-CC Interface Signals Overview

TABLE 48

BG - CC Interface Signals (Data direction DIR relative to the bus guardian. 'I' represents an input to the BG, 'O' represents an output from the BG.)

| Symbol | DIR | ACTIVE | Description |
|---|---|---|---|
| MT | I | rising edge | Macrotick - clock signal from CC |
| BGT | I | rising edge | Bus guardian tick - clock signal from CC |
| ARM | I | falling edge | ARM trigger signal from CC |
| TxEN | I | LOW | Transmit enable signal from CC<br>TxEN = HIGH: transmission inactive<br>TxEN = LOW: transmission active |
| BGE | O | HIGH | Transmission enable signal for Bus Driver<br>BGE = HIGH: transmission enabled<br>BGE = LOW: transmission disabled |

BG-CC Interface Signals Description

MT

The MT signal, generated by the CC, is used as a clock signal for the BG scheduler. The rising edge of the MT signal must be aligned to the start of the CC's internal locally corrected macrotick. The CC shall ensure that any internal macrotick corrections are reflected in the MT signal during the same macrotick (i.e., the MT signal is an accurate representation of the CC's internal locally corrected macrotick clock).

BGT

The BGT signal, generated by the CC, is used for supervision of the MT period. The BGT period is not affected by clock corrections and depends only on the frequency of the CC's crystal oscillator and a frequency divider at the CC.

ARM

The ARM signal is generated by the CC and indicates the start of the communication cycle to the BG. The ARM signal from the CC is generated such that it is synchronous to the MT signal (ARM edges aligned to rising edge of the MT signal). The falling edge of the ARM signal defines the ARM trigger event for BG cycle synchronization. After node startup the BG schedule needs to be synchronized to the CC schedule. This is achieved by means of the first ARM trigger event that is detected by the BG after node startup. Subsequent ARM trigger events are not required for cycle synchronization, but for supervision of the configured cycle length. The BG checks for the regular occurrence of ARM trigger events at the start of each cycle by counting the number of MT periods between ARM trigger events and comparing the result to the expected BG cycle time as calculated below.

BGE

The BGE signal is generated by the bus guardian and controls transmit access to the communication medium. Any transmit access to the medium shall be disabled as long as the BGE signal is in an inactive condition (BGE=LOW). the BGE signal is also provided to the CC as an input signal that is used for supervision of the BG schedule. Please refer to the BG schedule monitoring service described below.

TxEN

The TxEN signal is generated by the CC and indicates that the CC is currently attempting to transmit on the particular channel. This signal shall be evaluated by the BG for supervision of the CC schedule. The BG shall detect a schedule mismatch if the TxEN signal is active while the BGE signal is inactive (Refer to the BG Functional Specification for details of the schedule monitoring features provided by the BG.).

Bus Guardian Scheduling Scheme

Figure 83:
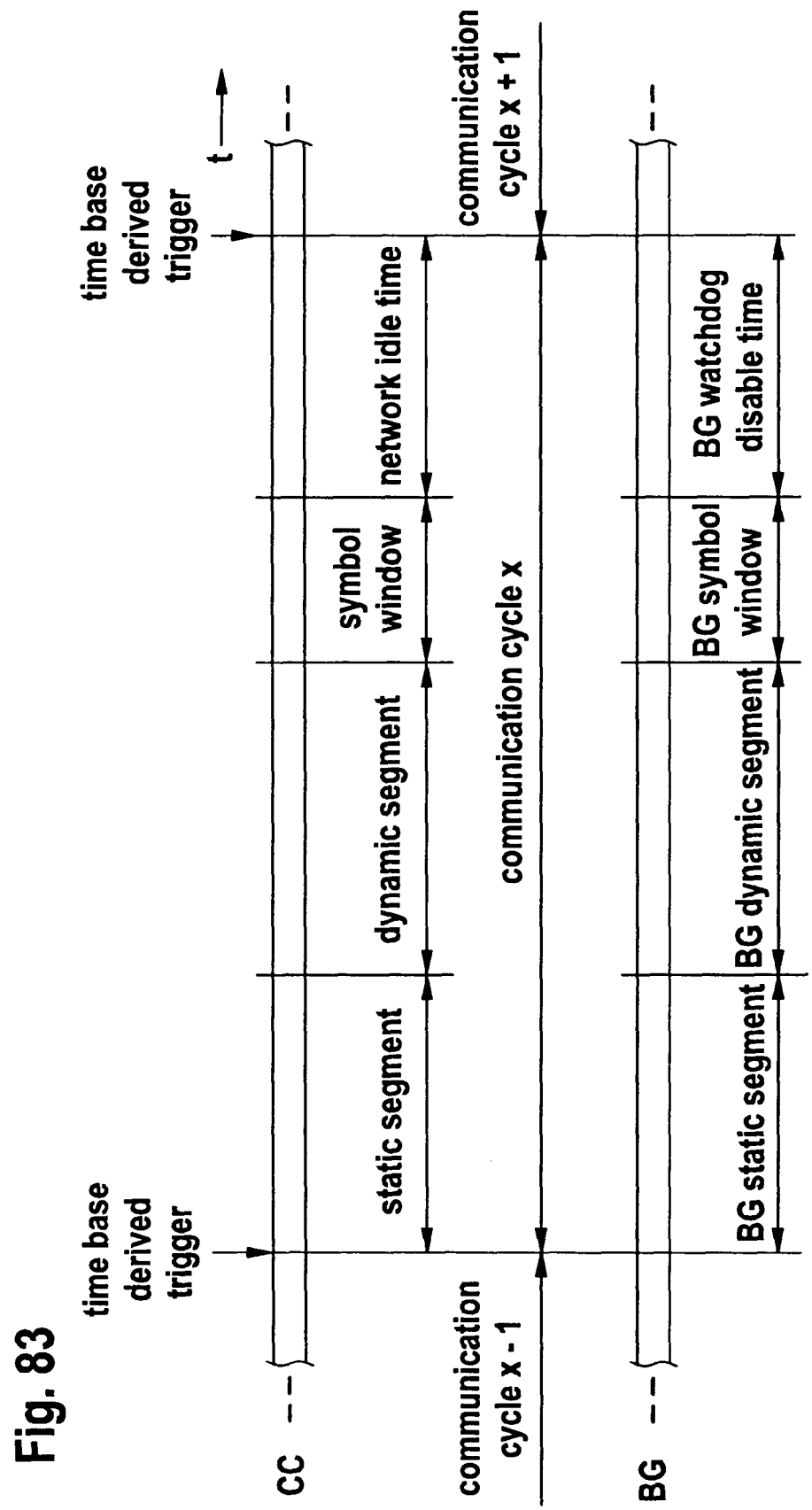
FIG. 83 illustrates a bus guardian schedule overview.

FIG. 83 shows an overview of the relation between CC schedule and BG schedule at the communication segment level. For each segment of the CC schedule a corresponding segment of the BG schedule shall be configured. The BG static segment and the BG watchdog disable time are mandatory parts of the BG schedule. The BG static segment must contain at least one static slot. The minimum length of the BG watchdog disable time is 1 MT period.

Parts of the BG schedule that may be used for transmission are separated by inter-slot gaps (ISG). This applies to static slots, the BG dynamic segment, and the BG symbol window. The BG shall enable transmission one macrotick prior to the expected beginning of a transmission and disable it one macrotick after the expected end. Note that a minimum ISG length of 2 macroticks is required in order to fulfill this requirement.

The ISG contains two optional elements gdBGpreEnablePart and gdBGpostEnablePart. Alignment of the BG schedule to the CC action points is achieved by configuration of gdBGpreEnablePart. while configuration of gdBGpostEnablePart allows to increase the safety margin between transmissions.

Figure 84:
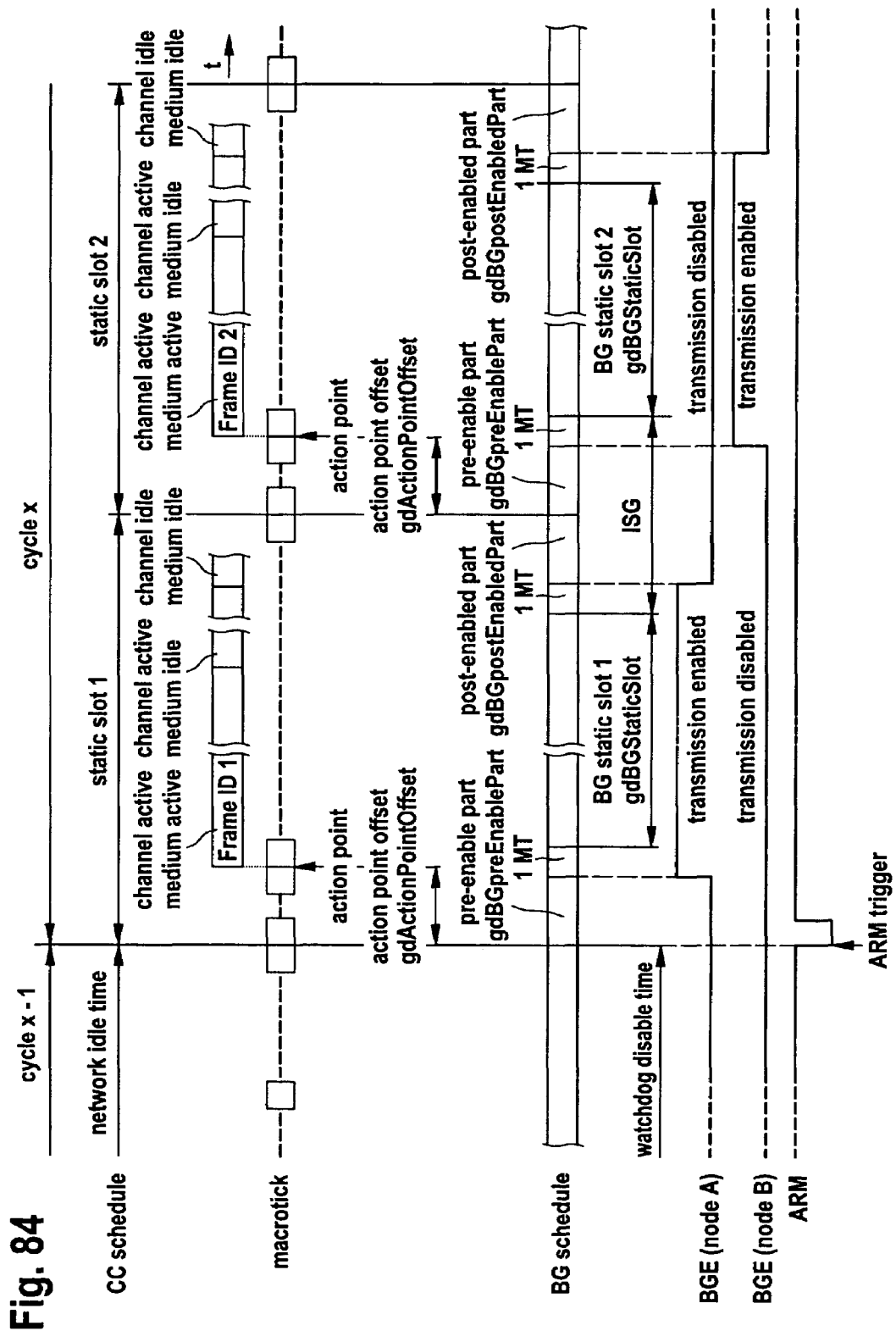
FIG. 84 illustrates a bus guardian—communication controller timing during a static segment of a communication cycle.

FIG. 84 illustrates the BG-CC timing during the static segment. Transmit access is enabled gdBGpreEnablePart macroticks after the beginning of a static slot and stays enabled for gdBGStaticSlot+2 macroticks. The static slot is completed by a period of gdBGpostEnablePart macroticks, during which transmission is disabled by the BG.

The BG communication cycle start is defined to be at the beginning of static slot 1. The BG shall assume the ARM trigger events happen at the BG cycle start.

Figure 85:
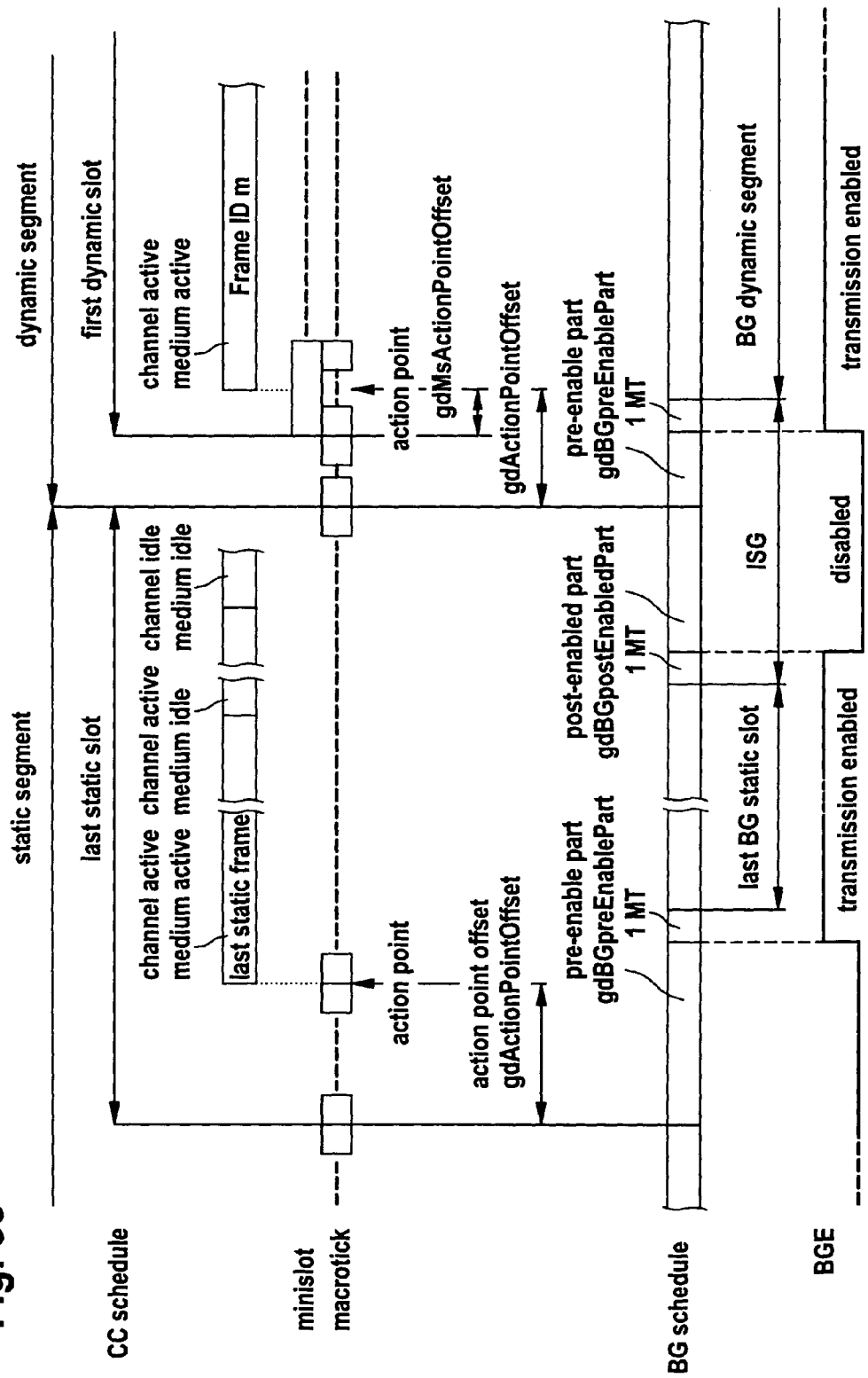
FIG. 85 illustrates a bus guardian—communication controller timing at the beginning of a dynamic segment of a communication cycle according to a first example.
Figure 86:
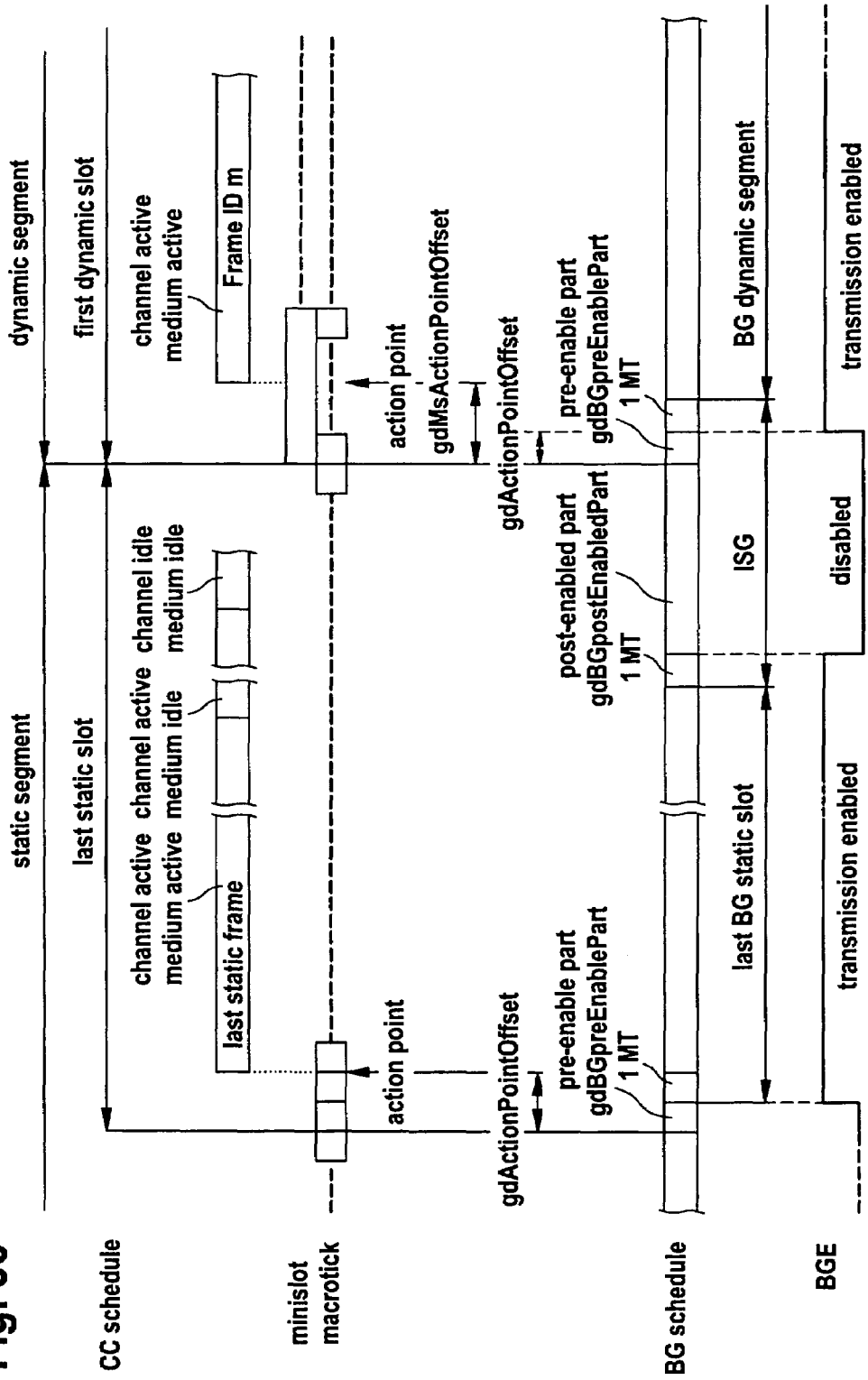
FIG. 86 illustrates a bus guardian—communication controller timing at the beginning of a dynamic segment of a communication cycle according to a second example.

At the beginning of the dynamic segment two possible cases must be distinguished (Refer to section 'Dynamic Segment'). FIG. 85 shows the BG-CC timing of a configuration with gdActionPointOffset>gdMSActionPointOffset. In this case transmit access is enabled one macrotick prior to the action point at the CC. FIG. 86 shows the BG-CC timing of a configuration with gdActionPointOffset≦gdMSActionPointOffset. In this case transmit access is enabled gdMSActionPointOffset−gdActionPointOffset+1 macroticks prior to the action point at the CC.

In general, transmit access is enabled gdBGpreEnablePart macroticks after the beginning of the dynamic segment, independent from the configuration of gdMSActionPointOffset and stays enabled for gdBGDynSegment+2 macroticks.

Figure 87:
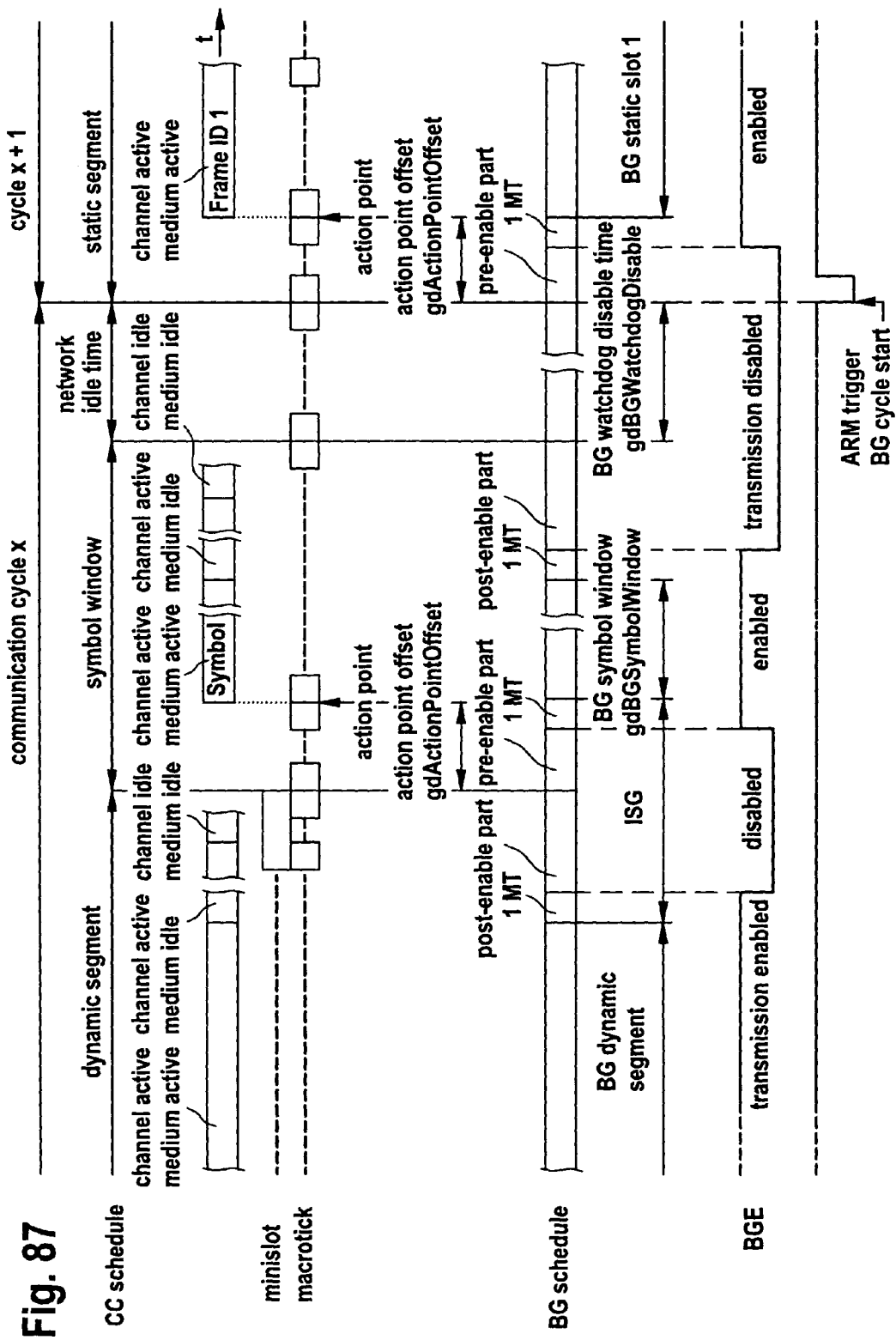
FIG. 87 illustrates a bus guardian—communication controller timing during a bus guardian symbol window and a bus guardian watchdog disable time.

FIG. 87 shows the BG-CC timing at the end of the dynamic segment as well as during the BG symbol window and the BG watchdog disable time (WDT). During the BG watchdog disable time supervision of the MT period is disabled. This allows clock offset correction to shorten or lengthen macroticks by an amount that would exceed the configured limits of the macrotick supervision.

The BG may be configured to enable or disable transmission during the BG dynamic segment and the BG symbol window, respectively. Transmit access is enabled gdBGpreEnablePart macroticks after the beginning of the symbol window and stays enabled for gdBGSymbolWindow+2 macroticks. The BG disables transmission during the BG watchdog disable time gdBGWatchdogDisable.

The BG shall support the application of the media access test during the symbol window, i.e. in addition to disabling transmit access a transmit attempt by the CC shall not be detected as schedule violation error. The purpose of the media access test is to check whether the BG successfully disables transmission. The BG supports application of the media access test if transmission during the symbol window is disabled (pBGSymWinEnable=0) and media access test is enabled (pBGMatEnable=1). Table 49 describes the configurable behavior of the BG during the BG symbol window.

TABLE 49

BG Behavior During the BG Symbol Window

| Media access test | BG behavior during BG symbol window |
|---|---|
| enabled (pBGMatEnable = 1) | If TxEN is active during the BG symbol window the BG does not enter BG_FailSilent mode and does not report a schedule violation error to the host controller. Local evaluation of the media access test is performed. The BG reports a local media access test error to the host controller if TXEN and RXEN signals are simultaneously active during the BG watchdog disable time. |
| disabled (pBGMatEnable = 0) | If TxEN is active during the BG symbol window the BG enters BG_FailSilent mode and reports a schedule violation error to the host controller. |

The relation between BG configuration parameters and global protocol parameters is defined by:

$$gdBGStaticSlot + ISG = gdStaticSlot$$

$$gdBGDynSegment + ISG = gNumberOfMinislots * gdMinislot + (gdActionPointOffset - gdMSActionPointOffset)$$

The above equation only holds when gNumberOfMinislots !=0; The term (gdActionPointOffset−gdMSActionPointOffset) only applies if gdActionPointOffset>gdMSActionPointOffset.

$$gdBGSymbolWindow + ISG = gdSymbolWindow$$

The above equation only holds when gdSymbolWindow !=0.

$$gdBGWatchdogDisable = gdNIT$$

$$gdBGpreEnablePart + 1 = gdActionPointOffset$$

The inter-slot gap (ISG) is defined by:

$$ISG = gdBGpreEnablePart + gdBGpostEnablePart + 2$$

Using BG configuration parameters the cycle time is calculated by:

$$BG\ cycle\ time\ (MT) = gNumberOfStaticSlots * (gdBGStaticSlot + ISG) +$$
$$gdBGDynSegment + ISG +$$
$$gdBGSymbolWindow + ISG +$$
$$gdBGWatchdogDisable$$

gdBGDynSegment is an optional dynamic segment. (The BG dynamic segment and the corresponding ISG are not part of the BG schedule if gdBGDynSegment=0 is configured.) gdBGSymbolWindow is an optional symbol window. (The BG symbol window and the corresponding ISG are not part of the BG schedule if gdSymbolWindow=0 is configured.)

A summary of configuration parameters related to the bus guardian schedule is shown in Table 50.

TABLE 50

Bus Guardian Schedule Configuration Parameters

| Name | Range | Unit | Remarks |
|---|---|---|---|
| gdBGStaticSlot | 0 to 4095 | MT | Static slot length (This does not include the interslot gap.) |

TABLE 50-continued

Bus Guardian Schedule Configuration Parameters

| Name | Range | Unit | Remarks |
|---|---|---|---|
| gdBGDynSegment | 0 to 65534 | MT | BG dynamic segment length (The BG supports static mode operation if gdBGDynSegment = 0 is configured.) |
| gdBGSymbolWindow | 0 to 255 | MT | BG symbol window length (Configurations without symbol window are supported if gdBGSymbolWindow = 0 is configured.) |
| gdBGpreEnablePart | 0 to TBD | MT | ISG part that precedes a guarded schedule element |
| gdBGpostEnablePart | 0 to TBD | MT | ISG part that follows a guarded schedule element |
| gdBGWatchdogDisable | 1 to 255 | MT | BG watchdog disable time (Part of the BG schedule reserved for the application of |

TABLE 50-continued

Bus Guardian Schedule Configuration Parameters

| Name | Range | Unit | Remarks |
|---|---|---|---|
| gdBGArmActive | 1 | MT | clock offset correction.) Duration of the ARM signal low condition |

BG-CC Synchronization

The FlexRay bus guardian approach maintains synchronization of the local BG schedule to the global time by basing all BG scheduling operations on a corrected macrotick signal (MT) being provided by the CC. This allows the BG to perform its media access protection function (i.e. restricting transmit access to the configured schedule) while being continuously synchronized to the global clock using the clock synchronization algorithm of the CC.

A second clock signal, bus guardian tick (BGT), used for supervising the period of the MT signal, is provided by the CC. The communication controller shall generate the BGT signal such that its period is independent from the clock correction performed by the CC (For example, the BGT signal could be derived from the application of a programmable prescaler to the oscillator input of the Communication Controller.). The bus guardian shall use the BGT signal to perform a supervision of the duration of the corrected macrotick by checking if the MT/BGT ratio deviates from the nominal ratio by more than a pre-defined configurable limit. Acceptable deviations from the nominal limit may be caused by the clock rate correction algorithm as it increases or decreases the length of certain macroticks to maintain the overall clock rate.

BG-CC Interface Requirements

Table 51 shows the BG-CC interface timing requirements. Note the specified restrictions have been introduced as a result of certain semiconductor technology limitations.

TABLE 51

BG-CC Interface Timing Requirements (These timing requirements are implementation-specific.)

| Name | Description | Range/Value | Units |
|---|---|---|---|
| gdBGMinMTNom | Minimum nominal MT period | 1.0 | µs |
| gdBGMinMTCorr | Minimum corrected MT period | 0.5 | µs |
| pdBGMTPeriod | Configured nominal MT period | TBD | µs |
| gdBGMinPwMT | Minimum MT pulse width (low or high) | 0.4 * pdMTPeriod | — |
| gdBGMinBGTPeriod | Minimum BGT period | 0.25 | µs |
| pdBGTPeriod | Configured BGT period | TBD | µs |
| gdMinPwBGT | Minimum BGT pulse width (low or high) | 0.4 * pdBGTPeriod | — |

BG Schedule Monitoring Service

Background

The BG schedule monitoring (BGSM) service is a service that is provided by the FlexRay communication controller. The purpose of this service is to assess that the execution of the bus guardian schedule matches the execution of the respective schedule of the CC.

Proposed Functional Specification

Structure

Figure 88:
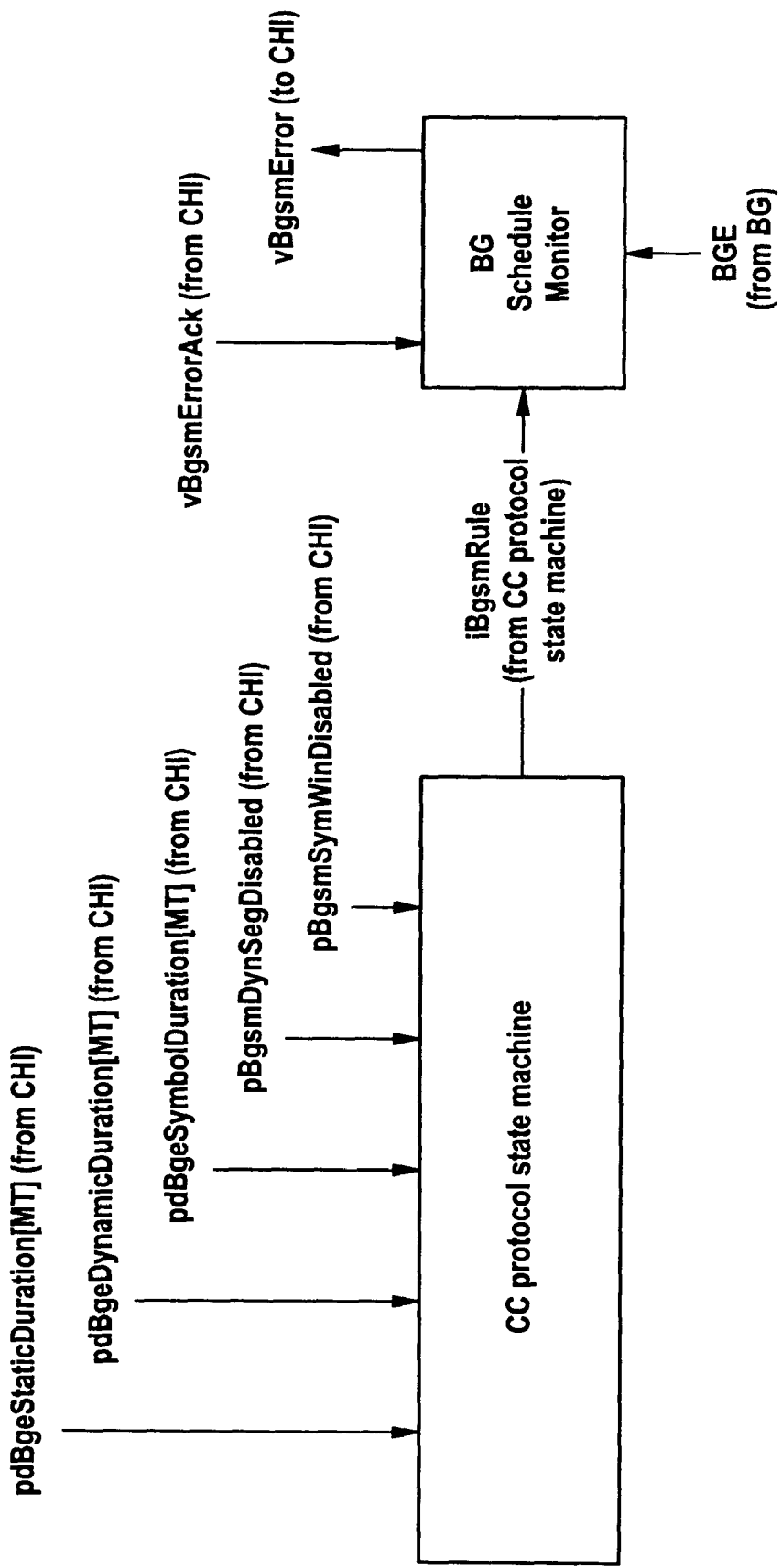
FIG. 88 illustrates a structure of a bus guardian schedule monitor.

The bus guardian schedule monitor uses the following input signals to perform its function (see FIG. 88): The BGE signal, the rule to be monitored iBgsmRule and the acknowledgement signal vBgsmErrorAck as inputs. The BGSM function produces the output signal vBgsmError. The CC protocol state machine reads the parameters pdBgeStaticDuration, pdBgeDynamicDuration, pdBgeSymbolDuration, pBgsmDynSegDisabled, and pBgsmSymWinDisabled The following constraints apply to these parameters:

BGE∈{0, 1},
iBgsmRule∈{BGE_X, BGE_ENABLED, BGE_DISABLED},
vBgsmErrorAck∈{FALSE, TRUE},
vBgsmError∈{FALSE, TRUE},
pdBgeStaticDuration[MT]∈{1 . . . TBD},
pdBgeDynamicDuration[MT]∈{1 . . . TBD},
pdBgeSymbolDuration[MT]∈{1 . . . TBD},
pBgsmDynSegDisabled∈{FALSE, TRUE},
pBgsmSymWinDisabled∈{FALSE, TRUE}.

Figure 89:
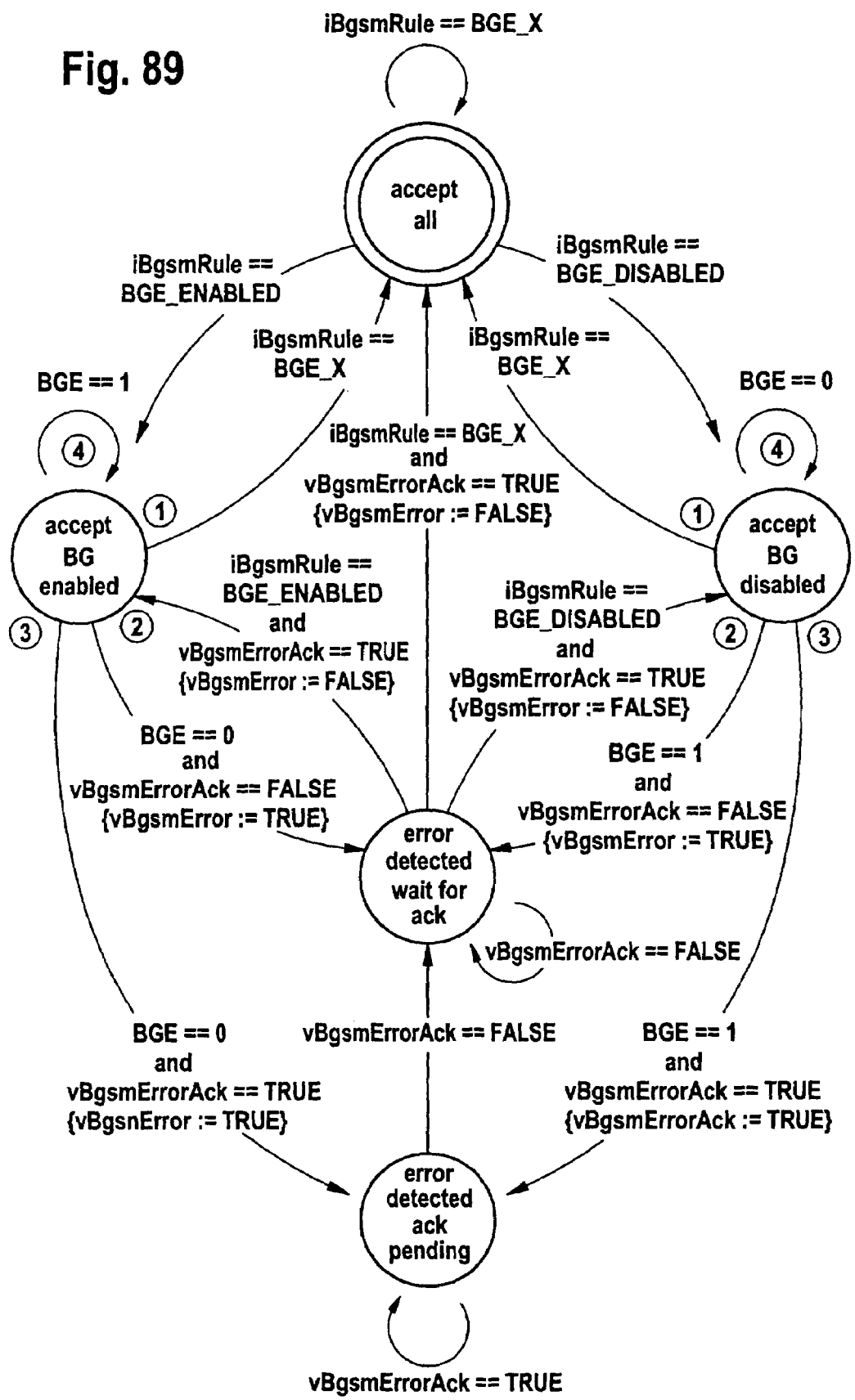
FIG. 89 illustrates a bus guardian schedule monitor state machine.

FIG. 89 depicts a state machine that describes the operation of the BGSM service.

Interaction of the BG Schedule Monitor with the Protocol Operation

Background

Protocol operation can be separated in two distinct phases: the initial unsynchronized startup phase and the subsequent synchronized operation phase. The two phases differ as follows:

during the initial unsynchronized startup phase the communication controller has no knowledge of the system wide synchronized time, i.e. the slot counter and the cycle counter are not synchronized.

during the synchronized operation phase the communication controller has knowledge of the system wide synchronized time, i.e. the slot counter and the cycle counter are synchronized.

Unsynchronized Startup Phase

Within the unsynchronized startup phase the BGSM shall execute the accept all rule, i.e. iBgsmRule is set to BGE_X.

Synchronized Operation Phase

Within the synchronized operation phase the communication schedule is used to access the communication media. A communication schedule consists of the following constituents: the static segment, the dynamic segment, the symbol window and the network idle time (NIT).

Static Segment

The configuration parameter pdBgeStaticDuration defines the duration of the BGE active phase during transmission slots in the static segment. The relationship between pdBgeStaticDuration and other configuration parameters related to the static segment is given by:

*pdBge*StaticDuration=*gdBG*StaticSlot+2=*gd*StaticSlot−*gdBG*preEnablePart−*gdBG*postEnablePart with:

*gdBG*preEnablePart=*gd*ActionPointOffset−1

*gdBG*postEnablePart=*gd*StaticSlot−*pdBge*StaticDuration−*gd*ActionPointOffset+1

Transmission Slot

Starting with the first macrotick of the transmission slot the following rule shall be applied:

```
if (gdBGpreEnablePart == 0) OR
    (gdBGpostEnablePart == 0 AND
    previous static slot == enabled)
        iBgsmRule shall be set to BGE_X;
else
        iBgsmRule shall be set to BGE_DISABLED;
end;
```

Starting with the second macrotick of the transmission slot the following rule shall be applied:

```
if (gdBGpreEnablePart > 1)
        iBgsmRule shall be set to BGE_DISABLED;
end;
```

Starting with macrotick gdActionPointOffset of the transmission slot the following rule shall be applied:

```
if (gdBGpreEnablePart > 0)
        iBgsmRule shall be set to BGE_X;
end;
```

Starting with macrotick gdActionPointOffset+1 of the transmission slot iBgsmRule shall be set to BGE_ENABLED.

Starting with macrotick pdBgeStaticDuration+gdActionPointOffset the following rule shall be applied:

```
if (gdBGpostEnablePart > 0)
        iBgsmRule shall be set to BGE_X;
end;
```

Starting with macrotick pdBgeStaticDuration+gdActionPointOffset+1 the following rule shall be applied:

```
if (gdBGpostEnablePart > 1)
        iBgsmRule shall be set to BGE_DISABLED;
end;
```

Reception Slot

Starting with the first macrotick of the reception slot the following rule shall be applied:

```
if (previous static slot == enabled) AND
    (gdBGpostEnablePart == 0)
        iBgsmRule shall be set to BGE_X;
else
        iBgsmRule shall be set to BGE_DISABLED;
end;
```

Starting with the second macrotick of the reception slot iBgsmRule shall be set to BGE_DISABLED.

Figure 90:
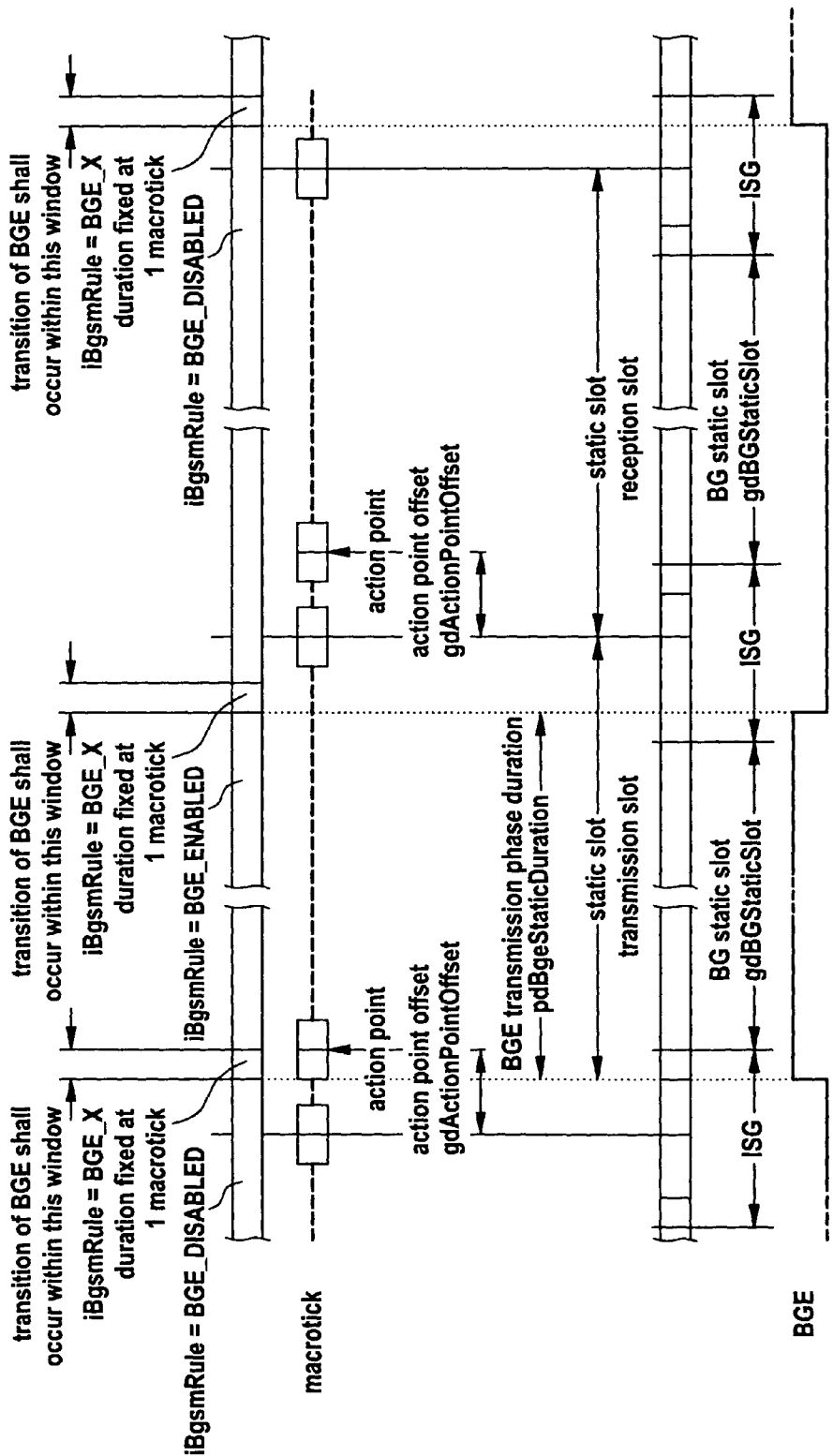
FIG. 90 illustrates interaction in a static segment of a communication cycle.
Figure 91:
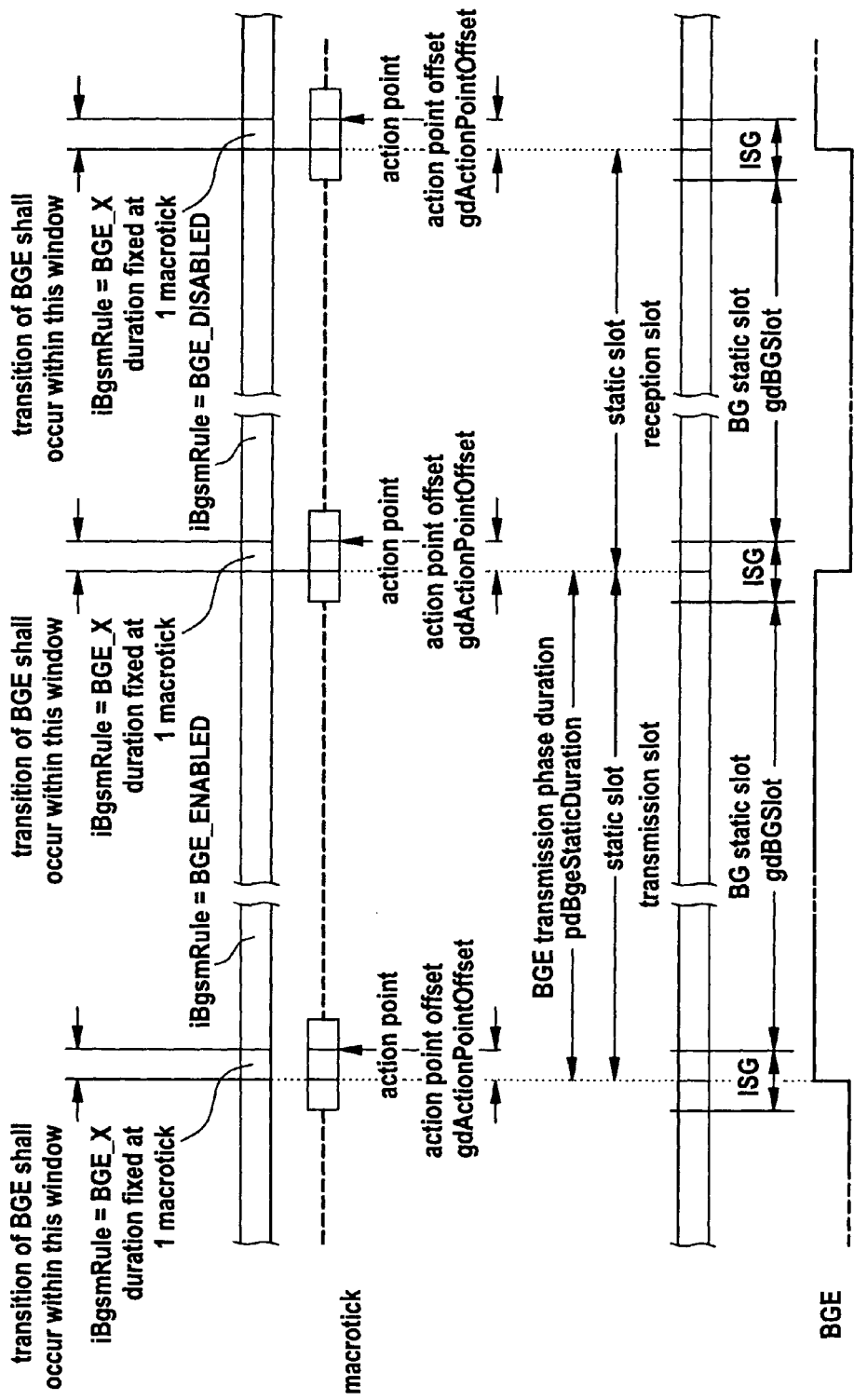
FIG. 91 illustrates interaction in a static segment of a communication cycle with a minimum length of inter-slot gaps.

FIG. 90 shows the interaction in the static segment. FIG. 91 shows the interaction in the static segment for a minimum ISG length.

Dynamic Segment

The configuration parameter pdBgeDynamicDuration defines the duration of the BGE active phase during the dynamic segment. The relationship between pdBgeDynamicDuration and other configuration parameters related to the dynamic segment is given by:

$pd{B}ge\text{DynamicDuration} = gd{B}G\text{DynSegment} + 2 = g\text{NumberOfMinislots} \cdot gd\text{Minislot} - gd{B}G\text{preEnablePart} - gd{B}G\text{postEnablePart}$ (Note: The equation gNumberOfMinislots only holds when gNumberOfMinislots !=0.) with:

$gd{B}G\text{preEnablePart} = gd\text{ActionPointOffset} - 1$ $gd{B}G\text{postEnablePart} = gd\text{StaticSlot} - pd{B}ge\text{StaticDuration} - gd\text{ActionPointOffset} + 1$ The following rules apply only to configurations, that contain a dynamic segment (gdNumberOfMinislots !=0). The configuration parameter pBgsmDynSegDisabled indicates if transmission during the dynamic segment shall be enabled or disabled by the BG and controls which set of rules has to be applied.

pBgsmDynSegDisabled=TRUE

Starting with the first macrotick of the dynamic segment the following rule shall be applied:

```
if (last static slot = = enabled) AND
    (gdBGpostEnablePart = = 0)
        iBgsmRule shall be set to BGE_X;
else
        iBgsmRule shall be set to BGE_DISABLED;
end;
```

Starting with the second macrotick of the dynamic segment iBgsmRule shall be set to BGE_DISABLED.

pBgsmDynSegDisabled=FALSE

Starting with the first macrotick of the dynamic segment the following rule shall be applied:

```
if (gdBGpreEnablePart = = 0) OR
    (last static slot = = enabled) AND
    (gdBGpostEnablePart = = 0)
        iBgsmRule shall be set to BGE_X;
else
        iBgsmRule shall be set to BGE_DISABLED;
end;
```

Starting with the second macrotick of the dynamic segment the following rule shall be applied:

```
if (gdBGpreEnablePart > 1)
        iBgsmRule shall be set to BGE_DISABLED;
end;
```

Starting macrotick gdActionPointOffset of the dynamic segment iBgsmRule shall be set to BGE_X.

Starting with macrotick gdActionPointOffset+1 iBgsmRule shall be set to BGE_ENABLED.

Starting with macrotick pdBgeDynamicDuration+gdActionPointOffset the following rule shall be applied:

```
if (gdBGpostEnablePart > 0)
    iBgsmRule shall be set to BGE_X;
end;
```

Starting with macrotick pdBgeDynamicDuration+gdActionPointOffset+1 the following rule shall be applied:

```
if (gdBGpostEnablePart > 1)
    iBgsmRule shall be set to BGE_DISABLED;
end;
```

Figure 92:
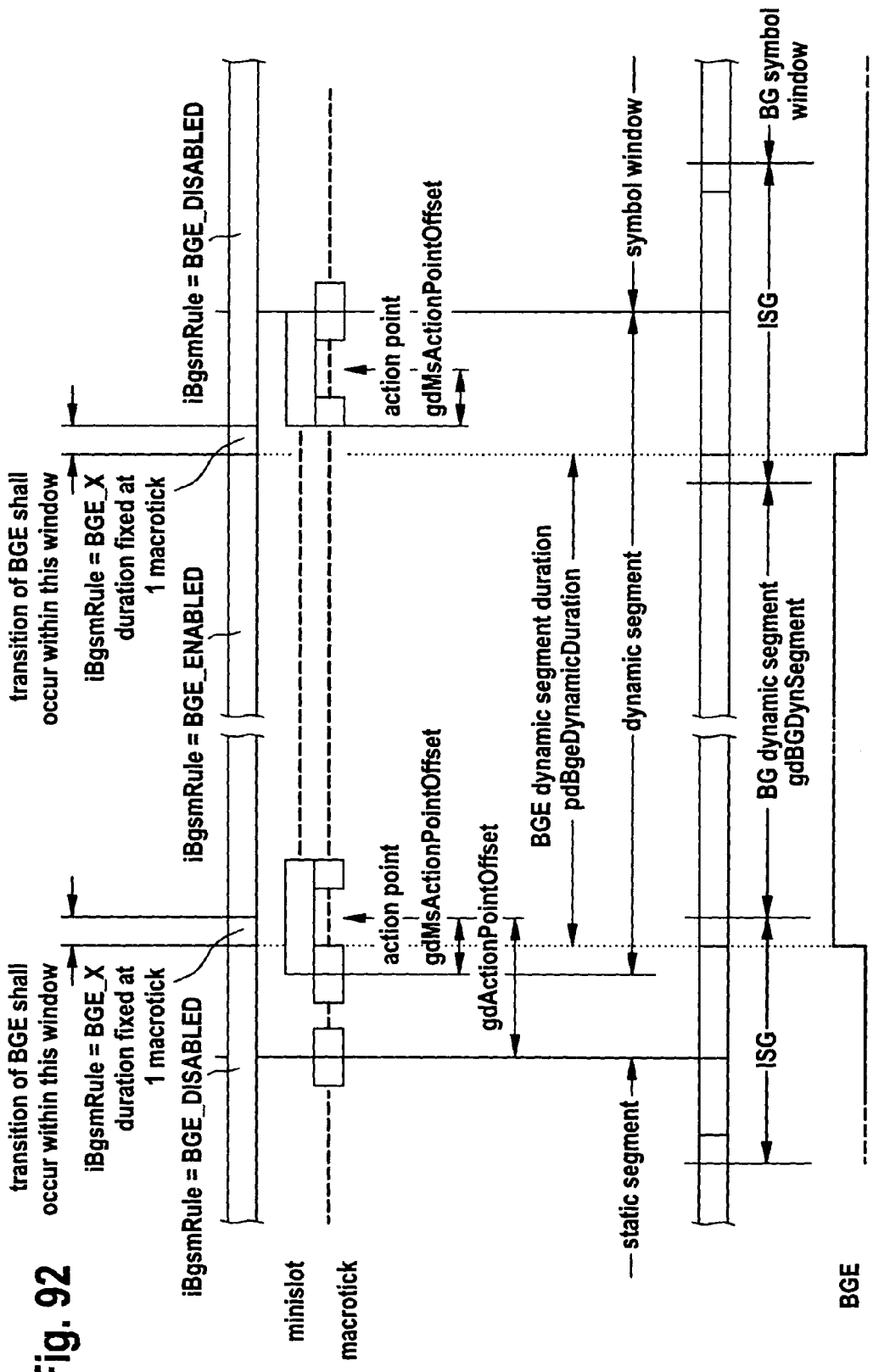
FIG. 92 illustrates interaction in a dynamic segment of a communication cycle with a symbol window disabled.

FIG. 92 shows the interaction in the dynamic segment with the symbol window disabled.

Symbol Window

The configuration parameter pdBgeSymbolDuration defines the duration of the BGE active phase during the symbol window. The relationship between pdBgeSymbolDuration and other configuration parameters related to the symbol window is given by:

$$pdBgeSymbolDuration = gdBGSymbolWindow + 2 = gdSymbolWindow - gdBGpreEnablePart - gdBGpostEnablePart$$

The following rules apply only to configurations, that contain a symbol window (gdSymbolWindow !=0). The configuration parameter pBgsmSymWinDisabled indicates if transmission during the symbol window shall be enabled or disabled by the BG and controls which set of rules has to be applied.

pBgsmSymWinDisabled=TRUE

Starting with the first macrotick of the symbol window the following rule shall be applied:

```
if (gdBGpostEnablePart = = 0) AND
  (pBgsmDynSegDisabled = = FALSE)
      iBgsmRule shall be set to BGE_X;
else
      iBgsmRule shall be set to BGE_DISABLED;
end;
```

Starting with the second macrotick of the symbol window iBgsmRule shall be set to BGE_DISABLED.

pBgsmSymWinDisabled=FALSE

Starting with the first macrotick of the symbol window the following rule shall be applied:

```
if (gdBGpreEnablePart == 0) OR
  (gdBGpostEnablePart == 0 AND
   pBgsmDynSegDisabled == FALSE)
      iBgsmRule shall be set to BGE_X;
else
      iBgsmRule shall be set to BGE_DISABLED;
end;
```

Starting with the second macrotick of the symbol window the following rule shall be applied:

```
if (gdBGpreEnablePart > 1)
    iBgsmRule shall be set to BGE_DISABLED;
end;
```

Starting with macrotick gdActionPointOffset of the symbol window the following rule shall be applied:

```
if (gdBGpreEnablePart > 0)
    iBgsmRule shall be set to BGE_X;
end;
```

Starting with macrotick gdActionPointOffset+1 iBgsmRule shall be set to BGE_ENABLED.

Starting with macrotick pdBgeSymbolDuration+gdActionPointOffset the following rule shall be applied:

```
if (gdBGpostEnablePart > 0)
    iBgsmRule shall be set to BGE_X;
end;
```

Starting with macrotick pdBgeSymbolDuration+gdActionPointOffset+1 the following rule shall be applied:

```
if (gdBGpostEnablePart > 1)
    iBgsmRule shall be set to BGE_DISABLED;
end;
```

Figure 93:
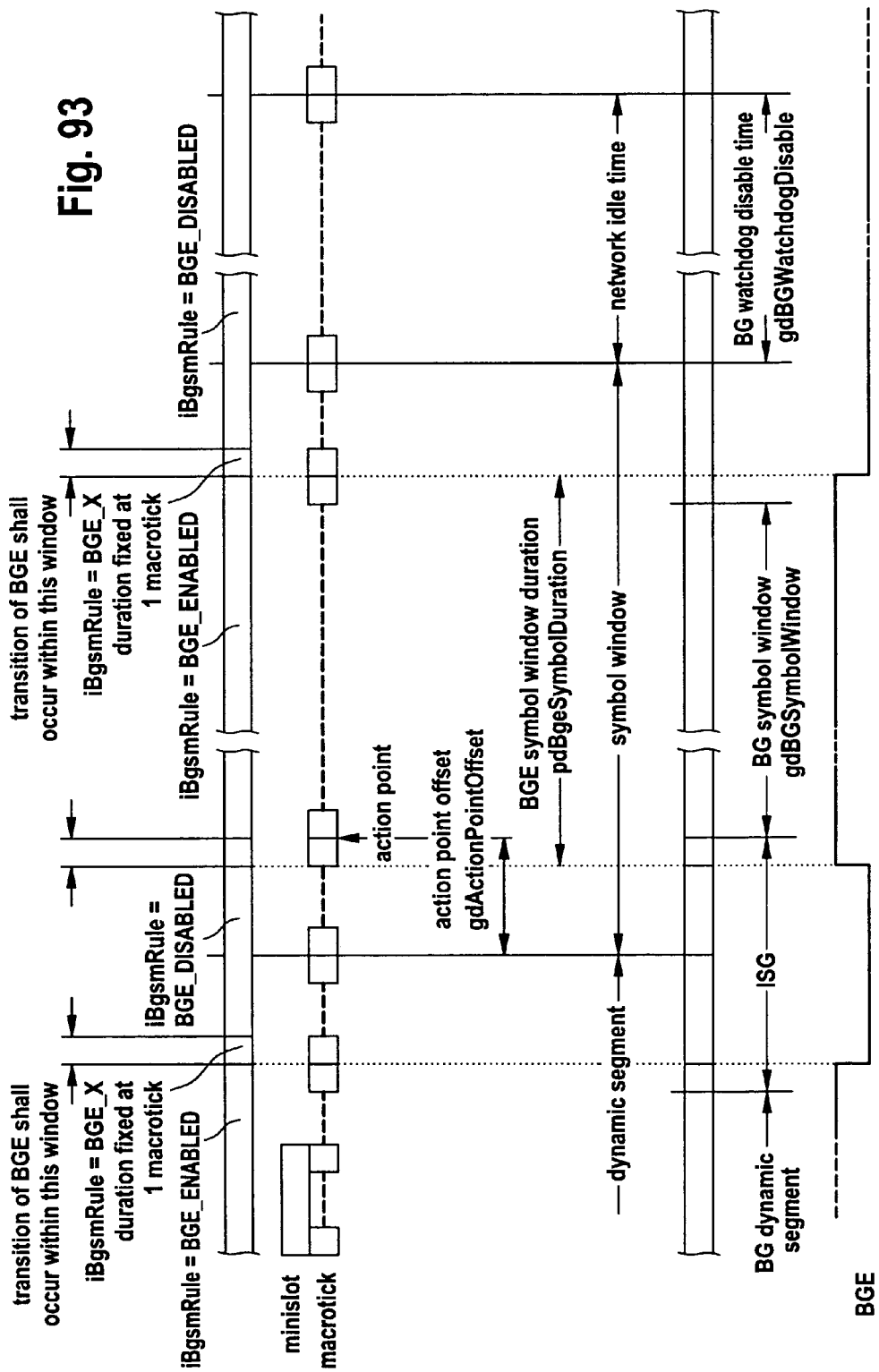
FIG. 93 illustrates interaction in a symbol window and in a network idle time.

FIG. 93 shows the interaction in the symbol window and the network idle time.

Network Idle Time

Starting with the first macrotick of the network idle time the following rule shall be applied:

```
if (gdBGpostEnablePart = = 0) AND
  (pBgsmSymWinDisabled = = FALSE)
      iBgsmRule shall be set to BGE_X;
else
      iBgsmRule shall be set to BGE_DISABLED;
end;
```

Starting with the second macrotick of the network idle time iBgsmRule shall be set to BGE_DISABLED.

Host Interaction

Upon detection of a rule violation the communication controller shall signal this violation to the host computer by means of the flag vBgsmError in the host interface.

The flag shall remain set until it is cleared by the host controller.

Comments

Currently it is not foreseen to have the option to deactivate the schedule monitor. Note with systems operating without a BG this implies the vBgsmError will indicate a permanent BG error as soon as the (expected) first mismatch between the configured rule and the BGE signal occurs.

Event Triggered Mode

Introduction

This chapter describes the event triggered communication mode of the FlexRay communication protocol. In contrast to the time triggered communication mode, the repetition interval of the communication cycle may vary in the event triggered communication mode.

Operating Modes

Figure 94:
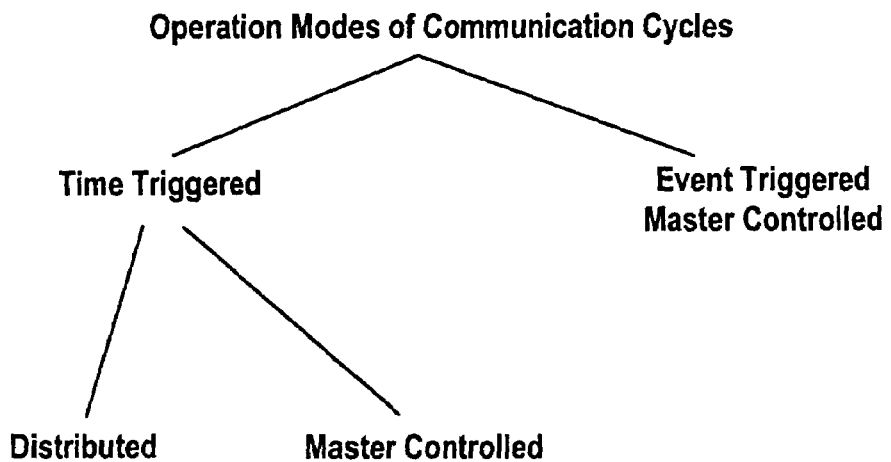
FIG. 94 illustrates FlexRay communication cycle operating modes.

FlexRay supports two operating modes for communication cycle execution (see FIG. 94, in which the FlexRay communication operation modes are shown):
- A time triggered communication mode, where the timebase is generated either by a distributed clock algorithm or under control of a communication master
- An event triggered communication mode The different operating modes are described below.

Time Triggered Communication Cycles

This mode is described in detail in the media access chapter (see Chapter 'Media Access Scheme').

Event Triggered Communication Cycles

Figure 95:
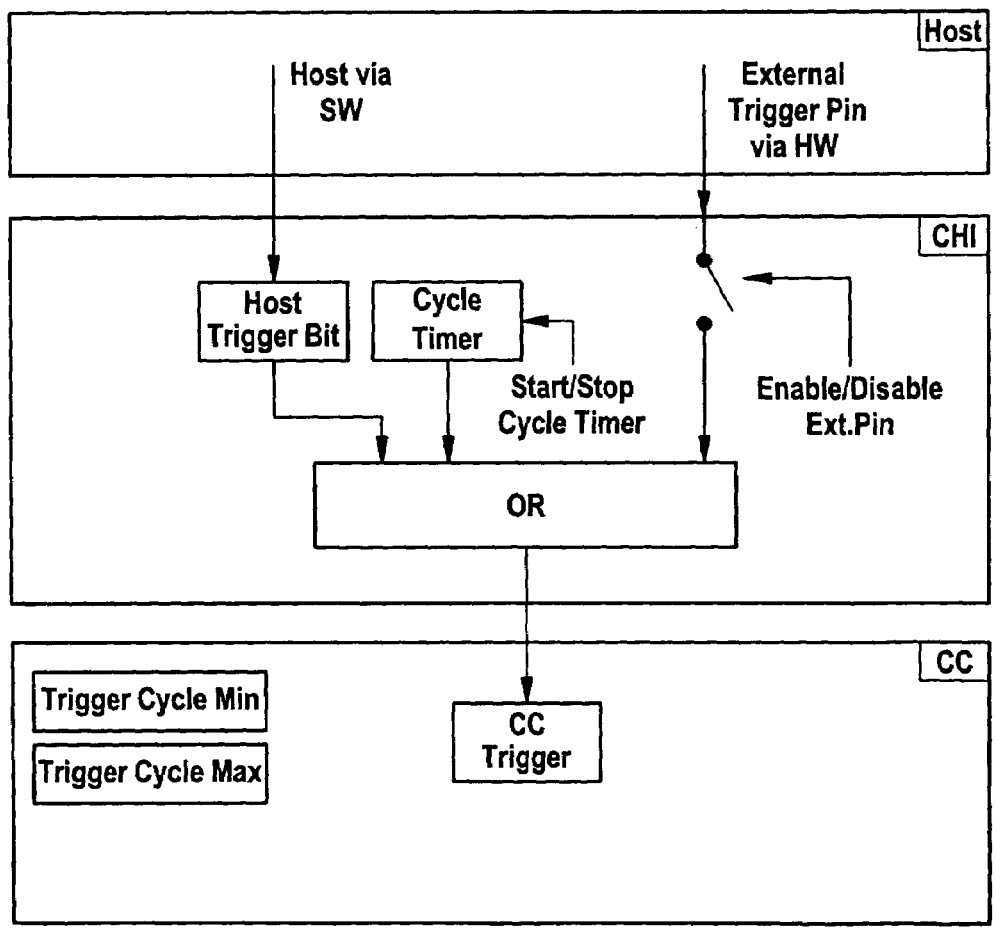
FIG. 95 illustrates an event triggered communication handling in a host controller, a controller host interface and in a communication controller of a node of the communication system.

In the event triggered communication mode the communication cycle is always initiated by a master node. The master node may initiate the communication cycle based on the input of a number of sources. The management of these sources is under host control via the CHI. The following functionality is the minimum required (see FIG. 95, in which the event triggered communication handling in the host, the CHI and the CC is shown).
- A mechanism that allows the host to initiate a communication cycle via the CHI. There are many means by which this could be accomplished. An example is a CHI element that, when written by the host, would cause the initiation of a communication cycle. If the host initiates a new trigger during a communication cycle, a new communication cycle shall be triggered immediately after the end of the current communication cycle.
- A configurable timer to initiate periodic communication cycles. The CHI provides a function to start/stop the timer. If the timer is enabled a communication cycle is started when the timer expires.
- A direct hardware input to the Communication Controller to trigger the communication cycle by an external hardware pin. The CHI gives the host the opportunity to configure the direct hardware input (enable/disable, edge sensitivity, etc.).

All CHI sources can raise the CC Trigger signal (OR function). The protocol engine interface that is required is the CC Trigger Input.

If the CC trigger signal at a dedicated master occurs the communication cycle is initiated by sending an event indication symbol (EIS) within the trigger window. The new cycle is then started after the NIT with frame ID 1 is sent by the master.

8. In the event triggered communication mode bus guardian protection is not required.

The clocks on the master and slave nodes are synchronized by sending and receiving the EIS symbol. The FlexRay protocol does not specifically handle a fault that prevents the communication master from sending the EIS or frame ID 1. There are possible recovery strategies (reconfiguration of the system to use a new master, for example), but these must be implemented at the application level and are not part of the protocol.

The event triggered mode supports two channels. The master controls both channels in a two-channel system. The master sends the EIS and frame ID 1 at the same time on all configured channels. The slave nodes need not be connected to both channels. If a slave is connected to both channels, the channel with a correct EIS symbol in combination with the frame ID 1 wins the arbitration and determines the cycle start on the slave.

The use of an EIS symbol in combination with the frame with ID 1 provides the following advantages:
- Slave nodes can react on a trigger event on the master node with minimal time delay on the assumption of the FlexRay media access scheme. Therefore the re-use of the FlexRay media access scheme is possible.
- Cycle counter will be incremented in the master and the slave at the (cycle start). Therefore nearly the same frame acceptance method can be applied
- Re-ordering of the messages in the dynamic part can be done within the NIT Media Access—Event Triggered Mode The communication cycle is the fundamental element of the media access scheme within FlexRay. It is defined by means of a timing hierarchy.

Timing Hierarchy

Figure 96:
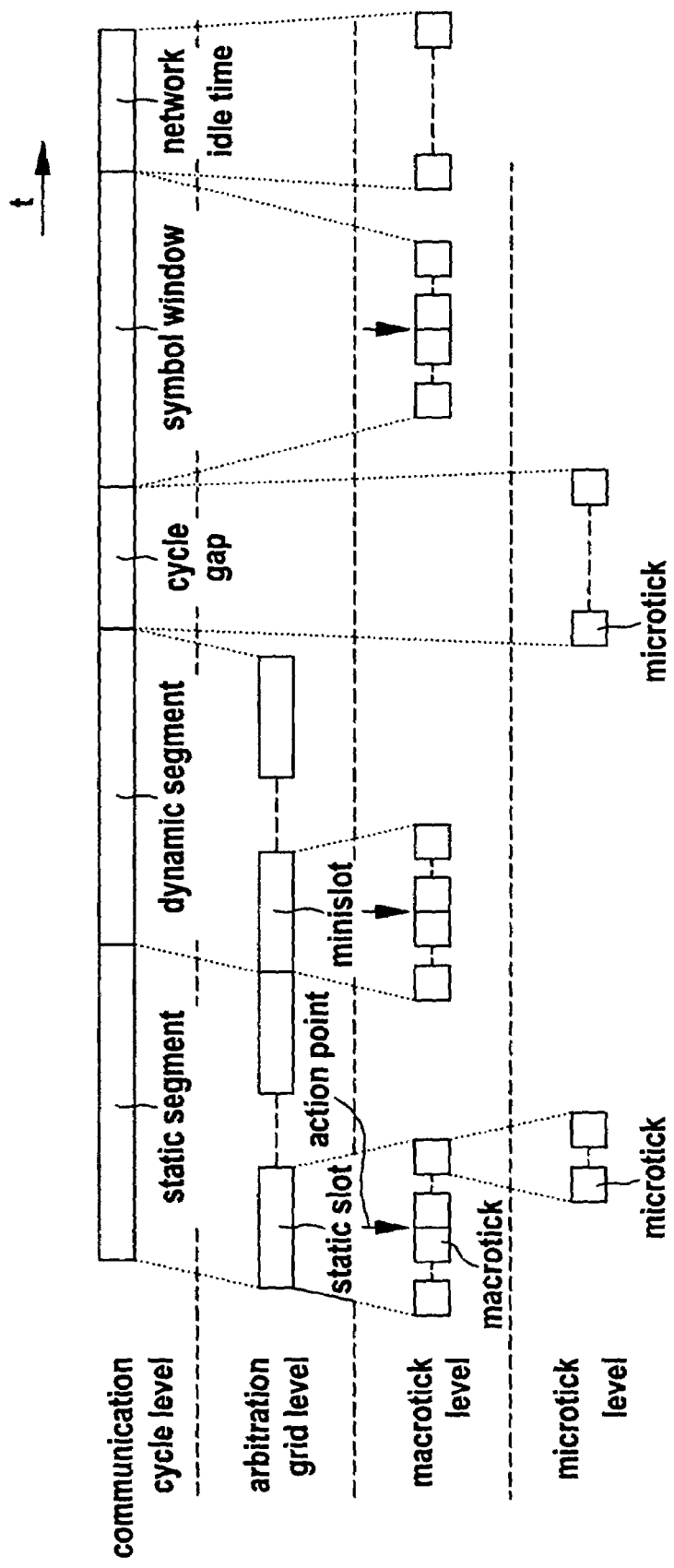
FIG. 96 illustrates a timing hierarchy in the view of a master node of the communication system.

The timing hierarchy consists of four timing hierarchy levels as shown in FIG. 96.

The highest level, the communication cycle level, defines the communication cycle. It contains the static segment, the dynamic segment, the symbol window and the network idle time (NIT). Within the static segment a static time division multiple access scheme is used to arbitrate transmissions as specified in Section 'Static Segment'. Within the dynamic segment a dynamic mini-slotting based scheme is used to arbitrate transmissions as specified in Section 'Dynamic Segment'. The symbol window is a communication period in which one symbol out of a defined set of symbols can be transmitted on the network as specified in Section 'Symbol Window'. The static segment, the dynamic segment and the symbol window form the network communication time (NCT), a period during which network wide communication takes place. The network idle time defines a communication-free period that concludes each communication cycle.

The next lower level, the arbitration grid level, contains the arbitration grid that forms the backbone of FlexRay media arbitration. In the static segment the arbitration grid consists of consecutive time intervals, called static slots, in the dynamic segment the arbitration grid consists of consecutive time intervals, called minislots.

The arbitration grid level builds on the macrotick level that is defined by the macrotick. The macrotick is specified in Chapter "Clock Synchronization". Specific macrotick boundaries are called action points. These are dedicated instants at which transmissions shall start (in the static segment, dynamic segment and symbol window) and shall end (only in the dynamic segment).

The lowest level in the hierarchy is defined by the microtick that is covered in Chapter 'Clock Synchronization'.

Communication Cycle Execution

In the event triggered mode the communication cycle is executed under the control of a single master. Each node enters a phase called the cycle gap immediately after the end of the dynamic segment. If there is no dynamic segment the cycle gap begins at the end of the static segment. In the cycle gap the execution of the communication cycle is suspended until an event indication symbol (EIS) is received. The master issues the EIS symbol. Upon reception of the EIS symbol all nodes resume execution of the communication cycle.

Figure 97:
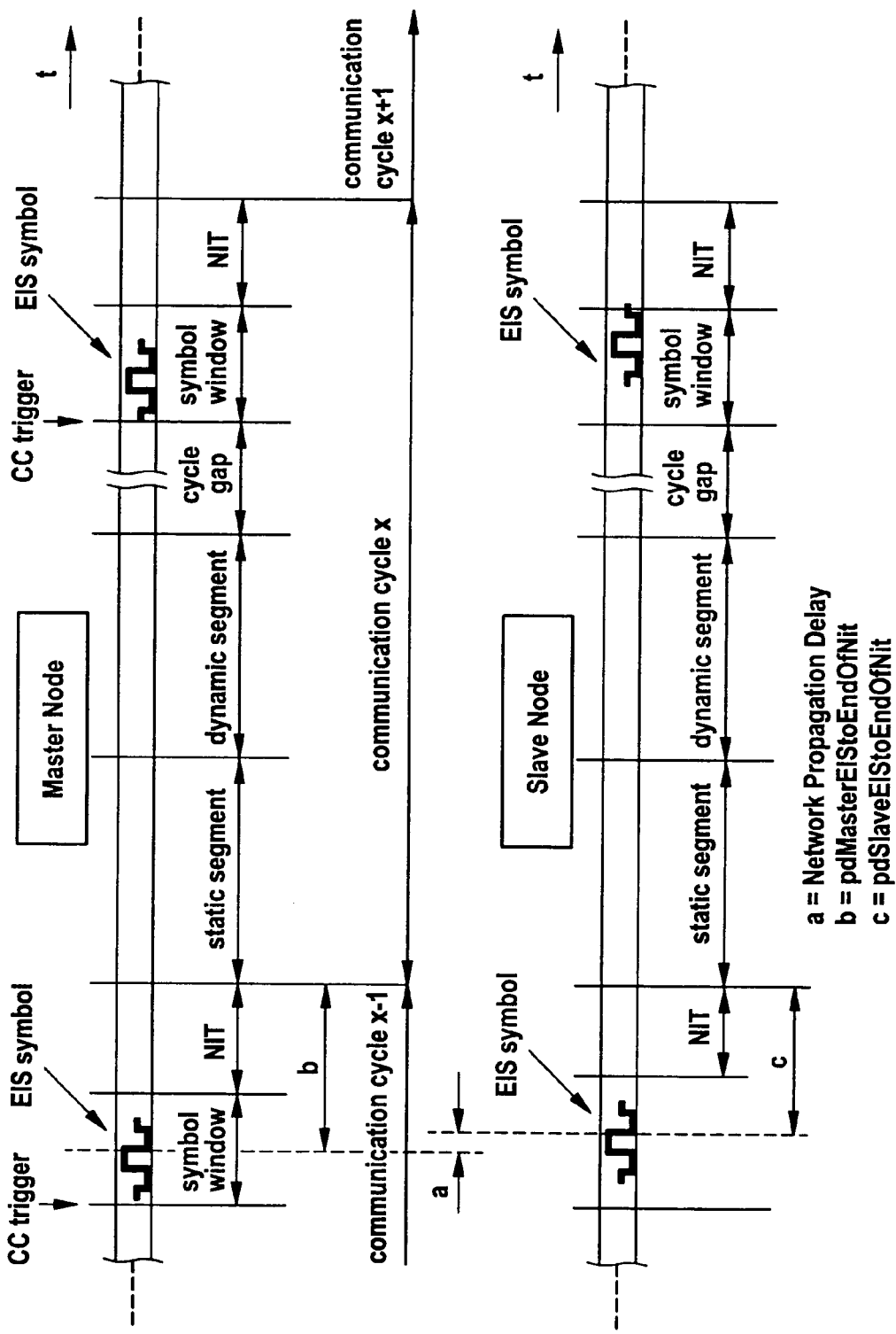
FIG. 97 illustrates a communication cycle execution from the view of a master node and a slave node.

FIG. 97 illustrates the execution of the event triggered communication cycle.

Event Indication Symbol (EIS)

Figure 98:
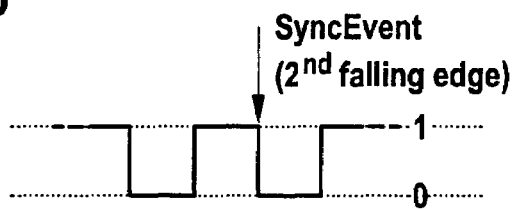
FIG. 98 illustrates a trigger condition in an event indication signal.

The Event Indication Symbol (EIS) is defined in Chapter 'Coding and Decoding'. The second falling edge is used as the synchronization event (SyncEvent) on master and slave nodes. The EIS symbol is not required to be collision resilient. The trigger condition in the EIS is illustrated in FIG. 98.

Clock Synchronization in Event Triggered Mode

Principle

Communication cycle timing in the event triggered mode is based on the EIS symbol. Since the start of a communication cycle is not predictable (and therefore the duration of a communication cycle is variable) there is no notion of time that can be used by the slave nodes to perform a clock rate correction, the EIS is simply used as a synchronizing event by the slave nodes and all subsequent timing is based on nominal (uncorrected) macroticks based on a timing grid that is set up by the arrival time of the EIS. The following paragraphs define the details of the clock synchronization for master and slave nodes.

Clock Synchronization of the Master Node

After the arrival of the CC trigger event on the master node, the symbol window starts and the master sends the EIS symbol within the symbol window at the beginning of the next microtick. While sending the EIS symbol, the timer vEDMTimer is initialized at the SyncEvent point with the configuration value pdMasterEIStoEndOfNIT (The parameter pdMasterEIStoEndOfNIT is expressed in microticks to minimize timing jitter.), which describes the duration between the SyncEvent point of the EIS and the end of the NIT.

When the timer vEDMTimer expires at the end of phase b (see FIG. 97) the new communication cycle is started, the master initializes the macrotick and microtick counters with 0, and the cycle counter is incremented.

Beginning with the new cycle the master transmits a frame with ID 1. The cycle counter field of this frame is set to the master's local cycle counter.

Clock Synchronization of the Slave Node

If a slave is connected to two channels, the first valid reception of a EIS symbol on one of the two channels will be taken.

When a slave recognizes the reception of a valid EIS symbol, the timer vEDMTimer is provisionally initialized at the SyncEvent point with the configuration value pdSlaveEIStoEndOfNIT, which quantifies the duration between the SyncEvent point of the received EIS symbol and the end of the NIT (The parameter pdSlaveEIStoEndOfNIT is expressed in terms of the SyncEvent of the received EIS, and therefore should include the effects of any fixed network propagation delay. The parameter is expressed in microticks to minimize timing jitter.). The timer vEDMTimer will be committed when the EIS symbol was correctly received. The parameter pdSlaveEIStoEndOfNIT is configured during soft reset. When the timer vEDMTimer expires at the end of phase c (see FIG. 97) the new communication cycle is started, the slave initializes the macrotick and microtick counters with 0, and the local cycle counter is incremented. Afterwards the slave waits to receive the frame with ID 1.

Using this procedure all slave nodes that receive the EIS and the master node switch consistently to the next communication cycle. During the startup phase the process is done in a different way (see below).

If the slave does not recognize the reception of a valid EIS symbol no action is performed. The local time proceeds until the reception of a new EIS symbol and the timing monitoring (see below) will signal an error.

Frame Processing in Event Triggered Mode

Frame Processing of the Master Node

The master node shall process frames using the procedure defined in Chapter 'Frame Processing' at the beginning of this document.

Frame Processing of the Slave Node

If no valid frame with frame ID 1 on at least one channel is correctly received in slot 1 after an EIS symbol on a slave node, then no communication will be performed by that slave node during the communication cycle (In this case, "no communication" means that no transmission of frames is possible. Receiving frames can be performed.). This will be indicated by setting S_Trig_Symb_Failure. If at least one valid frame with ID 1 is received in slot 1 on a slave node, then the slave applies the frame checks described above with the exception that the cycle counter checks of slot 1 are handled as described below (In the descriptions below, it is assumed that a frame is only considered valid if all acceptance criteria other than cycle counter matching are met.):

Single channel connected slaves

If the cycle counter of the received frame with Id=1 is not equal to the local cycle counter then the local cycle counter shall be changed to the cycle counter received in frame with ID=1. This will be indicated by an S_CycleCountError. The frame with ID=1 is accepted normally, and the remainder of the communication cycle is executed normally.

In all other cases the local cycle counter shall remain unchanged, the frame shall continue through the acceptance process, and the communication cycle shall be executed normally Dual channel connected slave If the cycle counts of all received frames with Id=1 are identical but not equal to the local cycle counter then the local cycle counter shall be changed to the cycle counter received in the frames with ID=1 (If only one frame is received then it is identical by default.). This will be indicated by an S_CycleCountError. The frame(s) with ID=1 are accepted normally, and the remainder of the communication cycle is executed normally.

In all other cases the local cycle counter shall remain unchanged, the frame(s) shall continue through the acceptance process, and the communication cycle shall be executed normally After the first slot, all frames for the remainder of the communication cycle shall be processed using the procedure described in Chapter "Frame Processing" of this document.

Monitoring of Cycle Timing

The FlexRay event triggered mode has two different methods of monitoring the timing of the communication system, depending on whether a node is serving as the master or a slave:

The timing of the CC trigger is monitored by the master.

The cycle-to-cycle timing of the EIS symbol, sent by the master, is monitored by the slaves.

Monitoring of the CC Trigger by the Master

The timing of the CC trigger is monitored by the master using a CC trigger window defined by two configuration parameters, pdExTrigCycleMin and pdExTrigCycleMax.

The timing monitoring refers only to the external trigger source—the trigger sources 'host trigger bit' and 'cycle timer' do not affect the monitoring. There are three different cases with respect to the arrival of the CC trigger:

In normal operation the CC trigger appears later than pdExTrigCycleMin and earlier than pdExTrigCycleMax. No error is signaled and the start of a new communication cycle is initiated by the CC trigger. The start of a new CC trigger window is computed when the CC trigger arrives.

If the CC trigger does not appear before pdExTrigCycleMax, an EXT_TRIG_EIF (CC Trigger Lost Interrupt Flag) error is signaled after pdExTrigCycleMax. The start of a new trigger window will be determined only after the actual arrival of a new CC trigger. As long as no new CC trigger arrives, no new communication cycle is initiated. It is up to the host to initiate the communication cycle if needed.

If the CC trigger appears earlier than pdExTrigCycleMin, the EXT_TRIG_EIF (CC Trigger Early Interrupt Flag) error is signaled immediately. No communication cycle is initiated, and no new trigger window is determined in this case.

Figure 99:
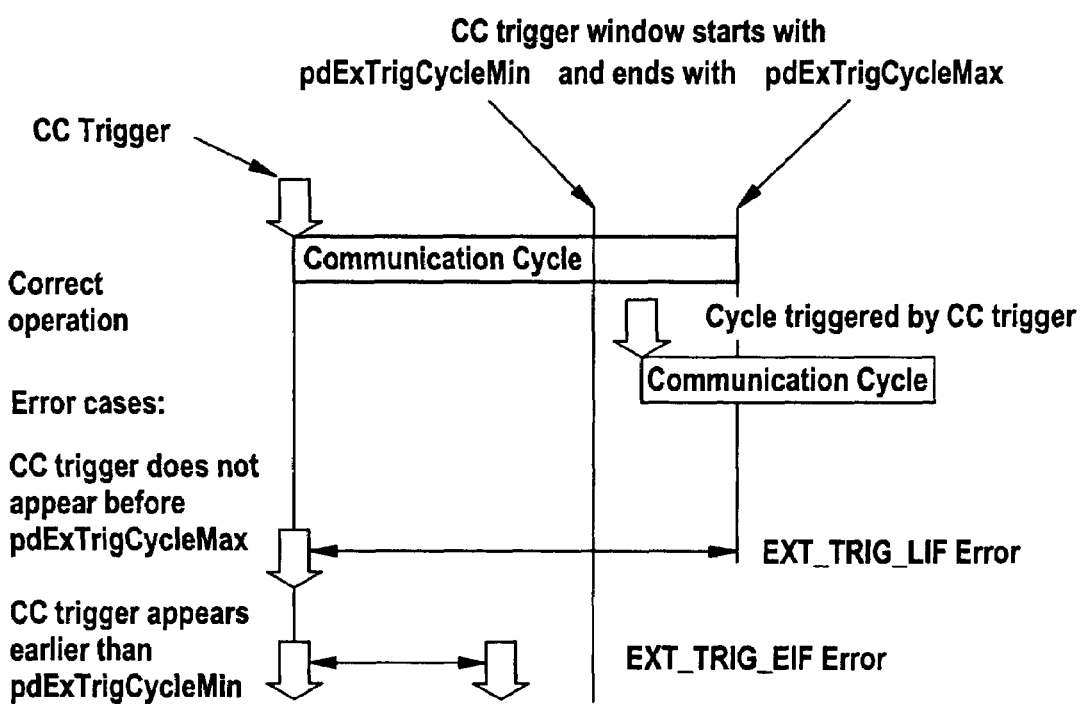
FIG. 99 illustrates a monitoring of a trigger signal for the communication controller by a master node of the communication system.

These conditions are depicted in FIG. 99.

Monitoring of EIS Timing by the Slaves

The timing of the reception of Event Indication Symbols is monitored by the slaves through the use on an EIS window defined by two configuration parameters, pdEISSymbCycleMin and pdEISSymbCycleMax. There are three different cases with respect to the arrival of the EIS:

In normal operation the end of the EIS appears later than pdEISSymbCycleMin but earlier than pdEISSymbCycleMax. No error is signaled. The start of a new EIS window is computed when the end of the EIS arrives.

If no valid EIS is received such that the end of the EIS appears before pdEISSymbCycleMax, an EIS_SYMB_LIF (EIS symbol Lost Interrupt Flag) error is signaled after pdEISSymbCycleMax. When an EIS symbol arrives, the slaves continue with a new communication cycle.

If the end of the EIS symbol appears earlier than pdEISSymbCycleMin the early EIS symbol is ignored, and an EIS_SYMB_EIF (EIS Symbol Early Interrupt Flag) error is signaled immediately. The node switches into a passive mode, stopping all frame transmission and reception. No new EIS window is computed, and no new communication cycle is initiated. The slave node waits for another EIS symbol after pdEISSymbCycleMin.

Figure 100:
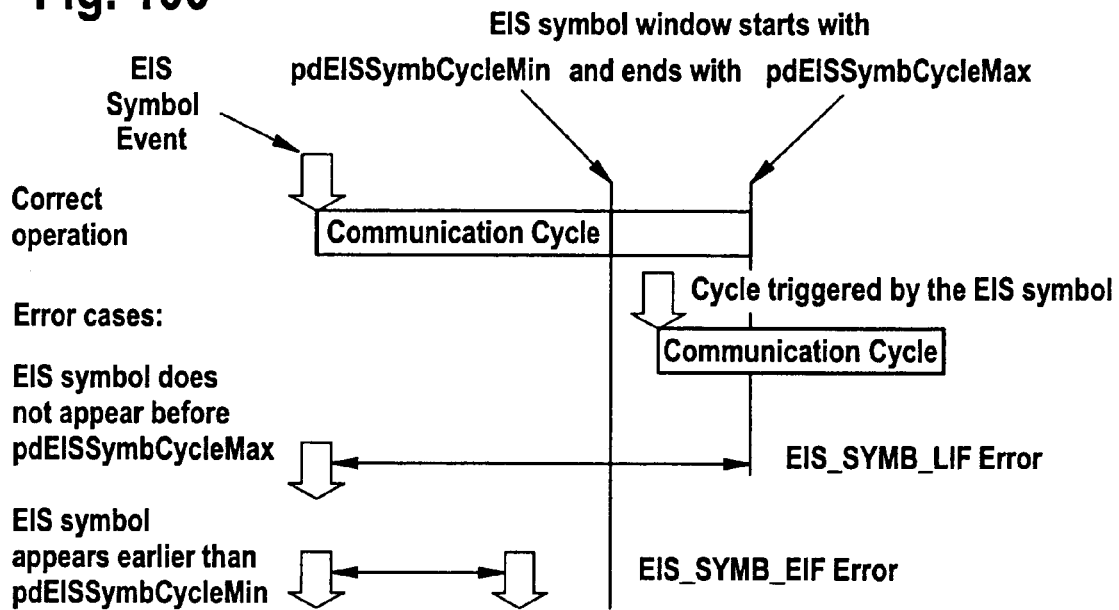
FIG. 100 illustrates a monitoring of an event indication signal by slave nodes of the communication system.

These conditions are depicted in FIG. 100.

Startup and Reintegration—Event Triggered Mode

The following overview describes the CC behavior in the event triggered communication mode. Conditions for entering and exiting these states are described in Table 52.

State transitions with a prefix of 'G' are global transitions for the FlexRay protocol.

State transitions with a prefix of 'L' indicate states transitions corresponding to logical conditions State transitions with a prefix of 'E' are transitions specific to the event triggered communication mode.

If a node integrates into a running system or at startup, the cycle counter from the master is accepted without raising an error indication. The error indication is suppressed until integration is successfully completed.

TABLE 52

State Transitions - Event Triggered Mode

| State Transition | Transition Direction From State | To State | Conditions for Transition | Action taken on Transition |
|---|---|---|---|---|
| L3 | CC_Normal | CC_SoftReset | A CC_Reset is requested by the host | The ongoing frame transmission or reception is allowed to proceed to completion and the configuration data shall be retained |
| L4 | | CC_SoftReset | Initialization is finished | |
| G5 | CC_SoftReset | CC_WaitEIS | soft reset released (in the respective control register) AND Event Triggered slave mode is configured | Reset timer for EIS symbol monitoring |
| G6 | | CC_WaitEvent | soft reset released (in the respective control register) AND Event Triggered master mode is configured | Reset timer for event trigger monitoring |
| E1 | CC_WaitEIS | CC_WaitSlaveNIT | Reception of a valid EIS with the end later than pdEISSymbCycleMin | set vEDMTimer to pdSlaveEISToEndOfNIT, set EIS_REC_INT interrupt Reset timer for EIS symbol monitoring |
| E2 | | CC_WaitEIS | Reception of a valid EIS with the end earlier than | Signal EIS_SYMB_EIF (EIS symbol Early Interrupt Flag) Error |

TABLE 52-continued

State Transitions - Event Triggered Mode

| State Transition | Transition Direction | | Conditions for Transition | Action taken on Transition |
|---|---|---|---|---|
| | From State | To State | | |
| | | | pdEISSymbCycleMin | (Note - The EIS timer is not reset by this transition) |
| E3 | | CC_WaitEIS | EIS Timer reaches pdEISSymbCycleMax without detecting a valid EIS | Signal EIS_SYMB_LIF (EIS symbol Lost Interrupt Flag) Error (Note - The EIS timer is not reset by this transition) |
| E4 | CC_WaitSlaveNIT | CC_WaitID1 | vEDMTimer expires (i.e., pdSlaveEIStoEndOfNIT has elapsed) | Reset vMacrotick, microtick counter, increment cycle counter |
| E5 | CC_WaitID1 | CC_NormalSlave | Reception of a valid frame with ID 1 (This implies that the cycle counter match check has also passed (i.e., the local cycle counter matches the received cycle counter).) | |
| E6 | | CC_NormalSlave | Reception of a frame with ID 1 which passes all frame checks other than cycle counter checks | Signal S_CycleCountError Error The received cycle count is applied for the local cycle count value |
| E7 | | CC_WaitEIS | The end of slot 1 was reached without having received an acceptable frame ID 1 message (Acceptable means all frame checks (with the possible exception of cycle counter match) are passed.) | Signal S_Trig_Symb_Failure Error |
| E8 | CC_NormalSlave | CC_WaitEIS | End of dynamic segment reached (vMacrotick == gdCycle − gdNetworkIdleTime − gdSymbolWindow; based on local timers) | Reset timer for EIS symbol monitoring |
| E9 | CC_WaitEvent | CC_WaitMasterNIT | CC trigger appears later than pdExTrigCycleMin | send EIS symbol set EXT_SOR_INT interrupt set vEDMTimer to pdMasterEIStoEndOfNIT |
| E10 | | CC_WaitMasterNIT | Trigger bit is set by host | send EIS symbol set vEDMTimer to pdMasterEIStoEndOfNIT |
| E11 | | CC_WaitEvent | CC trigger appears earlier than pdExTrigCycleMin AND Trigger source is external event | Signal EXT_TRIG_EIF (CC trigger Early Interrupt Flag) Error (Note - The CC trigger timer is not affected by this transition) |
| E12 | | CC_WaitEvent | CC trigger timer reaches pdExTrigCycleMax before a CC trigger appears | signal EXT_TRIG_LIF (CC trigger Lost Interrupt Flag) Error (Note - The CC trigger timer is not affected by this transition) |

TABLE 52-continued

State Transitions - Event Triggered Mode

| State Transition | From State | To State | Conditions for Transition | Action taken on Transition |
|---|---|---|---|---|
| E13 | CC_WaitMasterNIT | CC_NormalMaster | vEDMTimer expires (i.e., pdMasterEIStoEndOfNIT has elapsed) | Reset vMacrotick, and vMicrotick counters, increment cycle counter, reinitialize error signaling counters, send frame ID 1 in slot 1 |
| E14 | | CC_WaitMasterNIT | CC trigger appears AND Trigger source is external event | Signal EXT_TRIG_EIF (CC trigger Early Interrupt Flag) Error |
| E15 | CC_NormalMaster | CC_WaitEvent | End of dynamic segment reached (vMacrotick == gdCycle - gdNetworkIdleTime - gdSymbolWindow; based on local timers) | Reset timer for event trigger monitoring |
| E16 | | CC_NormalMaster | CC trigger appears AND Trigger source is external event | Signal EXT_TRIG_EIF (CC trigger Early Interrupt Flag) Error |

State Diagram

Figure 101:
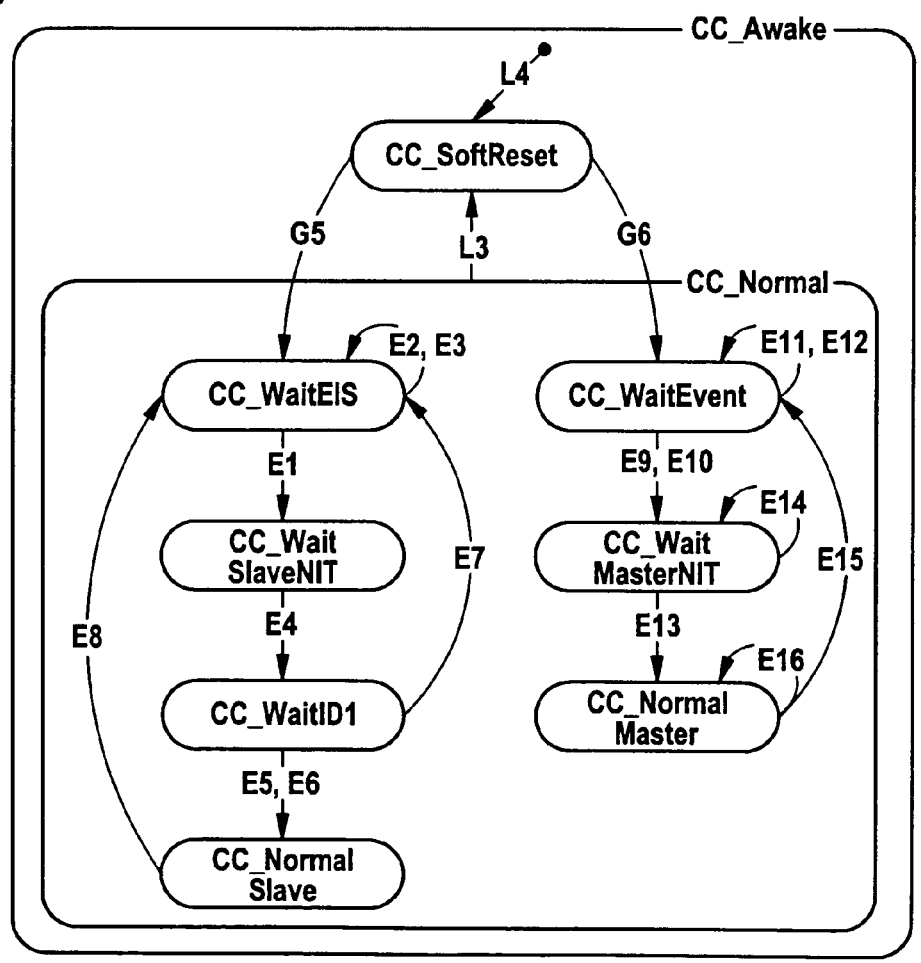
FIG. 101 illustrates a protocol state diagram for an event triggered mode.

FIG. 101 shows a protocol state diagram for the event triggered mode.

Host Interface Requirements—Event Triggered Mode

Event triggered mode specific requirements:

A configuration parameter (e.g. pMasterSelect or consider reusing pSyncMaster) defines whether the node acts as a master or as a slave.

For the master node three event sources for starting the next cycle exist: external event, host access, CC internal timer (normal cycle length). The host decides during runtime which event source(s) are used.

The trigger/event sources external event and CC internal timer can be enabled/disabled independently. If more than one source is enabled, the first event arms the CC to send the EIS symbol. At least one of the triggers sources has to be enabled.

Product specific: The behavior of the input signal for the external source should be configurable with respect to the trigger type (falling or rising edge) and the assignment to a trigger pin.

Product specific: Upon detection of the trigger event, the master CC shall capture the macrotick-counter and present this value to the host.

Product specific: Upon reception of the trigger event, the master CC shall indicate this immediately to the host (Event Trigger).

Product specific: Upon reception of the event indication symbol, the slaves shall capture their macrotick-counters.

Upon reception of the event indication symbol, the slave shall indicate this immediately to the host (Event Indication Symbol (EIS) Detected).

It is required for the host to be able to change the transmit buffers during the dynamic segment in the following way:

The data of a buffer may be changed.

The data and the ID of a buffer may be changed as long as its order in the list of dynamic IDs is not changed Range of pdExTrigCycleMin: 100 µs . . . 64 ms
Range of pdExTrigCycleMax: 100 µs . . . 64 ms
Range of pdEISSymbCycleMin: 100 µs . . . 64 ms
Range of pdEISSymbCycleMax: 100 µs . . . 64 ms General Interrupt Register For the event triggered communication mode the interrupt flags described above are available. Table 53 lists additional interrupt flags that are specific to the event triggered communications mode.

Every interrupt source described in Table 53 shall have an individual enable/disable mechanism.

TABLE 53

Interrupt Registers - Event Triggered Mode

| General Interrupt Flag | Bits | Description | Channel |
|---|---|---|---|
| EXT_SOR_INT | 1 | External source interrupt (master only) | — |
| EXT_TRIG_EIF | 1 | External Trigger Early Interrupt Flag, external trigger received before pdExTrigCycleMin (master only) | — |
| EXT_TRIG_LIF | 1 | External Trigger Late Interrupt Flag, external trigger not received before pdExTrigCycleMax (master only) | — |
| EIS_REC_INT | 1 | EIS symbol detected | A |
| EXT_TRIG_EIF | 1 | EIS symbol Early Interrupt Flag, EIS received before pdEISSymbCycleMin | A |
| EXT_TRIG_LIF | 1 | EIS symbol Lost Interrupt Flag, EIS not received before pdEISSymbCycleMax | A |
| EIS_REC_INT | 1 | EIS symbol detected | B |
| EXT_TRIG_EIF | 1 | EIS symbol Early Interrupt Flag, EIS received before pdEISSymbCycleMin | B |

TABLE 53-continued

Interrupt Registers - Event Triggered Mode

| General Interrupt Flag | Bits | Description | Channel |
|---|---|---|---|
| EXT_TRIG_LIF | 1 | EIS symbol Lost Interrupt Flag, EIS not received before pdEISSymbCycleMax | B |

Note:
It is possible to use the external source interrupt (EXT_SOR_INT) even if the external source is not used in order to gather information about the occurrence of external source trigger events.

Error Management—Master Triggered Mode

For the event triggered communication mode the error management described in Chapter "Error Signalling and Error Handling" applies in general. Only the treatment of frame with ID=1 is different. If a frame does not receive frame ID 1 after a correct EIS symbol, the slave node switches in Error (passive) and stops frame transmission until a next pair of valid EIS+frame Id 1 is received.

The error signaling counters are reinitialized during the transition at the beginning of the new communication cycle.

Controller Host Interface Example

Purpose

This chapter contains an example of a Controller Host Interface (CHI) that meets the Host Interface requirements defined in Chapter 'Controller Host Interface' and Chapter 'Controller Host Interface Services'.

Some of these requirements are applicable to all FlexRay implementations and others are applicable only when specific optional protocol mechanisms are implemented.

Controller Status Registers

This section enumerates the registers that shall be supported by the Communication Controller to provide the host with status information regarding the operation of the controller, and the current value of different CC internal variables. The current controller status shall be provided on read request of the host. The status registers holding internal variables shall be cleared at the state transitions L1, L5 and L6 of the HW state machine (see Section 'CC State Diagram') and shall be updated by the CC. The host shall have read-only access to the status information. The host is generally not able to modify the contents of these registers, with the exception of some error flags, that may be cleared by the host.

Product Version Register

The CHI shall provide a 16-bit read-only register to hold the FlexRay Product Version Number. This number identifies the manufacturer, the product and the implemented protocol version in order to allow the user to distinguish between different products. Starting with the MSB, the register shall be used as follows:

5 bits to identify the silicon manufacturer 4 bits for manufacturer defined silicon versions 7 bits to identify the implemented protocol version.

The semiconductor manufacturer shall agree this version number with the FlexRay Consortium.

Current Cycle Counter Value

The CHI shall provide a 6-bit register to hold the current cycle counter value (vCycle). The content shall be incremented by CC at start of cycle.

Current Macrotick Value

The CHI shall provide a 16-bit register to hold the current macrotick value (vMacrotick). The content shall be incremented by CC and reset at start of cycle.

Rate Correction Value

The CHI shall provide an 8-bit register to hold the rate correction value (vRateCorrection) applied by the clock sync in the current cycle. (See Section 'Calculation of the Rate Correction Value')

Offset Correction Value

The CHI shall provide an 8-bit register to hold the offset correction value (vOffsetCorrection) applied by clock sync in the current cycle. (See Section 'Calculation of the Offset Correction Value')

Valid Sync Frames Channel A (VSFC_A)

The CHI shall provide a 5-bit register indicating the number of valid Sync Frames received in the previous cycle. The variable shall only be updated at the end of the static segment with the counter value VSFC_A.

Valid Sync Frames Channel B (VSFC_B)

The CHI shall provide a 5-bit register indicating the number of valid Sync Frames received in the previous cycle. The variable shall only be updated at the end of the static segment with the counter value VSFC_B.

Sync Frames used for Clock Sync

The CHI shall provide a 5-bit register indicating the number of valid Sync Frame pairs used for the calculation of the rate correction terms in the previous cycle. The register shall only be updated at the end of the NIT of the odd cycle with the counter value vValidSyncFrameCount. (See Section 'Clock Synchronization—General Concepts')

Missing Rate Correction Signal (MRCS)

The CC shall provide a flag to signal to the host, that no rate correction can be performed because no pairs of (even/odd) Sync Frames were received. The flag shall be reset by the CC after successful rate correction. (See Section 'Missing Rate Correction Signal (MRCS)')

Missing Offset Correction Signal (MOCS)

The CC shall provide a flag to signal to the host, that no offset correction can be performed because no Sync Frames were received in an odd cycle. The flag shall be reset by the CC after successful offset correction. (see Section 'Missing Offset Correction Signal (MOCS)')

Clock Correction Failed Counter (CCFC)

The CC shall provide a 4-bit counter that is incremented by one at the end of any odd communication cycle where either the Missing Offset Correction error or Missing Rate Correction error are active. The CCFC shall be reset to zero at the end of an odd communication cycle if neither the Offset Correction Failed nor the Rate Correction Failed errors are active. The CCFC stops at 15. (see Section 'Clock Correction Failed Counter (CCFC)')

Startup Majority Missed Signal (SMMS)

The CC shall provide a flag to signal to the host that the CC has received a set of sync frames during startup that did not result in a majority of the sync frames agreeing with the local view of the system time (see Section 'Startup Majority Missed Signal (SMMS)'). The SMMS shall be reset by host interaction or when the CC performs the state transition L5 or L6 of the HW state machine (see Section 'CC State Diagram').

Protocol Error State

The CC shall provide 2 bits indicating the current protocol error state. (See Section 'Protocol Error State Signal')

Startup Status Vector

The CC shall provide a Startup Status Vector with following status flags:
- vCCMS; Coldstart max reached (vColdStartCount=gColdStartMax)
- vSMMS, Plausibility check failed
- vOpViaColdstart; Normal state entered via coldstart path
- vColdStartAborted; Coldstart aborted because of CAS or Sync Frame received
- vColdstartNoise; Coldstart path has been entered due to the expiration of pColdstartNoise A logical '1' indicates the truth condition for each status flag.

For details see Section 'Communication Startup and Reintegration'.

Bus Guardian Schedule Monitoring Error (BGME)

The CC shall provide a flag to signal a bus guardian schedule monitoring violation (vBgsmError) to the host. The flag shall be set by the schedule monitoring mechanism and shall be cleared only by the host. (see Section 'Bus Guardian Schedule Monitoring Error (BGME)')

Clock Correction Limit Reached (CCLR)

The CC shall provide a flag to signal to the host, that the Offset Correction Value (vOffsetCorrection) has reached the red region (vOffsetCorrection>gOffsetCorrectionOut). The CC shall only have the capability to set this flag. The flag shall remain set until it is cleared by the host. (See Section 'Value Limitations' and Section 'Clock Correction Limit Reached (CCLR)').

Media Access Test Warning

The CC shall provide a flag (pMATestWarning) to signal to the host, that the CC has received a Media Access Test Symbol (MTS) during the symbol window. The CC shall only have the capability to set this flag. The flag shall remain set until it is cleared by the host.

Wakeup Status Vector

The CC shall provide a Wakeup Status Vector with following status flags:
- Frame Header Received during Wakeup flag (vWakeupFrameHeaderReceived). This flag shall be set if due to the reception of a frame header without coding violation the CC stops the wakeup.
- Wakeup Symbol Received flag (vWakeupSymbolReceived). This flag shall be set if due to the reception of a valid Rx-wakeup symbol the CC stops the wakeup.
- Wakeup Failed flag (vWakeupFailed). This flag shall be set if due to too many wakeup tries the CC stops the wakeup.
- Wakeup Complete flag (vWakeupComplete). This flag shall be set if the CC has completed the transmission of the Tx-wakeup.

(see Section 'Cluster Wakeup' for details)

Communication Controller Status Vector

The CC shall provide a Communication Controller Status Vector with following status flags indicating the actual operation mode of the CC:
- CC_SoftReset State
- CC_Normal State
- CC_ShutdownRequest State
- CC_Shutdown Complete State
- CC_Standby State
- Listen-Only Mode
- WakeUPListen State
- StartupListen State
- ColdStartICW State
- ColdStartVCW State
- IntegrationVCW State
- PassiveOperation State
- Event Triggered Mode The CC shall set the status flag when entering the corresponding state or operation mode and shall clear it after leaving it, independent of the settings in the different configuration registers. For details see below and Sections 'HW States of the CC', and 'Startup State Diagram—Time Triggered Protocol Mode (TT-D and TT-M)'.

Configuration and Control Registers

This section enumerates the registers supported by the Communication Controller to allow the host to control the operation of the CC. The host shall have write and read access to all configuration data.

Configuration data shall not be changed by the CC during normal operation. The CC shall reset the configuration data on its transition L1 from the CC_HWReset state (see Section 'HW States of the CC').

Module Configuration Register

The Module Configuration Register (MCR) enables the host to configure basic operating modes in the CC. (see Section 'HW States of the CC') The MCR shall provide the following control bits:

Soft Reset

When this bit is set by the host, the CC shall immediately enter the CC_SoftReset State. Any ongoing transmission or reception shall be aborted and synchronization to the ongoing communication shall be stopped. When this bit is cleared by the host, the CC shall enter the Normal State and start the reintegration or startup. If wake-up is configured, the CC shall enter the WakeUPListen State after leaving CC_SoftReset. The CC shall enter the CC_SoftReset State automatically after power on reset. The host shall configure the CC in this state. When the host forces the CC into soft reset, the status and error registers should keep their data unchanged until the soft reset is terminated. (Transition L5 and L6 of the HW state machine; see Section 'CC State Diagram'))

Listen-Only Select

When this bit (vListenOnly) is set, the CC shall be able to receive all frames after successful integration to the running communication. In comparison to the normal operation mode the node does not actively participate in communication, i.e. neither symbols nor frames are transmitted. This bit can be set only in CC_SoftReset State to true, but can be cleared any time by the host. (See Section 'Listen-Only Mode')

Master Select

This bit (pSyncMaster) selects the CC as a bus master in the Master Controlled Operating modes. (See Section 0) The CC shall send the Event Indication Symbol and the static sync frame when the bit is set. The CC shall ignore any attempt to change the status of this bit when not in CC_SoftReset State.

Master Alarm

If the Master Select and the Master Alarm bits are set, the CC shall send an SAS symbol in the byteflight mode. The bit can be set and reset by the host any time during normal operation.

Shutdown Request

When this bit is set by the host, the CC shall enter the CC_ShutdownComplete state (see Section 'CC_Shut- DownComplete State'). In this state all internal clocks shall be stopped after finishing the current communication round. The state can be left by the host resetting the bit.

Standby Request

When this bit is set by the host, the CC shall enter the CC_StandByRequest State. In this state all internal clocks shall be stopped after the CC has completed any ongoing transmission and reception. The CC shall leave this state upon the host resetting the bit or upon wake-up activity being signaled by the physical layer on the Rx input.

Send Wakeup

When this bit is set by the host, the CC shall enter WakeUPListen State when leaving the CC_SoftReset State and send the Wakeup Pattern. The CC shall ignore any attempt to change the status of this bit when not in CC_SoftReset State. (See Section 'Waking One Channel')

Wakeup Channel Select

With this bit (vWakeupChannel) the host selects the channel on which the CC shall send the Wakeup Pattern ('0'=channel A, '1'=channel B). The CC shall ignore any attempt to change the status of this bit when not in CC_SoftReset State. (See Section 'Waking One Channel')

Event Triggered Mode Select

When this bit is set by the host, the CC shall operate in the Event Triggered Mode. This bit shall be reset by default (=Time Driven Mode), and the CC shall ignore any attempt to change the status of this bit when not in CC_SoftReset State.

External Trigger Acceptance

When this bit is set by the host, the CC shall accept an external trigger to send the Event Indication Symbol and the static sync frame in the Event Triggered Mode, if the CC is configured as a master (Master Select bit set). The CC shall ignore any attempt to change the status of this bit when not in CC_SoftReset State.

Message/Frame ID Filtering

When this bit (gMsgIdFilter) is set by the host, the CC shall apply the configured Message ID filtering for all dedicated receive and FIFO receive mailbox buffers as described in Section 0. If this bit is not set (by default) the CC shall apply the Frame ID filtering. The CC shall ignore any attempt to change the status of this bit when not in CC_SoftReset State. It should be configured identically in all nodes of a cluster.

byteflight Compatibility mode

This bit selects the byteflight Compatibility mode when set. The CC shall ignore any attempt to change the status of this bit when not in CC_SoftReset State.

FIFO Size

The CC shall provide a register to configure the number of FIFO receive buffers as a part of all available message buffers. The CC shall ignore any attempt to change the content of the register when not in CC_SoftReset. (See below).

Timing Parameters

The CHI shall provide three registers to configure the timing parameters TCR1, TCR2, TCR3 required for the byteflight compatibility mode. These parameters are not used in all the other operating modes of the CC.

TCR1

8 bit; to configure the timing parameter pdWx0Rx, a constant component of vdWaitTime in the dynamic section in the case that the most recent bus activity was received by the local node; may be modified only in CC_SoftReset.

TCR2

8 bit; to configure the timing parameter pdWx0Tx, a constant component of vdWaitTime in the dynamic section in the case that the most recent bus activity was transmitted by the local node; may be modified only in CC_SoftReset.

TCR3

10 bit; to configure the timing parameter gdWxDelta a multiplier part of vdWaitTime. The value chosen must be identical for all nodes in the cluster, and may be modified only in CC_SoftReset. It shall be calculated as follows:

$$gdWxDelta = gdMaxPropagationDelay + gdMaxTolerances$$

Clock Prescaler

The CC shall provide a clock prescaler register consisting of the following three fields:
Bit Rate Index, 4 bits
Sample Clock Prescaler, 4 bits
Samples per bit, 2 bits (8 or 10 samples; $01_b=8$, $10_b=10$ samples)
(See Section 'Coding and Decoding—Configuration Parameters' for details)
The CC shall accept modifications of the register only in CC_SoftReset.

Maximum Oscillator Drift

The CC shall provide a 16-bit register to hold the maximum expected clock deviation of the oscillator during one communication cycle (gdMaxDrift) in microticks, configurable only in CC_SoftReset.

Sample Voting Offset

The CC shall provide a 4-bit register to configure the offset from the start of the voting window (pVotingOffset) that is used to determine the value of a received bit from the start of the bit cell. This offset defines the first sample of the bit that shall be considered for the voting; configurable only in CC_SoftReset. (See Section 'Bit Value Voting')

Voting Samples

The CC shall provide a 4-bit register to configure the number of samples in the voting window (pVotingSamples) that are used to determine the value of a received bit; configurable only in CC_SoftReset. (See Section 'Bit Value Voting')

Nominal Macrotick Length

The CC shall provide an 8-bit register to hold the nominal (uncorrected) number of microticks per macrotick (pMicroPerMacroNom); may be modified only in CC_SoftReset.

Bus Guardian Tick

The CC shall provide a 4-bit register to configure the length of the Bus Guardian Tick (BGT) to be provided by the CC to the bus guardian in multiples of the CC microtick; configurable only in CC_SoftReset.

Static Slot Length

The CC shall provide an 8-bit register to configure the duration of a static slot (gdSlot) in minislots; may be modified only in CC_SoftReset. The static slot length must be identical in all nodes of a cluster.

Static Frame Data Length

The CC shall provide a 7-bit register to configure the (fixed) frame length (gPayloadLengthStatic) for all frames sent in the static part in double bytes; may be modified only in CC_SoftReset. The static slot length must be identical in all nodes of a cluster.

Number of Static Slots

The CC shall provide a 12-bit register to configure the number of static slots in a cycle (gNumberOfStaticSlots); may be modified only in CC_SoftReset. The static slot length must be identical in all nodes of a cluster.

Cycle Length

The CC shall provide a 16-bit register to configure the duration of one communication cycle (gMinislotPerCycle) in minislots; may be modified only in CC_SoftReset. The cycle length must be identical in all nodes of a cluster.

Network Idle Time

The CC shall provide an 8-bit register to configure the duration of the network idle time (gdNetworkIdle) at the end of the communication cycle in minislots; may be modified only in CC_SoftReset.

Start of Latest Transmit

The CC shall provide a 16-bit register to configure the maximum minislot value (pdLatestTX) allowed before inhibiting new frame transmissions in the dynamic section of the cycle, expressed in terms of minislots from the beginning of the cycle; may be modified only in CC_SoftReset.

Transmission Start Sequence Duration

The CC shall provide a 4-bit register to configure the duration of the Transmission Start Sequence (TSS) (gdTransmissionStartSequence) in terms of bit times (gdBit); may be modified only in CC_SoftReset, and shall be identical in all nodes of a cluster.

Symbol Window Length

The CC shall provide an 8-bit register to configure the length of the symbol window in minislots; may be modified only in CC_SoftReset.

Media Access Test Cycle Counter

The CC shall provide a 6-bit register to configure the cycle counter value (pMATestCycle) in which the CC shall send the Media Access Test Symbol (MTS) periodically to perform the Media Access Test.

Media Access Test Enable

The CC shall provide a configuration flag (pMATestEnable) to enable the CC to periodically perform the Media Access Test if bit set. The flag shall be reset by default and may be modified only in CC_SoftReset.

External Clock Correction Acceptance

The CC shall provide a configuration flag to allow external clock correction when set. The flag shall be reset by default after power on reset and may be modified only in CC_SoftReset. The CC shall ignore the external clock corrections if this bit is not set.

Maximum Offset Correction

The CC shall provide an 8-bit register to hold the maximum permitted offset correction value (gOffsetCorrectionOut) to be applied during regular clock synchronization algorithm; may be modified only in CC_SoftReset. The CC checks the sum of internal and external offset correction against the gOffsetCorrectionOut parameter. (See Section 'Correction Term Calculation—Value Limitations')

Maximum Initial Offset Correction

The CC shall provide an 8-bit register to hold the initial offset correction value (gOffsetCorrectionInitOut) to be applied by the clock synchronization algorithm in the IntegrationVCW state; may be modified only in CC_SoftReset. (See Section 'CC IntegrationVWC State')

Maximum Rate Correction

The CC shall provide an 8-bit register to hold the maximum permitted rate correction value (gRateCorrectionOut) to be applied by the internal clock synchronization algorithm; may be modified only in CC_SoftReset. The CC checks the sum of internal and external rate correction against the gRateCorrectionOut parameter. (See Section 'Correction Term Calculation—Value Limitations')

Cluster Drift Damping

The CC shall provide a 4-bit register to hold the cluster drift damping value (pClusterDriftDamping) used in clock synchronization to minimize accumulation of rounding errors; configurable only in CC_SoftReset. (See Section 'Calculation of the Rate Correction Value')

Bus Guardian Enable Duration for BGSM

The CC shall provide a 12-bit register to configure the duration (pBgenStaticDuration) of the bus guardian enable signal for the transmission phase of a static slot in macroticks. This shall be checked by the CC with the BGE signal produced by the bus guardian; may be modified only in CC_SoftReset. (See Section 'BG Schedule Monitoring Service')

Bus Guardian Dynamic Segment Enable Duration for BGSM

The CC shall provide a 16-bit register to configure the duration (pBgeDynamicDuration) of the bus guardian enable signal for the transmission phase of the dynamic segment in macroticks. This shall be checked by the CC with the BGE signal produced by the bus guardian; may be modified only in CC_SoftReset. (See Section 'BG Schedule Monitoring Service')

Bus Guardian Symbol Window Enable Duration for BGSM

The CC shall provide an 8-bit register to configure the duration (pBgeSymbolDuration) of the bus guardian enable signal for the transmission phase of the symbol window in macroticks. This shall be checked by the CC with the BGE signal produced by the bus guardian; may be modified only in CC_SoftReset. (See Section 'BG Schedule Monitoring Service')

BG Schedule Monitoring in Symbol Window

The CC shall provide a configuration flag (pBgsmSymWinDisabled) to disable bus guardian schedule monitoring during the symbol window when set; may be modified only in CC_SoftReset. (See Section 'BG Schedule Monitoring Service')

BG Schedule Monitoring in Dynamic Segment

The CC shall provide a configuration flag (pBgsmDynSegDisabled) to disable bus guardian schedule monitoring during the dynamic segment when set; may be modified only in CC_SoftReset. (See Section 'BG Schedule Monitoring Service')

Timer Interrupt Configuration Registers

The CC shall provide two Timer Interrupt Configuration Registers to enable the host to configure two different timer interrupts. Each register shall contain three fields:

Cycle Set—A 9-bit register is used to specify in which set of cycles the interrupt shall occur. It consists of two fields, the Base Cycle [b] and the Cycle Repetition [c].

The set of cycle numbers where the interrupt is to be generated is determined from these two fields using the formula $$b+n*2^c (n=0,1,2,\ldots):$$

Base Cycle [b]—A 6-bit cycle number used to identify the initial value for generating the cycle set Cycle Repetition [c]—A 3-bit value used to determine a constant repetition factor to be added to the base cycle (c=0 . . . 6).

Macrotick Offset—This 16-bit value is the macrotick offset from the beginning of the cycle where the interrupt is to occur. The interrupt occurs at this offset for each cycle in the Interrupt Cycle Set.

Transmitter Generated Padding Switch

In the CC a configuration switch decides whether the transmitter may add missing data bytes if the configured frame data length exceeds the length of the buffer data field. The configuration switch applies to all transmit buffers of the CC. The flag shall be disabled (logical '0') by default, may be enabled (logical '1') only in CC_SoftReset.

Cold Start Max

The CC shall provide an 8-bit register to configure the maximum number of cycles (gColdStartMax) that a cold starting node is permitted to try to start up the network without receiving any valid response from another node; configurable only in CC_SoftReset. If the value is '0' the CC is not allowed to start up the communication.

Cold Start Inhibit

The CC shall provide a configuration flag (vColdStartInhibit) to disable the cold starting of a node during wake-up when set. (See Section 'ColdStart-Inhibit Mode')

Max. Without Clock Correction Passive

The CC shall provide a 4-bit register configurable with the number of cycles without performing rate correction (gMaxWithoutClockCorrectionPassive) when the CC shall enter the "Yellow" state. The register can be configured only in CC_SoftReset. (See Section 'Error Handling for TT-D and TT-M Protocol Modes')

Max. Without Clock Correction Fatal

The CC shall provide a 4-bit register configurable with the number of cycles without performing rate correction (gMaxWithoutClockCorrectionFatal) when the CC shall enter the "Red" state. The register can be configured only in CC_SoftReset. (See Section 'Error Handling for TT-D and TT-M Protocol Modes')

Wake-Up Symbol Definition Registers

The CHI shall provide following registers to configure the parameters needed by the CC to send and receive the wake-up symbol:

6 bits; to configure the duration of the active low level (gdWakeupSymbolTxLow) of the wake-up symbol in multiples of bit times (gdBit); may be modified only in CC_SoftReset.

8 bits; to configure the duration of the idle/recessive high level (gdWakeupSymbolTxIdle) of the wake-up symbol in multiples of bit times (gdBit); may be modified only in CC_SoftReset.

4 bits; to configure the number of repetitions (sequences) (pdWakeupPattern) of the wake-up symbol; may be modified only in CC_SoftReset.

6 bits; to configure the minimum duration of the active low level (gdWakeupSymbolRxLow) in multiples of bit times (gdBit) for the receiver to recognize the symbol as a wake-up; may be modified only in CC_SoftReset.

6 bits; to configure the minimum duration of the idle/recessive high level (gdWakeupSymbolRxIdleMin) in multiples of bit times (gdBit) for the receiver to recognize the symbol as a wake-up; may be modified only in CC_SoftReset.

9 bits; to configure the window length within which the symbol has to be received (gdWakeupSymbolRxWindow) in multiples of bit times (gdBit) for the receiver to recognize the symbol as a wake-up; may be modified only in CC_SoftReset.

4 bits; to configure the maximum number of times (gWakeupMax) the CC is permitted to autonomously attempt to send a wake-up pattern; may be modified only in CC_SoftReset.

6 bits; to configure in multiples of bit times (gdBit) the duration of the active low level on the bus (gdWakeupMaxCollision) that a CC sending a wake-up pattern shall accept during the idle phase of the pattern without reentering the WakeupListen state; may be modified only in CC_SoftReset.

(See Section 'Cluster Wakeup'0)

Communication Delay Registers

The CC shall provide two 8-bit registers to configure the average delay compensation values for each channel (pDelayCompensationChx) in microticks; configurable only in CC_SoftReset. (See Section 'Time Measurement')

Buffer Control Register

The configuration of the message mailbox buffers (as Transmit, Dedicated Receive or FIFO Receive buffer) and host's access to the mailbox message buffers shall be controlled by the use of a Buffer Control Register. (See below for implementation guidelines)

Clock Correction Registers

This section enumerates the registers the Communication Controller shall provide to allow external clock correction by the host. The host shall have write and read access to these registers.

The CC shall have read-only access during normal operation. The CC shall reset the configuration data during power on reset.

External Offset Correction

The CC shall provide an 8-bit register to hold the external clock offset correction value (vOffsetCorrectionExtern) in microticks to be applied by the internal clock synchronization algorithm when the External Clock Correction Acceptance bit is set (See above). The register content is supposed to be written by the host before start of the Network Idle Time (NIT) and it shall be consumed when applied by the CC. (See Section 'External Clock Synchronization (Optional)')

External Rate Correction

The CC shall provide an 8-bit register to hold the external clock rate correction value (vRateCorrectionExtern) in microticks to be applied by the internal clock synchronization algorithm when the External Clock Correction Acceptance bit is set (See above). The register content is supposed to be written by the host before start of the Network Idle Time (NIT) and it shall be consumed when applied by the CC. (See Section 'External Clock Synchronization (Optional)')

Message Buffers

The communication controller has to provide an implementation specific number of configurable message buffers for data communication with an implementation specific frame length up to the maximum of 254 data bytes. The message buffers shall be configurable to be used as transmit, dedicated receive or FIFO receive buffers.

Each buffer shall include the complete frame header and data field, and shall not include the frame CRC (See Section 'FlexRay Frame Format' for details). The CC shall provide suitable mechanisms to grant a secure access to the buffers. Using a suitable mechanism, either the CC or the host shall get access to one particular buffer. A predefined number of buffers shall be configurable during CC_SoftReset only while the others shall be reconfigurable during runtime.

Transmit Buffers

A portion of message buffers shall be configurable as transmit buffers.

There shall be one explicit transmit buffer, which is dedicated to be configured to hold the transmitted Sync frame of a node, if it transmits one, and which can be reconfigured only in CC_SoftReset. This shall ensure that for Sync Frames, the Sync Frame ID, Sync Bit, Payload Length and the corresponding header CRC can be changed only during CC_SoftReset, and that any node transmits at most one Sync frame per communication cycle. The CC shall provide mechanisms that do not allow the transmission of sync frames from other buffers.

For transmit frames in the dynamic segment reconfigurable buffers can be used. The frame ID, the header CRC, and the corresponding Payload Length shall be reconfigurable during runtime.

The CC shall not have the capability to calculate the transmit header CRC. The host is supposed to provide the frame IDs and header CRC's for all transmitted frames.

The CC shall not permit any write access by the host to the Null Frame Indication Bit.

The length field in all messages (static and dynamic) reflects the frame payload data length as defined in the frame format. The CC may use mailbox transmit buffer structures shorter than the actual configured data frame length in the static segment. In this case, the CC shall generate padding bytes—if enabled—to ensure that frames have proper physical length. However, this capability must be enabled via configuration (See above). The padding pattern shall be logical zero. The padding function shall apply only to frames to be transmitted in the static part. In the dynamic part no frame shall be transmitted if the data field in the buffer is shorter than the configured data length.

An indicator shall be provided for each transmit message buffer to indicate if the message was transmitted by the CC, respectively updated by the host. The host shall explicitly set this "Commit" flag when the buffer is ready for transmission. In the "Single-shot Mode" the CC shall reset the flag after transmission has been completed and the host may access the buffer for writing next message into the buffer. This handshaking flag shall be reset on the CC's transition from the CC_HWReset state (See Section 'CC_HWReset State').

The CC shall not transmit frame data from a buffer that the host is updating. The CC shall not transmit the message data out of the buffer before the host has indicated that the update is completed by setting the "Commit" flag.

Null Frame Transmission

The CHI shall provide for each transmission buffer a flag to allow the host to configure the transmission mode for the buffer. If this bit is set, the transmitter shall operate in the static segment in the so-called "Single-shot Mode". If this bit is cleared, the transmitter shall operate in the static segment in the so-called "Continuous Mode".

If a buffer is configured in the "Single-shot Mode", the configured frame will be sent out by the transmitter only once after the host has set the "Commit" flag. As defined above, the CC resets the flag after transmission. If the host does not set the "Commit" flag before transmit time and there is no other transmit buffer with matching frame ID and cycle counter filter, the CC shall transmit a Null Frame with the Null Frame bit (fNullFrameIndicationBit) set and the payload data set to '0'.

If a buffer is configured in the "Continuous Mode", the CC shall not reset the "Commit" flag after transmission. If the "Commit" flag is set, the frame shall be sent out any time the frame ID and cycle counter filter match. If the host clears the "Commit" flag and there is no other transmit buffer with matching frame ID and cycle counter filter, the CC shall transmit a Null Frame with the Null Frame bit (fNullFrameIndicationBit) set and the payload data cleared.

If a static slot is assigned to the CC, it shall transmit a Null Frame with the Null Frame Indication Bit (fNullFrameIndicationBit) set, and the rest of the frame header and the frame length unchanged (See Section 'Null Frame Indication Bit') in any of the following cases:

There are matching frame IDs and cycle counters, but none of these transmit buffers has the "Commit" flag set.

All transmit buffers configured for the slot have cycle filters that do not match the current cycle (see below).

Null Frames shall not be transmitted in the dynamic segment.

Receive Buffers

A portion of the CC's message buffers shall be configurable as dedicated receive buffers.

The CC shall transfer only valid received messages from the serial receive message buffer to the dedicated receive buffer with the matching filter configuration (See below).

A receive message buffer shall contain space for all frame elements as defined in Chapter 'Frame Formats', except the frame CRC.

The payload length information presented to the host shall reflect the length indicated by the received payload length code, not any other value.

If no frame, null frame, or corrupted frame is received in a slot, the buffer contents prior to the reception shall not be deleted or overwritten. The discrepancy to the configured frame should be signaled to the host using a suitable bit in the corresponding buffer status register.

An indicator shall be provided for each dedicated receive message buffer to indicate if it contains new data (updated by the CC since last read). The host is responsible for clearing this flag after the read operation.

The CC shall not store frame data into a dedicated receive buffer that the host is reading.

The host shall not have write access to the dedicated receive buffers during normal operation. The host shall have write access to the dedicated receive buffers only while configuring the buffer in CC_SoftReset with the needed parameters for the dedicated receive process.

Null Frame Reception

The payload of a received Null Frame shall not be copied into the matching mailbox receive buffer. The reception of the Null Frame shall be signaled to the host by setting an appropriate bit in the receive buffer status register. (See below)

FIFO Receive Buffers

A portion of the CC's message buffers can be configured as FIFO receive buffers.

The CC shall transfer only valid received messages from the serial receive message buffer to the FIFO receive buffer if there is no matching dedicated receive buffer and the header is not rejected by the FIFO Rejection filter (See below).

A FIFO receive message buffer shall contain all frame elements as defined in Chapter "Frame Formats", except the frame CRC.

An indicator shall be provided to indicate that a message was stored in a FIFO receive buffer by the CC. The indicator shall provide the information 'FIFO not empty'. The CC shall reset the flag after all messages have been accessed by the host.

The CC shall not store frame data into a FIFO receive buffer that the host is reading. The data shall be stored into the next free FIFO buffer.

Frame Status and Error Information (FSEI)

There shall be dedicated frame status and error information associated with each message buffer. The Frame Status and Error Information contains 8 bits which are summarized in the following Table 54:

receive buffer holds the same Frame ID and cycle counter filter, the error vector shall be updated in the first matching buffer.

Filtering and Masking

Definitions

Frame Filtering

Frame filtering shall be done by checking specific fields in a frame against corresponding configuration constants in the buffer, with the stipulation that the received frame shall only be processed further if the required matches occur. Otherwise, it shall be discarded. Frames shall be filtered on the following frame fields:

Channel Number

Frame Id

Cycle Counter

Message Id

Frame Filter Mask

The CC shall provide a mechanism to mask the frame filters. The filtering parameters masked by the host shall be disregarded (set to "don't care").

TABLE 54

Frame Status and Error Vector

| Status/Error Flag | Bits | Tx Buffer | Rx Buffer | FIFO Buffer |
|---|---|---|---|---|
| Null Frame (static segment only) | 1 | Null Frame transmitted | Null Frame received | Null Frame received |
| Empty Slot (static segment only) | 1 | — | No bus traffic detected | — |
| Bit Coding/CRC Error | 1 | — | Error detected (bit coding, header or frame CRC, in static segment only) | — |
| Length Mismatch | 1 | — | Length Mismatch detected (static segment only) | — |
| Slot Mismatch | 1 | — | Slot Mismatch detected | — |
| Cycle Counter Mismatch | 1 | — | Cycle Counter Mismatch detected (static segment) | — |
| Transmission Conflict | 1 | Start of transmission during ongoing reception | Start of Transmission during ongoing Reception | — |
| Empty Slot on second channel | 1 | — | No bus traffic detected on the other channel (static segment only) | — |
| Receive Error on second channel | 1 | — | Receive Error detected on the other channel (static segment only) | — |

The vector content shall be updated at the end of the corresponding slot (defined by the configured Frame ID, See Section 'Frame Status and Error Information (FSEI)') by the communication controller and can be checked by the host. The flags shall be set if one of the listed errors is detected by the communication controller during the frame acceptance checks. (See Chapter "Frame Processing") The vector content shall always show the status of the latest slot, which means that errors from previous cycles shall be overwritten.

The first seven flags refer specifically to the configured channel, on that the frame shall be received (see below), while the other two refer to the other channel.

In searching for Frame ID matches, searching shall commence with the first receive buffer. It shall proceed incrementally through the remaining receive buffers. If more than one Filtering Mechanisms The filtering mechanisms described below shall be applied differently for receive and transmit message buffers Receive buffer: In order to store a message the filters for channel Id, and cycle counter must match. In addition, depending on the configuration bit gMsgIdFilter (see Section 0) either the Frame Id (gMsgIdFilter='0') or the Message Id (gMsgIdFilter='1') must match (but not both).

Transmit buffer: A frame shall be transmitted in the time slot corresponding to the frame ID on the configured channel(s) if the cycle counter matches the configured cycle filter value.

Channel Filtering

There shall be a Channel Filtering field (2 bits) associated with each buffer. It serves as a filter for a receive message buffer, and as a control field for a transmit message buffer. Depending on the buffer configuration (see Table 55)

Receive buffer: received frames shall be stored if they are received on all the specified in the Channel Filtering Field. Other filtering criteria must also be met.

Transmit buffer: the content of the buffer is transmitted only on the channels specified in the Channel Filtering Field when the Cycle Counter Filtering and Frame Id Filtering criteria are also met.

TABLE 55

Channel Filtering Configuration

| Config. bit A | Config. bit B | Tx Buffer Transmit frame | Rx Buffer Store valid Rx frame |
|---|---|---|---|
| 1 | 1 | on both channels | received on channel A or B (pick first valid) |
| 1 | 0 | on channel A | received on channel A |
| 0 | 1 | on channel B | received on channel B |
| 0 | 0 | no transmission | ignore frame |

Frame ID Filtering

Every Transmit and dedicated Receive message buffer shall contain a frame ID. This frame ID shall be used differently for receive and transmit message buffers.

Receive message buffers: A received message is stored in the first receive message buffer where the received frame ID matches the receive mailbox frame ID, provided gMsgIdFilter='0' and the other receive filtering criteria are also met. If Message Id filtering is being used (gMsgIdFilter='1'), this filter is not applied.

For Transmit buffers the frame ID in the buffer is used to determine the appropriate slot for the message transmission. The frame shall be transmitted in the time slot corresponding to the frame ID, provided the channel and cycle counter criteria are also met.

Cycle Counter Filtering

Cycle Counter Filtering is based on the notion of a Cycle Set. For filtering purposes, a match shall be detected if any one of the elements of the set is matched.

Cycle Set—A 9 bit register is used to specify which cycle numbers are elements of the set. It consists of two fields, the Base Cycle [b] and the Cycle Repetition [c]. The set of cycle numbers belonging to the set shall be determined from these two fields using the formula $b+n*2^c (n=0,1,2,\ldots)$:

Base Cycle [b]—A 6 bit cycle number used to identify the initial value for generating the cycle set Cycle Repetition [c]—A 3 bit value used to determine a constant repetition factor to be added to the base cycle (c=0 . . . 6).

The operation of the filtering mechanism depends on the configuration of the buffer:

Receive buffer: The received message is stored only if the received cycle counter matches an element of the buffer's Cycle Set. Channel, Frame Id or Message Id criteria must also be met.

Transmit buffer: The content of the buffer is transmitted when an element of the Cycle Set matches the current cycle counter and the frame ID matches the slot counter value. If the cycle counter does not match any cycle counter filter criteria from the configured transmit buffers with matching frame ID, a Null Frame shall be transmitted in the static segment. (See below).

Message ID Filtering

Message ID filtering applies only for receive message buffers and shall be used by the CC if the message Id filtering is configured (gMsgIdFilter='1') (see above). For message ID filtering the first two data bytes out of the receive buffer shall be used. The received frame shall be stored in the configured receive buffer if the message ID, channel and cycle counter match. The frame ID shall be stored in the buffer, but ignored for filtering.

There shall be no message ID filtering used for frame transmission.

FIFO Filtering

For FIFO filtering there shall be one Rejection Filter and one Rejection Filter Mask available. Each register consists of 39 bits for channel (2 bits), frame ID (12 bits), cycle counter (9 bits), and message ID (16 bits). The two registers shall be reconfigurable only in CC_SoftReset.

A received frame shall be stored in the next free FIFO buffer if the channel, frame ID, cycle counter, and message ID are not rejected by the configured reject and mask reject filter and if there is no matching dedicated receive buffer available.

General Interrupts

Interrupts shall be triggered almost immediately when an error is detected by the controller, a frame is received or transmitted, or a configured timer interrupt is activated. This enables the host to react very quickly on specific error conditions, timers and events. The CC shall support disable/enable controls for each individual interrupt, separately and as a whole.

Tracking status and generating interrupts when a status change occurs shall be two independent tasks. Regardless of whether an interrupt is enabled, or not, the corresponding status should be tracked and indicated by the CC.

At least one hardware interrupt line shall be available to signal an interrupt to the host.

General Interrupt Register

The communication controller shall provide a General Interrupt and Error Indication Register.

TABLE 56

General Interrupt Register

| General Interrupt Flag | Bits | Receiver | Channel |
|---|---|---|---|
| Bit Coding/CRC Error | 1 | Error detected (bit coding, header or frame CRC) | A |
| Slot Mismatch | 1 | Slot Mismatch detected | A |
| Cycle Counter Mismatch | 1 | Cycle Counter Mismatch detected | A |
| Length Mismatch | 1 | Length Mismatch detected | A |
| Unaccepted Symbol | 1 | Unexpected symbol reception | A |
| Symbol Normal | 1 | Symbol Normal received | A |
| Symbol Alarm | 1 | Symbol Alarm received | A |
| Bit Coding/CRC Error | 1 | Error detected (bit coding, header or frame CRC) | B |
| Slot Mismatch | 1 | Slot Mismatch detected | B |
| Cycle Counter Mismatch | 1 | Cycle Counter Mismatch detected | B |
| Length Mismatch | 1 | Length Mismatch detected | B |
| Unaccepted Symbol | 1 | Unexpected symbol reception | B |
| Symbol Normal | 1 | Symbol Normal received | B |
| Symbol Alarm | 1 | Symbol Alarm received | B |

The flags shall be set when the communication controller detects one of the listed errors or events. (See Sections 'Channel Status and Error Information (CSEI)' and 'Frame Reception') If the host checks the vector, it must reset the values so that the CC can update them.

The communication controller shall provide a General Error Interrupt, which shall be triggered when any of the flags is set, provided the corresponding interrupt is enabled.

General Interrupt Enable Register

The CC shall provide for each general interrupt indication flag a General Interrupt Enable flag. The settings in the General Interrupt Enable Register determine which status changes in the General Interrupt Register shall result in an interrupt.

Receive Interrupt Status Register

The communication controller shall provide a Receive Interrupt Status Register to indicate the reception of a valid frame (stored in one of the receive buffers), a Collision Avoidance Symbol (CAS), a Wake-up Symbol, a Media Access Test Symbol (MTS), an Event Indication Symbol (EIS), a Status Normal Symbol (SNS), a Status Alarm Symbol (SAS) or an optical diagnosis signal (when using an optical physical layer). The flags shall be set by the CC when a corresponding event occurs. If enabled, an interrupt is pending while one of the bits is set. If the host checks the vector, it must reset the values so that the CC can update them.

Following read-only bits shall be readable by host:
    Receive Interrupt Flag
    The flag shall be set by the CC when a frame was received and stored in one of the dedicated receive buffers.
    Receive FIFO Not Empty Interrupt Flag
    The flag shall be set by the CC when a frame was received and stored in one of the FIFO buffers.
    Receive FIFO Overrun Interrupt Flag
    The flag shall be set by the CC when a Receive FIFO Overrun was detected.
    Collision Avoidance Symbol Interrupt Flag
    The flag shall be set by the CC when a CAS was received.
    Wake-up Symbol Interrupt Flag
    The flag shall be set by the CC when a Wake-up Symbol was received.
    Media Access Test Symbol Flag
    The flag shall be set by the CC when a MTS was received.
    Event Indication Symbol Flag
    The flag shall be set by the CC when an EIS was received.
    Optical Diagnosis Flag
    The flag shall be set by the CC when an optical diagnosis signal was received.
    Status Normal Symbol Flag
    The flag shall be set by the CC when a SNS was received.
    Status Alarm Symbol Flag
    The flag shall be set by the CC when a SAS was received.
    Network Management Vector Change Flag
    The flag shall be set by the CC when the optional NM services are implemented, and a change in the NM vector occurred. (See below)

Receive Interrupt Enable Register

The communication controller shall provide a Receive Interrupt Enable Register to enable each of the Receive Interrupt Status Register flags separately. The settings in the Receive Interrupt Enable Register determine which status changes in the Receive Interrupt Status Register shall result in an interrupt.

General Error and Status Interrupt Enable Register

The CC shall provide an interrupt enable flag to individually enable each of the following status and errors:

Clock Correction Failure; This flag enables an interrupt whenever one of the following errors occur:
    Missing Rate Correction Signal (MRCS)
    Missing Offset Correction Signal (MOCS)
    Clock Correction Failed Counter (CCFC) stopped at 15
    Clock Correction Limit Reached (CCLR)
    The interrupt shall be raised at the end of the cycle after the listed errors have been checked.
    Protocol Error State; This flag enables an interrupt whenever the error state will change from "Green" to "Yellow" or to "Red".
    Startup: This flag enables an interrupt whenever one of the following events occur:
    Coldstart max reached
    Coldstart path has been entered due to the expiration of pStartupNoise
    Normal state entered via coldstart path
    Plausibility check failed (during startup)
    Bus Guardian Schedule Monitoring Error (BGME)
    Media Access Test Warning
    Wakeup; This flag enables an interrupt whenever one of the following events occur:
    Frame Header Received during Wakeup
    Wakeup Symbol Received
    Wakeup Failed
    Wakeup Complete The settings in the General Error and Status Interrupt Enable Register determine which status or error flags changes shall result in an interrupt. (See above)

Requirements for Optional Mechanisms

Network Management Services

If NM services are supported, the CHI shall provide the following:

four bits to configure the length of the NM vector (gNetworkManagementVectorLength), (0 to 12 bytes); may be modified only in CC_SoftReset. The configured length must be identical in all nodes of a cluster.
    one bit to configure the starting point of the NM vector in the data field (byte 0 if bit not set, byte 2 if bit set); may be modified only in CC_SoftReset. The configured starting point must be identical in all nodes of a cluster.
    one register (with in the implementation specified 8 to 12 bytes) to hold the NM vector as a result of a logical OR operation over all received NM vectors in the previous cycle. The CC shall perform the OR operation over all NM vectors out of all received NM frames with the fNMIndicationBit set. (See Section 'Network Management Indication Bit') The CC shall update the NM vector at the end of the cycle.
    one interrupt flag to signal a change in the NM vector visible to the host.
    one interrupt enable bit.

Optical Diagnosis Flags

If the optical diagnosis service is supported, the CHI shall provide the following:

Two Optical Diagnosis Flags (one for each channel)
    The flags shall be set by the CC when too low optical power was received by the optical transceiver and signaled to the CC. If the host checks the flags, it must reset them so that the CC can update them.

Implementation Example

Mailbox Buffer Control Register Fields

The CHI shall provide one Buffer Control Register to configure the message mailbox buffers (as Transmit, Dedicated Receive or FIFO Receive buffer) and to control host's access to the message buffers.

This control register shall provide one byte for each mailbox buffer.

TABLE 57

Mailbox Buffer Control Register Fields

| Control Flag | Bits | Tx Buffer | Rx Buffer | FIFO Buffer | Comment |
|---|---|---|---|---|---|
| CFG | 1 | '1' = Transmit Buffer | '0' = Receive Buffer | '0' | Message Buffer Configuration Bit |
| CFG_SR | 1 | '1' = Mailbox Buffer and the associated filter can be configured only during CC_SoftReset. | '1' = Buffer and the associated filter can be configured only during CC_SoftReset. | — | '0' = Mailbox Buffer and the associated filter can be configured during normal operation. |
| Transmission Mode | 1 | '1' = Single-shot Mode (transmit Null Frame if buffer not updated, Commit flag = '0') '0' = Continuous Mode (See above) | — | — | only for static slots |
| Commit Flag | 1 | '0' = buffer not updated, '1' = buffer committed for transmission; Host explicitly sets the Commit flag when the buffer is ready for transmit. The Commit flag is reset by the CC after transmission has been completed in the "Single-shot" mode only. (See above). | '1' = buffer updated (valid), '0' = not updated; Host shall explicitly clear the flag after reading the data. | — | Commit Flag |
| IENA | 1 | '1' = Interrupt enabled | '1' = Interrupt enabled | — | Commit Interrupt Enable |
| ABTRQ | 1 | '1' = Abort request; Message shall be aborted at next start of cycle if transmission has not been started before. | — | — | Abort Request |
| ABTAK | 1 | '1' = Message has been aborted. | — | — | Abort Acknowledge |
| LOCK | 1 | '1' = lock, '0' = release | '1' = lock, '0' = release | — | Message Buffer Lock. A locked buffer is visible to the host. |

(Note: The host can modify the control flags CFG and CFG_SR only during CC_SoftReset.)

Indication of Bus Events

The communication controller shall provide additional output signals to indicate the following events:

TABLE 58

Bus Event Indication

| Event | Description |
|---|---|
| Status Normal Symbol (SNS) detected on bus | SET_SNSIF |
| Status Alarm Symbol (SAS) detected on bus | SET_SASIF |
| Correct message was received which may be copied into a receive buffer | SET_RCVMSG, even if message is not copied into any buffer (in case no adequate receive buffer is configured) |
| One of following errors detected during the receive process: S_TssViolation, S_HeaderCodingError, S_InvalidHeaderCRC, S_FrameCodingError, S_InvalidFrameCRC. (See Section 'Syntactical Correctness') | SET_ERRIF |
| Slot mismatch detected (S_FrameIDError). (See Section 'Frame Acceptance') | SET_SLMM |

TABLE 58-continued

Bus Event Indication

The exact attribution of events to interrupt vectors or lines shall be described in the documentation of the respective communication controller implementation.

In order to enable error monitoring in a star node the communication controller shall provide four output signals with the setting of internal status flags indicated by means of a pulse.

Figure 102:
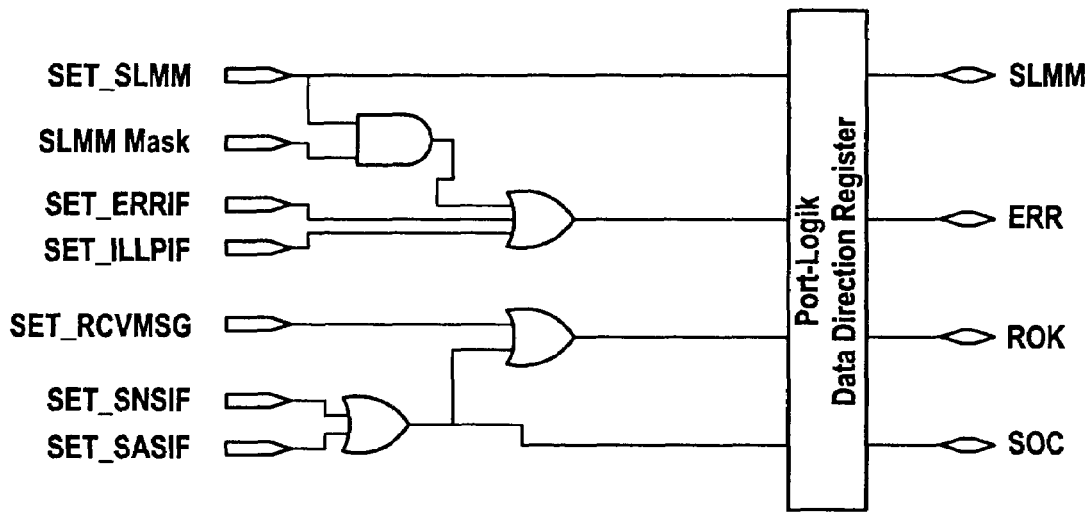
FIG. 102 illustrates internal bus events, which are indicated externally.

The FIG. 102 shows which internal events should be indicated externally as SLMM, ERR, ROK and SOC signals.

If an internal event is indicated, the corresponding signal shall be switched to the active state for a defined time, in order to generate a short logical "1" signal with a duration of at least 50 ns.

The SLMM signal confirms the reception of a frame with a correct format and correct CRC, even if the frame identifier deviates from the slot counter value at reception time.

The ERR signal indicates an error as described above.

The ROK signal indicates that a correct frame or a valid symbol has been received even if the message was not copied into a buffer in the communication controller.

The SOC signal confirms that a valid SOC symbol (Normal or Alarm) has been received or sent. It can be used to trigger timers or to start synchronized software tasks with every SOC.

Every communication controller should be able to generate at least the signals ERR, ROK and SOC.

System Parameters

The following parameters are used in the description of the present invention. Any values and ranges of the parameters are given by way of example and imply no restriction what so ever.

Protocol Constants

| Name | Description | Value | Unit |
|---|---|---|---|
| cControllerMax | The maximum number of nodes in a cluster | 64 | — |
| cCycleMax | The maximum cycle counter in a cluster | 63 | — |
| cMaxChannels | The maximum number of supported channels | 2 | — |
| cPaddingValue | Value of the data byte used for padding of static frames in case pMaxPayloadLength is smaller than fPayloadLength | 0 | — |
| cPayloadLengthMax | Maximum length of the payload segment of a frame | 127 | 2-byte words |
| cSlotIDMax | The highest slot ID number | 4095 | — |
| cStarCouplersMax | The largest allowed number of cascaded star couplers between any two nodes in a cluster | 3 | — |
| cSyncNodeMax | The maximum possible number of sync nodes | TBD | — |

Global Cluster Constants

| Name | Description | Range | Unit |
|---|---|---|---|
| gChannels | The number of channels supported by the cluster. Note: there is also a node constant pChannels, which reflects the connectivity of each specific node | 1-cMaxChannels | — |
| gColdStartMax | The maximum number of times that a node in this cluster is permitted to attempt to start the cluster by initiating schedule synchronization | 0-TBD | — |
| gdActionPointOffset | The offset of the action point | 1-TBD | MT |
| gdBGArmActive | Duration of the Bus Guardian ARM signal low condition | 1 | MT |
| gdBGDynSegment | Bus Guardian dynamic segment length | 0-65534 | MT |
| gdBGpostEnablePart | Bus Guardian ISG part that follows a guarded schedule element | 0-TBD | MT |
| gdBGpreEnablePart | Bus Guardian ISG part that precedes a guarded schedule element | 0-TBD | MT |
| gdBGStaticSlot | Bus Guardian Static slot length (Does not include the inter-slot gap.) | 0 to 4095 | MT |
| gdBGSymbolWindow | Bus Guardian symbol window length | 0 to 255 | MT |
| gdBGWatchdogDisable | Bus Guardian watchdog disable time | 1 to 255 | MT |
| gdBit | The configured duration of one bit. The value is derived from gBitRate. | TBD | ns |
| gdCycle | The duration of one communication cycle in this cluster | 250-64000 | μs |
| gdCycleMax | Maximum duration of a byteflight communication cycle | TBD | ?? |
| gdCycleMIn | Minimum duration of a byteflight communication cycle | TBD | ?? |
| gdDynamicSlotIdlePhase | The duration of the dynamic slot idle phase | 1-TBD | Minislots |
| gdInitialColdStartPhase | Period for which a node remain in CC_ColdStartICW state, if no incident causes the transition into CC_StartupListen beforehand; this is not a configuration parameter | 3* gdCycle + gdSlot | MT |
| gdMaxDrift | Maximum drift offset between two node that operate with unsynchronized clocks over one communication cycle | TBD | MT |
| gdMedPropagationDelay (not a global constant) | The medium expected propagation delay of a signal (including transceiver delays, wire delays and controller internal delays) in the cluster | TBD | μT |

-continued

| Name | Description | Range | Unit |
|---|---|---|---|
| gdMinislot | The duration of a minislot | 2-TBD | MT |
| gdMsActionPointOffset | The offset of the action point within the minislot | 1-TBD | MT |
| gdNIT | The duration of the network idle time | TBD-TBD | MT |
| gdStartup | Upper limit for the listen-timeout in CC_StartupListen state (before a sync node is allowed to become a coldstart node). See also vdStartup. | gdStartup = gdCycle + gdMaxDrift | MT |
| gdStaticSlot | The duration of a static slot. | 2-TBD | MT |
| gdSymbolWindow | The duration of the symbol window | 0-TBD | MT |
| gSyncNodeMax | The maximum number of sync nodes allowed for this cluster | 0-16 | — |
| gdWakeup | Upper limit for the listen-timeout in CC_WakeupListen state (before a sync-Node is allowed to transmit the Tx-wakeup pattern); (this is not a configuration parameter) | gdWakeup = gdStartupt = gdCycle + gdMaxDrift | MT |
| gdWakeupMaxCollision | Duration of 'active low' on the bus that a communication controller sending a Tx-wakeup pattern accepts during the idle phase of the pattern without re-entering the CC_WakeupListen state. | TBD | gdBit |
| gdWakeupPattern | Maximal number of repetitions of the Tx-wakeup symbol to be sent during the CC_WakeupSend state of any Node in the cluster. | 15 | — |
| gdWakeupSymbolRxIdleMin | The equivalent of 6 μs minus a safe part. (Collisions, clock differences and other effects can deform the Tx-wakeup pattern.) To be used by the communication controller for the 'idle' part of the CheckRxWakeupSymbol test | TBD | gdBit |
| gdWakeupSymbolRxLow | The equivalent of 6 μs minus a safe part. (Active stars, clock differences and other effects can deform the Tx-wakeup pattern.) To be used by the communication controller for the 'active low' parts of the CheckRxWakeupSymbol test | TBD | gdBit |
| gdWakeupSymbolRxWindow | The equivalent of 30 μs plus a safe part. (Clock differences and other effects can deform the Tx-wakeup pattern.) To be used by the communication controller for the CheckRxWakeupSymbol test | TBD | gdBit |
| gdWakeupSymbolTxIdle | The equivalent of 18 μs (rounded up). To be used by the communication controller for the transmission of the 'idle' part of the Tx-wakeup symbol | TBD | gdBit |
| gdWakeupSymbolTxLow | The equivalent of 6 μs (rounded up). To be used by the communication controller for the transmission of the 'active low' part of the Tx-wakeup symbol | TBD | gdBit |
| gMacroPerCycle | The configured duration of the cluster cycle in macroticks | TBD | MT |
| gMaxWithoutClockCorrectionFatal | Threshold concerning CCFC. Defines when the CC shall change from green or yellow into red error state | [gMaxWithoutClockCorrection-Passive-15] | Number of even/odd cycle pairs |
| gMaxWithoutClockCorrectonPassive | Threshold concerning CCFC. Defines when the CC shall change from green into yellow error state | 1-7 | Number of even/odd cycle pairs |
| gMsgIdFilter | Indicates that Message ID filtering is used within the cluster and that the first two bytes of the payload segment contain Message ID data | Boolean | — |
| gNetworkManagementVectorLength | Length of the Network Management vector in a cluster | 0-12 | Bytes |
| gNumberOfMinislots | The duration of the dynamic segment | 0-TBD | Mini slots |
| gNumberOfStaticSlots | The number of static slots in the static segment. | 1-cSlotIDMax | Slots |
| gOffsetCorrectionInitOut | The maximum offset value permitted for the first offset correction in CC_IntegrationVCW state. (This constant is the basis for the calculation of the controller specific parameter (see pOffsetCorrectionInitOut)) | TBD | MT |
| gOffsetCorrectionOut | The maximum offset correction permitted. (This constant is the basis for the calculation of the controller specific parameter (see pOffsetCorrectionOut)) | TBD | MT |

-continued

| Name | Description | Range | Unit |
|---|---|---|---|
| gPayloadLengthStatic | Globally configured payload length of a static frame | 0-cPayloadLengthMax | 2-byte words |
| gRateCorrectionOut | The maximum rate correction permitted (This constant is the basis for the calculation of the controller specific parameter (see pRateCorrectionOut)) | TBD | MT |
| gStartupNoise | Upper limit for the start up listen timeout in the presence of noise. Expressed as a multiple of the cluster constant gdStartup. | TBD | — |
| gSyncNodeMax | The maximum number of sync nodes allowed in the cluster | 1-cSyncNodeMax | — |
| gWakeupMax | The maximum number of times that a Node in this cluster is permitted to attempt to send a Tx-wakeup pattern. | TBD | — |
| gWakeupNoise | Upper limit for the wakeup listen timeout in the presence of noise. Expressed as a multiple of the cluster constant gdWakeup. this is not a configuration parameter! | gWakeupNoise = gStartupNoise | — |
| gWakeupPattern | Number of repetitions of the Wakeup symbol | 2-TBD | — |

Cluster-Wide Technology-Dependent Constants (The constants listed here define implementation-specific restrictions. The specified values apply for the FlexRay bus guardian from Philips. Worst-case restrictions apply to the whole cluster if bus guardian devices from different semiconductor vendors are mixed in a cluster.)

| Name | Description | Range | Unit |
|---|---|---|---|
| gdBGMinMTNom | Minimum nominal MT period | 1.0 | µs |
| gdBGMinMTCorr | Minimum corrected MT period | 0.5 | µs |
| gdBGMinBGTPeriod | Minimum BGT period | 0.25 | µs |
| gdBGMinPwMT | Minimum MT pulse width (low or high) | 0.4 * pdMTPeriod | — |
| gdBGMinPwBGT | Minimum BGT pulse width (low or high) | 0.4 * pdBGTPeriod | — |

Node Constants

| Name | Description | Range | Unit |
|---|---|---|---|
| pBGDynSegEnable | Indicates that a bus guardian enables transmission during the dynamic segment | Boolean | — |
| pBGMatEnable | Indicates that a bus guardian enables the application of the media access test during the symbol window | Boolean | — |
| pBgsmDynSegDisabled | | Boolean | — |
| pBgsmSymWinDisabled | | Boolean | — |
| pBGSymWinEnable | Indicates that a bus guardian enables transmission during the symbol window | Boolean | — |
| pChannels | number of channels supported by the node (Note: there is also a cluster constant gChannels) | 1-gChannels | — |
| pClusterDriftDamping | Cluster drift damping value used in clock synchronization to minimize accumulation of rounding errors | TBD | µT |
| pdBgeDynamicDuration | Duration of the BGE active phase during the BG dynamic segment | 0-65534 | MT |
| pdBgeStaticDuration | Duration of the BGE active phase during active static slots | 0-4095 | MT |
| pdBgeSymbolDuration | Duration of the BGE active phase during the BG symbol window | 0-255 | MT |
| pdBGMTPeriod | Configured nominal Bus Guardian MT period | TBD | µ |
| pdBGTPeriod | Configured Bus Guardian BGT period | TBD | µ |
| pdCycleWithHistory | Upper limit for timeout that covers a period, which is large enough that any periodic transmission that complies to the global communication schedule is visible for an unsynchronized node at least once (Note: this is not a configuration parameter) | gdStartup | MT |
| pdEISSymbCycleMax | Slave node, maximal appearance interval for the CC trigger | TBD | MT |

-continued

| Name | Description | Range | Unit |
|---|---|---|---|
| pdEISSymbCycleMin | Slave node, minimal appearance interval for the CC trigger | TBD | MT |
| pDelayCompensationChA | Value used to compensate for reception delays on channel A | | µT |
| pDelayCompensationChB | Value used to compensate for reception delays on channel B | | µT |
| pdExTrigCycleMax | For the master node in an Event Triggered Mode system, maximal appearance interval for the CC trigger | TBD | MT |
| pdExTrigCycleMin | Master node, minimal appearance interval for the CC trigger | TBD | MT |
| pdMasterEIStoEndOfNIT | Master node, duration between reference point in the EIS symbol and begin of next cycle (which is also the end of NIT) | TBD | µT |
| pdSlaveEIStoEndOfNIT | Slave node, duration between reference point in the EIS symbol and begin of next cycle (which is also the end of NIT) | TBD | µT |
| pdTSS | Duration of the Transmission Start Sequence | 1-15 | gdBit |
| pdWakeupPattern | Number of repetitions of the Tx-wakeup symbol to be sent during the CC_WakeupSend state. | 0-gdWakeupPattern | — |
| pEdgeSamples | Width of the edge detection window in the Bit Clock Alignment procedure | TBD | — |
| pLatestTx | The number of the last minislot in which transmission can start in the dynamic segment for the respective node | 0-TBD | Minislots |
| pMaster | Denotes that the node is configured as the sync master in byteflight mode | Boolean | — |
| pMaxPayloadLength | Maximum number of payload data bytes stored in a message buffer | 12-127 | 2-byte words |
| pMicroOverheadPerCycleNom | The node-specific initial value of the node variable vRateCorrection | TBD | µT |
| pMicroPerMacroMax | Maximum number of microticks for one macrotick | TBD | µT |
| pMicroPerMacroMin | Minimum number of microticks for one macrotick | TBD | µT |
| pMicroPerMacroNom | The nominal (uncorrected) number of microticks in a macrotick | TBD | µT |
| pOffsetCorrectionInitOut | Parameter determining the upper and lower boundaries between the red and green areas of the clock offset correction term, applied only the first time an offset correction term is available in CC_IntegrationVCW state, expressed in node-local microticks. pOffsetCorrectionOut = gOffsetCorrectionInitOut * pMicroPerMacroNom | TBD | µT |
| pOffsetCorrectionOut | Parameter determining the upper and lower boundaries between the red and green areas of the clock offset correction term, expressed in node-local microticks. pOffsetCorrectionOut = gOffsetCorrectionOut * pMicroPerMacroNom | TBD | µT |
| pRateCorrectionInitOut | Parameter determining the upper and lower boundaries for the initial rate correction allowed for rate adoption during CC_InitSync state | TBD | µT |
| pRateCorrectionOut | Parameter determining the upper and lower boundaries between the red and green areas of the clock rate correction term, expressed in node-local microticks. pRateCorrectionOut = gRateCorrectionOut * pMicroPerMacroNom | TBD | µT |
| pSamplesPerBit | The number of samples taken in the determination of a bit value | TBD | — |
| pSyncNode | Indicates that the node is a sync node (sync slot configured; connected to gChannels) | Boolean | — |
| pSyncSlot | The number of the static slot in which a sync frame shall be sent, if a sync frame shall be sent. | 0-cSlotIDMax | Slots |
| pVotingOffset | Number of samples skipped prior to the voting window in bit value voting | TBD | — |
| pVotingSamples | Numbers of samples used in bit value voting | TBD | — |

Node Variables

| Name | Description | Range | Unit |
|---|---|---|---|
| lbgsmRule | Local variable for BG schedule monitoring service | BGE_X, BGE_ENABLED, BGE_DISABLED | — |
| vBgsmError | Variable indicating that the Bus Guardian Schedule Monitoring service has detected an error | Boolean | — |
| vBgsmErrorAck | Variable allowing the host to acknowledge the detection of a Bus Guardian Schedule Monitoring error | Boolean | — |
| vCCLR | The calculated rate correction value or calculated offset correction value is beyond the specified limit | Boolean | — |
| vColdStartCount | Counter for number of cycles/transitions for which the node has been in the coldstart path | 0-gColdStartMax | — |
| vColdStartInhibit | Denotes that the node is not allowed to enter coldstart path | Boolean | — |
| vCurrentSlot | Number of the current slot. Note that this is slightly different to fFrameID as it is independent of frame reception. | 1-cMaxStaticSlot | slots |
| vCycle | Cycle counter of the current communication cycle | 0-gCycleMax | — |
| vdCycleWithHistory | Timeout counter that covers a period, which is large enough that any periodic transmission that complies to the global communication schedule is visible for an unsynchronized node at least once | 0-pdCycleWithHistory | MT |
| vdInitialColdStartPhase | Timer for the period for which a node remain in CC_ColdStartICW state, if no incident causes the transition into CC_StartupListen beforehand | 0-gdInitialColdStartPhase | MT |
| vdStartup | Listen-timeout (counter) in CC_StartupListen state | 0-gdStartup | MT |
| vdStartupNoise | Listen-timeout (counter) with noise in CC_StartupListen state | 0-pdStartupNoise * gdStartup | MT |
| vdWakeup | Listen-timeout (counter) in CC_WakeupListen state for fast Wakeup. | 0-gdWakeup | MT |
| vdWakeupNoise | Listen-timeout (counter) in CC_WakeupListen state. | 0-gdWakeupNoise * gdWakeup | MT |
| vErrorHandlingLevel | Current Error Handling Level | [Green, Yellow, Red] | — |
| vGloNMVec | The network management vector provided by the CHI service "network management" | Bit vector of 12 bytes | — |
| vInvalidSyncCount[ch] | Counters for invalid SYNCFrame$_{StartupVCW}$ decisions; assigned per channel | 0-31 | — |
| vListenOnly | Denotes that the node is not allowed to transmit | Boolean | — |
| vMacrotick | Macrotick counter, number of the current macrotick | TBD | MT |
| vMeasureChx | Measure time; time difference between the expected and the observed arrival time of a frame with respect of run time compensation | TBD | |
| vMicroPerMacroCorr | Actual number of microticks during the current (corrected) macrotick. The value of vMicroPerMacroCorr can change from macrotick to macrotick in a cycle. | TBD | µT |
| vMicrotick | Microtick counter, number of the current microtick | TBD | µT |
| vMOCS | The calculation of an offset correction value was not possible in the clock synchronization mechanism | TBD | Boolean |
| vMRCS | The calculation of a rate correction value was not possible in the clock synchronization mechanism | TBD | Boolean |
| vNoise | Denotes that coldstart path has been entered due to the expiration of pdStartupNoise | Boolean | — |
| vObservedArrivalTimeCh | Time when a frame arrived | TBD | TBD |
| vOffsetCorrection | Signed integer indicating the number of microticks the node should shift the start of its communication cycle. | TBD | µT |
| VoffsetCorrectionExternal | External correction term for the offset correction | TBD | µT |

-continued

| Name | Description | Range | Unit |
|---|---|---|---|
| vOffsetOut | Denotes that the application of the extended limit setting for the offset correction term check is prohibited | Boolean | — |
| vRateCorrection | Rate correction value; number of microticks which should the added or subtracted from a communication cycle | TBD | µT |
| vRateCorrectionExternal | External correction term for the rate correction | TBD | µT |
| vRefSync | The identifier of the sync frame which was originally used to enter the integration path | 0-4095 | — |
| vRxSymbol | Denotes which symbol was received during the symbol window | [no_symbol, SNS, SAS, MTS] | — |
| vSlotCounter[ch] | Slot counter for channel ch | 0-cSlotIDMax | Slots |
| vsMeasureEvenList | List of the time difference values (observed time minus expected time) measured for sync frames received during an even cycle. (Note: If valid sync frames are received on both channels the list entry corresponds to the difference value associated with the earlier sync frame (after taking delay compensation into account) | TBD | µT |
| vsMeasureOddList | List of the time difference values (observed time minus expected time) measured for sync frames received during an odd cycle. | TBD | µT |
| vSMMS | Indicates that the CC has received a set of sync frames during protocol startup phase that did not result in a majority of the sync frames agreeing with the local view of the system time | TBD | Boolean |
| vSyncPairs | The number of corresponding sync pairs gathered during the rate measurement phase and available for calculation of the rate correction term | 0-gSyncNodeMax | — |
| vTxSymbol | Denotes which symbol is to be transmitted during the symbol window | [no_symbol, SNS, SAS, MTS] | — |
| vValidSyncCount[ch] | Counters for valid SYNCFrame$_{StartupVCW}$ decisions; assigned per channel | 0-gSyncNodeMax | — |
| vValidSyncFrameCount | Counter for valid SYNCFrame$_{StartupPCW}$ decisions per slot during gdPlausibilityCheckWindow | 0-cSyncNodeMax | — |
| vWakeupSymbolReceived | Status flag indicating the abort of wakeup due to a received Rx-wakeup symbol. | TBD | — |
| vWakeupChannel | Variable that defines which channel shall be woken. It captures the value of the 'Wake Up Channel Select' control bit. | TBD | — |
| vWakeupComplete | Status flag indicating the transmission of a Tx-wakeup pattern. | TBD | — |
| vWakeupCount | Counter for number of attempts to transmit Tx-wakeup patterns. | 0-gWakeupMax | — |
| vWakeupFailed | Status flag indicating the abort of wakeup due to gWakeupMax aborted attempts to send a Tx-wakeup pattern. | TBD | — |
| vWakeupFrameHeaderReceived | Status flag indicating the abort of the wakeup due to a frame header. | TBD | — |

Frame Variables

| Name | Length | Description |
| --- | --- | --- |
| fCycleCount | 6 | Cycle count |
| fData | 0...2032 | Data |
| fData[x] | 8 | Byte x of the data from fFrameData |
| fFrameCRC | 24 | Frame CRC |
| fFrameID | 12 | Frame ID |
| fHeaderCRC | 11 | Header CRC |
| fLocNMVec | 96 | Network management vector extracted from the frame's payload section if fNMIndicationBit is set to one |
| fMessageID | 16 | Message ID |
| fNMIndicationBit | 1 | Network management indication bit |
| fNullFrameIndicationBit | 1 | Null frame indication bit |
| fPayloadLength | 7 | Payload length |
| fReservedBit | 1 | Reserved bit |
| fSyncBit | 1 | Sync bit |

Event Indications

| Name | Description | Range | Unit |
| --- | --- | --- | --- |
| S_CASReception | Indicates the reception of a valid CAS symbol on one of the configured channels | Event | — |
| S_ChannelIdleCodingError | | Event | — |
| S_CorrectFrame | Indicates the reception of a syntactically correct frame that successfully passed all frame reception criteria | Event | — |
| S_CycleCounterError | | Event | — |
| S_CycleCountError | Indicates the violation of the corresponding static segment acceptance criterion | Event | — |
| S_CycleCountError | | Event | — |
| S_EmptySlot | | Event | — |
| S_FrameCodingError | | Event | — |
| S_FrameIDError | Indicates the violation of the corresponding static segment acceptance criterion | Event | — |
| S_FrameIDError | | Event | — |
| S_HeaderCodingError | | Event | — |
| S_IllegalNullFrame | | Event | — |
| S_IllegalSyncBit | | Event | — |
| S_InvalidDTSError | | Event | — |
| S_InvalidFrameCRCError | | Event | — |
| S_InvalidFrameLengthError | | Event | — |
| S_InvalidHeaderCRCError | | Event | — |
| S_PayloadLengthError | | Event | — |
| S_PayloadLengthStaticError | Denotes the violation of the corresponding static segment acceptance criterion | Event | — |
| S_SuccessfulHeaderReception | Denotes the reception of a frame header on one of the configured channels | Event | — |
| S_TransmissionConflictError | | Event | — |
| S_Trig_Symb_Failure | Event indication symbol Failure | Event | — |
| S_TSSError | | Event | — |
| S_ValidEvenStartupFrame | Denotes the reception of a sync frame with an even fCycleCount that passed the startup acceptance criteria | Event | — |
| S_ValidFrame | | Event | — |
| S_ValidOddStartupFrame | Denotes the reception of a sync frame with an odd fCycleCount that passed the startup acceptance criteria | Event | — |
| S_ValidStartupFrame | Denotes the reception of a sync frame that passed the startup acceptance criteria | Event | — |

Glossary

In the following glossary some of the terms used for the description of the present invention are defined.

| | |
|---|---|
| μT | Microtick |
| Application Data | Data produced and/or used by application tasks. In the automotive context the term 'signal' is often used for application data exchanged among tasks. |
| BCA | Bit Clock Alignment |
| BD | Bus Driver |
| BDe | Electrical Bus Driver |
| BDo | Optical Bus Driver |
| BF | byteflight (protocol mode) |
| BG | Bus Guardian |
| BGME | Bus Guardian Schedule Monitor Error (error signal) |
| BGSM | Bus Guardian Schedule Monitor |
| BSD | Bit Stream Decoding |
| BSS | Byte Start Sequence |
| Bus | A communication channel in bus topology. Sometimes the word "bus" is used as synonym for communication channel. |
| byteflight | Communication network developed by BMW AG, Motorola, ELMOS, Infineon, Siemens EC, Steinbeis Transferzentrum für Prozessautomatisierung, and IXXAT. |
| CAS | Collision Avoidance Symbol |
| CC | Communication Controller - The device that implements the FlexRay protocol |
| CCFC | Clock Correction Failed Counter |
| CCLR | Clock Correction Limit Reached (error signal) |
| CCMS | Coldstart Count Maximum Signal (error signal) |
| Channel Idle | The condition of medium idle as perceived by each individual node in the network. |
| CHI | Controller Host Interface |
| Cluster | A communication system of two or more nodes connected via at least one communication channel directly (bus topology) or by star couplers (star topology). |
| Communication Channel | The inter-node connection through which signals are conveyed for the purpose of communication. The communication channel abstracts both the network topology, i.e. bus or star, as well as the physical transmission medium, i.e. electrical or optical. |
| CRC | Cyclic Redundancy Code |
| CSEI | Channel Status and Error Information |
| Cycle Time | Time for one communication cycle. |
| DTS | Dynamic Trailing Sequence |
| Dynamic Segment | Portion of the communication cycle where the media access is controlled via a mini-slotting scheme, also known as Flexible Time Division Media Access (FTDMA). During this segment access to the media is dynamically granted on a priority basis to nodes with data to transmit. |
| Dynamic Slot | Variable duration unit used to control media access in the dynamic segment of a communication cycle. A dynamic slot is comprised of one or more minislots, as determined by the minislot FTDMA/ minislot media access scheme. The duration of a dynamic slot can vary from slot to slot in a given cycle, and from cycle to cycle for a given slot. Only one node may transmit in any given dynamic slot/channel combination. |
| EIS | Event Indication Symbol |
| ET | Event Triggered (protocol mode) |
| FES | Frame End Sequence |
| FIFO | First In, First Out (data buffer structure) |
| Frame | A structure used by the communication system to exchange information within the system. A frame consists of a header segment, a payload segment and a trailer segment. The payload segment is used to convey application data. |
| FSEI | Frame Status and Error Information |
| FTDMA | Flexible Time Division Multiple Access (media access method). This is another name for the minislot based media access method. |
| Hamming Distance | The minimum distance (i.e., the number of bits which differ) between any two codewords in a binary code |
| ICW | Initial Check Window |
| Macrotick | Unit of time derived from the cluster-wide clock synchronization algorithm. A macrotick consists of an integral number of microticks - the actual number of microticks in a given macrotick is adjusted by the clock synchronization algorithm. The macrotick represents the smallest granularity unit of the global time. |

| | -continued |
|---|---|
| Medium Idle | The condition of the physical transmission medium when no node is actively transmitting on the physical transmission medium |
| Microtick | Unit of time derived directly from the CC's oscillator. The microtick is not affected by the clock synchronization mechanisms, and is thus a node-local concept. Different nodes can have microticks of different durations. |
| Minislot | Fixed duration unit of time that is used to control the minislot/FTDMA media access scheme in the dynamic segment. A minislot consists of a configurable number of macroticks. All minislots in a cycle have the same duration (expressed in macroticks), and this duration is constant from cycle to cycle. |
| MOCS | Missing Offset Correction Signal (error signal) |
| MRCS | Missing Rate Correction Signal (error signal) |
| MT | Macrotick |
| MTS | Media Access Test Symbol |
| Network Topology | The arrangement of the connections between the nodes. FlexRay supports both a bus network topology and a multiple star network topology. |
| NIT | Network Idle Time |
| NM | Network Management |
| Node | A device connected to the network that is capable of sending and/or receiving frames. |
| NRZ | Non-Return to Zero (method of encoding) |
| Physical Communication Link | An inter-node connection through which signals are conveyed for the purpose of communication. All nodes connected to a given Physical Communication Link share the same electrical or optical signals (i.e., they are not connected through repeaters, stars, gateways, etc.). Examples of a Communication Physical Link include a bus network, or a point-to-point connection between a node and a star. A Communication Channel may be constructed by combining one or more Physical Communications Links together using stars. |
| SAS | Status Alarm Symbol |
| Slot | Either a Static Slot or Dynamic Slot, depending on context. |
| SMMS | Startup Majority Missed Signal (error signal) |
| SNS | Status Normal Symbol |
| Star | A device that allows information to be transferred from one physical communication link to one or more other physical communication links. A star duplicates information present on one of its links to the other links connected to the star, allowing clusters to be built from nodes supporting only point-to-point connections. A star can be either passive or active. |
| Static Segment | Portion of the communication cycle where the media access is controlled via a static Time Division Media Access (TDMA) scheme. During this segment access to the media is determined solely by the passage of time. |
| Static Slot | Fixed duration unit of time that is used to control media access in the static segment of a communication cycle. All static slots in a cycle have the same duration (expressed in macroticks), and this duration is constant from cycle to cycle. Only one node may transmit in any given a static slot/channel combination. |
| Sync Frame | FlexRay frame whose header segment contains information that indicates that the deviation measured between the frame's arrival time and its expected arrival time should be used by the clock synchronization algorithm. |
| TBD | To Be Determined |
| TDMA | Time Division Multiple Access (media access method) |
| TSS | Transmission Start Sequence |
| TT-D | Time Triggered Distributed Synchronization (protocol mode) |
| TT-M | Time Triggered Master Controlled Synchronization (protocol mode) |
| VCW | Validation Check Window |
| WUS | Wakeup Symbol |

We claim:

1. A method for bit stream decoding of a received bit stream, the method comprising the steps of:
   a) defining a detection window of sample values which are used to determine a value of a bit cell in a bit stream;
   b) applying a majority voting to said sample values within said detection window;
   c) generating a value of said bit cell in dependence on the results of step b); and
   d) decoding the bit stream using the bit cell values generated in step c), wherein said detection window is positioned at an expected edge between two bit cells of the bit stream to overlap at least one sample of a first bit cell and at least one sample of a subsequent bit cell, having respective sample values, in order to perform bit edge detection.

2. The method of claim 1, wherein said detection window comprises an odd number of samples.

3. The method of claim 1, wherein said detection window is centered on an expected center of a bit cell of the bit stream to only overlap samples of said bit cell for detecting a bit value of said bit cell.

4. The method of claim 3, wherein glitches or spikes in the bit stream are filtering out.

5. The method of claim 1, including:
sampling said bit cell in the received bit stream, to generate at least two sample values of said bit cell.

6. A method for bit stream decoding of a received bit stream, the method for comprising the steps of:
   a) defining a detection window of sample values which are used to determine a value of a bit cell in a bit stream;
   b) applying a majority voting to said sample values within said detection window;
   c) generating a value of said sampled bit cell in dependence on the results of step b); and
   d) decoding the bit stream using the bit values generated in step c), wherein said detection window is positioned on an expected center of said bit cell of the bit stream in dependence on a predetermined offset-parameter and in dependence on a predetermined parameter specifying a number of samples in said detection window to only overlap samples of said bit cell for detecting a bit value of said bit cell.

7. The method of claim 6, wherein said detection window comprises an odd number of samples.

8. The method of claim 6, wherein said detection window is centered on an expected center of a bit cell of the bit stream to only overlap samples of said bit cell for detecting a bit value of said bit cell.

9. The method of claim 7, wherein glitches or spikes in the bit stream are filtering out.

10. A device for decoding a received bit stream, the device comprising:
    means for defining a detection window of sample values which are used to determine a value of a bit cell in a bit stream;
    means for applying majority voting to said sample values within said detection window;
    means for generating a value of said sampled bit cell in dependence on results of said voting; and
    means for decoding the bit steam using the generated bit cell values, wherein said detection window is positioned at an expected edge between two bit cells of the bit stream according to a predetermined offset-parameter and according to a predetermined parameter specifying a number of samples in said detection window to only overlap samples of said bit cell for detecting a bit value of said bit cell.

11. A device for decoding a received bit stream, the device comprising:
    means for defining a detection window of sample values which are used to determine a value of a bit cell in a bit stream;
    means for applying majority voting to said sample values within said detection window;
    means for generating a value of said sampled bit cell in dependence on results of said voting; and
    means for decoding the bit steam using the generated bit cell values, wherein said detection window is positioned at an expected edge between two bit cells of the bit stream to overlap at least one sample of a first bit cell and at least one sample of a subsequent bit cell, having respective sample values, in order to perform bit edge detection.

12. The device of claim 11, wherein said detection window comprises an odd number of samples.

13. The device of claim 11, wherein said detection window is centered on an expected edge between two bit cells of the bit stream to only overlap samples of said bit cell for detecting a bit value of said bit cell.

14. The device of claim 13, wherein glitches or spikes in the bit stream are filtering out.

15. A node in a communication system, the node comprising the device of claim 11.

16. The device of claim 11, including a sampling unit for sampling said bit cell in the received bit stream to generate at least two sample values of said bit cell.

17. The device of claim 10, wherein said detection window is positioned at an expected edge between two bit cells of the bit stream to only overlap samples of said bit cell for detecting a bit value of said bit cell.

18. The device of claim 17, wherein said detection window comprises an odd number of samples.

19. The method of claim 6, including:
sampling said bit cell in the received bit stream, to generate at least two sample values of said bit cell.

20. The device of claim 10, wherein glitches or spikes in the bit stream are filtering out.

21. The device of claim 17, including a sampling unit for sampling said bit cell in the received bit stream to generate at least two sample values of said bit cell.

22. A node in a communication system, including a device as claimed in claim 17.

23. A computer readable medium having instructions executable by at least one of a computer and a microprocessor stored thereon for performing the steps of:
    a) defining a detection window of sample values which are used to determine a value of a bit cell in a bit stream;
    b) applying a majority voting to said sample values within said detection window;
    c) generating a value of said bit cell in dependence on the results of step b); and
    d) decoding the bit stream using the bit cell values generated in step c), wherein said detection window is positioned at an expected edge between two bit cells of the bit stream to overlap at least one sample of a first bit cell and at least one sample of a subsequent bit cell, having respective sample values, in order to perform bit edge detection.

* * * * *